US007446601B2

(12) United States Patent
LeChevalier

(10) Patent No.: US 7,446,601 B2
(45) Date of Patent: Nov. 4, 2008

(54) ELECTRON BEAM RF AMPLIFIER AND EMITTER

(75) Inventor: Robert E. LeChevalier, Golden, CO (US)

(73) Assignee: Astronix Research, LLC, Golden, CO (US)

( * ) Notice: Subject to any disclaimer, the term of this patent is extended or adjusted under 35 U.S.C. 154(b) by 938 days.

(21) Appl. No.: 10/875,489

(22) Filed: Jun. 23, 2004

(65) Prior Publication Data

US 2005/0285541 A1 Dec. 29, 2005

Related U.S. Application Data

(60) Provisional application No. 60/482,106, filed on Jun. 23, 2003.

(51) Int. Cl.
*H03F 7/06* (2006.01)

(52) U.S. Cl. ........................................ 330/4.7; 315/364

(58) Field of Classification Search .................. 330/4.5, 330/4.6, 4.7, 43–46; 315/3, 364
See application file for complete search history.

(56) References Cited

U.S. PATENT DOCUMENTS 3,221,207 A 11/1965 Kaufman et al.
3,665,241 A 5/1972 Spindt et al.
3,725,803 A 4/1973 Yoder
3,749,961 A 7/1973 Bates et al.
3,922,616 A 11/1975 Weiner
4,263,531 A 4/1981 Yoder
4,328,466 A 5/1982 Norris, Jr. et al.
4,410,903 A 10/1983 Wieder
4,498,952 A 2/1985 Christensen
4,771,214 A 9/1988 Takenaka et al.
4,902,898 A 2/1990 Jones et al.
4,980,567 A 12/1990 Yasuda et al.
5,041,069 A 8/1991 Horst
5,122,663 A 6/1992 Chang et al.
5,186,670 A 2/1993 Doan et al.
5,191,217 A 3/1993 Kane et al.
5,319,322 A 6/1994 O'Loughlin
5,355,380 A 10/1994 Lin et al.
5,363,021 A 11/1994 MacDonald
5,430,347 A 7/1995 Kane et al.
5,489,818 A 2/1996 Naff et al.
5,497,053 A 3/1996 Tang et al.

(Continued)

OTHER PUBLICATIONS

T.H.P. Chang et al, "Electron-beam microcolumns for lithography and related applications", J. Vac Sci. Technol. B 14(6), Nov./Dec. 1996, pp. 3774-3781.

(Continued)

*Primary Examiner*—Khanh V Nguyen
(74) *Attorney, Agent, or Firm*—Lathrop & Gage LC

(57) ABSTRACT

RF field is sensed to produce an incoming voltage that drives a microarray of electron guns in a sweep pattern towards a detector array. The electron guns emit a beam current that may amplify the incoming voltage signal, and the detector material may be selected to amplify the beam current at the detector, for example, by avalanche and/or cascade in a Schottky material, to provide a low current, high gain amplification. The microarrays may be arranged in various combinations to produce successive amplifications, frequency multipliers, transmit-receive amplifiers, crossbar switches, mixers, beamformers, and selective polarization devices, among other such devices.

210 Claims, 122 Drawing Sheets

U.S. PATENT DOCUMENTS

| | | | | |
|---|---|---|---|---|
| 5,514,847 | A | 5/1996 | Makishima et al. | |
| 5,592,053 | A | 1/1997 | Fox et al. | |
| 5,773,933 | A | 6/1998 | Yoder | |
| 5,842,680 | A | 12/1998 | Bustamante et al. | |
| 5,955,849 | A | 9/1999 | Tang et al. | |
| 6,023,060 | A | 2/2000 | Chang et al. | |
| 6,145,438 | A | 11/2000 | Berglund et al. | |
| 6,177,909 | B1 | 1/2001 | Reid et al. | |
| 6,281,508 | B1 | 8/2001 | Lee et al. | |
| 6,356,221 | B1 | 3/2002 | LeChevalier | |
| 6,369,385 | B1 | 4/2002 | Muray et al. | |
| 6,384,519 | B1 | 5/2002 | Beetz, Jr. et al. | |
| 6,433,303 | B1 | 8/2002 | Liu et al. | |
| 6,479,320 | B1 | 11/2002 | Gooch | |
| 6,498,349 | B1 | 12/2002 | Thomas et al. | |
| 6,518,923 | B2 | 2/2003 | Barquist et al. | |
| 6,545,425 | B2 | 4/2003 | Victor | |
| 6,617,587 | B2 * | 9/2003 | Parker et al. | 250/398 |
| 7,157,703 | B2 * | 1/2007 | Nakasuji et al. | 250/311 |

OTHER PUBLICATIONS

M.G.R. Thomson et al., “Lens and deflector design for microcolumns”, J. Vac Sci. Technol. B 13(6), Nov./Dec. 1995 American Vacuum Society, pp. 2445-2449.

E. Kratschmer et al., “Experimental evaluation of a 20×20mm footpring microcolum”, J. Vac Sci. Technol. B 14(6), Nov./Dec. 1996 American Vacuum Society, pp. 3792-3796.

T.H.P. Chang et al., “Electron beam microcolumn technology and applications”, Electron-Beam Sources and Charged-Particle Optics, SPIE vol. 2522, 1995, 9 pgs.

T.H.P. Chang et al., “Arrayed miniature electron beam columns for high throughput sub-100nm lithography”, J. Vac Sci. Technol. B 10(6), Nov./Dec. 1992 American Vacuum Society, pp. 2743-2748.

M. Kitamura et al., “Microfield emitter array triodes with electron bombarded semiconductor anode”, J. Vac. Sci. Technol. B 11(2), Mar./Apr. 1993, pp. 474-476.

H.S. Kim et al., “Miniature Schottky electron source”, J.Vac. Sci. Technol. B 13(6), Nov./Dec. 1995, pp. 2468-2472.

N.M. Froberg et al, “TeraHertz Radiation from a Photoconducting Antenna Array”, IEEE J. Quantum Electronics, vol. 28, No. 10, pp. 2291-2301 (Oct. 1992).

Sang-Gyy Park et al, “High-Power Narrow-Band Terahertz Generation Using Large-Aperture Photoconductors”, IEEE J. Quantum Electronics, vol. 35, No. 8, pp. 1257-1268 (Aug. 1999).

Cha-Mei Tang et al, “Deflection Microwave And Millimeter-Wave Amplifiers”, J. Vac Sci. Technol. B 12(2), Mar./Apr. 1994, pp. 790-794.

Manohara et al, “Design And Fabrication Of A Thz Nanoklystron”, Far-Ir, Sub-Mm & Mm Detector Technology Workshop, Monterey Ca; Apr. 1-3, 2002 22 pgs.

* cited by examiner $$Z_0 = \eta \frac{a}{b}$$

ELECTRON BEAM RF AMPLIFIER AND EMITTER

CROSS-REFERENCE TO RELATED APPLICATION

This application claims priority to U.S. provisional application Ser. No. 60/482,106 filed 23 Jun. 2003 and hereby incorporated by reference.

FIELD OF THE INVENTION

The field of the invention is that of high-frequency electronic amplifiers intended for electromagnetic radio frequency reception and generation, both tuned and broadband. Applications also include digital signal processing and general purpose computing.

BACKGROUND

The twentieth century opened with the discovery of radio wave transmission by Marconi. World War II heralded the emergence of radar. The 1960's witnessed the launching of satellites. The 1990's saw the proliferation of commercial wireless data communications. These four events signaled epochal moments in history, opening up entirely new ranges of the electromagnetic spectrum for revolutionary applications such as radio, television, long-range surveillance, satellite communications and computer networking. The key components that made these advances possible were the development of electronic components capable of detecting, amplifying and re-transmitting high-frequency electrical signals: the point contact diode, the vacuum tube triode, the semiconductor transistor, the traveling wave tube, the integrated circuit. Each had—or is having—its moment and was superceded by a newer technology as demand for higher performance increased.

Today, RF communications, radar and other applications are pushing well into the high gigahertz region, as much as 200 GHz or more. Even home wireless networking and simple cordless telephones are operating at over 5 GHz, a domain once reserved to only the military a few short decades ago.

The key components that made these advances possible are high-frequency devices: transistors with current-gain-bandwidth product $f_T$>200 GHz, LNAs with high linearity (IIP3), emerging power transistors made of SiC and GaN, and the venerable traveling wave tube (TWT). Many applications such as digital radio and military surveillance today are limited by the power or bandwidth achievable in a conventional semiconductor, or by the size, weight, cost, power and distortion products of the TWT. Space electronics is also limited by the radiation hardness and reliability of semiconductors. Military applications also require greater bandwidth, with tuning ranges exceeding 10:1 at frequencies up to 100 GHz.

Semiconductor Amplifiers

Despite the ubiquity of modem semiconductors, they suffer several limitations for the highest frequency RF applications. First, transistor breakdown voltage must be reduced significantly to achieve the necessary bandwidth, often to a volt or two or less. This severely limits the power they can generate, especially when low distortion is required. More fundamentally, semiconductors have an upper bandwidth dictated by the physics of the semiconductors: the maximum carrier velocity, especially, the saturated electron velocity. Current art places a limitation of perhaps 400 GHz $f_T$ on III-V compound devices such in InP, GaAs, InAs, and a theoretical limit of approximately 1 THz is dictated by the velocity of current-conducting carriers (electrons) in any semiconductor crystal. Practical applications such as an RF low-noise amplifier (LNA) usually can only operate at no more than 1/10 of the $f_T$. Furthermore, to operate at speeds of 100 GHz or more (as in an RF LNA) requires considerable power. At this time, there are almost no semiconductor power amplifiers capable of operating much above 10 GHz, leaving the entire field of high-power antennas to the field of vacuum electronic devices, such as the TWT, which are orders of magnitude more expensive and bulky. Semiconductor amplifiers are also extremely sensitive to radiation induced degradation and failure in space environments.

TWTs and Other Traditional Vacuum Electronic Devices

TWT's offer direct RF amplification with power gains exceeding 40 dB, frequency of amplification over 100 GHz, and bandwidth of more than 2 octaves in specialized devices. The drawback is they are large, very expensive, power consumptive, noisy and introduce significant signal distortion. Size can vary from 10 cubic inches in very high frequency devices (~100 GHz). Cost can be $10,000 in a typical device to as much as $100 k in a space-rated device. Minimum power consumption can be hundreds of watts even in a low power device. Noise figures are typically 40 dB, compared to as little as 1 dB in a semiconductor LNA. Distortion products for wideband operation can be similarly oppressive, restricting their use to power amplification. TWTs can in principle operate at frequencies approaching or exceeding 1 THz, but become extremely inefficient at these frequencies (as little as a few percent), and very hard to build because of the micron-sized dimensions. Machining tolerances of a few nanometers become necessary, and waveguide losses become dominant, since a long waveguide (such as a helix, serpentine, or many coupled cavities) has unavoidable ohmic sidewall losses.

Many applications today are severely constrained by the lack of high-frequency performance in available amplifiers. For example, an emerging application is wireless networking in dense urban environments. The demand for communication bandwidth on network channels is already exceeding 1 Gbps, yet the limits of present-day carrier frequencies is only about 5-10 GHz. As is known in the art, the carrier frequency must normally be much higher than the data rate—100 times higher or more. For example, 2.4 Ghz carriers typically provide 10 Mbps data rates or less in the well-known "Bluetooth" system (sometimes called "802.11b"). 1 Gbps data rates imply a carrier of at least 100 GHz or more.

The problem is exacerbated in dense urban environments, especially around large office buildings. Current technology increases the spectrum capacity by limiting the range of a limited number of sub-channels (which may be spectrally broad in spread spectrum or Ultra Wideband (UWB) systems). No more than a few hundred low-bandwidth (10 Mbps) channels can typically be made available within a short geographic radius of a few hundred meters. In an urban environment with thousands of network connections within a single building and other buildings in close proximity, it can be seen that there is a hard limit, indeed, on the number of network connections and the aggregate data transfer rate that is possible per cubic mile.

Hard-wired networks traditionally overcome this density limitation, but they are difficult to install and very expensive to retrofit an existing structure. Wireless systems have recently proliferated (based on the 802.11b standard, among others) using higher carrier frequencies, but for higher bandwidths and link densities, few or no solutions exist today.

As mentioned, semiconductor amplifiers cannot operate much above 100 GHz with any gain at all, and are very power inefficient. TWT amplifiers also cannot operate efficiently much above 100 GHz (though they are much better), but are prohibitively expensive for most applications. What is needed is a solution that offers the size and economies of scale of semiconductors, and the gain and frequency performance of TWTs, with power efficiency and linearity greater than both. Thus, it can be appreciated that there is a real demand for a low cost, efficient millimeter wave to sub-millimeter wave RF technology.

Related Art

As will become apparent, the present invention relates to microminiature electron beam devices applied to RF amplification and signaling, particularly those that operate in the millimeter to sub-millimeter wave region (50 GHz to 2 THz). Similar inventions have claimed advances that might operate in this region. For example, Manohara et al (ref. 11) have published work on sub-millimeter "nano-klystrons" based on many of the elements described herein for the present invention: semiconductor fabrication, MEMS and electron gun construction. An impressive development, it nonetheless suffers many deficiencies, including narrowband tuning, and relatively slow response to signal modulation, because of the resonant cavities inherent in the method. The nano-klystron also lacks integral phase and polarization control, which are highly desirable features of any RF power device intended for transmission purposes, yet expensive and bulky to provide as separate elements.

U.S. Pat. No. 5,497,053 issued to Tang, et al shows a deflection amplifier (or "deflectron") that purports to offer wideband amplification, but suffers low gain, relative to the invention here, because the detrimental effects of space charge repulsion limit the maximum beam current. Furthermore, such beam current as Tang et al. can generate creates significant heating losses. Tang et al. also does not offer integral solutions to antenna coupling, phase and polarization control.

U.S. Pat. No. 3,725,803 issued to Yoder predates Tang et al., and teaches an electron beam driven P-N junction in a push-pull detector arrangement. Yoder does not suggest his method provides extra gain through the beam interaction with the semiconductor diodes, though it may be inferred. However, such extra gain as may be provided will be modest, and the apparatus does not lend itself well to microfabrication. Further, Yoder does not adequately elaborate on how his method will provide linear gain, and it may be inferred from the description that high linearity will not be achievable. For example, Yoder does not describe means for achieving a substantially uniform electron beam. Yoder does not indicate how the detection apparatus can be constructed so as to achieve a linear output from a uniform beam, and in fact, it achieves just the opposite. Thus, Yoder's arrangement is seriously deficient in regard to actual construction of a deflectron having linear response.

Chang, Muray, Lee, MacDonald (see references) have described "microcolumn arrays" of miniature electron guns and elements thereof for the purpose of improved electron beam lithography in semiconductor fabrication, yet they have not explored the potential of employing microcolumn arrays in amplifiers, RF generators or computing.

U.S. Pat. No. 3,922,616 issued to Weiner describes one way to provide gain from an electron beam, by means of an electron bombarded semiconductor. This is commonly called an "EBS" amplifier. The method is based on a p+-i-n+ diode with an intrinsic "i" layer. Kitamura et al (1993, ref 12) explicitly describes an EBS amplifier based on a silicon Schottky diode, but do not employ deflection means. U.S. Pat. No. 4,410,903 issued to Weider describes a heterojunction EBS amplifier based on InGaAs and InP compounds to improve the speed and bandwidth, but these suffer from lack of compatibility with low-cost silicon microfabrication. All three disclosures provide means to improve the gain of an electron beam deflectron amplifier over that of Yoder or Tang et al.

U.S. Pat. No. 5,592,053 issued to Fox et al. describes a variation on the EBS amplifier that provides gain via an electron-beam activated diamond conductor. U.S. Pat. No. 5,355,380 issued to Lin describes a related e-beam excited diamond switch for millimeter wave generation that depends on modulating the current of an electron beam. The principle disadvantage in either is that high beam energies are required with a diamond detector material. This causes extra heating losses, reduced efficiency, and severely limits the deflection gain. Another disadvantage is that Fox does not employ a precision e-beam forming device, such as a microcolumn. Another disadvantage is the difficulty of fabricating high-quality diamond films. Again, beam deflection is not incorporated in the gain mechanism.

A principle disadvantage of following Tang et al., Yoder, or Weiner is that they rely on high current electron beams, which are difficult to focus in low-energy beam systems because of the space charge effect. Lack of focus reduces amplifier gain, decreases bandwidth and increases amplifier distortion. Fox overcomes this with a high energy beam. High current and high energy beams are antithetical to microfabricated electron beam systems. High current and high energy beams dissipate excess anode heating power. High voltage beam circuitry is susceptible to destructive arcing and requires high voltage power supplies, which are difficult to build, bulky and power consumptive, and not amenable to microfabrication.

U.S. Pat. No. 4,328,466 issued to Norris et al describes an EBS amplifier that operates with a sheet beam to disperse the space charge and permit higher beam current, but sheet beams still suffer substantial space charge effects, thereby limiting the beam current and amplifier gain. Norris' amplifier suffers from the complexity of a distributed architecture to achieve high frequency broadband and high power operation, making it unsuitable for low-cost microfabrication.

Low current beams are desirable, yet they reduce amplifier gain. It may be appreciated that there is a need for higher current, but low energy electron beam systems for microfabricated high speed amplifiers.

U.S. Pat. No. 5,041,069 issued to Seiler, U.S. Pat. No. 6,177,909 issued to Reid, and Froberg (ref. 8) have constructed photoconductive antennas which employ semiconductor antenna excitation to generate THz radiation, yet they suffer from uncontrolled wideband transmission, no phase or polarization control, and require complex laser activation with slow pulse repetition rates. As will be seen, the present invention advances the art over all these examples of prior art, simultaneously providing, in different embodiments, controlled wideband modulation, high gain, RF transmission, phase and polarization control.

It will be appreciated in the following description and appended claims that the present invention combines many of the advantages of prior art while overcoming the deficiencies in a novel arrangement, to thereby achieve RF amplifier embodiments possessing higher gain, faster operation, less distortion and lower power consumption. These benefits accrue in almost any RF receiver or transmitter application including wireless networking and antenna beamforming, frequency multiplication, high-speed digital logic and computing.

SUMMARY OF THE INVENTION

The disclosure to follow provides method and apparatus for wideband RF amplification that solves the shortcomings of both semiconductor and conventional vacuum electronic amplifiers. It can simultaneously provide high frequency of operation (exceeding 1 THz), wide bandwidth (up to 10:1 frequency range or more), high power gain (60 dB or more), linear operation and low noise in a size comparable to an integrated circuit (several cubic millimeters) with similar cost and lower power consumption. What is disclosed is a hybrid of semiconductor and vacuum electronics. It can be constructed using standard semiconductor fabrication techniques. There are many embodiments of the same basic principle:

A first embodiment, amplifies a voltage signal and generates a highly linear current output by exciting a detector with a deflection modulated electron beam. The method includes a two-dimensional array of electron guns to generate beamlets, a distributed beam deflection apparatus in each electron gun array to provide high deflection gain to re-direct the electron beam in response to a voltage signal, and an electrostatic lens system to create a shaped electron beam spot where the beam strikes a current amplifying detector. The detector in one form comprises dual segments to differentially collect the beam in proportion to the deflection. Each segment converts a collected proportion of the beam to an electrical current, amplifies it, and couples it to an output network.

In the most linear configurations, the dual detector segments are triangular and oriented in opposition to respond to a narrow rectangular beam spot; for the highest linearity, the space separating the segments distorts the shape of the segments from pure triangularity. In the fastest configuration, the segments are rectangular and the beam spot is rectangular to give a configuration that has the smallest detector.

One construction is by semiconductor manufacturing processes including wafer bonding.

In another embodiment the detector is a Schottky diode made of a germanium-silicon heterostructure. In another, the detector is Schottky diode made from a low-ionization material such as InAs or InSb. In either case, the detector provides beam-generated cascade gain and avalanche multiplication by a sandwich of semiconductor between a beam contact and an output contact.

In another embodiment, the beam shaping is achieved with a shaped array of electron guns that are imaged on the detector by the electrostatic lens system.

In another embodiment, the lens system is a doublet of a retarding and accelerating lens constructed from planar electrodes in the drift cavity. One configuration comprises a circular disc electrode enclosing the electron gun array to generate the retarding lens, and a circular electrode enclosing the detector to generate the accelerating lens. The drift cavity is enclosed by a cylindrical drift can with the electron gun array centered in one end, and the detector centered in the other. Planar donut electrodes may enclose the first and second disc electrodes in their respective planes.

A variation achieves beam shaping with an astigmatic electron lens system comprising multiple shaping electrodes disposed around the exit plane of the electron gun array, and the electrodes are subject to different applied voltage potentials.

All embodiments employ electron gun construction comprising field emission cathodes, cathode gating, a plurality of focusing and aperture electrodes, and deflection plates. In one variation, the plurality of focusing and aperture electrodes is increased in number to reduce the diameter of the gun column (relative to the beam axis). In another a beam blanking deflector is incorporated for pulsed operation.

Another embodiment incorporates current control in every electron gun, comprising a ballast resistor to sense the cathode current and an amplifier to compare the ballast voltage against a reference, thereby generating an error signal that is applied to the cathode gate electrode.

In another embodiment, offset centering apparatus keeps the beam centered on the detector with a control loop comprising an integrator generating an offset correction signal in response to the beam offset as measured at the detector. A variation employs independent detector segments to measure the offset.

Another embodiment provides true time delay shifting by means of apparatus to adjust the energy of the electron beam and thereby the drift time through the drift cavity. One variation adjusts the potential of the detector plane, and in a configuration that improves the focusing, augments the cylindrical drift can electrode with a consecutive series of ring electrodes to approximate the fields potentials generated by a much larger drift cavity. In another variation the acceleration energy of the electron gun achieves the time delay control by augmenting the construction with a plurality of DACs coupled to deliver precise electrode focusing voltages for every time delay command. A further variation augments this arrangement with an analog-to-digital converter to couple a digitized measurement of the control gate with the time delay command, to generate electron gun focusing electrode potentials that are corrected for varying gate voltages in response to a current control loop.

Yet another embodiment achieves frequency multiplication. One configuration uses a multiplicity of detector segments in a linear array that provides programmable multiplication. Another configuration achieves lower inharmonicity by using a circular detector in a two-dimensional arrangement of segments similar to the slices of a pie, and uses horizontal and vertical electron gun deflection.

Another embodiment of frequency multiplication employs a single shaped detector segments and a shaped beam spot. The sweep of the shaped beam spot across the edge of the segment generates strong harmonics. The variations include triangular beam spots on rectangular detectors, rectangular beam spots on triangular detectors, rectangular beam spots on quadratically shaped detectors, and so forth, to generate second, third, fourth and so on harmonics.

Another embodiment, is a mixing device comprising a square detector made of four equal square segments arranged symmetrically around axes X and Y, a square beam spot disposed to sweep in X and Y directions in response to a first signal applied to an X deflection apparatus and a second signal applied to a Y deflection apparatus.

Another embodiment is a combinational logic device comprising a plurality of N deflectors X1, X2, . . . XN, a corresponding plurality of deflection signals V1, V2, . . . VN, and detectors D1, D2, . . . DM, each individually positioned to correspond to a logic state of the deflection vector V1 . . . VN. Some of the deflectors XN are oriented for horizontal beam deflection and some of the deflectors are oriented for vertical beam deflection to improve the degeneracy of states and the compaction of the system. A further extension of the concept employs deflectors of different geometries to achieve gray coding for a further reduction in the state degeneracy.

Another embodiment, is a method of exciting electromagnetic radiation by incorporating an antenna, such as a dipole, patch or horn. Some variations provide a selectable polarization dipole or patch by means of X and Y deflection, multiple detector segments and/or multiple addressable feedpoints.

Another radiating embodiment, excites a waveguide. The waveguide may be rectangular or circular. The excitation can be single or dual polarization to excite desired waveguide modes. The dual polarization device consists of four segments, with two opposing segments connected across a diameter of the waveguide, and the other two opposing segments connected across an orthogonal diameter of the waveguide. This may be augmented with a selectably shaped beam spot for selectable polarization, with a rectangular spot shape spanning two opposing detectors and a motion that sweeps between the two detectors. Any of the waveguide embodiments may be coupled to the feed of an antenna horn.

Another embodiment merges the detector and antenna in a single structure to make a novel radiator that can simultaneously generate harmonics and controlled phase and polarization. In a variation, multiple, independently steerable beams are employed to enhance the diversity of the output radiation.

Another embodiment, is constructed as an array of amplifiers according to any of the other embodiments, thereby achieving transmit antenna arrays, receive antenna arrays, T-R arrays and signal combining networks.

Another embodiment, is a crossbar matrix comprising a plurality of N independent electron guns, a plurality of M detectors and crossbar addressing means. Each electron gun includes independent X and Y deflectors, and receives N digital input signals and N X and Y offset control signals for addressably configuring the matrix. The crossbar addressing means comprises a plurality of DACs under the control of a processor or ROM.

An extension of the crossbar matrix further includes free-space photonic I/O comprising a photonic input array, an input lens system, a photodetector array, a laser diode array, an output lens system, and an output photonic coupling array. The lens system images the photonic input array on the photodiode array. The photodiode array electrically couples individual photodiodes to individual electron guns to transmit the signals to addressed detector outputs. The laser diode array electrically couples individual laser diodes to individual detectors. The photonic I/O can be provided by fiber optic bundles Another embodiment, is a multiprocessing compute engine comprised of a crossbar matrix coupled to a plurality of processor elements.

BRIEF DESCRIPTION OF THE DRAWINGS

FIG. 120 shows a detector circuit using HBT load isolation;

FIG. 121 shows a detector circuit with bipolar injection gain; and

Figure 121:
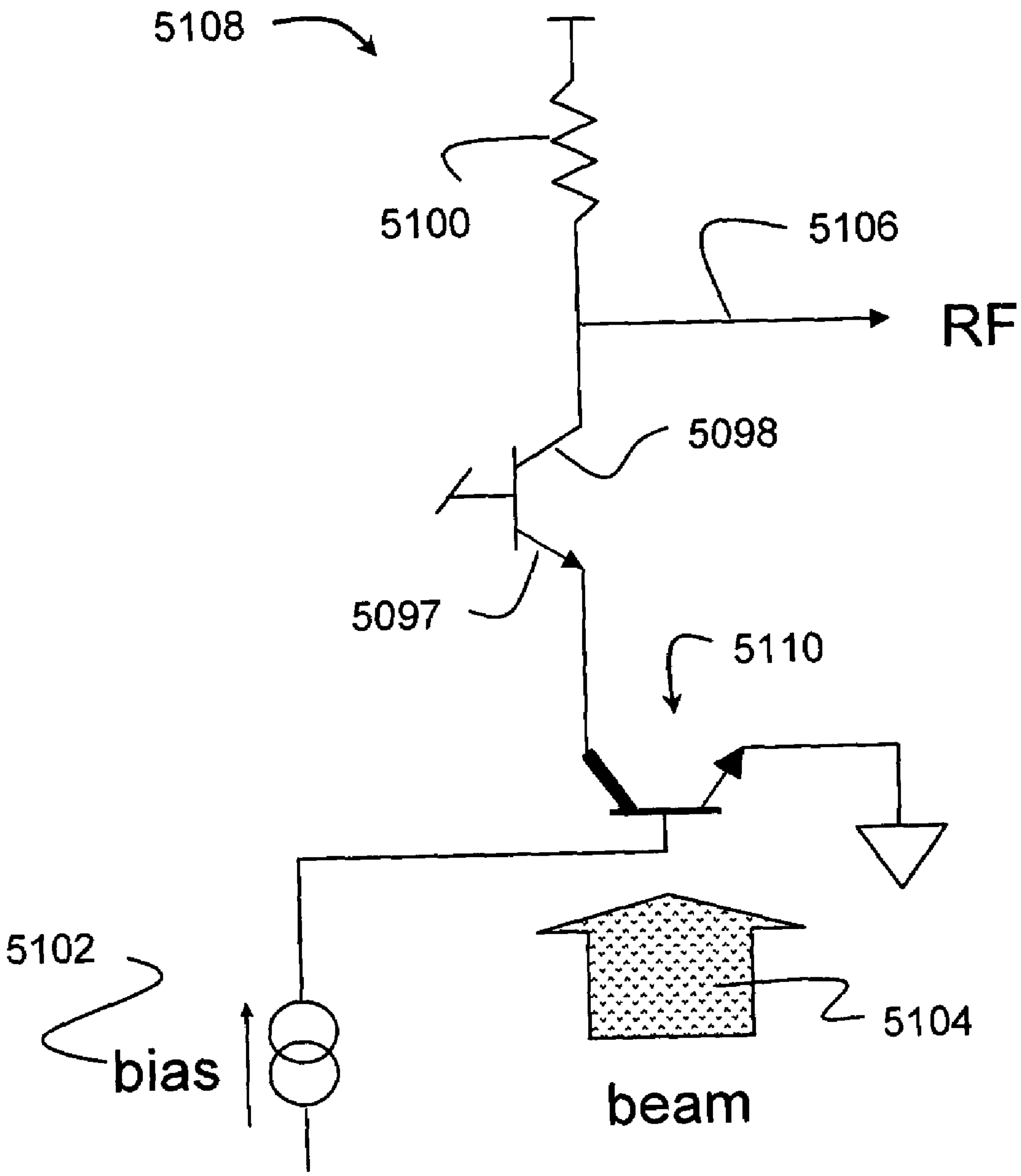
Figure 122B:
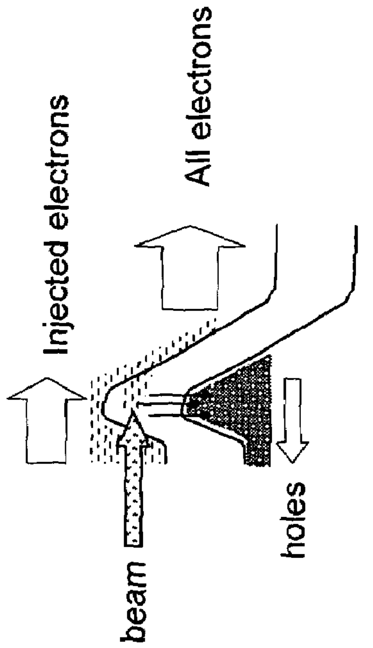
Figure 122A:
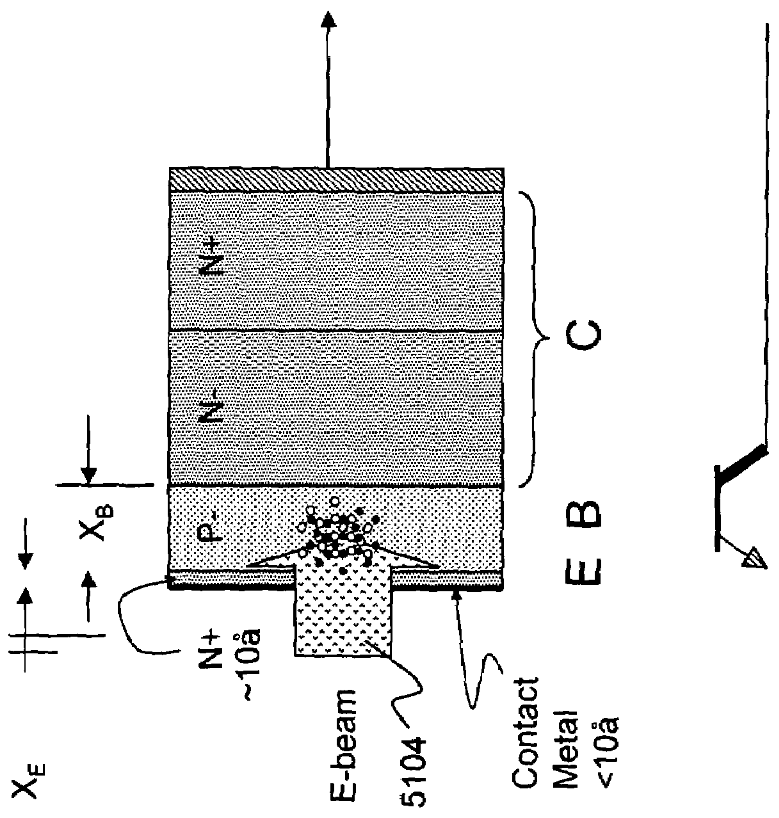

FIG. 122A and FIG. 122B provide additional detail with respect to and HBT used in the circuit of FIG. 121.

DETAILED DESCRIPTION OF THE DRAWINGS

Overview

Figure 1:
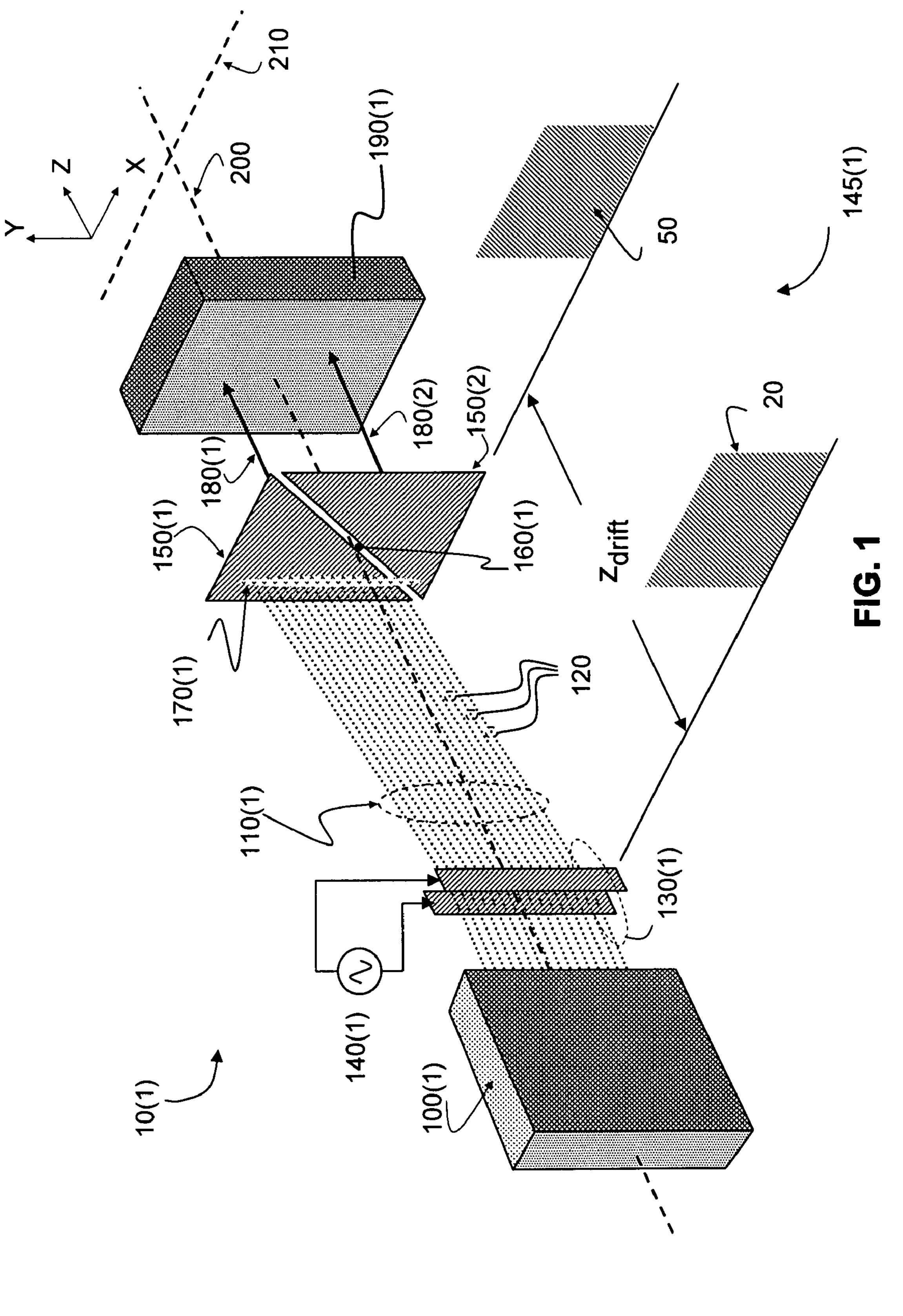
FIG. 1 shows one embodiment of an electron-beam amplifier.

FIG. 1 shows one embodiment of an electron-beam amplifier 10(1), including an array 100(1) of electron guns, an electrostatic deflection apparatus 130(1) driven by a voltage signal 140(1), a drift cavity 145(1) characterized by a length $z_{drift}$, two detector segments 150(1), 150(2) separated by a slot 160(1), and an output network 190(1). An X-Y plane in which detector segments 150(1), 150(2) are located is a detector plane 50; an X-Y plane at a nearest side of deflection apparatus 130(1) to the detector plane is an emission plane 20 (only small portions of emission plane 20 and detector plane 50 are shown, for clarity of illustration). Emission plane 20 and detector plane 50 are separated by a drift cavity length $z_{drift}$, as shown. A Z direction from detector plane 50 to emission plane 20 is a transmission axis 200; in this embodiment an X direction is a sweep direction 210. Detector segments 150(1), 150(2) may be semiconductor diodes or other beam-current amplifying detectors, as described below. Each of detector segments 150(1), 150(2) has a width $X_D$ in sweep direction 210.

Amplifier 10(1) operates by (1) emitting a composite electron beam ("e-beam") 110(1) (consisting of electron beams 120 emitted from individual electron guns that are not shown in this figure), (2) deflecting composite beam 110(1) by applying voltage signal 140(1) to deflector apparatus 130(1), (3) generating output currents $I_1$ 180(1) and $I_2$ 180(2) through the action of composite beam 110(1) impinging upon detector segments 150(1), 150(2) at beam spot 170(1), and (4) transmitting output currents 180(1), 180(2) into output network 190(1). By deflecting composite beam 110(1) with voltage signal 140(1), a physical change in position of beam spot 170(1) impinging upon segments 150(1), 150(2) generates changes in output currents 180(1), 180(2) that can be coupled to an output load such as a resistor, a transmission line, a waveguide, or an antenna.

The principle of operation may be understood as follows. Composite beam 110(1) sweeps back and forth in sweep direction 210 from detector segment 150(1) to detector segment 150(2) in response to voltage signal 140(1). Electron beams 120, and thus composite beam 110(1), carry an electrical current equal to the well-known electronic charge q times a number of electrons emitted per unit time. Voltage signal 140(1), applied across a gap within beam deflection apparatus 130(1) establishes an electric field E that subjects electrons in e-beams 120 to a transverse force F as they travel through the deflector. The force is described by the well-known law F=qE. At a maximum positive beam deflection, detector segment 150(1) may collect all of the impinging beam current; at a maximum negative deflection, detector segment 150(2) may collect all of the impinging beam current. Between these extremes of positive and negative deflection, each of detector segments 150(1) and 150(2) collects a proportionate amount of the beam current. For example, when composite beam 110 is centered, each of detector segments 150(1) and 150(2) may collect 50% of the beam current. If beam 110(1) is positioned to 70% of maximum deflection in the positive sweep direction (i.e., the X direction of FIG. 1), detector segment 150(1) may collect 30% of the beam current and detector segment 150(2) may collect 70% of the beam current. An absence of a voltage signal 140(1) applied to beam deflection apparatus 130(1), resulting in no deflection of e-beams 110(1) by deflection apparatus 130(1), is a quiescent state.

Other factors being equal (as explained below), a deflection of composite beam 110(1) may be proportional to voltage signal 140(1), and a beam current collected by either of detector segments 150(1), 150(2) may be linear in response to the change in position of beam 110(1). As shown in FIG. 1, beam 110(1) may approximate a sheet, made of a linear array of e-beams 120, and generating a line-shaped beam spot 170(1) (the terms "sheet" and "line spot" are not to be taken in the mathematical sense of having zero thickness or width respectively). When beam 110(1) is deflected across a rectangular detector segmented by a diagonal slot (e.g., detector segments 150(1), 150(2) and slot 160(1)) the collection of beam current by each of the detector segments 150(1), 150(2) may be proportional to a beam deflection and a resulting beam spot displacement on the detector.

Figure 2:
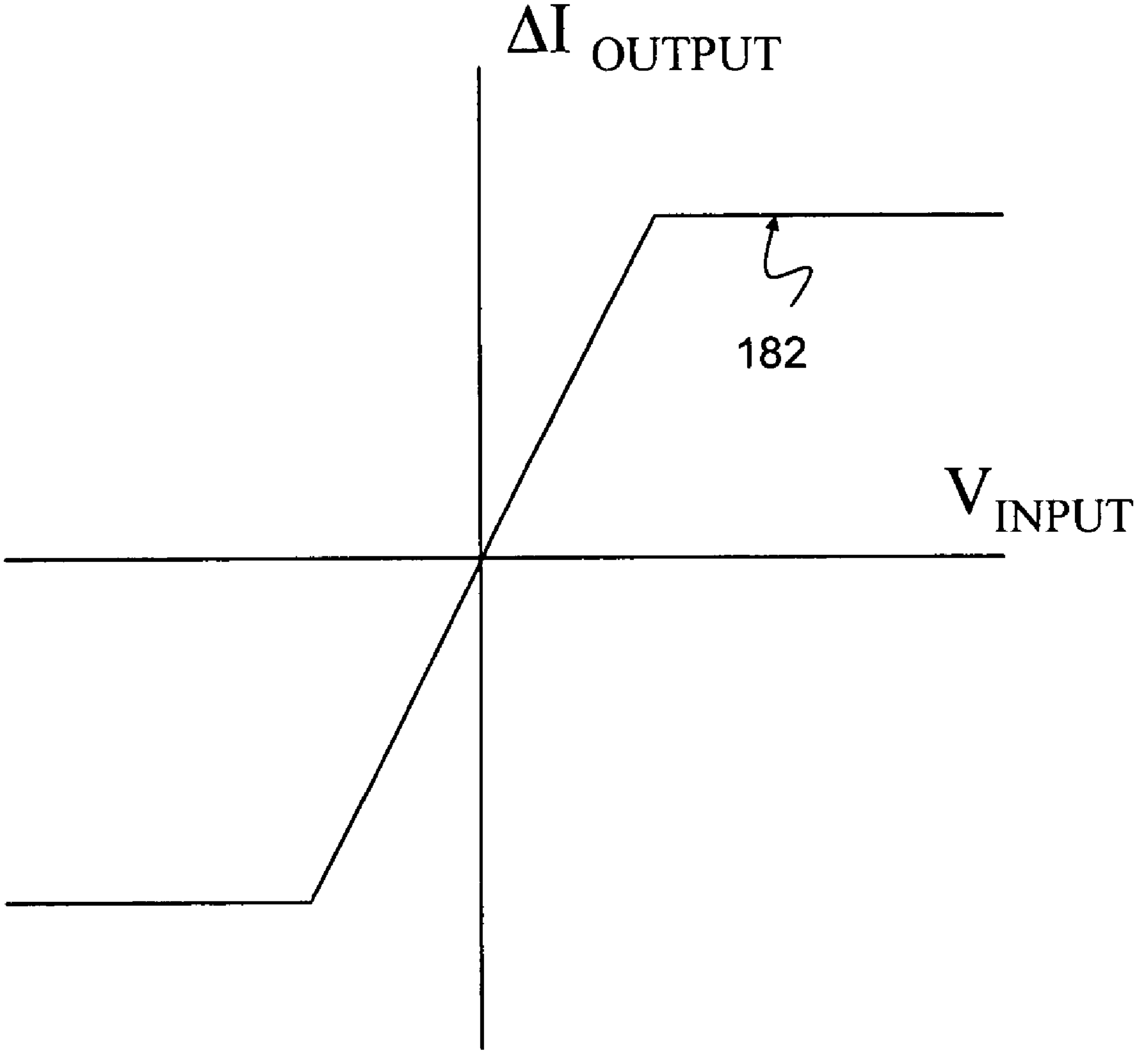
FIG. 2 shows an amplifier transfer curve of the electron-beam amplifier of FIG. 1.

FIG. 2 shows an amplifier transfer curve 182 for the electron-beam amplifier of FIG. 1. As explained above, each of output currents $I_1$ and $I_2$ (180(1) and 180(2) in FIG. 1) can vary according to the input voltage drive amplitude $V_{INPUT}$; at a given $V_{INPUT}$, a differential current $\Delta I_{OUTPUT}=I_2-I_1$. $\Delta I_{OUTPUT}$ varies from a maximum negative amount to a maximum positive amount as input voltage $V_{INPUT}$ varies, as shown in FIG. 2.

Figure 3:
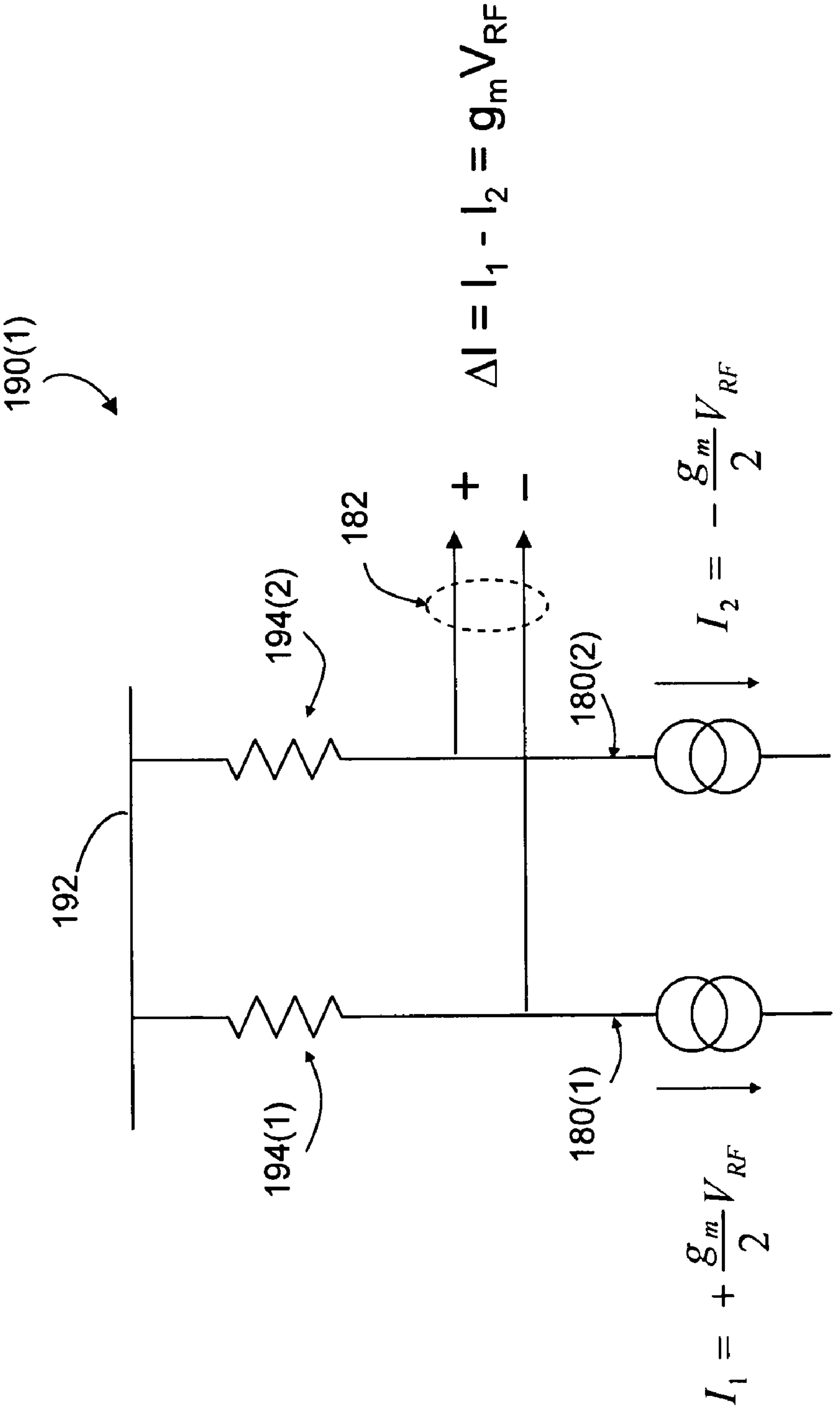
FIG. 3 shows an exemplary output network of the electron-beam amplifier of FIG. 1.

FIG. 3 shows an exemplary output network 190(1) for the electron-beam amplifier of FIG. 1. In this embodiment, a voltage source 192 is provided, and each of output currents 180(1) and 180(2) connect with voltage source 192 through loads 194(1) and 194(2) respectively. A differential current 182 forms in output network 190(1) such that output currents 180(1) and 180(2) convert to a voltage (FIG. 3). With sufficient deflector gain (as explained below), a large enough drift cavity length $z_{drift}$, and a small enough detector width $X_D$, the arrangement of FIG. 1 may have voltage gain.

Current Multiplying Detector

Figure 4:
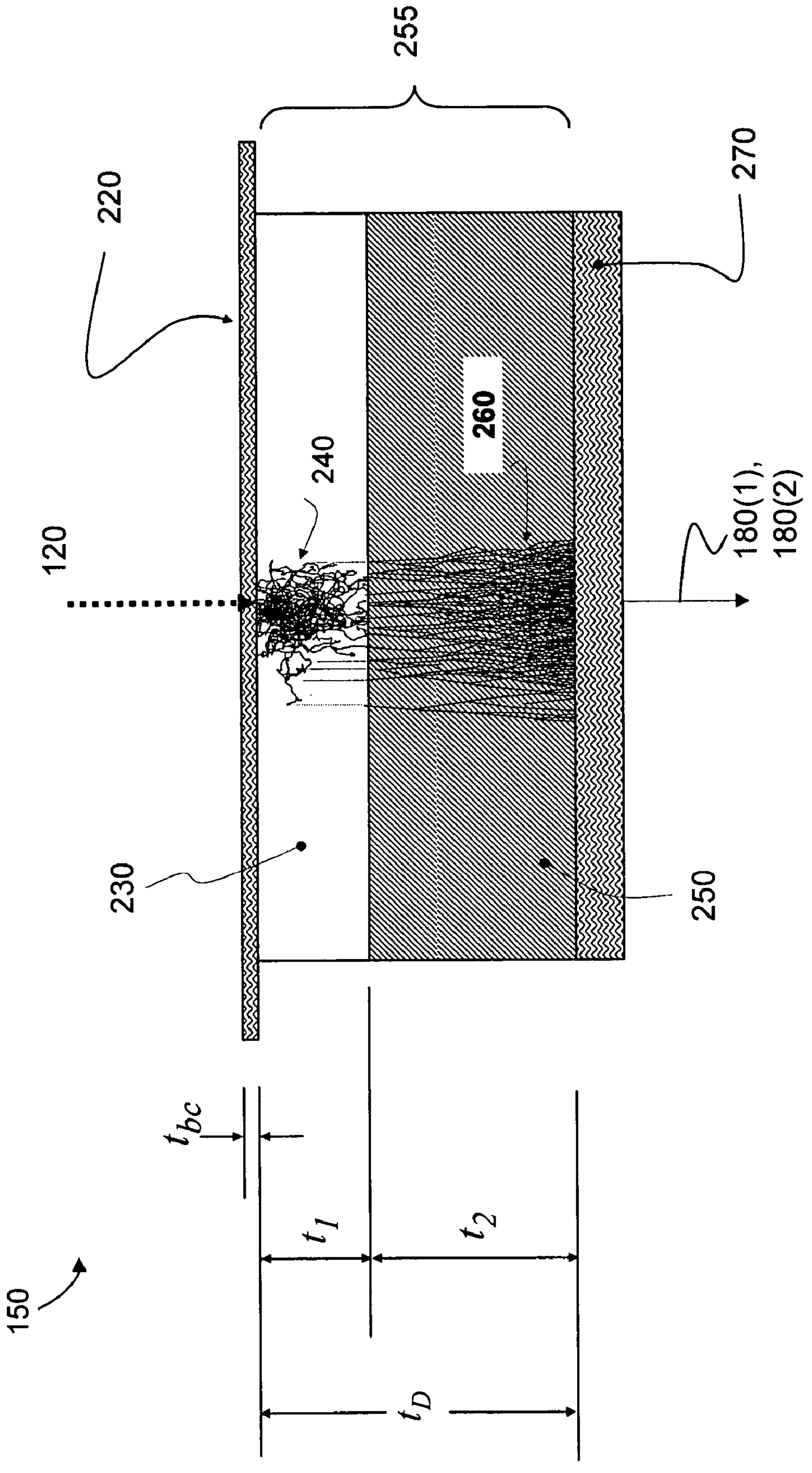
FIG. 4 shows a schematic midsection of one current multiplying Schottky electron beam detector of the electron-beam amplifier of FIG. 1.

FIG. 4 shows a schematic cross section of one current multiplying Schottky e-beam detector 150 of electron-beam amplifier 10(1). Beam detector 150 consists of a thin beam contact 220 having a thickness $t_{bc}$, a cascade gain layer 230 having a thickness $t_1$, an avalanche multiplication layer 250 having a thickness $t_2$, and an output contact 270. Beam contact 220 and output contact 270 may be a diode anode and cathode, but which of the beam contact and output contact is anode or cathode will depend on the specific beam contact material and semiconductor being contacted.

A gain of electron-beam amplifier 10(1) may substantially increase when detector segments 150(1), 150(2) amplify collected beam currents so that output currents 180(1), 180(2) are much greater than the beam currents alone. For example, a gain of 1000 or more is possible with a Schottky diode detector. In the embodiment of FIG. 4, thin beam contact 220 mates to cascade gain layer 230 having a high cascade ionization gain. Beam contact thickness $t_{bc}$ is thin enough to permit e-beam 120 to penetrate to cascade gain layer 230. In cascade gain layer 230, substantially all electrons in beam 120 excite hole-electron pairs in a cascade process that generates hole-electron pairs as beam energy dissipates within the diode (only exemplary electrons 240 are shown, for clarity of illustration). For example, germanium has a cascade ionization gain that generates one hole-electron pair per 2.8 electron-volts (eV) of beam energy. With, for example, a 280 eV beam exciting a germanium diode, the net cascade gain may be 100.

In certain semiconductor devices such as, for example, a Schottky diode, cascaded electrons can further multiply through the well-known avalanche multiplication effect. A key parameter for avalanche multiplication is thickness $t_2$ of avalanche multiplication layer 250. With an appropriate reverse bias voltage between cathode and anode contacts, a thickness $t_2$ of 250 to 1000 angstroms can create a sufficiently strong electric field within the diode to accelerate conduction electrons, generating even more hole-electron pairs (only exemplary electrons 260 are shown, for clarity of illustration). An avalanche gain of 10 or more is practical, and with a cascade gain of 100, an overall detector gain of 1000 is possible.

Alternative Detector Types

Many types of current multiplying detectors are possible, including Schottky diodes, junction diodes, photoconductors, and even micro-channel plates (MCPs, or micro-dynodes). Junction diodes operate similar to a Schottky diode, and may support higher voltage operation, but may have lower bandwidth. Photoconductors typically operate by generation of hole-electron pairs by photons to modulate the conductance of a resistor; a photoconductor can be designed to respond to electrons instead, generating conduction electrons by cascade excitation. A photoconductor may lack avalanche multiplication to supplement the cascade gain, and thus have lower gain than a diode; photoconductors also typically have a less linear response when coupled to a load. MCPs generate gain by a photomultiplier effect, but require high bias voltages (thousands of volts), complex construction, and have long response times.

It can be appreciated that a Schottky diode detector is preferred where high gain and fast response is desired.

Schottky Detector

The exemplary Schottky detector 150 of FIG. 4 has germanium and silicon epitaxial layers. A cascade gain layer 230 is n-type Ge and an avalanche layer 250 is n-type Si, where the cascade gain layer 230 and the avalanche layer 250 make up generally a semiconductor layer 255. A beam contact 220 is an anode made of gold (Au) forming a Schottky contact, and an output contact 270 is a cathode.

However, in other Schottky diode embodiments, other contact metals and semiconductor materials (such as, for example, InAs) may be used; in such embodiments a beam contact may be a cathode and an output contact may be an anode. A beam contact may connect with a bias voltage and the Schottky diode may be reverse biased to establish a field gradient between the beam contact and an output contact. The field gradient (1) accelerates carriers to generate avalanche multiplication of current, and (2) sweeps carriers rapidly out of the diode. The output contact is coupled to a load, for example a terminating resistor or a transmission line. When a beam contact is an anode, the bias voltage may be negative with respect to a load.

In detector 150 of FIG. 4, the electrons in e-beam 120 first impinge upon beam contact 220, which permits penetration of energetic electrons into cascade gain layer 230 with little absorption by the contact metal. Thus, detector 150 has a high beam current collection efficiency. If thickness $t_{bc}$ of beam contact 220 is on the order of 10 angstroms, most electrons of e-beam 120 will enter cascade gain layer 230. Cascading starts when one high-energy beam electron (not shown) collides with an electron in a crystal lattice structure of cascade gain layer 230, leaving two electrons (and holes) with half the energy of the original. These two electrons in turn generate 4 electrons (and holes) of ¼ energy, and so on, until the energy of the pairs is comparable to typical thermal energies of electron and holes in Ge. The termination of the cascade process depends on a property called cascade ionization energy, which is the amount of energy in eV required for cascade-generation of a hole-electron pair.

Germanium is a desirable cascade layer material because it has a high cascade gain relative to other materials, such as silicon or diamond. In germanium, one cascade electron (and a corresponding hole) are generated for each 2.8 eV energy for each beam electron. The cascade energy of silicon is 3.5 eV; the cascade energy of diamond is 5.5 eV.

A cascade process generally occurs within approximately 50 angstroms of semiconductor depth for a beam energy of several hundred electron volts; for higher energy beams, the cascade may spread deeper. Because conduction electrons in germanium have lower saturation velocities than conduction electrons in silicon, thickness $t_1$ of cascade gain layer 230 is optimally thick enough to allow completion of the cascade process, but not thicker, so that a transit time of conduction electrons to avalanche layer 250 is minimized.

Avalanche layer 250 of detector 150 optimally achieves two goals: (1) it supports a high saturated electron velocity, for fast detector response, and (2) it produces efficient, low-noise avalanche multiplication. Avalanche multiplication occurs when conduction electrons accelerate in a high-field region of avalanche layer 250. Accelerated electrons may impinge upon electrons in a crystal lattice of avalanche layer 250, generating more hole-electron pairs. Electrons thus generated accelerate again, and the process repeats, generating an avalanche current. The electrons are collected by output contact 270; holes thus generated travel through cascade gain layer 230 and are collected by beam contact 220. Avalanche multiplication can easily provide current amplification of 5, 10, 20 or more. Practical limits to avalanche multiplication are set by leakage current across a Schottky junction, and electrical noise generated by the avalanche multiplication. Silicon is a desirable avalanche layer material because leakage currents in Si are lower than in many other materials. Ge—Si epitaxy is desirable because a large body of experience in reliably and inexpensively fabricating this material system exists.

Thus, a Ge—Si Schottky diode may provide high cascade gain, high avalanche gain, high speed response, and low leakage. With a 280 eV beam, a cascade gain may approach 100, avalanche gain may be 10, and a total detector gain may be 1000.

III-V Detectors

Fast, high gain detectors may also be constructed with epitaxial systems other than Ge—Si, and such detectors may offer suitable performance for some embodiments of electron-beam amplifier 10. For example, all of Ge, Si and diamond are indirect bandgap semiconductors; in each, the cascade ionization energy is approximately ⅓ of the bandgap. Materials with direct, small bandgaps may have lower ionization energies. For example, Indium Arsenide (InAs) has a direct bandgap of 0.35 eV. Indium Antimonide (InSb) has a direct bandgap of 0.17 eV. These bandgaps compare with 0.66 eV for Ge and 1.12 eV for silicon. Either of these materials from groups III and V of the periodic table (the "III-V" group), or a ternary compound (such as for example In $As_{1-x}Sb_x$) may have a cascade ionization energy of 1 eV or less, and provide a cascade gain of three times or more the cascade gain of Ge.

III-V materials have a zincblende crystal structure; epitaxial growth of this structure on a diamond lattice of silicon may be problematic or impossible. In order to overcome this difficulty, InAs or InSb layers could instead be mated with another III-V avalanche layer, such as Indium Phosphide (InP).

For example, one drawback of a Ge—Si detector 150 is that its breakdown voltage is limited by a Si layer thickness (e.g., thickness $t_2$ of FIG. 4). A diode with low breakdown voltage may limit output power since the diode cannot sustain a large reverse voltage; a Ge—Si detector that is a few hundred angstroms thick will be limited to an operating voltage of 2-3 volts. However, with an InP layer, an operating voltage of 6V or more may be possible while enabling the same detector response. This is partly because of high electron mobility in InP (about 4 times higher than in silicon) and partly because InP supports high saturated carrier velocity (almost 2.5 times higher than in Si), permitting a thicker avalanche region to be used while maintaining a given transit time. InP also has an inherently higher dielectric strength, so a thicker layer is required to achieve the same avalanche gain. Therefore, a useful embodiment of detector 150 may have an InAs/InP Schottky diode, or utilize other combinations of III-V materials that achieve high cascade and avalanche gain.

Detector Beam Contact

For electrons to penetrate a beam contact of a detector (e.g., beam contact 220 of detector 150) and enter an underlying semiconductor (i.e., Ge cascade gain layer 230, or another material), the contact metal must usually be thin. At beam energies of 100 eV to 300 eV, beam contact layer 220 may be around 10 angstroms, or thinner. However, a thin contact layer may have a high sheet resistance, for example about 10 ohms per square of metal. Contact layer 220 may conduct all of the detector current, which may be 100 mA or more, and an ohmic voltage drop across contact layer 220 may substantially de-bias a low-voltage detector 150. Such de-biasing may have consequences such as loss of detector gain, slower response, and signal distortion.

Figure 5A:
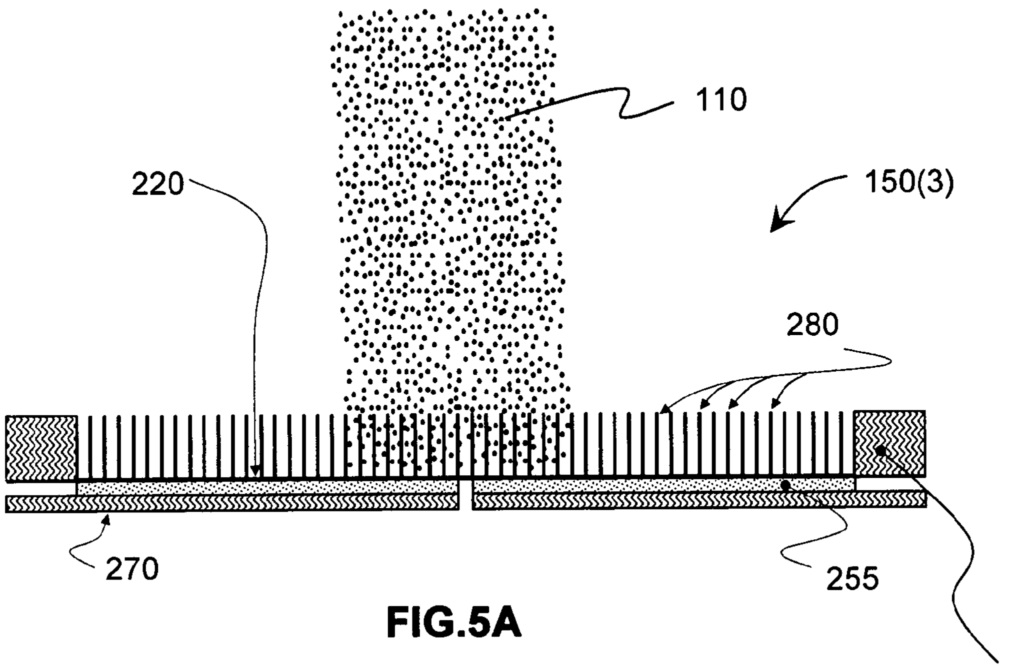
FIG. 5A and FIG. 5B show a schematic midsection of one embodiment of an electron beam detector with a low resistance electrode.
Figure 5B:
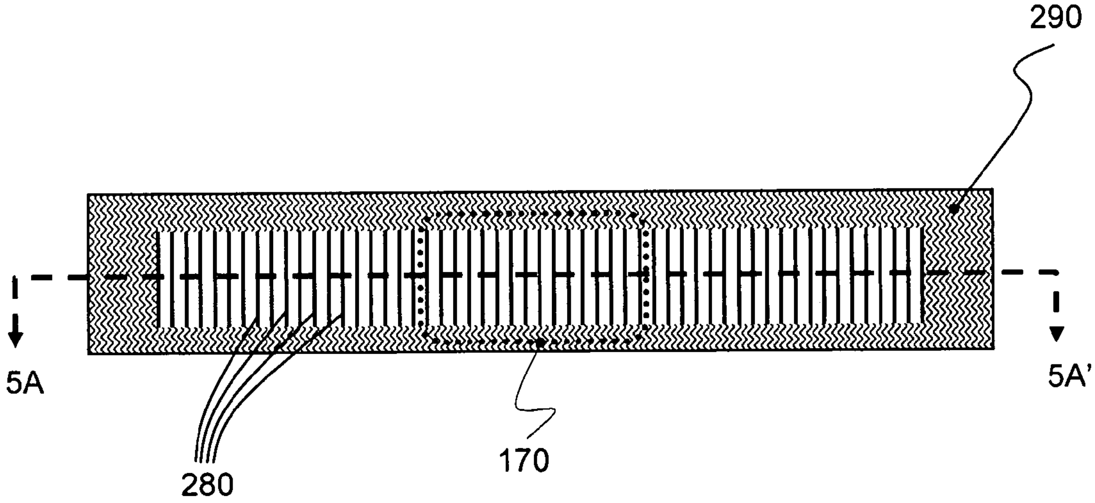

FIG. 5A and FIG. 5B show a schematic cross section of one e-beam detector 150(3) with a low resistance electrode 290. Detector 150(3) has gridded beam conductors 280(only exemplary conductors 280 are labeled, for clarity of illustration) that are much thicker than beam contact 220, and connect with low resistance electrode 290 at each end. By fabricating gridded beam conductors 280 on top of beam contact 220, most electrons of beam 110 will still pass between conductors 280, and impinge upon and pass through beam contact 220. Conductors 280 ensure low electrical resistance between external connections (not shown) and all portions of beam contact 220, thus mitigating ohmic drops and power losses.

Figure 6A:
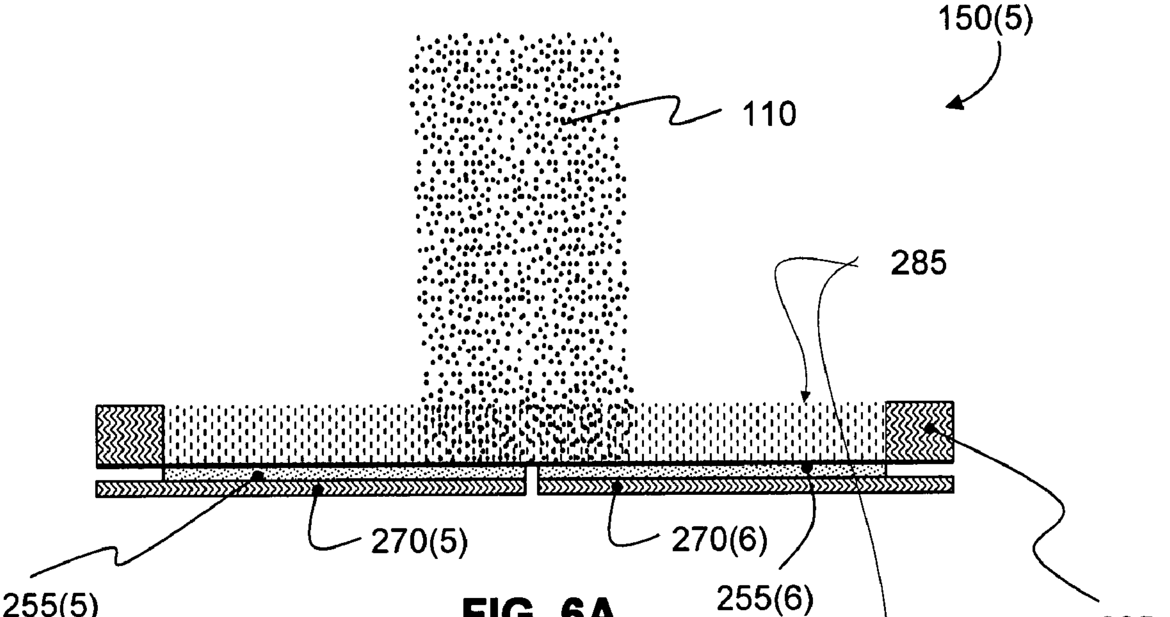
FIG. 6A and FIG. 6B show a schematic midsection of another embodiment of an electron beam detector with a low resistance electrode.
Figure 6B:
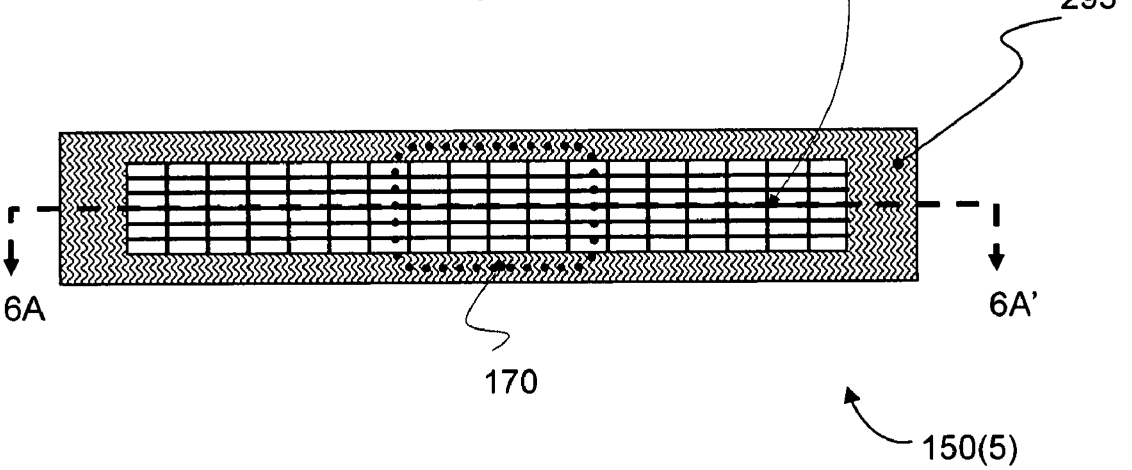

FIG. 6A and FIG. 6B show a schematic cross section of another e-beam detector 150(5) with a low resistance electrode 295. In detector 150(5), a rectangular grid of beam conductors 285 overlies beam contact 220, connecting beam contact 220 to low resistance electrode 295 from all sides.

A width of each of beam conductors 280 and 285 may be much less than a space between adjacent beam conductors. For example, if a space between beam conductors is 1 um, the beam conductors' width may be less than 0.1 um. Thus, in each of detectors 150(3), 150(4), 150(5) and 150(6), the proportion of area that beam 110 cannot penetrate the thick beam conductors may be less than 10%.

Amplifier Gain

An overall electron-beam amplifier gain depends on deflection and detection gain and an output coupling impedance. Beam deflector, drift cavity and detector geometries can generally be chosen to (1) provide a given level of gain and frequency response, and (2) achieve 100% differential beam collection at a maximum deflector input voltage. That is, in the example of FIG. 1, a maximum positive deflector input voltage will direct 100% of the beam current into detector segment 150(1) and zero beam current into segment 150(2); a maximum negative deflector input voltage will direct zero beam current into segment 150(1) and 100% beam current into segment 150(2). A differential transconductance gain $g_m$ of electron-beam amplifier 10 is a ratio of a maximum output current swing $2I_{BEAM}$ to a maximum input voltage $V_{MAX}$, multiplied by a detector gain $K_{DET}$, or $$g_m = 2\frac{I_{BEAM}}{V_{MAX}}K_{DET} \tag{1.1}$$

The factor of 2 reflects the fact that the signaling is differential. For example, when a beam current is 100 μA, a maximum peak deflector voltage drive is 1V and a detector gain is 1000, the differential transconductance gain is 100 mA/volt.

When output network 190 has a differential impedance $Z_0$=100 ohms, the amplifier voltage gain $G_v=g_m Z_0$ equals 10.

A power gain $G_P$ is given by a ratio of an AC input power, $V_{IN}^2/2R_{IN}$, to an AC output power, $$V_{OUT}^2/2R_{OUT} = (G_V V_{IN})^2/2R_{OUT}: \tag{1.2}$$

$$G_P = \frac{R_{IN}}{R_{OUT}}\left(\frac{V_{OUT}}{V_{IN}}\right)^2 = \frac{R_{IN}}{R_{OUT}}G_V^2 \tag{1.3}$$

where $R_{IN}$ is an input impedance and $R_{OUT}$ is an output impedance. With equal input and output impedances (e.g., 50 ohms), power gain $G_P$ may be 20 db or more. For larger input impedances, the power gain will be larger. For instance, for an input impedance of 1 kohm, a differential output impedance of 100 ohm and a voltage gain of 10, $G_P$ is 1000, or 60 db. High frequency systems typically do not utilize high input source impedances, but specialized systems may.

Other Detector Shapes and Beam Spots

Figure 7A:
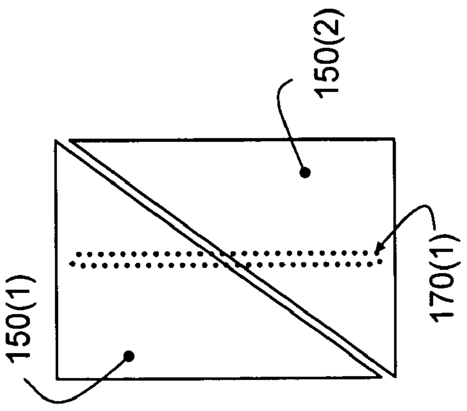
FIG. 7A through FIG. 7G show several geometric embodiments of detector segments and electron beam spots.
Figure 7B:
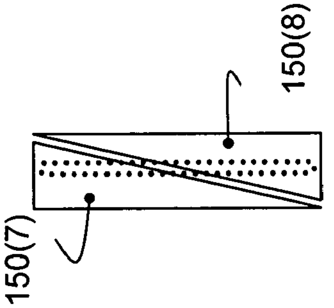

FIG. 7A through FIG. 7B show various geometric embodiments of detector segments 150 and beam spots 170 that are drawn approximately to scale with one another for purposes of comparison. Diagonally segmented detectors 150(1), 150 (2) and sheet beam spot 170(1) of FIG. 7A (and FIG. 1) illustrate a first embodiment that is characterized by very linear amplifier response, simple spot creation, and conceptual simplicity for purposes of illustration. The embodiment of FIG. 7A is also characterized by a large detector, slow response, and low gain. The low gain stems from a large beam deflection angle required for full scale detector output, and a low beam current of a sheet beam. The gain can be increased by decreasing detector segment width, as shown in detector segments 150(7) and 150(8) of FIG. 7B, but with some sacrifice in linearity, and the detector is still large.

High Speed Detector

Figure 7C:
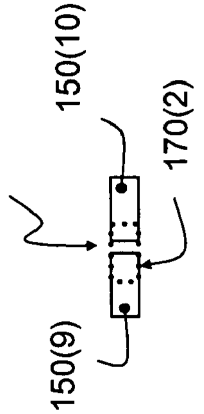

FIG. 7C shows detector segments 150(9) and 150(10) separated by a vertical slot 160(2). The detector embodiment of FIG. 7C has a rectangular beam spot 170(2), and has a smaller size, a faster response and a higher beam current than the embodiments of FIG. 7A and FIG. 7B. Unlike a detector made of triangular segments and excited by a line spot, the detector embodiment of FIG. 7C has a much smaller detector, only about twice as large as beam spot 170(2). Detector segments 150(9) and 150(10) have lower parasitic junction capacitance and contact resistance than detector segments 150(1), 150(2), 150(7) and 150(8), and thus may support operation at higher frequencies.

Beam spot 170(2) permits high beam current by dispersing beam charge over an area, rather than a line. Detector segments 150(9) and 150(10) are small, with a height of segments 150(9) and 150(10) matching the height of beam spot 170(2), resulting in lower parasitic capacitance and wider bandwidth into an output impedance. Vertical slot 160(2) enables linear differential beam collection, with some sacrifice of linearity because of the small dimensions.

Figures 8A, 8B:
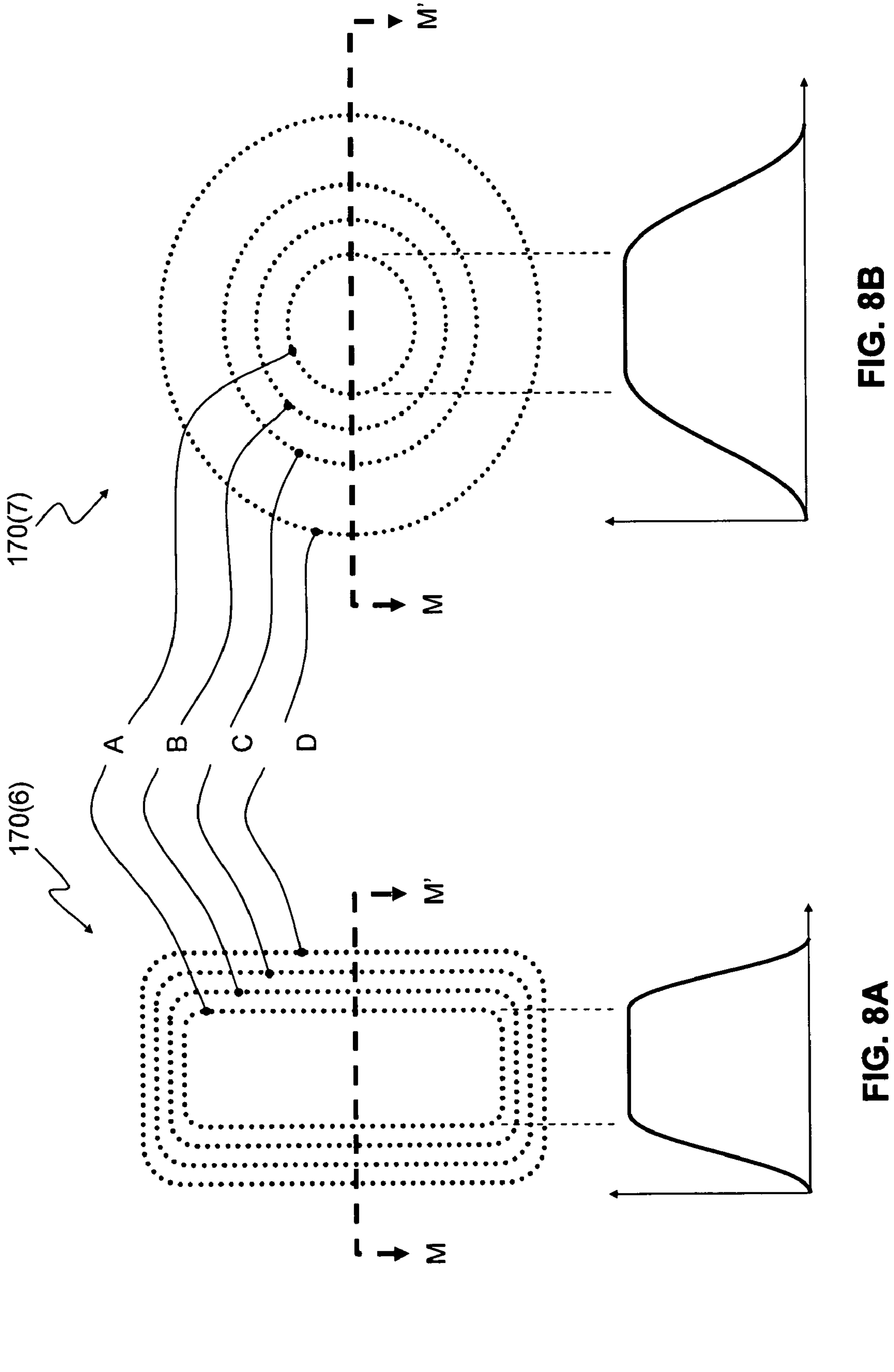
FIG. 8 shows variation in beam current density in two electron beam spots.

In a preferred embodiment, a height of a beam spot is slightly greater than a height of corresponding detector segments, placing current density variation substantially outside the detector segments. FIG. 8A and FIG. 8B show exemplary variation in beam current density in a rectangular e-beam 170(6) and a circular beam 170(7). Contour lines A, B, C and D of each of beams 170(6) and 170(7) represent regions of greatest to least current density, respectively; in particular, each contour line A encloses a region of maximum current density. Graphs below electron beams 170(6) and 170(7) show the beam current density as a function of position across each e-beam at a midpoint that is indicated by dashed lines M-M' on each e-beam. Beam spots 170 (i.e., including beam spot 170(1), 170(2) and so on) shown in the accompanying drawings other than FIG. 8A and FIG. 8B correspond to maximum current density contour line A of FIG. 8A and FIG. 8B, and do not show variations in beam current density which may occur around edges of each beam spot.

When a beam spot 170 is larger than a corresponding detector segment 150, most of a beam current density variation may fall outside detector segment 150, where it has no effect. Thus, the region of the most uniform spot current density (i.e., an interior of a beam spot 170) sweeps across a vertical slot 160, enabling high linearity of differential beam collection. Any portion of an beam spot 170 that falls outside a detector segment 150 is collected by a passive metallic anode and returned to ground.

Figure 7D:
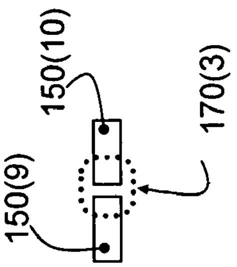

The linearity of the detector of FIG. 7C depends strongly on a uniform beam current density. FIG. 7D shows a version that is more linear in the presence of beam current density variation. Beam spot 170(3) is made somewhat larger than detector segments 150(9) and 150(10) so that beam current density variations fall outside the detector segments. This configuration incurs some loss of beam current and amplifier gain due to the portion of beam current that falls outside detector segments 150(9) and 150(10).

Figure 7E:
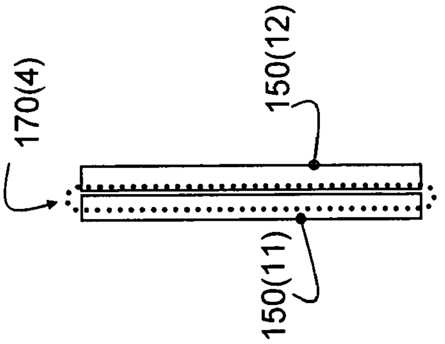

FIG. 7E shows a version that has both high speed and higher power. Detector segments 150(11) and 150(12) are stretched in height, and beam spot 170(4) is increased in area, so that more beam current can be delivered without incurring focusing distortions from space charge spreading, as explained below.

Unipolar Detector

Figure 7F:
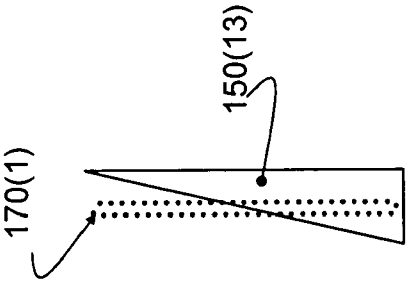
Figure 7G:
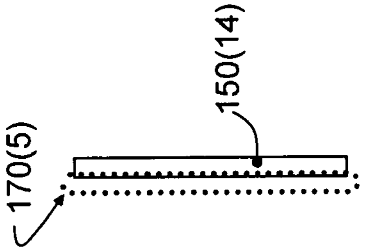

In certain embodiments, a unipolar detector for driving only one output load may be preferred. Two versions are shown in FIG. 7F and FIG. 7G. Unipolar detectors 150(13) and 150(14) have only one of the two segments of the previously described differential detectors (e.g., FIG. 7A through FIG. 7E). The area surrounding detector segments 150(13) and 150(14) are ground or power planes (not shown), and a slot (not shown) exists between this ground plane and the detector segment. The unipolar detector configuration may drive a single output load, such as the unbalanced port of a balun.

Many detector configurations are possible for optimizing electron-beam amplifier operation and performance. Certain configurations will be described in the embodiments that follow, but others will be evident to those skilled in the art, as depending on the basic elements of a shaped e-beam spot and a high-gain detector consisting of one or more segments that are shaped.

Linearity Requirements

One attribute of many amplifiers is linearity of amplification. The linearity of RF amplifiers is characterized by a quantity known as a third order input intercept point ("IIP3") that characterizes an input referred power of distortion products (i.e., an output distortion power divided by amplifier gain) in relation to an input signal power. IIP3 measures the most significant distortion product, a third harmonic, referred to an input of an amplifier. Fully differential operation of certain systems may eliminate the second and other even harmonics, or at least reduce them well below the third harmonic; thus the third harmonic is a useful measure of total non-linearity, including $5^{th}$, $7^{th}$, and higher orders, as well as intermodulation products.

IIP3 describes the concept that a ratio of third harmonic output power to signal output power may increase in direct proportion to a first harmonic input signal power (this ratio is the same when referred to the input). That is, small input signals may generate small distortion products, since the non-linearities present in an amplifier are less significant for the small input signals, while large input signals may generate proportionately larger distortion products. The output of an amplifier operating with large signals may "clip" peaks in an output waveform (i.e., the peaks of amplified signals may not achieve appropriate values, because such values would exceed the maximum voltages available). Generally, for a 3 dB increase in small-signal output power, third harmonic output power increases by 9 dB. Even if the third harmonic output power is much smaller than a linear output power under small-signal conditions, if the input increases sufficiently, the third harmonic output power may equal and even exceed it. The point where input signal power and the third harmonic output power are equal is called the third order intercept point. IIP3 is usually an extrapolated figure of merit since linear output power cannot usually reach this level of power because of gain compression (i.e., where amplifier gain starts to diminish at high signal levels).

Figure 9:
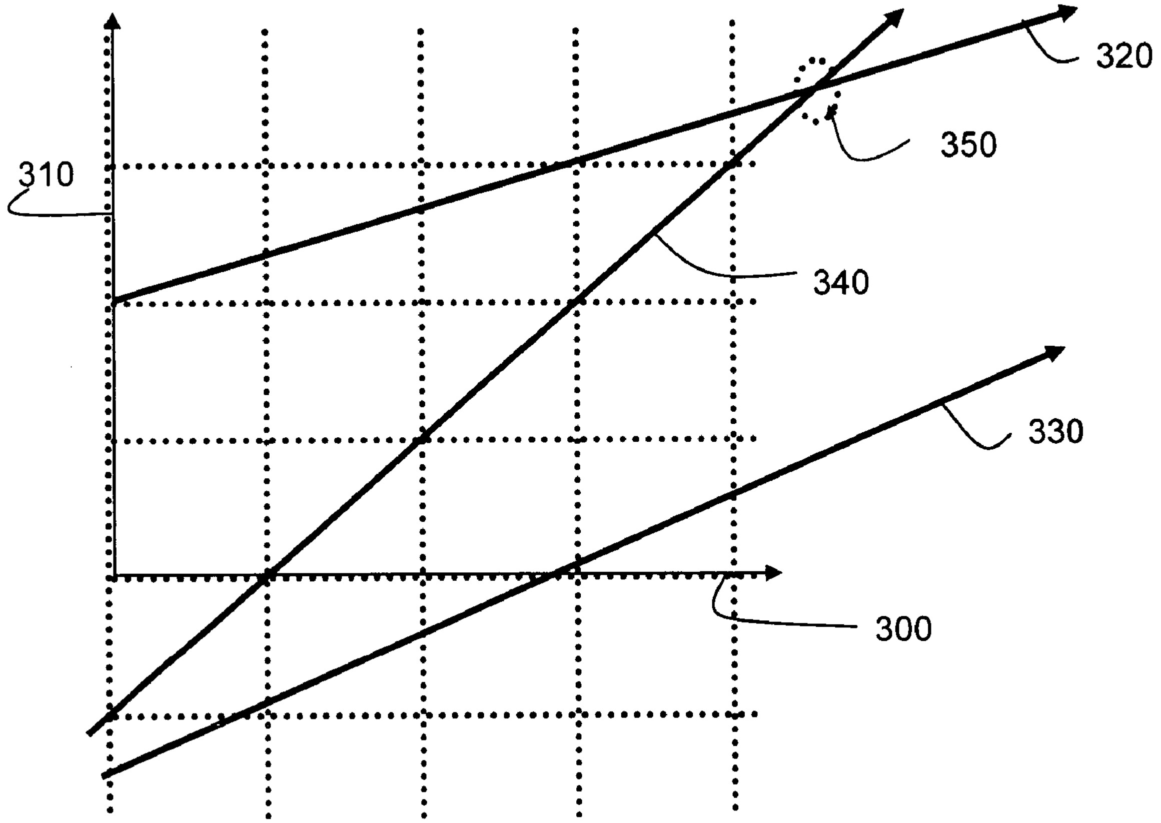
FIG. 9 illustrates relationships among the fundamental output power, second harmonic output power, and third harmonic output power for an exemplary amplifier.

FIG. 9 illustrates relationships among the fundamental output power, second harmonic output power, and third harmonic output power for an exemplary amplifier. Horizontal axis 300 is an input power axis and vertical axis 310 is an output power axis; both are logarithmically scaled. Curve 320 shows input referred output power at a fundamental (i.e., the input) harmonic (i.e., at an input frequency when the input is a single frequency tone); curve 330 shows input referred output power at the second harmonic; curve 340 shows input referred output power at the third harmonic. An intercept of curve 320 and curve 340 is IIP3.

IIP3 is a valid figure of merit for many amplifiers in a restricted range of actual operation. Higher IIP3 implies better amplifier performance in rejecting distortion, even if an amplifier cannot operate at an input signal level indicated by an IIP3 specification. A well-made low noise amplifier ("LNAs") may achieve an IIP3 of +5 dbm. That is, 3 mW input signal power will generate 3 mW of distortion (referred back to the input). Certain amplifiers may achieve an IIP3 of +20 dbm or +40 dbm, but these performance figures may not be achieved at frequencies that exceed a few hundred MHz. Generally, the higher an operating frequency and the wider an operating bandwidth, the more difficult it is to achieve a high IIP3.

Electron-beam amplifier 10 may achieve an IIP3 as high or higher than typical solid-state amplifier, such as +40 dbm or better, at frequencies of many GHz, and potentially up to K band (40 GHz) or higher. This may be shown by considering an input-referred effect of third harmonic distortion as described by a transfer function of the form $y=x+a_3x^3$:

$$V_{in}=V_1+a_3V_1^3=V_1(1+a_3 2Z_0P_1) \tag{1.4}$$

where $V_{in}$ is an input voltage, $V_1$ is an input deflection voltage corresponding to a maximum beam deflection (e.g., a peak sinusoidal input cos(ωt)), $a_3$ is a third harmonic distortion coefficient, $Z_0$ is an input impedance, and $P_1$ is an extrapolated input power. At a very high IIP3 of +50 dbm, $P_1$ is 100 W from a 50 ohm source $Z_0$. At an IIP3 intercept point, third harmonic power is the same as input power, so solving the above equation, the third harmonic distortion coefficient is $$a_3 = \frac{1}{2Z_0 \cdot IIP3\ (\text{watts})} = 1\times10^{-4}, \tag{1.5}$$

or 0.01%. This harmonic distortion coefficient is of the same order of magnitude as the manufacturing tolerances that may be achieved in a microfabricated embodiment of the electron-beam amplifier (for example, the reproducibility that may be achieved in the beam spot and the detector and slot geometries). For example, a detector of 10 um width may be made with segment tolerances of about 1 nm, about 10,000 times smaller than the width. Given the wide bandwidth of the electron-beam amplifier, it is possible to achieve high IIP3, and by the wideband nature of the amplifier, can achieve such high IIP3 at extremely high frequencies.

Distortion Compensation

Solid-state amplifiers have little flexibility in eliminating distortion. For example, low distortion requires high bias levels and amplifier bandwidth much wider than a signal bandwidth; reducing output signal level as a fraction of total bias level, in turn reducing the range and effect of non-linearities. The high bias levels lead to excessive power consumption in exchange for minor linearity improvement.

Non-linearity of electron-beam amplifier 10 is primarily related to non-ideal deflector apparatus 130, a shape and a current density of beam spot 170 and a shape of detector segment(s) 150. The most difficult linearity parameters to control are deflector apparatus 130 and beam current density. Though deflector apparatus 130 inherently has a linear response, fringing fields are unavoidable and difficult to compensate in a compact electron-beam amplifier 10. Beam current density is also difficult to control because of space-charge spreading effects and variations in currents among individual e-beams 120.

High linearity in electron-beam amplifier 10 can be achieved by optimizing the geometry of apparatus 130 and regulating beam currents of individual e-beams 120 with control loops to assure a uniform, controlled beam spot current density. Residual beam spot and deflection distortion can be compensated by appropriately shaping a geometry of beam spot(s) 170, and slot(s) 160 separating detector segment(s) 150.

As discussed above, beam spot 170 is an outline of a cross-sectional current density of e-beam 110 where it impinges upon detector(s) 150. This current density may be non-uniform, and a "spot shape" is simply a contour of some value of current density. For many configurations of electron-beam amplifier 10, it may be convenient to assume that this current density is essentially uniform within the spot, and zero outside. It can be appreciated that simply referring to the "beam spot" may facilitate understanding of the basic principles of electron-beam amplifier 10.

Non-uniform beam spots 170 may occur for many reasons, including imperfect electron gun focusing, thermal agitation of electrons, space charge spreading, imperfect focusing of multiple e-beams 120 into a single beam spot 170, and quantum effects. In electron-beam amplifier 10, the beam spot 170 and detector segments 150 may be shaped to effectively eliminate many distortion effects, substantially extending the linearity and utility of the amplifier.

Slot Deformation Linearity Correction

FIG. 1 shows a simple arrangement of electron-beam amplifier 10(1) for conceptual purposes, with a pair of complementary triangular detector segments 150(1) and 150(2) and a narrow sheet beam 10 that generates a line spot 170. It can be seen that when beam 110 is centered with zero deflection, both of segments 150(1) and 150(2) collect equal amounts of beam current. As beam 110 is displaced left or right, output currents $I_1$ and $I_2$ (180(1) and 180(2) in FIG. 1) change in proportion to the deflection. Ideally, this arrangement generates no distortion at all; for example, as long as line spot 170 is straight and has a uniform current density from top to bottom.

Figure 10:
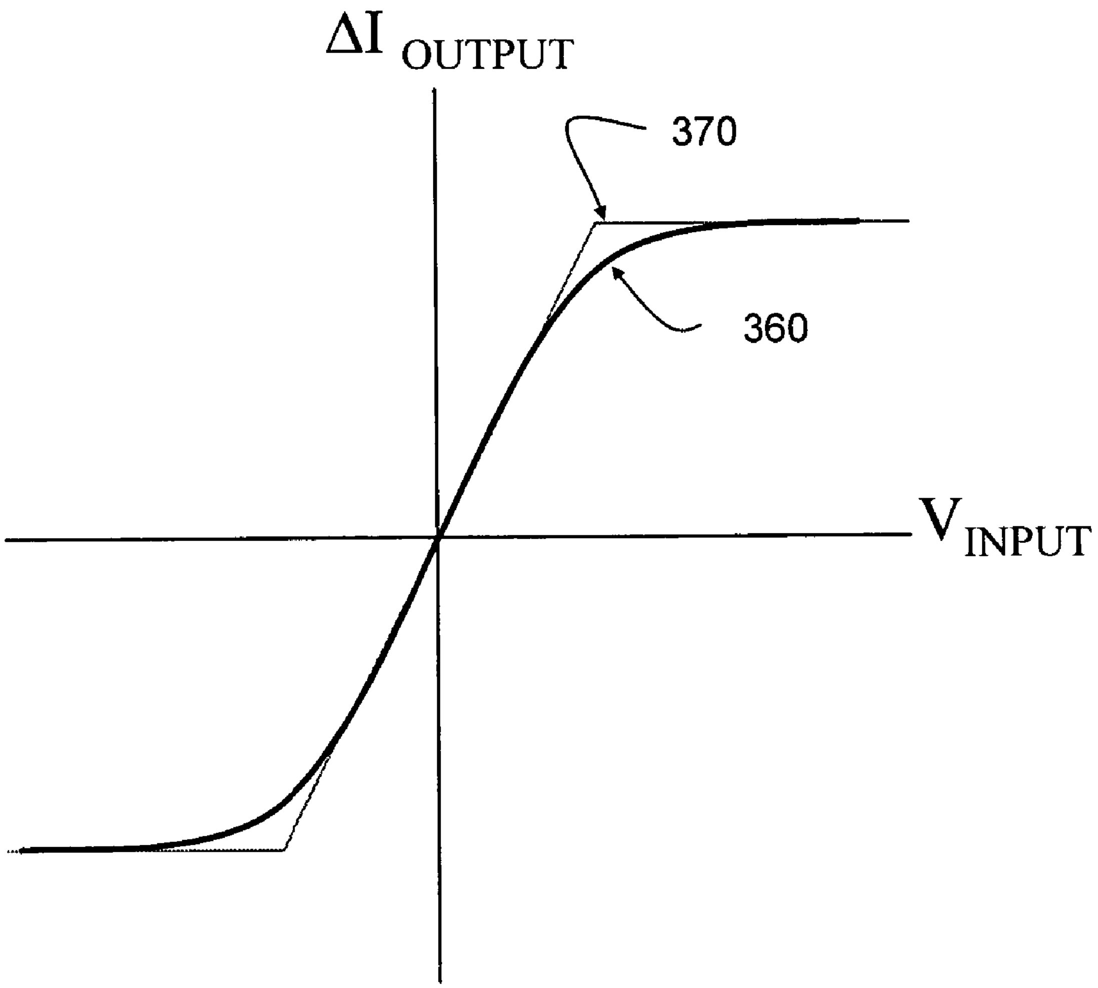
FIG. 10 shows a distorted amplifier transfer curve and a corrected amplifier transfer curve.

FIG. 10 shows a distorted amplifier transfer curve and a corrected amplifier transfer curve. When a shape of beam spot 170 is distorted but is otherwise uniform in current density, a transfer curve of the amplifier may become distorted; curve 360 is an example of a distorted transfer curve.

Figure 11A:
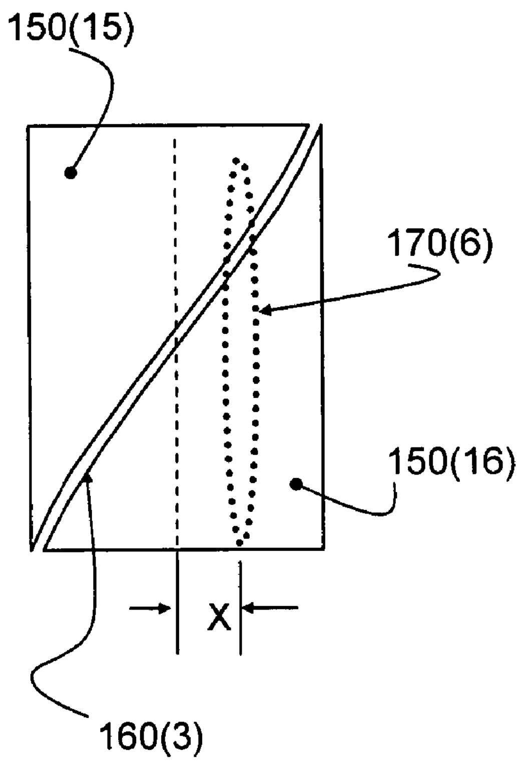
FIG. 11 shows three embodiments of detectors shaped to adjust amplifier transfer function characteristics.
Figure 11B:
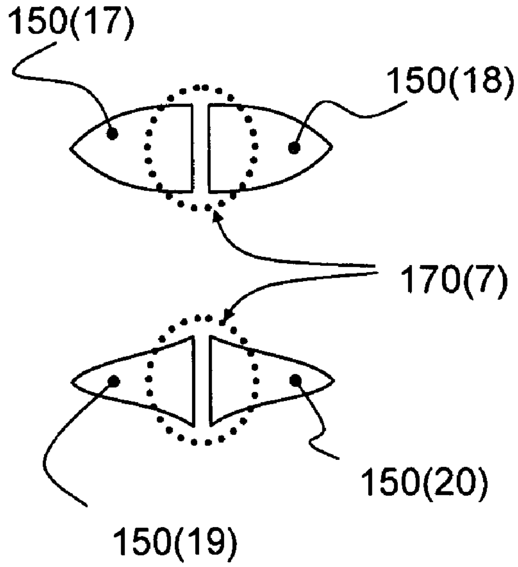

FIG. 11 shows three embodiments of detectors shaped to adjust amplifier transfer function characteristics. Detector segments 150(15) and 150(16), separated by slot 160(3), may compensate for a distorted beam spot 170(6) and a corresponding transfer function distortion illustrated in curve 360 of FIG. 10. Slot 160(3) has a geometry that makes a differential increase in collected current constant as a function of spot displacement X; that is, slot 160(3) keeps $d(\Delta I_{OUTPUT})/dX$ constant until the maximum value of $\Delta I_{OUTPUT}$ is reached.

Curve 370 in FIG. 10 shows an amplifier transfer curve that may be generated by the use of detector segments 150(1-5) and 150(16).

The principle of slot deformation can extend to other shapes of beam spots 170 and detector geometries 150. For example, in some configurations it may be convenient to utilize a circular spot shape rather than a line spot; others might employ a triangular shape. Other embodiments may unavoidably have beam spots 170 with non-uniform current density.

Detector Shaping Linearity Correction

Because slot 160(2) between high speed detector segments 150(9) and 150(10) of FIG. 7C is always covered by beam spot 170(2), it cannot be deformed to correct for a non-linearities caused by beam spot current density variation or an imperfect rectangular spot shape. Instead, distortion may be corrected by shaping the geometry of the detector without altering the spot. This is illustrated in detector segments 150(17), 150(18), 150(19), and 150(20) of FIG. 11. A shape of beam spot 170(7), of course, may also be altered, but precise distortion correction is generally more easily achieved by shaping detector segments 150. When a beam spot 170 is larger than corresponding detector segments 150, a proportion of beam current collected by the detector segments and collected by a surrounding ground plane changes as the spot is swept. Thus, with appropriate shaping, a linearity of differential collection can be improved.

Beam Centering

Proper operation of electron-beam amplifier 10 requires centering of e-beam 110 on detector segments 150, since a displacement of the beam with respect to a center position generates an amplifier output signal. Because of manufacturing tolerances in mechanical construction of the amplifier (including for example tolerances in geometries within beam deflection apparatus 130(1), and in axial alignment of deflection apparatus 130(1) to detector segments 150) the beam may be displaced from the center position when the voltage signal 140 is zero. For this reason, a feedback amplifier may be incorporated to center e-beam 110 through use of an offset control loop.

Figure 12A:
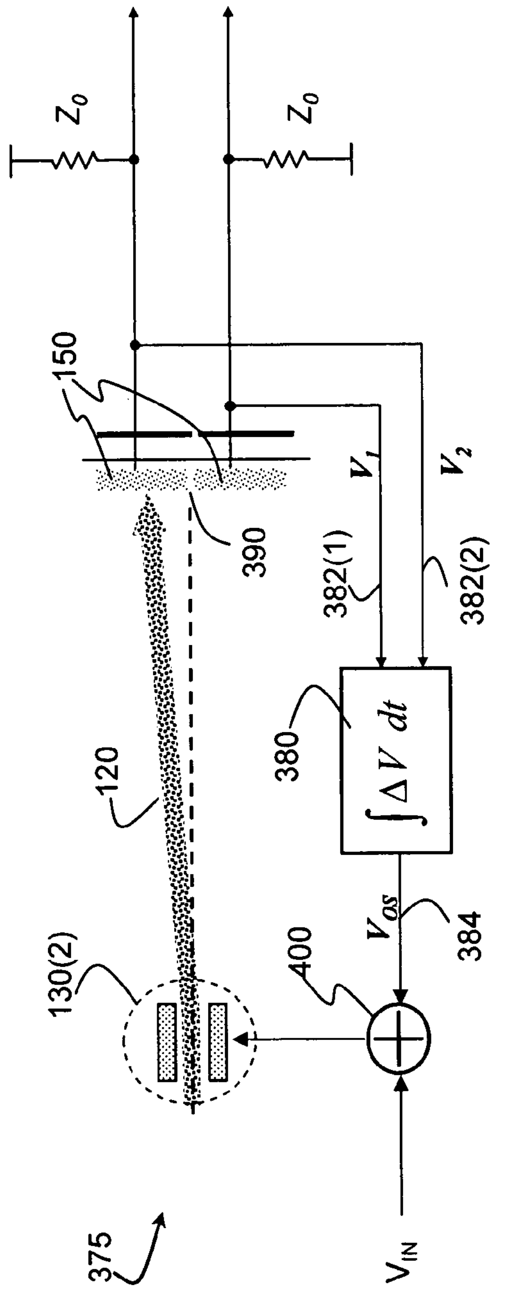
FIG. 12 shows two embodiments of a beam offset control loop.
Figure 12B:
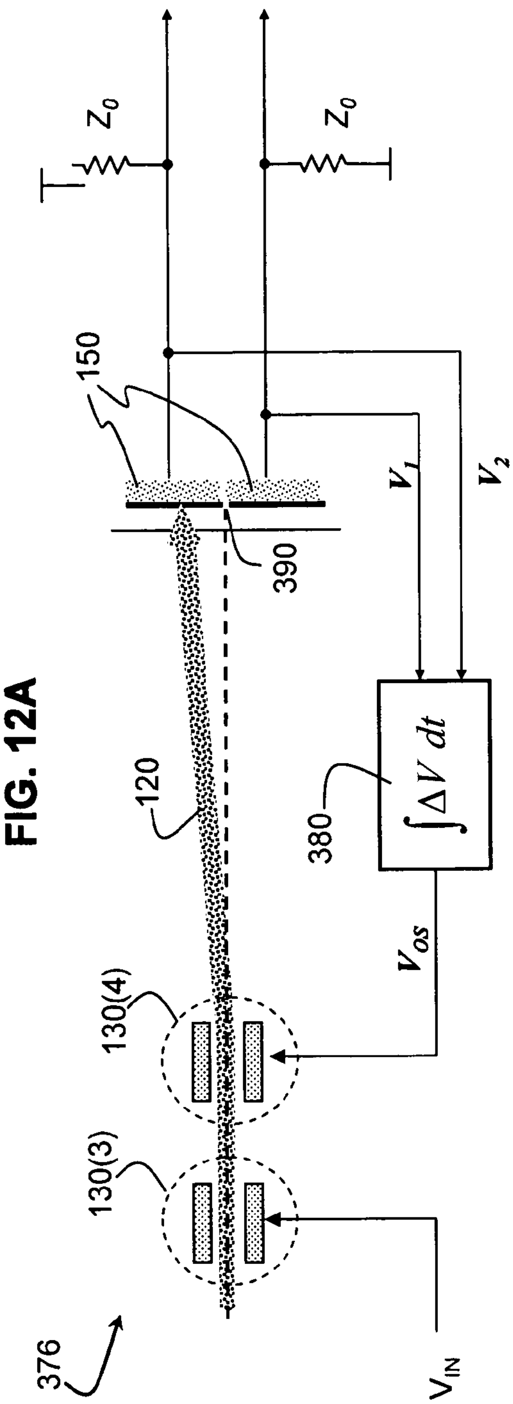

FIG. 12A and FIG. 12B show two embodiments of a beam offset control loop. FIG. 12A shows a beam offset control loop 375 with an integrator 380 coupled to receive a differential detector output 382 (1) and 382 (2), and coupling (as explained below) from an integrator output 384 to a deflection apparatus 130(2). Deflection apparatus 130(2) can be a distributed structure, but FIG. 12B shows a single deflection apparatus for purposes of illustration.

In beam offset control loop 375, a differential voltage $\Delta V$ develops when currents from detector segments 150 are applied to a load. Integrator 380 filters and amplifies $\Delta V$ over time to generate a correction signal $V_{OS}$, which is a measure of a misalignment of beam 120 with respect to a center position 390 between detector segments 150. $V_{OS}$ is applied to deflection apparatus 130(2) as described below. Correction signal $V_{OS}$ acts to restore an average beam position so that it stays centered between detector segments 150. A static gain of electron-beam amplifier 10 may be high enough that a residual offset is negligible.

In beam offset control loop 375, the coupling from integrator output 384 to deflection apparatus 130(2) includes a summing circuit 400. Correction signal $V_{OS}$ is summed with an RF voltage input $V_{IN}$ being amplified, and the sum of these signals is applied to a single deflection apparatus 130(2). In a beam offset control loop 376 shown in FIG. 12B, $V_{IN}$ is applied to one deflection apparatus 130(3) and the correction signal is applied to a separate deflection apparatus 130(4).

Figure 13A:
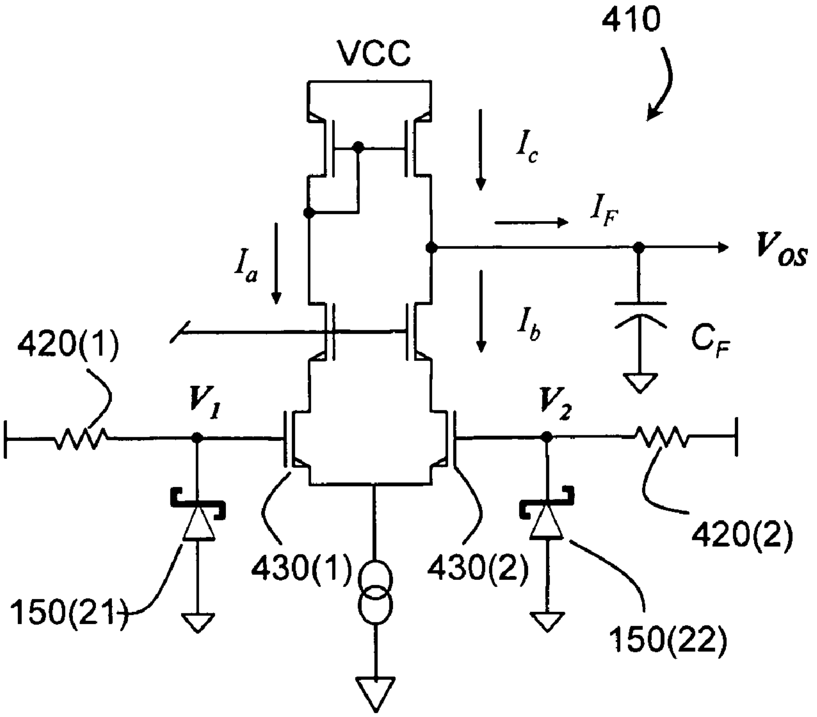
FIG. 13A and FIG. 13B show two circuit embodiments of integrators for beam centering.
Figure 13B:
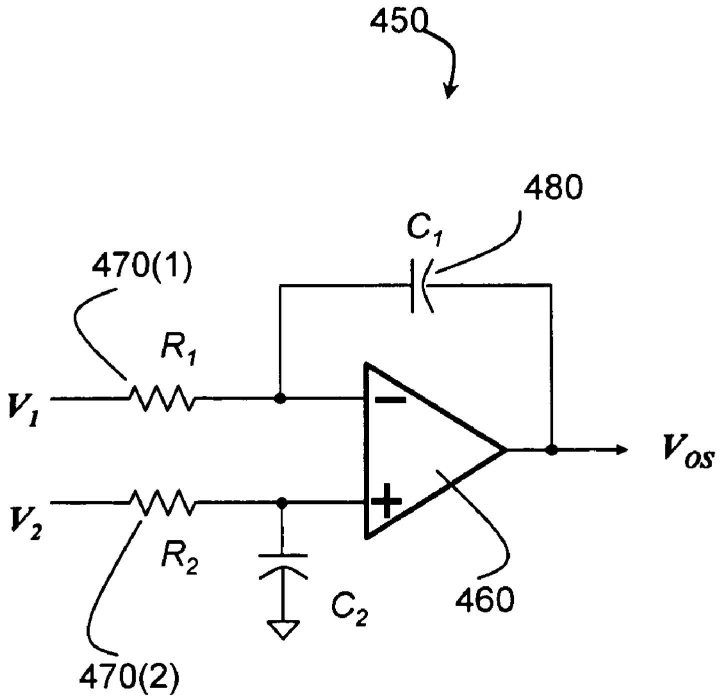

FIG. 13A and FIG. 13B show two circuit embodiments of integrators for beam centering. FIG. 13A shows an integrator embodiment 410 made from transistors in a standard cascaded differential pair with a current mirror load. Detector output voltages $V_1$ and $V_2$ are generated by currents, from detector segments 150(21) and 150(22) that are shown schematically here as diodes, driving output loads 420(1) and 420(2). A voltage difference $V_1-V_2$ corresponds with an instantaneous beam offset. Transistors 430(1) and 430(2) respond to $V_1-V_2$ by generating currents $I_a$ and $I_b$, while rejecting common-mode voltage of $V_1$ and $V_2$. The current mirror copies and reflects $I_a$ to generate $I_c$, which in turn generates filter current $I_F=I_a-I_b$ feeding capacitor $C_F$. When a composite beam (not shown) is offset towards detector segment 150(21), $V_1<V_2$ and $I_F$ causes $V_{OS}$ to increase, forcing the beam away from detector segment 150(21). Conversely, if the beam is offset towards detector segment 150(22), $V_1>V_2$ and $I_F$ causes $V_{OS}$ to decrease, forcing the beam away from detector segment 150(22). A filtering action of $C_F$ makes the circuit of FIG. 13A responsive to the average beam position, and non-responsive to the input signal. High impedance of current sources $I_c$ and $I_b$ into the high DC impedance of the capacitive deflector load generates a high gain response at low frequencies. Thus, an average position of the beam is centered.

FIG. 113B shows another integrator embodiment 450 employing an operational amplifier ("opamp") 460. Again, detector output voltages $V_1$ and $V_2$ are generated by currents from detector segments (not shown) driving output loads 470(1) and 470(2) with values of $R_1$ and $R_2$ respectively. The circuit of FIG. 13B also includes capacitors 480 and 490, with values of $C_1$ and $C_2$ respectively. By utilizing a nodal analysis, the output $V_{OS}$ is seen to respond to the average of $V_1$ and $V_2$ according to $$V_{OS} = \frac{-1}{sR_1C_1}(V_1 - V_2) + \frac{V_2}{1 + sR_2C_2} \tag{1.6}$$

for frequencies $f \gg 1/2\pi R_2C_2$, where s is a Laplace frequency variable equal to $j2\pi f$. At high frequencies, the second term is near zero, and the device acts as an integrator with a time constant $\tau_1=R_1C_1$. At low frequency, the first term still dominates because $$\frac{V_1 - V_2}{sR_1C_1} \gg V_2. \tag{1.7}$$

Thus, integrator 450 has feedback loop characteristics similar to those of integrator 410; both are suitable for beam centering in certain embodiments of electron-beam amplifier 10. In certain other embodiments of electron-beam amplifier 10, it may be advantageous to have dedicated detector segments, called "offset sense segments," for measuring beam offset.

Figure 14B:
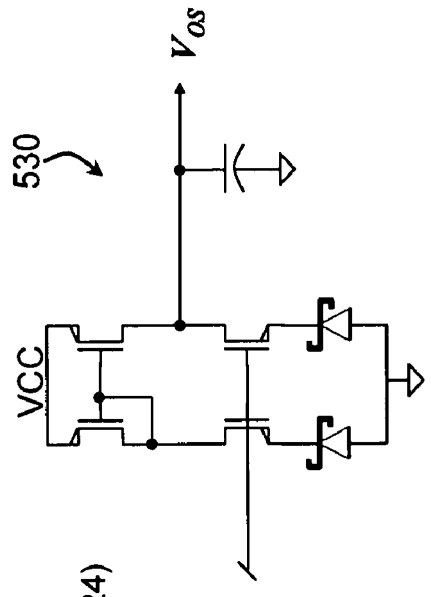
FIG. 14A and FIG. 14B show a beam offset control loop and a circuit embodiment of an integrator for implementing beam offset control using offset sense segments.
Figure 14A:
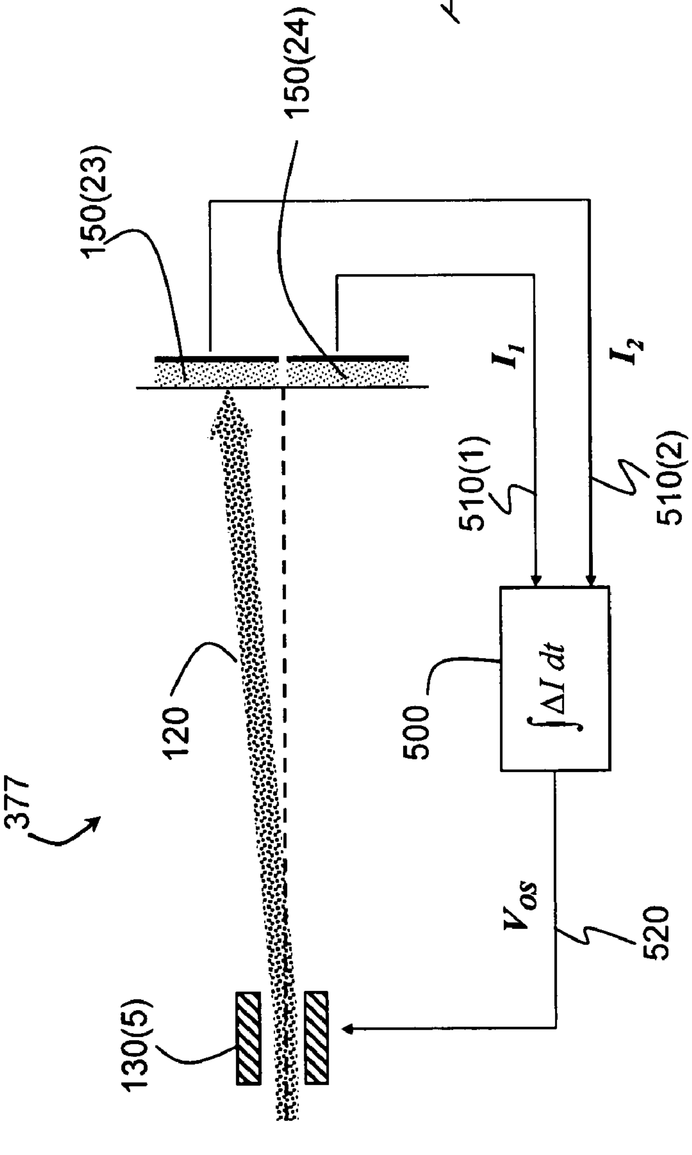

FIG. 14A and FIG. 14B show a control loop configuration, an integrator circuit, and several offset sense segment configurations for implementing beam offset control. FIG. 14A shows a beam offset control loop 377 with construction similar to beam offset control loop 376 of FIG. 12B. A portion of a beam 120 strikes offset sense segments 150(23) and 150(24), generating currents $I_1$ and $I_2$ that are fed into inputs 510(1) and 510(2) of an integrator 500. An output 520 of integrator 500 connects with beam deflection apparatus 130

(5) to apply a correction to beam 120. FIG. 14B shows an integrator 530 which is simpler than integrator 410(i.e., the amplifier need not decouple an input RF signal).

Figure 15A:
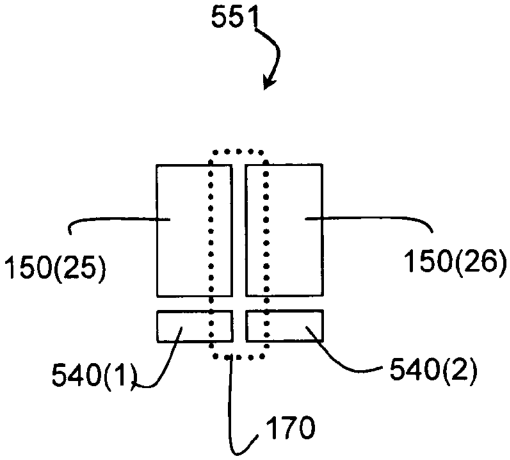
FIG. 15A through FIG. 15D show several offset sense segment configurations.
Figure 15B:
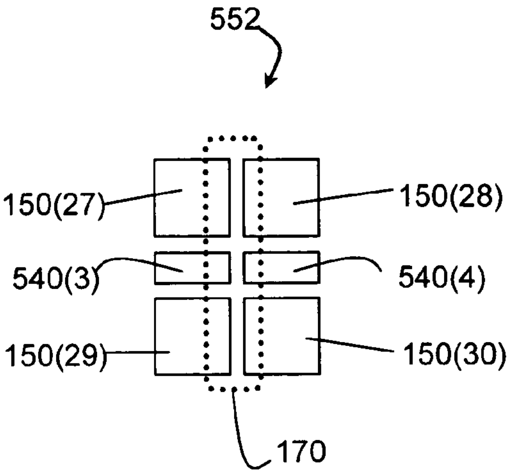
Figure 15C:
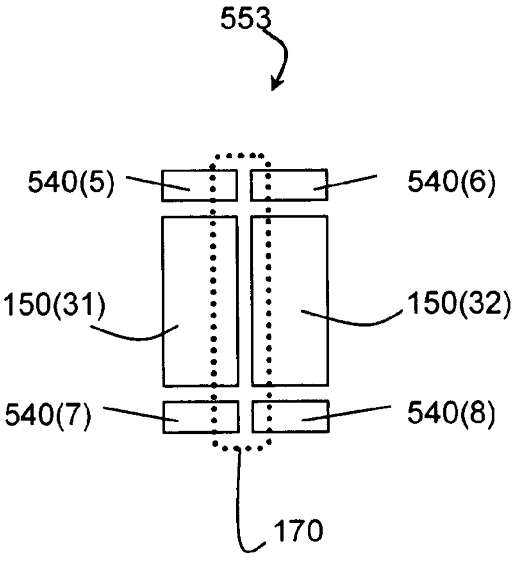
Figure 15D:
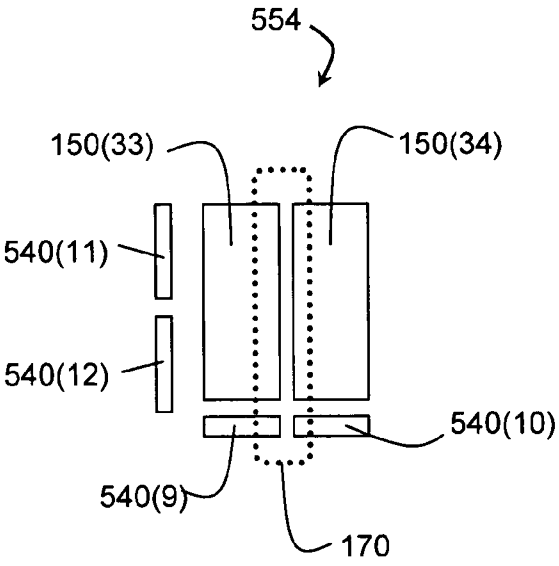

FIG. 15A through FIG. 15D show several offset sense segment configurations. FIG. 1SA shows arrangement 551 which includes detector segments 150(25) and 150(26) with offset sense segments 540(1) and 540(2), a simple arrangement that provides a signal for controlling beam offset in one direction for one pair of detector segments. FIG. 15B shows arrangement 552 which includes detector segments 150(27), 150(28), 150(29) and 150(30) with offset sense segments 540(3) and 540(4); this arrangement supports two pair of detector segments but still provides a signal for controlling beam offset in only one direction. FIG. 1SC shows arrangement 553 which includes detector segments 150(31) and 150 (32) with offset sense segments 540(5), 540(6), 540(7) and 540(8). Arrangement 553 may provide more balanced offset signals if there is current density gradation around the edge of beam spot, and a suitable pair of integrators (not shown) may derive offset control signals in a sweep direction (horizontal in this view) and an orthogonal direction (vertical in this view). FIG. 1 SD shows arrangement 554 which includes detector segments 150(31) and 150(32) with offset sense segments 540(5), 540(6), 540(7) and 540(8). Arrangement 554 may also be used to derive control signals in a two directions, and a pair of integrators corresponding to arrangement 554 may be simpler than the pair of integrators corresponding to arrangement 553, there being a dedicated set of offset sense segments in each axis. However, arrangement 554 requires a larger beam spot to overlap around detector segments 150(33) and 150(34), resulting in lower amplifier gain due to lost beam current; offset sense segments are also more susceptible to current density variations in arrangement 554 than in arrangement 553.

Microminiaturized Fabrication

Electron-beam amplifier 10 may be made with microminiaturized construction using wafer-based semiconductor fabrication technology. Microminiaturized deflectors may be as little as 1 μm long and may produce a frequency response greater than 1 THz. Single electron guns may have a cross-section of a few microns, and entire arrays of hundreds of guns may generate a precise beam with a diameter of 100 μm or less. Electron-beam detectors may be as small as a few microns, with femto-farad parasitic capacitance and THz bandwidth. An entire amplifier may have dimensions of only a few millimeters and thousands of amplifiers may be batch produced simultaneously with low cost, high yield and reliability characteristic of conventional integrated circuits.

Figure 16A:
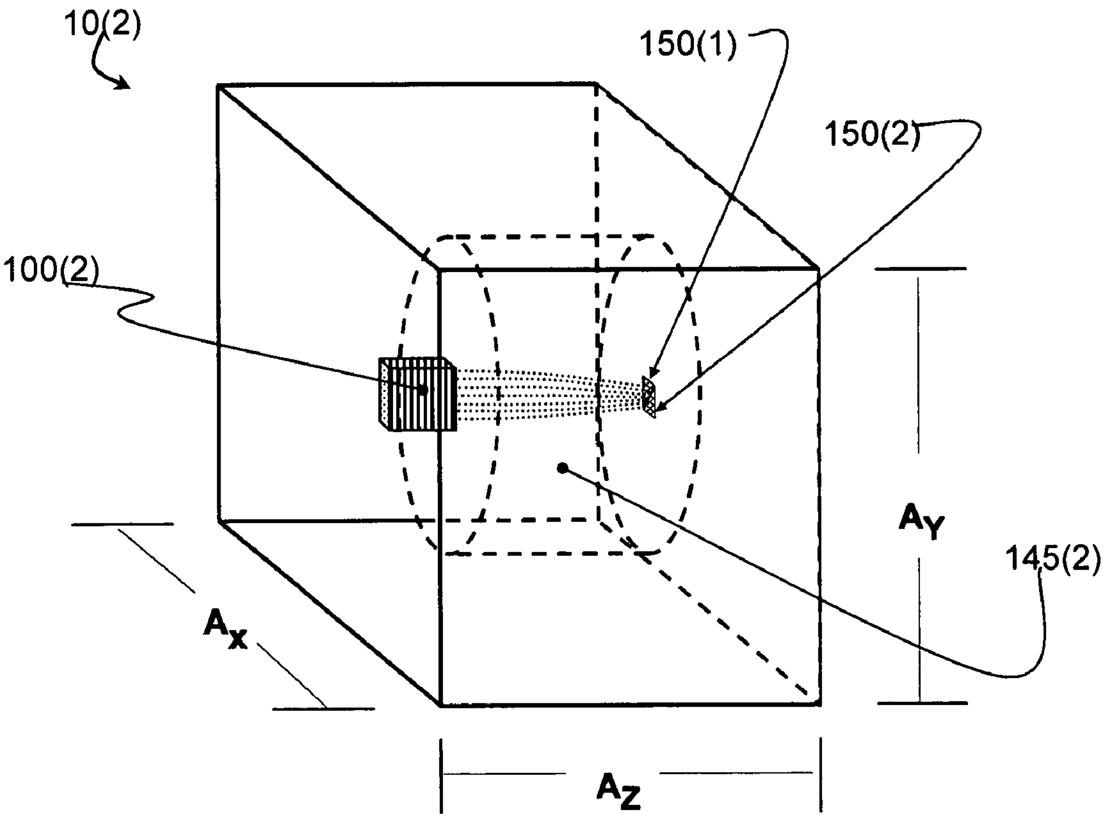
FIG. 16A and FIG. 16B show typical dimensions of a microfabricated electron-beam amplifier.
Figure 16B:
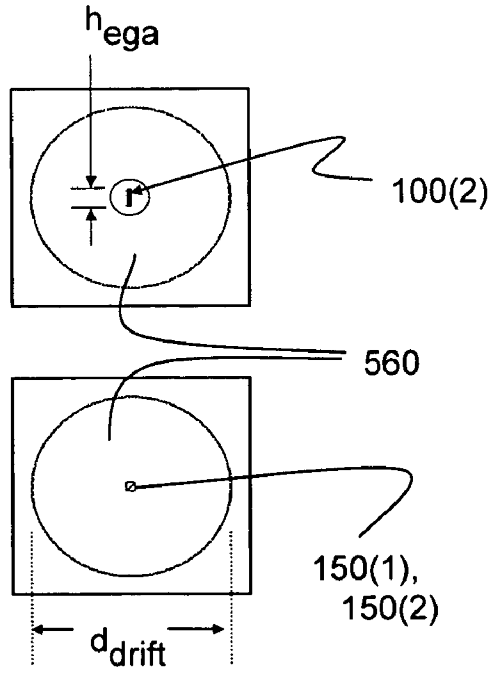

FIG. 16A shows a dimension of one microfabricated electron-beam amplifier 10(2). Outer dimensions of the amplifier $A_X$, $A_Y$, and $A_Z$ may be, for example, 5 mm. FIG. 16B shows another dimension of electron-beam amplifier 10(2). A height $h_{ega}$ of electron gun array 100(2) may be in the range of 50 μm to 200 μm. A diameter $d_{drift}$ of drift cavity 560 may be, for example, 3 mm, and a drift cavity length $z_{drift}$ may be 2 mm.

Manufacturing of a microminiaturized electron-beam amplifier may include fabrication, alignment, and bonding of individual elements such as field emission cathodes, beam focusing electrodes, deflector plates and other components into electron gun assemblies called "microcolumns" or "electron gun microcolumns" herein. Techniques such as photolithography, etching, deposition, implantation, plating, multi-level metallization, wafer bonding, and possibly other methods may be used to assemble components such as microcolumns, drift cavities, detectors, output coupling networks and bias circuitry into a monolithic device.

Entire wafers may be constructed as arrays of amplifiers, for individual use or to work in concert. Silicon wafers are useful substrates for forming certain components because of silicon's low cost and because diverse fabrication techniques are available. For example, field emission cathodes on silicon wafers, including the molybdenum tips called Spindt cathodes disclosed in U.S. Pat. No. 3,665,241, have been especially successful. Wet etching may be employed for large drift cavities, and dry etching methods such as deep reactive ion etching can cut very small, precise, high-aspect ratio features such as the beam contact grid of the detector. Critical holes in electron guns can be fabricated with even more precise focused ion-beam and laser drilling. Multi-level planarized metallization processes using chemical and mechanical polishing ("CMP") may form many of the electrodes, especially those in the microcolumn electron guns. Aluminum, gold, copper, nickel, tungsten and other metals are widely applied with both sputtering, vacuum deposition and plating techniques. Semiconductor devices (for example, bias circuits, output networks and other circuitry for use with electron-beam amplifier 10) may be formed concurrently with other electron-beam amplifier components on a silicon substrate, using similar, compatible techniques.

High aspect ratio etching technologies and waferbonding are characteristic of what is called "micromachining" or micro-electrical mechanical systems ("MEMS") technology. Because of the complex three-dimensional geometries, different elements of the device may be constructed on separate substrates, and these substrates can be assembled into a single unit. Many methods of bonding wafers exist today, such as, for example, eutectic or fusion bonding. Techniques for wafer bonding have also been developed to create vacuum-encapsulated cavities, which are useful for electron beam devices, e.g., as shown in U.S. Pat. No. 5,842,680 issued to Davis and U.S. Pat. No. 6,479,320B1 issued to Gooch. Furthermore, $SiO_2$ gettering materials are compatible with silicon semiconductor processing and have been demonstrated to sustain ultra-high vacuum and enhance cathode lifetime in electron guns, e.g., as shown in U.S. Pat. No. 4,771,214 issued to Takenaka et al.

Space Charge Spreading

A primary reason for limited beam current in any e-beam amplifier is an inherent, electric-field induced repulsion between beam electrons, which forces apart electrons in a focused beam, and is called "space charge spreading". In high current beams, the forces are substantial, and as electrons travel through a drift cavity, these forces can spoil an initial focus that may exist just after a beam exits from an electron gun.

Figure 17:
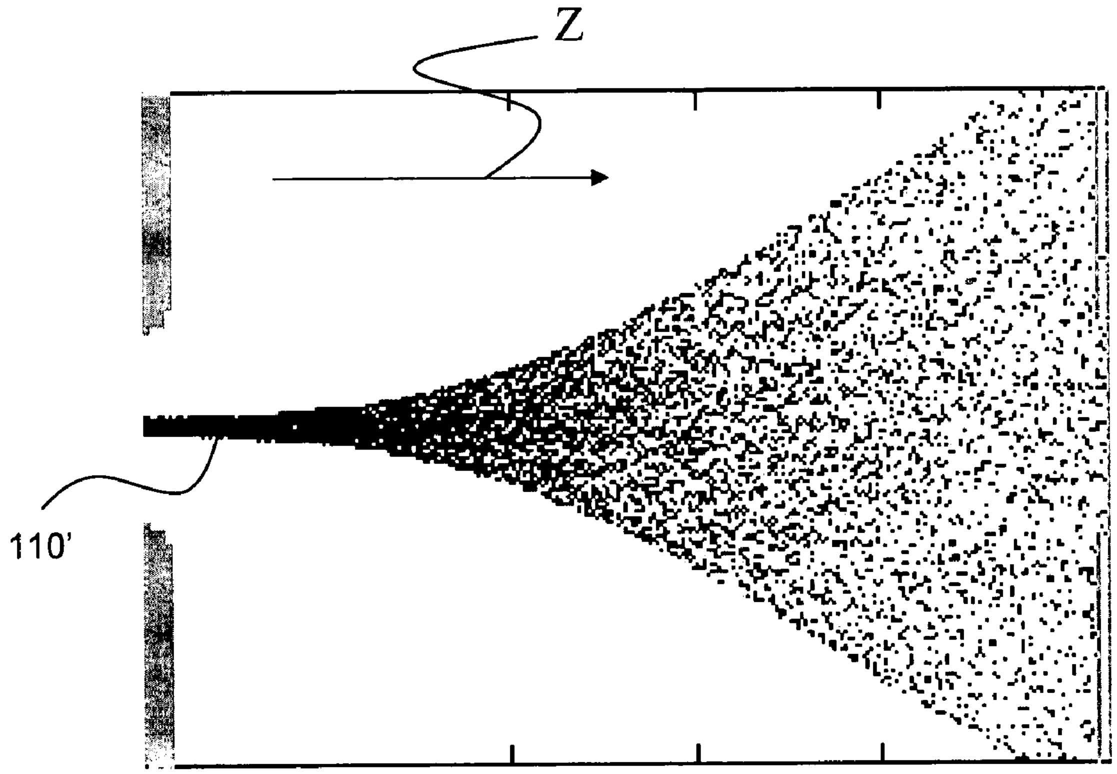
FIG. 17 illustrates a space charge spreading effect in a high current electron beam.

FIG. 17 illustrates a space charge spreading effect in a high current electron beam. Electron-beam 110' traveling in a direction shown by arrow Z spreads as it travels.

Coulomb's Law describes a force between two electrons:

$$F \propto 1/R^2, \tag{1.8}$$

where R is a distance between adjacent electrons. Since, for any two electrons at random positions within a beam, R is proportional to the radius r of the beam, so an average repulsive force between electrons decreases (to first order) quadratically with the total radius of a beam, for the same total beam current. Thus, a beam of 10 um diameter will have 100 times less repulsive force than a beam of 1 um diameter.

Electron Gun Arrays

An embodiment of an electron-beam amplifier minimizes space charge spreading by using a two-dimensional ("2-D") array of electron guns. Like a linear (i.e., one-dimensional) array, a 2-D array of electron guns generates individual electron beams that are emitted as parallel beams from an emission plane (e.g., emission plane 20).

Figure 18:
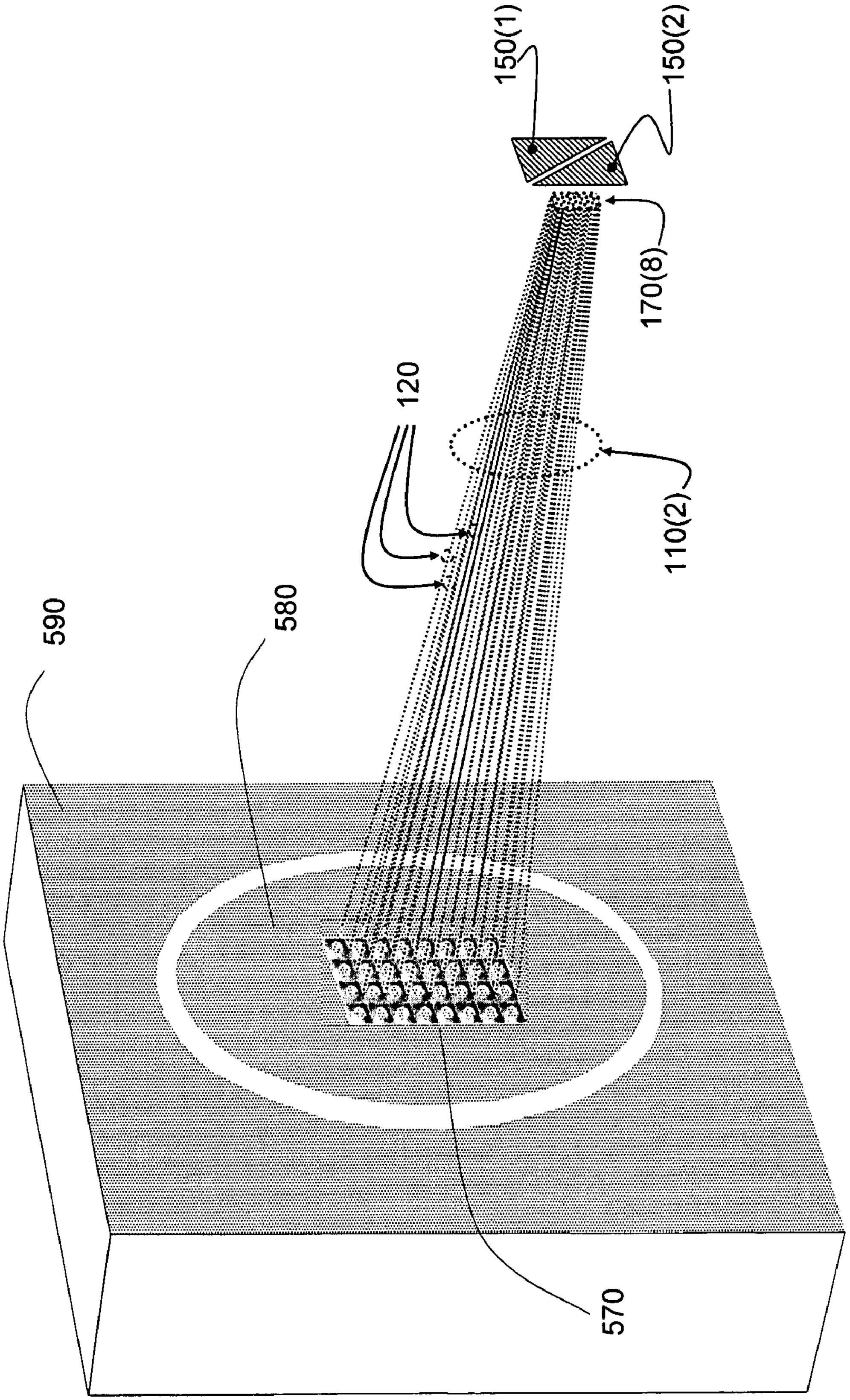
FIG. 18 shows one embodiment of a two-dimensional microcolumn array, and an associated electron beam and detector.

FIG. 18 shows one embodiment of a two-dimensional microcolumn array, and an associated electron beam and detector. Microcolumn array 570 emits e-beam 110(2) towards detectors 150(1) and 150(2). As described below, electron optics consisting of a first electrode 580(1) and a third electrode 590(1) focus composite e-beam 110(2) consisting of individual e-beams 120 to a beam spot 170(8). Each e-beam 120 has a current that is low enough that space charge spreading within the e-beams is negligible over the length $z_{drift}$ of a drift cavity, (e.g., drift cavity 145). The electron gun array spaces the e-beams sufficiently far apart so that the space charge repulsion between adjacent beamlets is also negligible over the length of the drift cavity.

The aggregate sum of the individual e-beams is termed here the composite electron beam. The low Coulomb force interactions within individual e-beams reduces beam spreading in proportion to a cross-sectional area of the beam, permitting higher total beam current for a given amount of spreading force. For example, a linear array of electron guns emitting N e-beams of current I will have approximately the same spreading force as a circular two-dimensional electron gun array emitting $N^2$ e-beams of current I. The circular array will have N times higher current for the same spreading force.

From this example, it may be appreciated that a 2-D arrays of electron guns provides a significant reduction in space charge spreading forces in a microminiaturized electron-beam amplifier 10. In combination with beam current amplification from an active detector 150, and optical focusing techniques described below, electron-beam amplifier 10 achieves higher gain and power, and requires no (large, heavy and costly) magnets. Thus, microminiaturized amplifier construction is possible, with attendant advantages including, for example, high bandwidth and low cost.

Distributed Deflector Array

To achieve high-gain deflection performance with a two-dimensional array of beams, it is not possible to simply pass all electron beams through a single large pair of deflection plates. A beam originating at an emission plane (e.g., emission plane 20) with a diameter corresponding to a 2-D electron gun array would require a deflector with a plate spacing that is too large to generate sufficient beam deflection at reasonable voltage drives. This reduces amplifier gain unacceptably, unless the plate lengths were made correspondingly longer; however, longer plates reduce bandwidth performance proportionately.

For example, if an electron gun array has a diameter of 100 μm at an emission plane, a deflector with 100 μm plate spacing would have 100 times less deflection force than a deflector with a plate spacing of only 1 μm. To get the same beam deflection as the deflector with 1 μm plate spacing, the deflector with 100 μm plate spacing would have to be 100 times longer.

Disadvantages of large deflectors include low bandwidth, and a physical size that is incompatible with microminiaturized construction. In the above example, bandwidth of the 100 μm long deflector is 100 times lower than bandwidth of a 1 μm deflector for a single e-beam. Large deflectors may also have uneven electric field gradients between deflector plates. For a large diameter beam, this causes uneven deflection for different parts of the beam; in an array of individual e-beams, it causes different deflections for different e-beams. In either case, beam misfocusing results, causing amplifier gain distortion.

One advantage of the instrumentalities described herein is the incorporation of independent, matched deflectors at the output of each individual electron gun in an array of electron guns. Each electron gun and a corresponding deflector is part of a single microcolumn.

Figure 19:
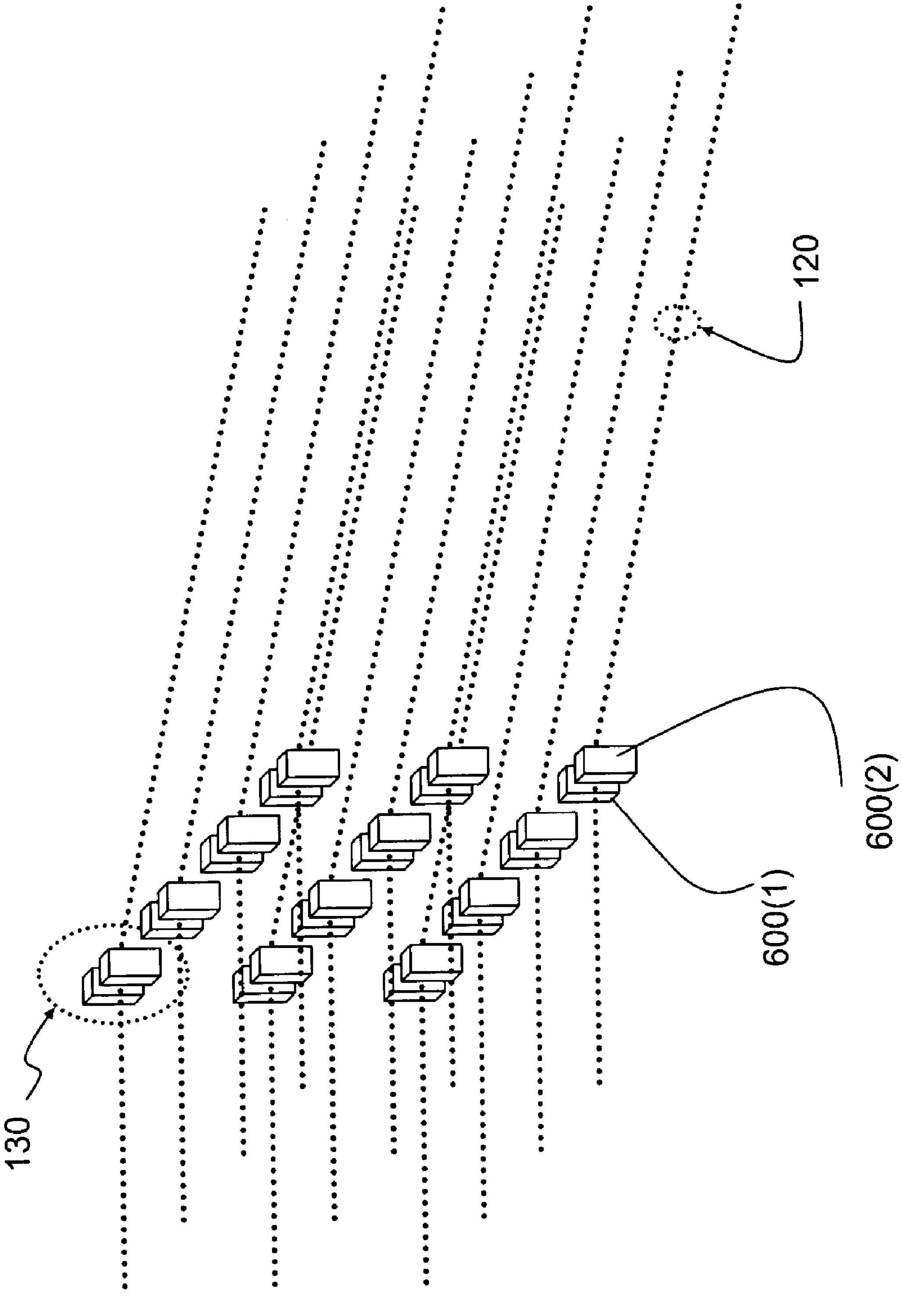
FIG. 19 shows a set of independent, matched deflectors corresponding to individual electron beams.

FIG. 19 shows a set of independent matched deflectors 130 corresponding to individual electron beams 120. Each deflector 130 has two plates (e.g., plates 600(1), 600(2)) spaced only slightly further apart than a diameter of each electron beam 120, thereby providing a strong deflection force with a short deflector, for high bandwidth. The electric field gradients of a small deflector may be more uniform across the region where a single beamlet passes through.

In a microfabricated device, plate spacing and length may be less than 1 μm. Microfabricated plate tolerances may be controlled to under 1 nm, so that deflectors of all microcolumns are matched to 0.1% or better, so that all e-beams are deflected the same amount for the same drive signal. A set of deflectors ("ganged deflectors") driven in this manner constitutes a distributed deflector structure that provides uniform deflection to an array of e-beams, with high gain and fast, wideband response.

Figure 20B:
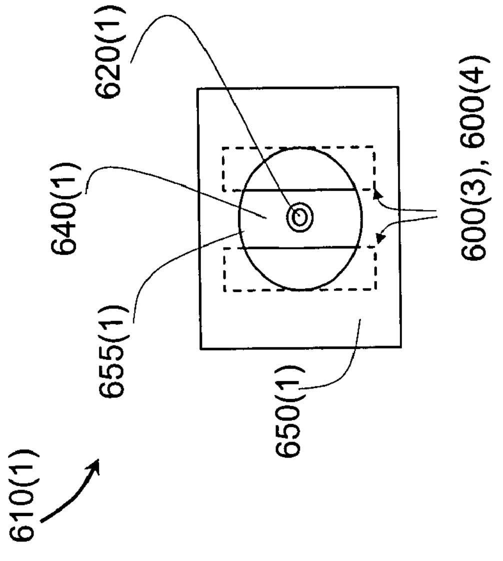
FIG. 20A shows a three-dimensional midsection view and FIG. 20B shows an end view of a microcolumn of an electron-beam amplifier.
Figure 20A:
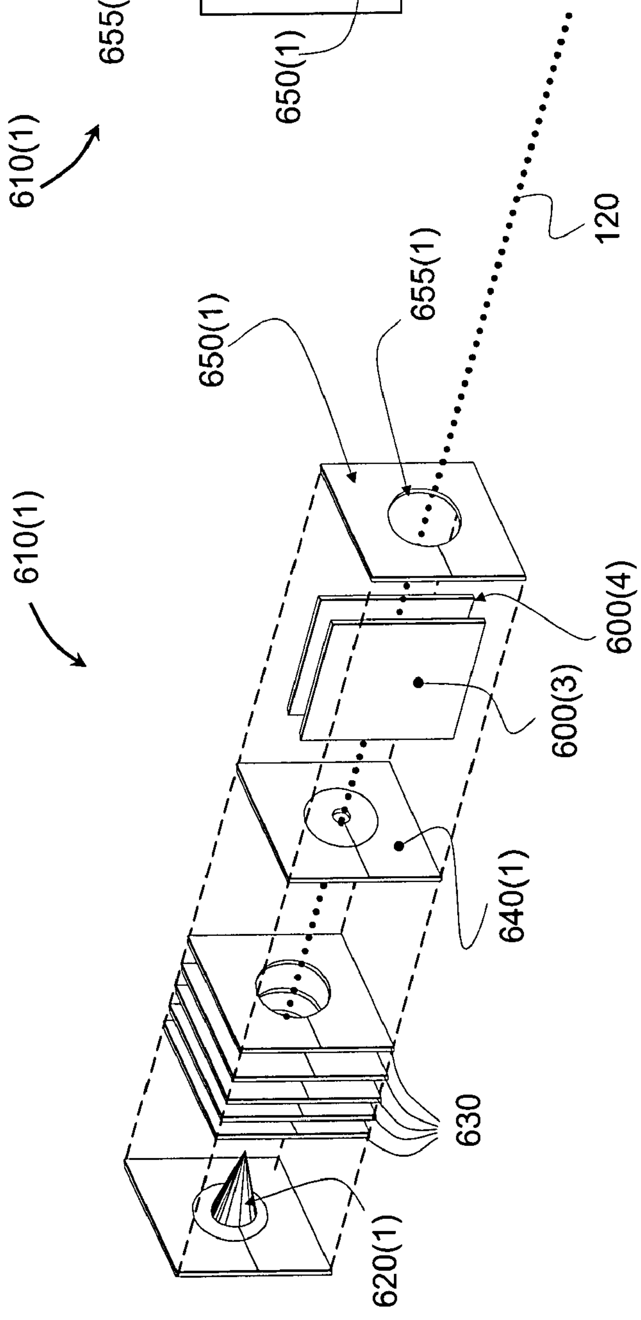

FIG. 20A shows a three-dimensional cutaway view and FIG. 20B shows an end view of a microcolumn or electron gun 610(1) of an electron-beam amplifier 10. Visible in FIG. 20A are a Spindt cathode 620(1), focusing electrodes 630, an aperture plate 640(1), X deflector plates 600(3), 600(4) and a shield plate 650(1) with a hole 655 (1). In FIG. 20B, deflector plates 600(3), 600(4) are partially hidden by shield plate 650(1); shield plate 650(1), deflector plates 600(3), 600(4) and aperture plate 640(1) completely hide focusing electrodes 630. Microcolumn 610(1) emits electron beam 120 (not shown in the end view). It can be appreciated in these pictures that the mechanical complexity of the device makes microfabrication of microcolumn 610(1) essential, as construction by conventional machining at the required size would be difficult or impossible.

Microcolumn with X-Y Deflectors.

X-Y deflection is required for certain embodiments of electron-beam amplifier 10. This is enabled by adding a second beam deflector to each electron gun. It will be appreciated that the use of "X" and "Y" is for reference only; actual beam sweep directions in an electron-beam amplifier 10 are a matter of design choice, but X and Y are meant to convey two orthogonal directions in which an electron beam may be swept.

Figure 21B:
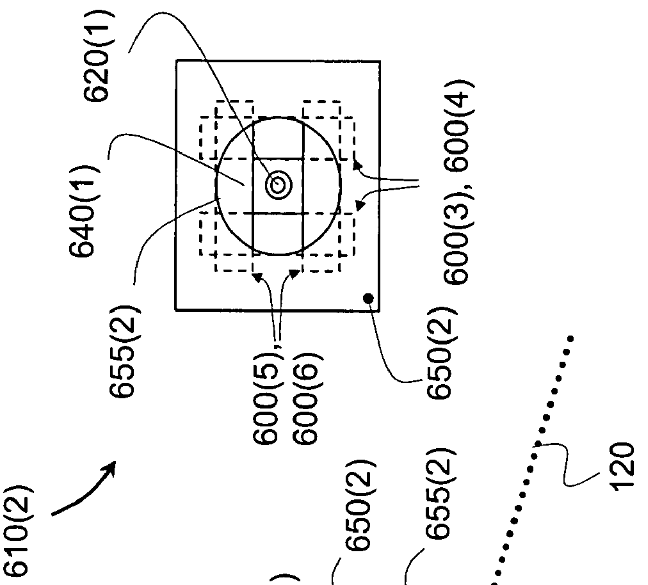
FIG. 21A shows a three-dimensional cutaway view and FIG. 21B shows an end view of a microcolumn configured for X-Y deflection.
Figure 21A:
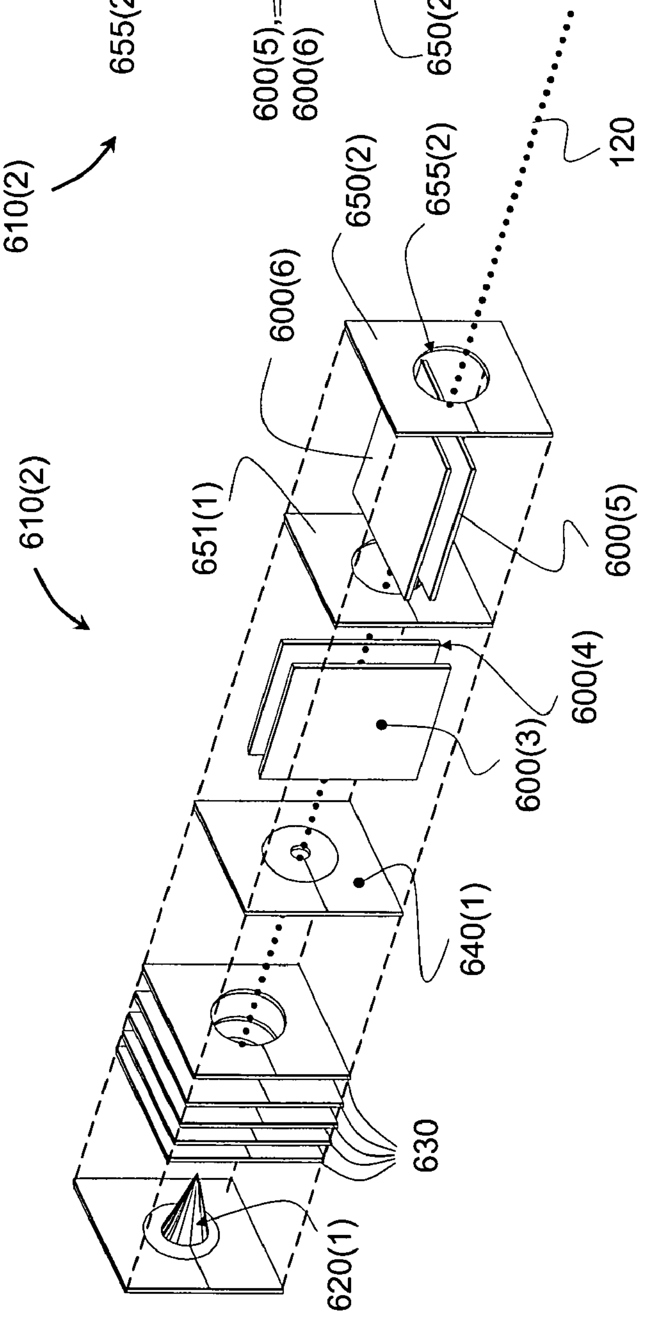

FIG. 21A shows a three-dimensional cutaway view and FIG. 21B shows an end view of a microcolumn or electron gun 610(2) configured for X-Y deflection. A pair of X deflection plates 600(3) and 600(4) and a pair of Y deflection plates 600(5) and 600(6) are positioned in close proximity to shield plate 650(2). Deflection plates 600(3) and 600(4) are orthogonal to plates 600(5) and 600(6), as shown; each pair of plates is separated from the other pair by an aperture plate 651 (1). A width (but not plate spacing) of plates 600(5) and 600(6) may be increased relative to a height of deflection plates 600(3) and 600(4) to accommodate the deflection generated by plates 600(3) and 600(4). Cathode 620(1), focusing electrodes 630, and aperture plate 640(1) are the same as in microcolumn 610(1) of FIG. 20A. Microcolumn 610(2) emits beam 120 through opening 655 (2) in shield plate 650(2). In the end view of microcolumn 610(2), deflector plates 600(5), 600(6) are partially hidden by shield plate 650(2), deflector plates 600(3), 600(4) are partially hidden by shield plate 650(2) and deflector plates 600(5), 600(6), and deflector plates 600(3), 600(4) and aperture plate 640(1) completely hide focusing electrodes 630. Again, the deflector geometries, shield plates and apertures are created through microfabrication. As discussed below, X-Y deflection makes possible other embodiments of electron-beam amplifier 10 such as, for example, combinational logic, certain frequency multipliers, and certain radiating amplifiers that require polarization of an RF output.

Deflector Loading

Loading of an array of ganged deflectors is low. For example, if each deflector consists of two 1 um×1 um deflector plates with a spacing of 1 um between plates, a capacitance per deflector is only 8.85 aF ($10^{-18}$ F). 100 deflectors in an array of 100 electron guns will have a total capacitance of only 0.9 fF ($10^{-15}$ F). A 3 dB bandwidth ($=\frac{1}{2}\pi Z_0 C_{LOAD}$) of a 50 ohm source driving the deflector array capacitance is 3.6 THz. The loading of an array of deflectors thus has little effect on the device performance, and enables a wide bandwidth that is compatible with that of the other system elements.

Electron Gun

Figure 22:
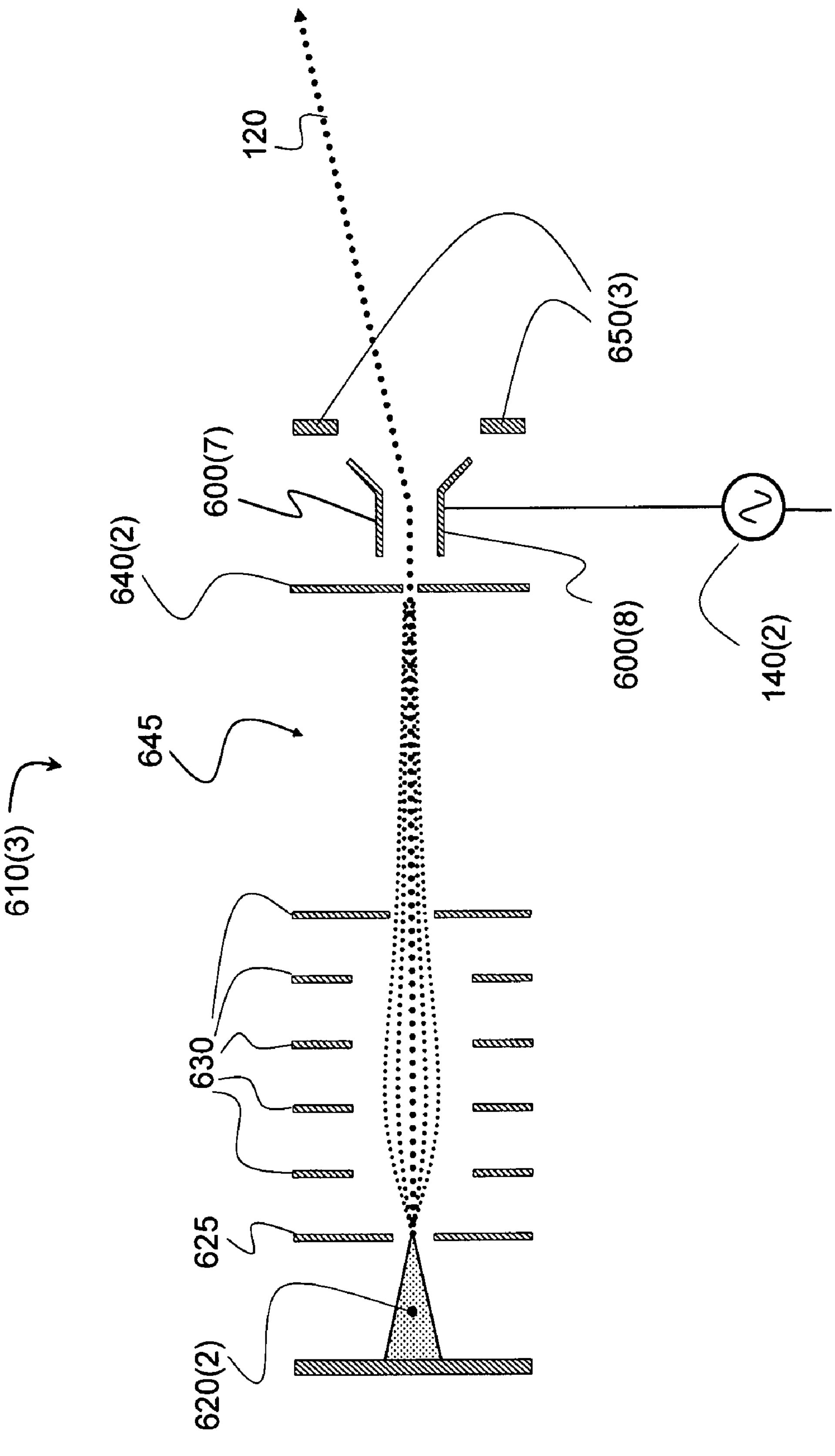
FIG. 22 is a schematic cross-sectional view of another electron gun microcolumn.

FIG. 22 is a schematic cross-sectional view of a microcolumn or electron gun 610(3). Microcolumn 610(3) includes a cathode 620(2), a control gate 625, focusing electrodes 630, an aperture plate 640(2), a drift region 645, voltage signal 140(2), deflection plates 600(7), 600(8) and a shield plate 650(3). Cathode 620(2) may be a field emitter ("FE") and may be a molybdenum tip (e.g., a Spindt cathode) because of its high gain, emission efficiency, low power, maturity and compatibility with microfabrication technology; however, other field emitter types may be employed, including Schottky, diamond, etched silicon tip, and carbon nanotube. Advantages of a field emission cathode include no requirement of a heating element, instantaneous start-up, low-voltage (10V-50V) operation, and low energy electron emittance (with an energy spread <0.3V), leading to low chromatic dispersion in the electron beam focusing, as discussed below.

The basic operation of the electron gun is as follows. A strong voltage between control gate 625 and cathode 620(2) (typically in the range of +10 to +50V) creates a strong electric field around cathode 620(2) that causes a release of electrons into free space. A current transported by the electrons may be described by the Fowler-Nordheim theory of electron flux over an energy barrier. Electrons may be released in the direction of the gate, with an angular distribution and an energy approximately equal to the potential difference between control gate 625 and cathode 620(2). By appropriate design, most of the electrons pass through the center of the gate electrode, and from there, they are focused within the electron microcolumn, as explained below.

Many electron gun microcolumn designs may be conceived as variations on the teachings herein to collimate electrons from a field emission tip into a narrow parallel beam.

Electron Gun Current

An electron gun 610 may be designed with a low enough beam current so that individual beam electrons are separated, on average, by a distance greater than the beam diameter. As a result, the electrons are far enough apart that mutual repulsion is minimized, so that space charge effects do not materially affect focusing.

Electron gun beams may have a diameter <1 μm and a maximum current of approximately 1 μA. This low current is consistent with negligible beam spreading because of a low density of electrons at beam energies typically used (around 100 eV to 300 eV). Generally, a lineal density λ that is a number n of electrons per unit beam length x, is given by $$\lambda = \frac{dn}{dx} = \frac{I_{BEAM}}{q v_{BEAM}} \quad (1.9)$$

where $I_{BEAM}$ is a beam current, q is the electron charge, and $v_{BEAM}$ is a velocity of the electrons, given by $$v_{BEAM} = \sqrt{2qV_{BEAM}/m_e}. \quad (1.9.1)$$

Here, $V_{BEAM}$ is a beam energy in volts, and $m_e$ is the mass of an electron ($9.11\times10^{-31}$ kg). At 200V, $v_{BEAM}$ is $8.4\times10^6$ m/s, and at $I_{BEAM}=1$ μA, the lineal electron density λ is 0.75 electrons per micron. A 1 μA beam current spaces the electrons apart by approximately the beam diameter, so that the electrons experience no significant lateral Coulomb force interactions or beam spreading.

Electron Optics

Focusing of electron beams 120 by electron optics can be understood by analogy to geometrical light optics. The advantage of the optical analogy is that it clearly predicts how focusing works for electron beams 120 from any direction, and provides insight into design of focusing fields.

If electron beams 120 exiting an emission plane (e.g., emission plane 20) are collimated into parallel beams they may be considered, by analogy, like light rays emitted from an object at an infinite distance from a lens. The lens is analogous to the electron optics. In geometrical optics, parallel rays can be focused to a point on an image plane on another other side of a lens, one focal length away.

Figure 23:
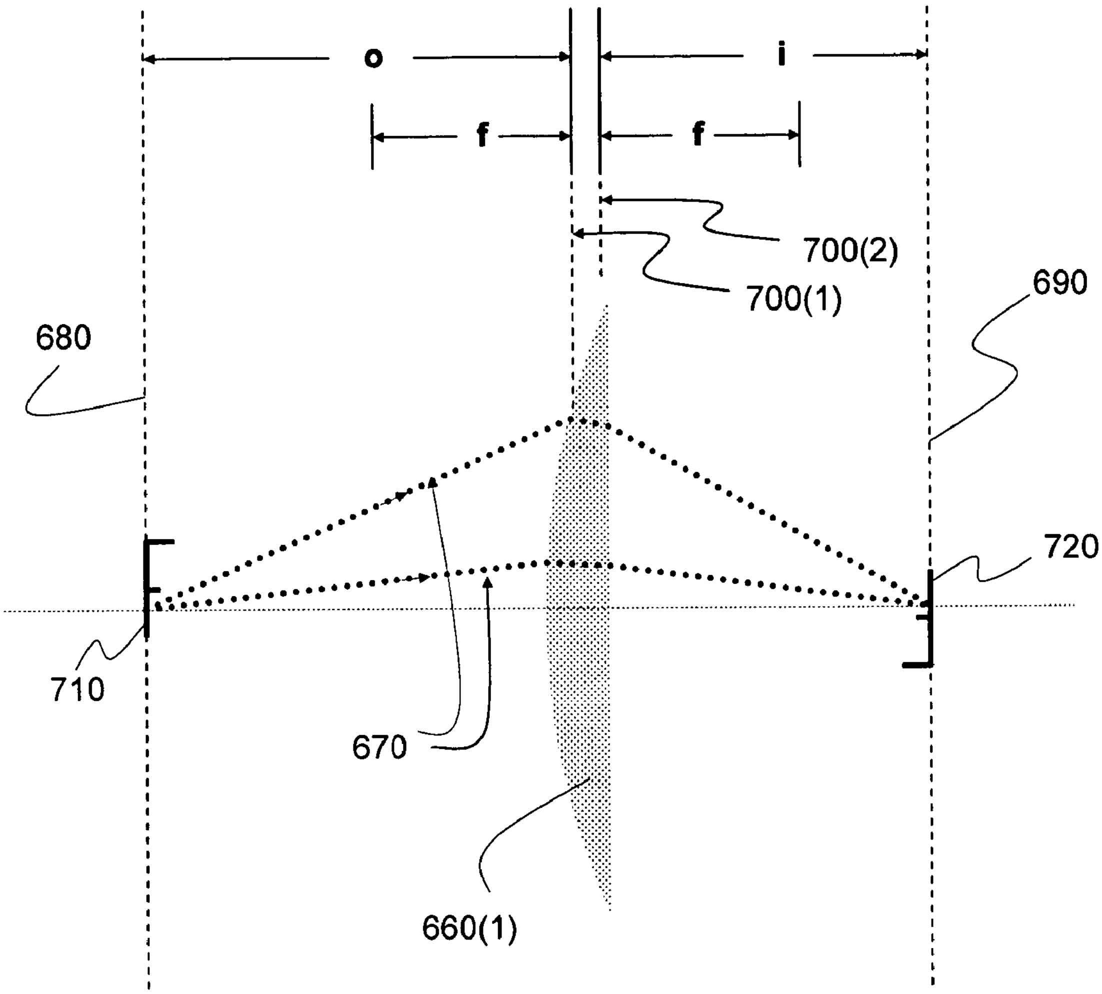
FIG. 23 shows an optical lens imaging an object into an image.

FIG. 23 shows an optical lens 660 imaging an object 710 into an image 720. Light rays 670 travel from object 710 in an object plane 680 through lens 660 and form image 720 in an image plane 690. The basic Gaussian relation of geometrical optics is $$\frac{1}{f} = \frac{1}{o} + \frac{1}{i}, \quad (1.10)$$

where f=focal length, o=distance from object plane to lens, and i=distance from lens to image plane. (As in light optics, the lens "position" in this case is described in terms of "principal planes" 700(1) and 700(2), which are generally different for the object and image sides of a thick lens, but for purposes of this analogy the principal planes can be assumed coincident in position, which is the "thin lens" approximation from light optics.)

Figure 24A:
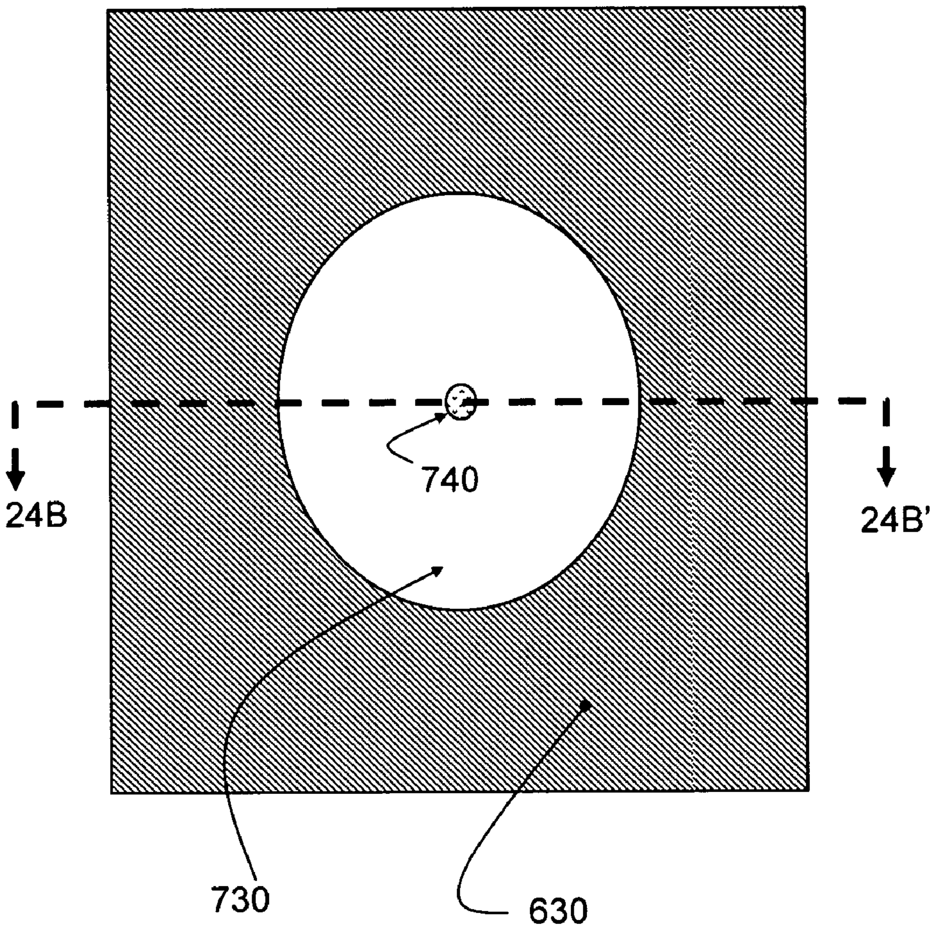
FIG. 24A and FIG. 24B shows a front and a side view of one electron optics focusing electrode.
Figure 24B:

In electron optics, a "lens" consists of electrodes of appropriate sizes, shapes, and voltage potentials. FIG. 24A and FIG. 24B show a front and a side view of one electron optics focusing electrode 630. Focusing electrode 630 may be, for example, a conductive plate with a circular hole to allow electrons to pass through. Hole 730 may be centered about an axis 740 which is a transmission axis of electrons through an electron gun. The positional relationship of focusing electrodes 630 to each other, the sizes of holes 730 in each electrode 630, and the voltage potential differences among electrodes 630 create electric fields that may focus moving electrons. The concepts of focal length, object plane and image plane from geometrical light optics apply substantially to electron optics.

Figure 25:
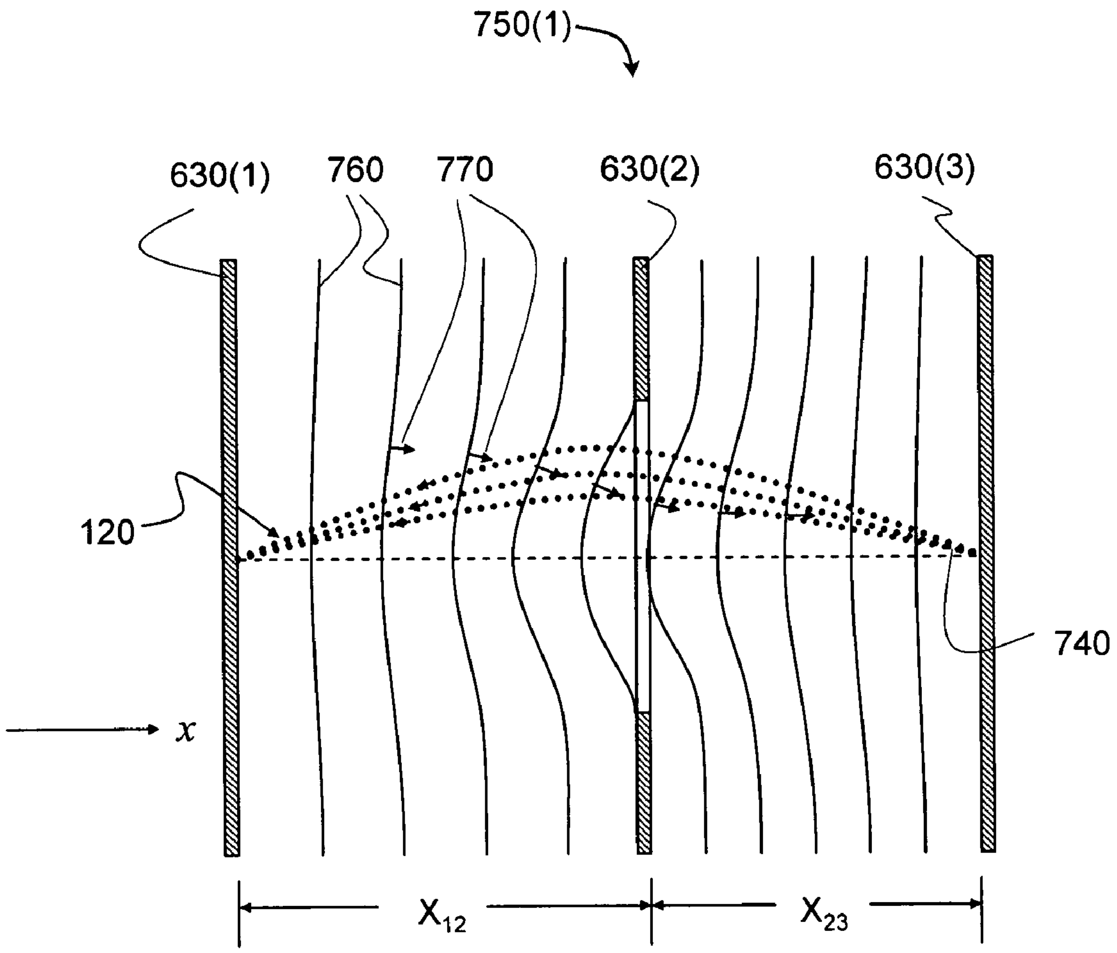
FIG. 25 shows a schematic cross-sectional view of one accelerating electron lens.

FIG. 25 shows a schematic cross-sectional view of one accelerating electron lens 750(1). Electrodes 630(1), 630(2) and 630(3) in this idealized case extend much further away from a transmission axis 740 than shown in the drawing. Electrons accelerate in the direction indicated by arrow x. The essence of lens 750(1) is that an electric field gradient (indicated by the spacing of equipotential lines 760) between electrodes 630(1) and 630(2) is greater than the electric field gradient between electrodes 630(2) and 630(3), measured far from transmission axis 740. This can be achieved by selecting appropriate electrode potentials and plate spacing, since an electric field gradient E is given by the formula E=dV/dx from electromagnetic theory. In electron lens 750, electrodes 630 (1), 630(2) and 630(3) have potentials $V_1$, $V_2$, and $V_3$ respectively; thus the field gradient between electrodes 630(1) and 630(2) is $E_{12}=(V_2-V_1)/x_{12}$ and the gradient between electrodes 2 and 3 is $E_{32}=(V_3-V_2)/x_{23}$. For example, if a potential difference $(V_2-V_1)$ is the same as a potential difference $(V_3-V_2)$, then a plate spacing $x_{12}>x_{23}$ will create a stronger gradient between electrodes 2 and 3, and the electrodes will generate a convex lens action by means of an accelerating field. An electrostatic force on an electron will be perpendicular to equipotential lines 760 at each point; accordingly, force vectors exemplified by arrows 770 act to focus electron beams 120 as shown.

Figure 26:
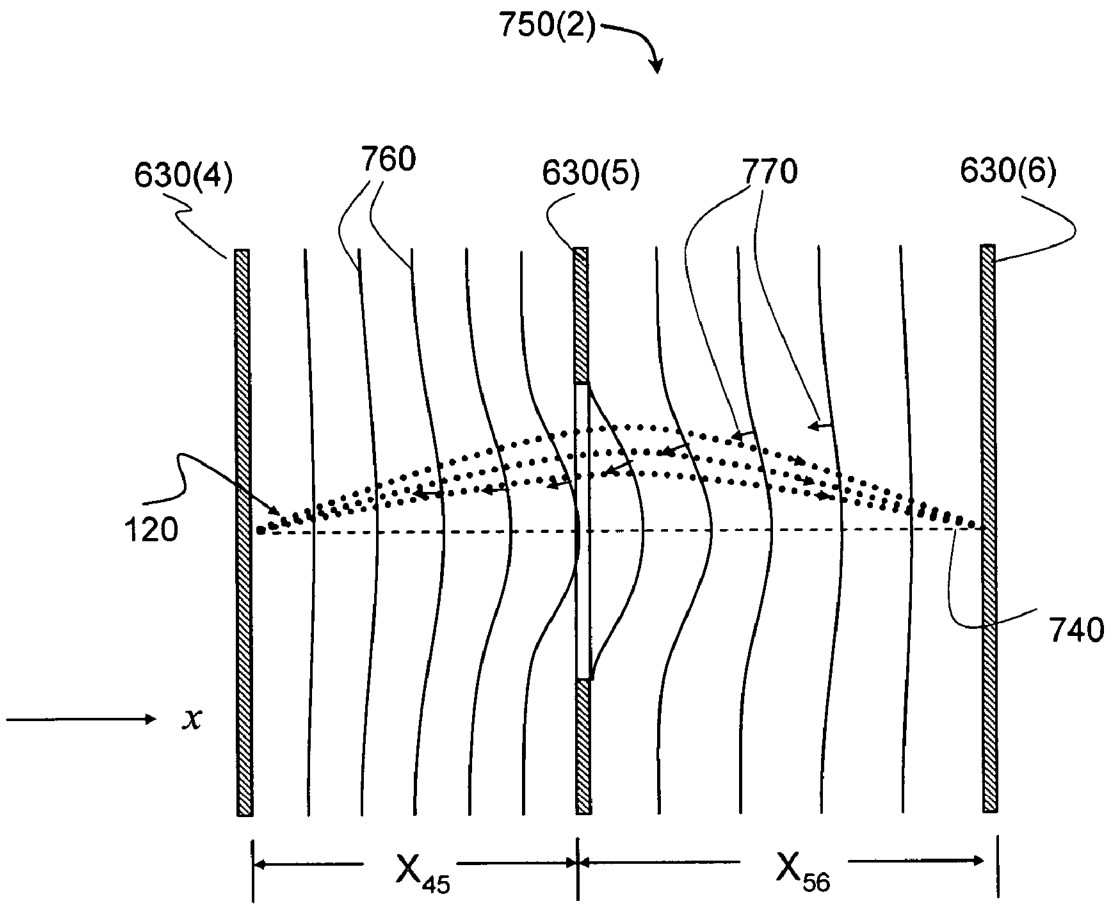
FIG. 26 shows a schematic cross-sectional view of one decelerating electron lens.

FIG. 26 shows a schematic cross-sectional view of one decelerating electron lens 750(2). Electrodes 630(4), 630(5) and 630(6) in this idealized case extend much further away from transmission axis 740. An electric field gradient (indicated by the spacing of equipotential lines 760) between electrodes 630(4)and 630(5) is less than the electric field gradient between electrodes 630(5) and 630(6), measured far from transmission axis 740. In this case, if potential difference $(V_5-V_4)$ is the same as potential difference $(V_6-V_5)$, plate spacing $x_{45}<x_{56}$ gives a stronger gradient between electrodes 630(4)and 630(5). Force vectors exemplified by arrows 770 act to focus electron beams 120 as shown (note that arrows 770 point in the negative x direction in lens 750(2) because potentials are decreasing in the positive x direction).

It can be understood from electron lenses 750(1) (FIG. 25) and 750(2) (FIG. 26) that an electron lens with "convex action" (in analogy to light optics) may be made from either accelerating or retarding fields; similarly, either accelerating or retarding fields may be used to create an electron lens with "concave action". A concave lens essentially works with a "negative" focal length, and causes parallel rays to diverge, or converging rays to converge less.

Electron Gun Focusing

Figure 27A:
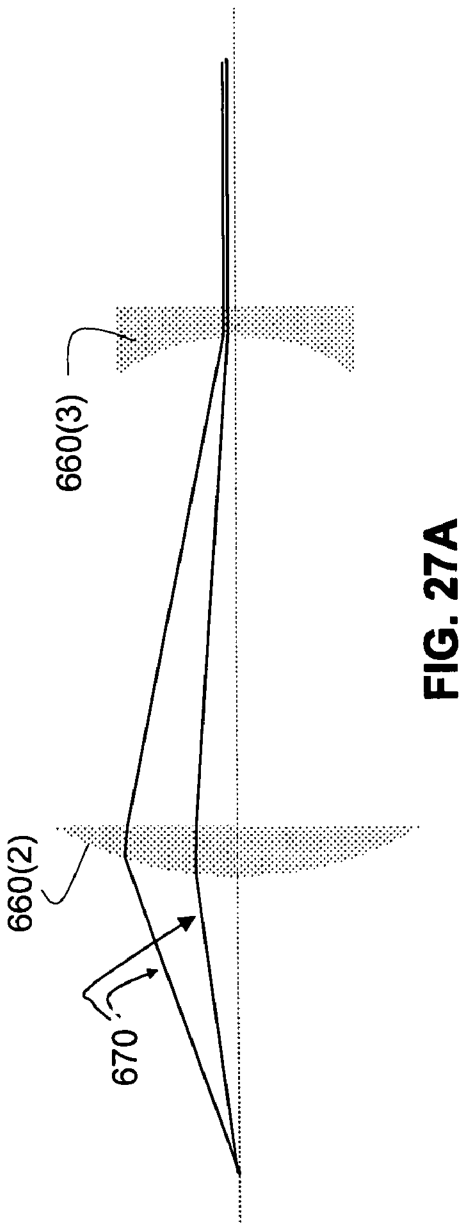
FIG. 27 shows schematic cross-sectional views of a two-lens light optics system and a two-lens electron optics system in an electron gun.
Figure 27B:
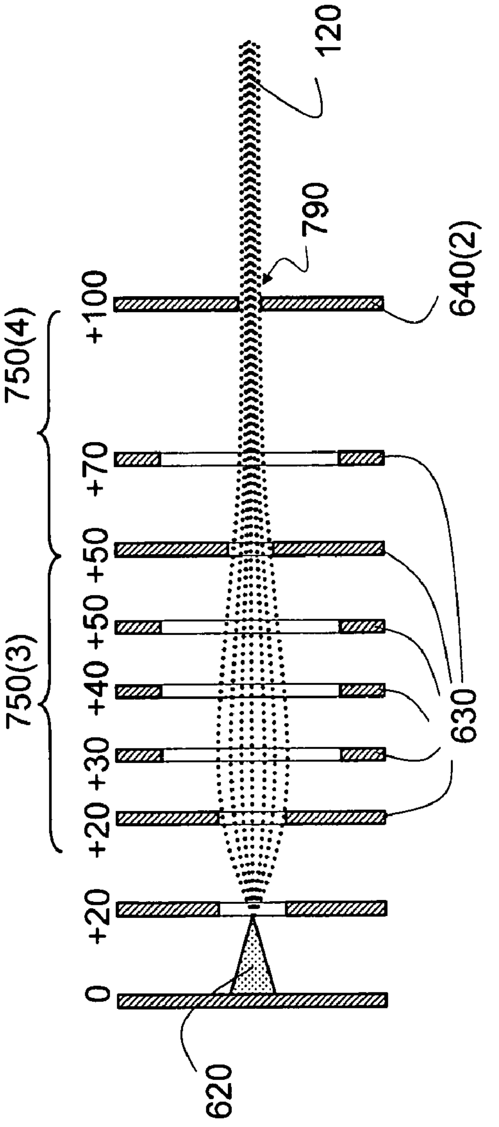

FIG. 27A shows a schematic cross-sectional view of a two-lens light optics system and FIG. 27B shows a schematic cross-sectional view of a two-lens electron optics system in an electron gun. Each of focusing electrodes 630 is connected to a potential voltage shown above the electrode. The regions marked 750(3) and 750(4) correspond to electron lenses acting on an electron beam 120 which function like corresponding glass lenses 660(2) and 660(3) acting on light rays 670. Lens 750(3) acts like convex lens 660(2), focusing a radial distribution of electron beams 120 from cathode 620 on the other side of the lens. Lens 750(4) acts like concave lens 660(3), converting converging electron beams 120 to a parallel bundle of beams having a very small angular distribution (for example, a fraction of a degree). When a concave lens power of lens 750(4) is matched to a convex lens power of lens 750(3), the converging beams can be made parallel. An aperture plate 640(2) masks stray electrons caused by focusing aberrations to ensure perfect parallelism of electron movement within beam 120, and to ensure that the diameter of beam 120 at an exit aperture 790 is under 1 μm.

In electron optics of an electron gun microcolumn, the "lens" may be constructed as a stack of electrodes perforated by circular holes (e.g., focusing electrodes 630). In the microcolumn, electrodes 630 may be metal layers (such as Al) separated by insulating layers (such as $SiO_2$). Potential voltages applied to the electrodes create electric fields in the microcolumn that act on the emitted electrons to produce focusing action. In this way, electrons can be either accelerated or retarded in velocity.

Optical Aberrations

A limitation of optics, whether for light rays or electron beams, is focusing aberration. Two common aberrations that are relevant to electron-beam amplifiers are spherical and chromatic aberrations.

Spherical aberrations are characteristic of off-axis rays that meet the lens at a large angle. These rays are focused closer to the lens than rays that travel at angles close to the lens axis (called "paraxial" rays in optics). Correction of spherical aberrations can be accomplished in light optics through certain deviations of a lens shape from a spherical surface ("aspheric" lenses). In electron optics, analogous corrections can be made by shaping the electric fields via electrode sizes, shapes, spacings and potentials, although no "spherical" surface per se is being corrected.

Chromatic aberration is caused in light optics by different wavelengths being bent by different amounts within lenses. Chromatic aberration produces, in a given lens system, longer focal lengths for short wavelengths, and shorter focal lengths for long wavelengths. Correcting chromatic aberration in light optics can be done through certain combinations of lenses made from materials having different indices of refraction (for example, crown glass and flint glass), a combination referred to as an "achromat." With the right combination of lens materials and curvatures, a lens system can balance chromatic variations in focal length for different lenses and can achieve approximately the same focal length for over a range of wavelengths.

In an electron optical system, chromatic effects arise from electrons of different energies. In an electron-beam amplifier, this may occur primarily at the point of emission from the field cathode. The general principle of correction through an achromat combination is analogous to an achromat in light optics; an electron achromat uses lenses of different field gradient densities to achieve the effect of different indices of refraction. However, it is difficult to combine separate lenses of different field densities because of the electrode structures required. An alternative to use of an achromat is to filter electrons of different energies with an aperture stop. This solution operates somewhat like a pinhole camera.

Figure 28A:
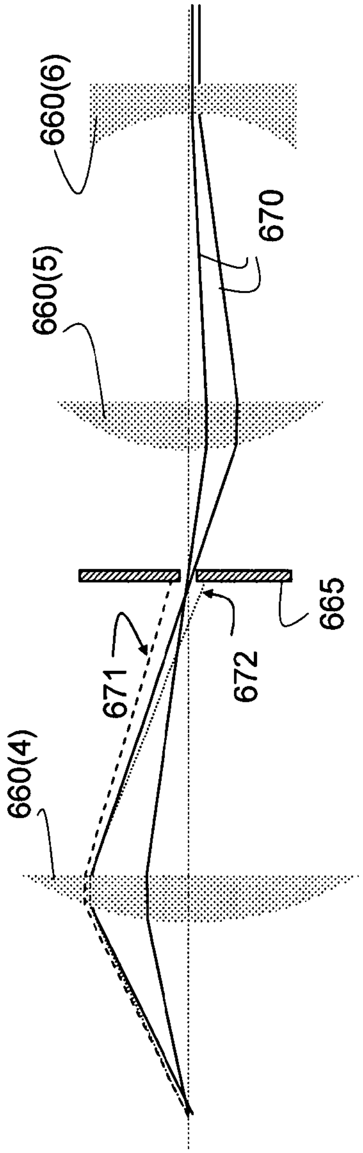
FIG. 28A and FIG. 28B show schematic cross-sectional views of a three-lens light optics system with an aperture stop, and a three-lens electron optics system with an aperture stop in an electron gun.
Figure 28B:
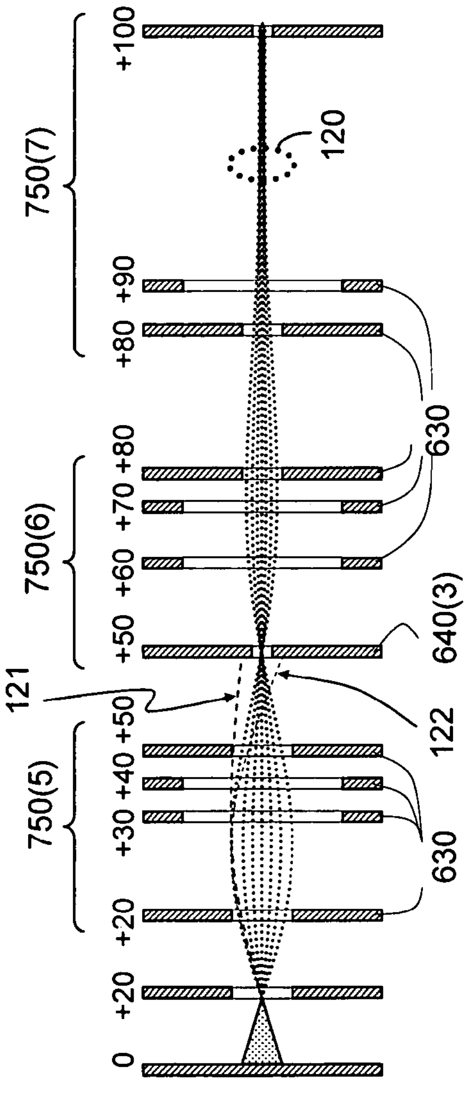

FIG. 28A shows a schematic cross-sectional view of a three-lens light optics system with an aperture stop, and FIG. 28B shows a schematic cross-sectional view of a three-lens electron optics system with an aperture stop in an electron gun. In FIG. 28B, each of focusing electrodes 630 is connected to a potential voltage shown above the electrode. The regions marked 750(5), 750(6) and 750(7) correspond to electron lenses acting on an electron beam 120, which function like corresponding glass lenses 660(4), 660(5) and 660(6) acting on light rays 670 in FIG. 28A. Lens 750(5) acts like convex lens 660(4), focusing a radial distribution of electron beams 120 from cathode 620 on the other side of the lens. However, lens 750(5) and lens 660(4) are optimized for electrons of a certain energy, and light of a certain wavelength, respectively. High energy electrons 121 and high energy (low wavelength) light ray 671 have longer focal lengths than electron beam 120 and light ray 670 respectively; low energy electrons 122 and low energy (long wavelength) light ray 672 have shorter focal lengths. Electron aperture stop 640(3) and optical aperture stop 665 block these high and low energy electrons and light rays respectively. Lens 750(6) and 660(5) refocus the remaining electrons and light rays respectively. Lens 750(7) and concave lens 660(6), convert the converging electron beams 120 and light rays 670, respectively, to parallel bundles.

A disadvantage of filtering electron beams with apertures, as opposed to use of an electron achromat, is that some portion of beam current is blocked, reducing efficiency of an electron gun. An advantage is that a beam emerging from an aperture may be well focused and collimated. Spherical and chromatic aberrations may be corrected to produce an electron beam diameter of a few nanometers in a microcolumn that is several millimeters in length, at beam energies of 1 keV and currents up to 50 nA. Generally, higher energies, lower currents, longer columns and short drift distances achieve better focusing.

An electron-beam amplifier may require beam focusing on the order of a micron to ensure proper focusing across a drift cavity. Another way of looking at the beam focus requirement is that all e-beams emitted from a microcolumn array should act as if emitted from a single point source at infinite distance.

Electron Gun Fabrication

The components of an exemplary electron gun microcolumn include an FE tip cathode, a control gate (called a "wehnelt" in some literature), electrodes forming a first lens element, a first aperture plate, electrodes forming a second lens element, a second aperture plate, deflection plates, and a shield plate. The cathode may be a single field emitter tip; alternatively, a heated Schottky or other thermionic emitter may be used.

The microfabricated construction of an electron gun in an electron-beam amplifier may follow a sequence of fabricating components on individual silicon wafers, followed by alignment and wafer bonding of the wafers into a stack.

Figure 29:
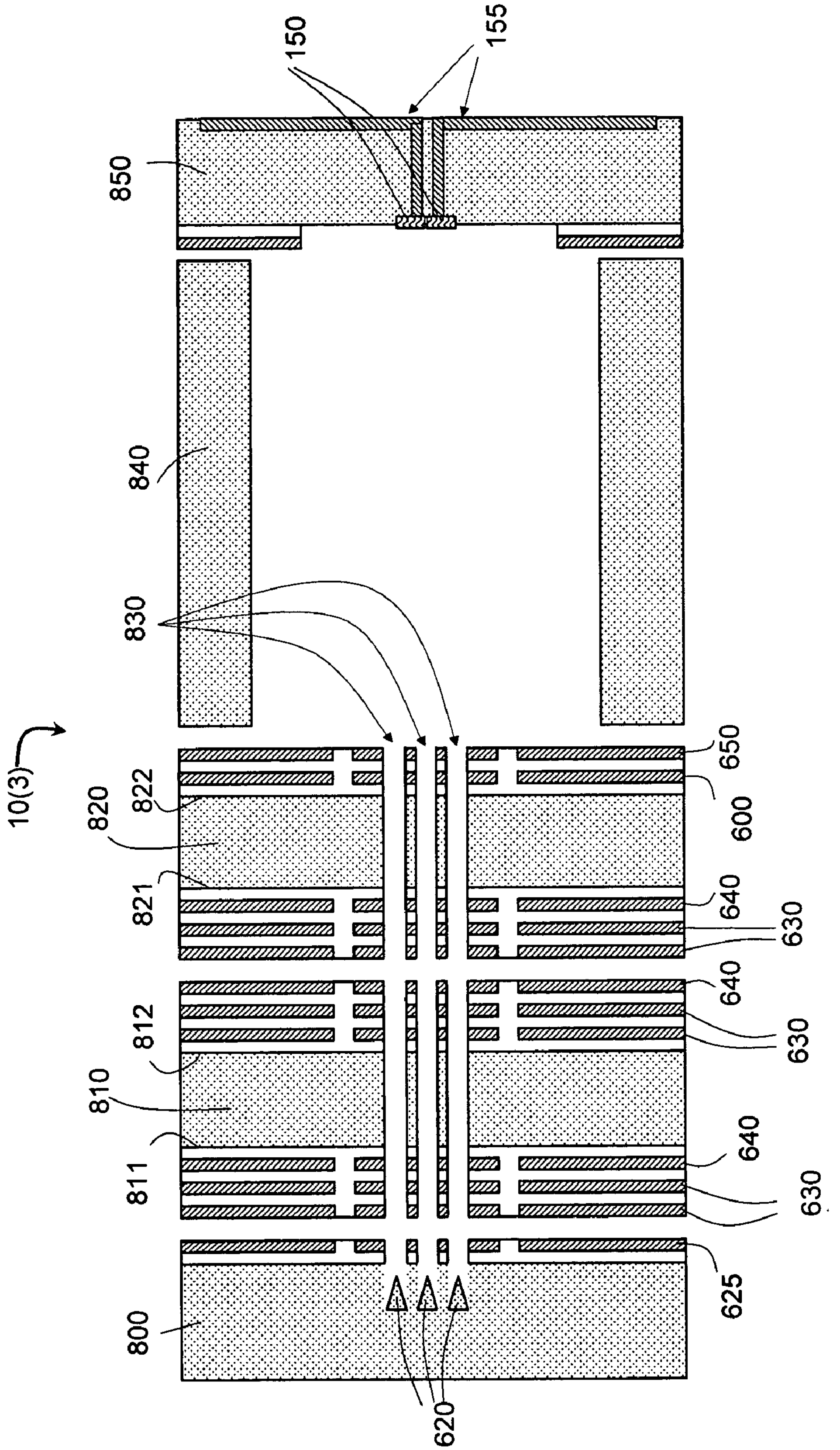
FIG. 29 shows an exploded or assembly midsectional cross-sectional view of one electron-beam amplifier assembled by bonding multiple wafers.

FIG. 29 shows an exploded, cross-sectional view of one electron-beam amplifier 10(3) assembled by bonding multiple wafers 800, 810, 820, 840 and 850. Cathodes 620 and control gates 625 are constructed on first silicon or glass wafer 800. Electrodes 630, forming a first lens, and a first aperture plate 640 may be formed on a first side 811 of second wafer 810; one or more lens electrodes 630 and aperture plates 640 may be formed on a second side 812 of wafer 810. More lens electrodes and aperture plates may be formed on a first side 821 of third wafer 820; deflectors 600 and shield plates 650 may be formed on a second side 822 of wafer 821. Wafers 800, 810, and 820 may then be aligned to each other and bonded together; holes 830 may be drilled through these wafers to provide paths for electron passage. Several drift cavity wafers (shown in FIG. 30 as a single wafer 840) and a detector wafer 850 (including detectors 150 and detector connections 155) may be aligned to wafers 800, 810 and 820 and all of the wafers may be bonded together, forming electron-beam amplifier 10(3).

Figure 30:
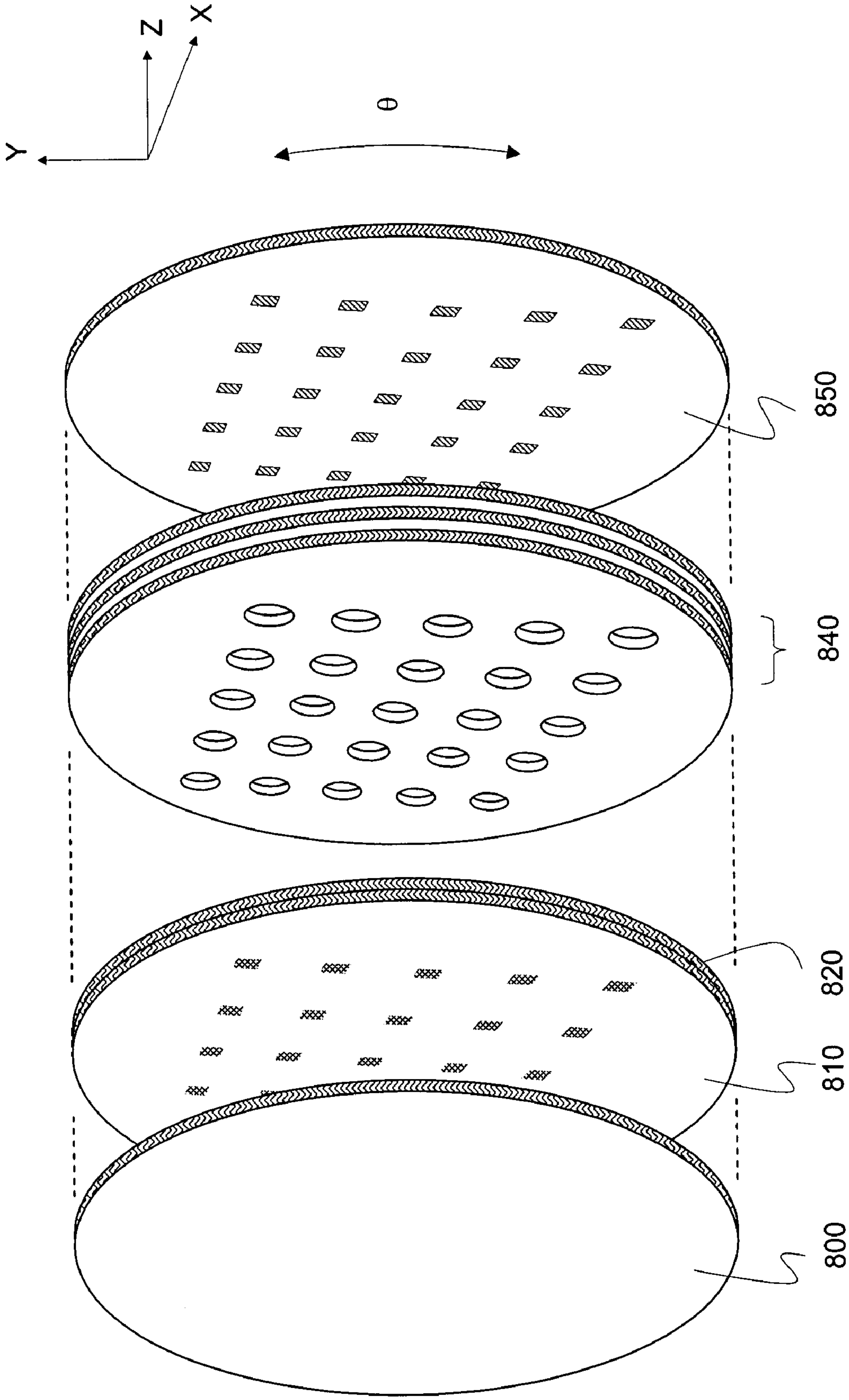
FIG. 30 shows an exploded view of the wafers of FIG. 29 in alignment for bonding.

FIG. 30 shows an exploded view of wafers 800, 810, 820, 840 and 850 of FIG. 29 in alignment for bonding. In a bonding operation, one wafer may be selected as a reference wafer; the other wafers may be aligned to the reference wafer in a rotational direction θ and translational directions X and Y, before bringing the wafers together in the Z direction and bonding them.

The wafers and assembly illustrated in FIG. 29 and FIG. 30 are by way of example only; it may be appreciated that many variations are possible. For example, more or fewer wafers may be used depending on the complexity of the electrode structures and the length of the gun column, and components may be fabricated on either side of any of the wafers. Additional structures such as optical elements and integrated circuits may be fabricated in wafers and bonded into the wafer stack. Wafer bonding technology may provide for electrical conduction, selective interconnection, or insulation between adjacent wafers. Holes of different diameters may be drilled through individual wafers or groups of wafers bonded together (i.e., to produce focusing electrodes with large holes in certain wafers, and aperture stops with small holes in others) before a final bonding step completes a wafer stack.

Multiple Focusing Electrodes

In electron-beam amplifier 10, multiple microcolumns are advantageously constructed concurrently in a compact array. Making a gun array as small as possible helps create high beam current density with good spot formation. For example, a single microcolumn may have a diameter of 5 μm or less to allow several hundred or more microcolumns to be fabricated in an array having a diameter of approximately 100 μm.

It is possible to use large electron lens electrodes achieve aberration-free focusing, as in light optics, in which large lenses improve image quality. In electron optics, as discussed above, perforated electrodes may act as lens elements (see FIG. 25). Circular perforations make spherically symmetrical lenses (called "stigmatic"), and large perforations help electron optics achieve low spherical focusing aberrations that characterize a paraxial (ideal) lens system. Put another way, high performance may result when an electron lens is much larger than a beam diameter. For example, a 1 μm beam may be advantageously focused by a 20 μm lens perforation. These numbers are very approximate, since any properly designed system requires precise specification of plate spacings, number of plates, perforation sizes, plate potentials and mechanical tolerances (since larger perforations are less sensitive to size irregularities).

It can be appreciated that large lenses are not compatible with a small diameter microcolumn and a dense gun array. In an improved embodiment of an electron-beam amplifier, small microcolumns having a plurality of small electrodes approximate the focusing of a single large electrode.

Figure 31:
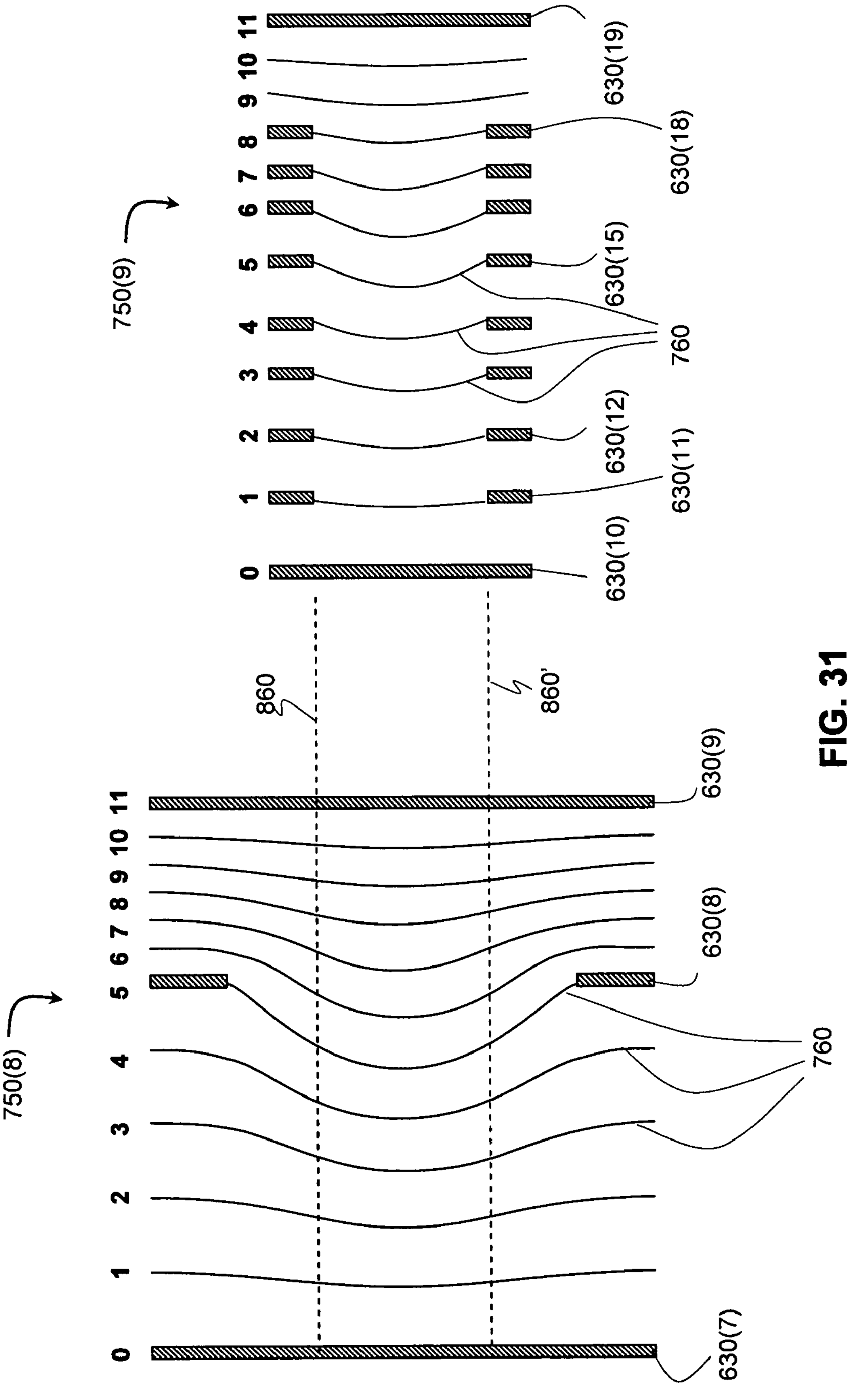
FIG. 31 shows an electron lens constructed from three large electrodes and a corresponding lens constructed from ten small electrodes.

FIG. 31 shows an electron lens 750(8) constructed from three large electrodes 630(7), 630(8) and 630(9), and a corresponding lens 750(9) constructed from ten small electrodes 630(10) through 630(19). Electrodes 630(7) and 630(10) are at a reference potential within lenses 750(8) and 750(9) respectively. Each equipotential line 760 is identified by a numeral and indicates positions of a potential, and each successive equipotential line 760 indicates a uniform change in potential from the corresponding reference potential (for example, successive lines may indicate 10V, 20V, 30V, and so on). A "bulge" in equipotential lines 760 arises from the stronger field gradient between certain adjacent electrodes as opposed to the field gradient between other adjacent electrodes.

Where the potential lines coincide with electrode surfaces, they have the same potential as the corresponding electrode. This is the principle of an improvement to electron-beam amplifier 10. The potential gradients near the centerline of the lens, within the radius of the perforation, can be preserved without a wide diameter lens by using a series of thin, small diameter electrodes. For example, each equipotential line 760 in lens 750(9) has the same spacing and shape as a corresponding equipotential line 760 in the small region between dashed lines 860, 860' within lens 750(8). Thus, lens 750(9) may provide similar focusing action, within a smaller physical size, as lens 750(8). In the case of an infinite number of differential electrodes, the lens 750(9) performs exactly as lens 750(8). In practice, only a few extra electrodes are required to substantially approximate a large three electrode lens with a small, multi-electrode lens.

Beam Current Control

Formation of a useful beam spot 170 requires substantially uniform beam current from all electron guns that supply individual beams for the composite beam. Field emission cathode tips ("FE tips") may have nonuniform current-voltage characteristics ("I-V characteristics"); applying a single potential to a gate electrode 625 of each gun in an electron gun array 100 may result in a beam spot 170 with large current density variations. For this reason, beam current from each electron gun may be individually regulated by a control loop so that each electron gun produces substantially equal current.

The gate electrode potential has a significant effect on the electron optical focusing of the microcolumn, and changes in gate potential may significantly defocus the electron gun beam unless compensated by changes in potentials of other electrodes. For this reason, an improved electron-beam amplifier 10 may include circuitry which adjusts certain electron gun focusing electrodes at the same time as the potential of a gate electrode is changed, to maintain constant focusing characteristics.

Focusing potentials are generally difficult to determine except by computer analysis. One method of adjusting electron gun focusing potentials in the presence of a current-regulated gate potential consists of an analog-to-digital converter ("ADC"), a digital-to-analog converter ("DAC") and a read-only memory ("ROM") that is programmable with digital values. The ADC may be coupled to the gate electrode, to develop a digital word representative of the gate potential. This word is transmitted to the ROM as an address. The ROM functions as a look-up table, and stores DAC codes representative of optimized electrode potentials for any given gate potential measured by the ADC. The DAC responds to the output of the ROM by generating a focusing potential, which may be applied to an electrode. Thus, one or more electrode potentials may be arranged to correlate directly to the gate potential. In alternative embodiments, it may be appreciated that the ROM can be replaced with other means of generating digital values, such as a processor element.

Figure 32:
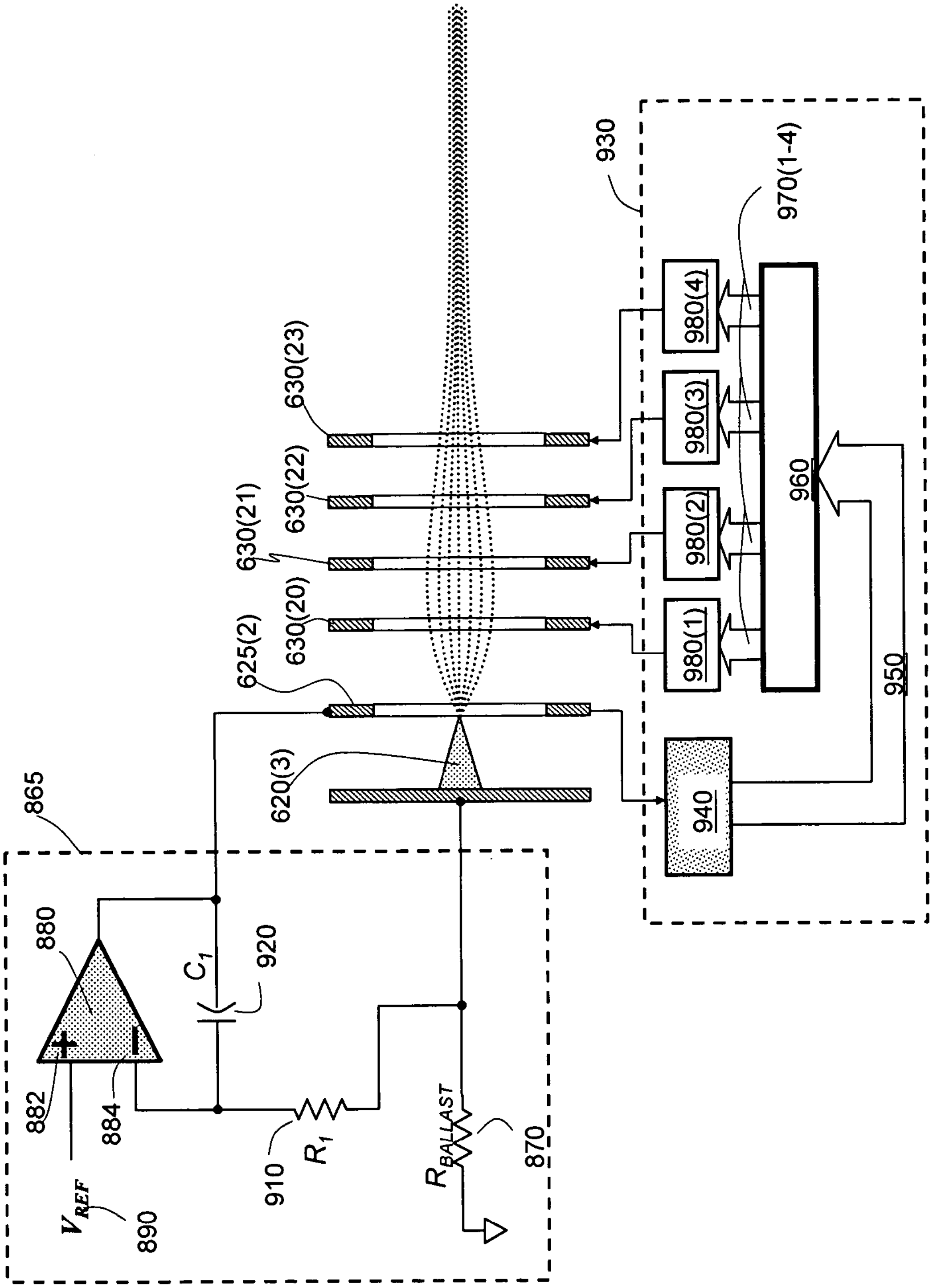
FIG. 32 shows one arrangement for controlling beam current and focusing electrode potentials.

FIG. 32 shows one arrangement for controlling beam current and focusing electrode potentials. Beam current control operates by regulating a potential difference between a gate electrode 625 (2) and a corresponding cathode 620(3). A current control loop 865(1) includes a current sensing ballast resistor 870 having a value $R_{BALLAST}$, and an opamp 880. A positive terminal 882 of opamp 880 is connected with a reference potential 890. A beam current 900 with a value $I_{BEAM}$ flowing through cathode 620(3) develops a ballast potential across ballast resistor 870; this potential may be applied to a second resistor 910 having a value $R_1$, which connects with a negative input 884 of opamp 880, as shown. The voltage difference between the ballast potential and reference potential 890 is an error voltage representative of the difference between a desired current and the actual beam current 900. This error voltage difference is filtered by a capacitor 920 having a value $C_1$ to eliminate noise fluctuations, amplified by opamp 880, and applied to gate electrode 625(2). Changes in potential of gate electrode 625(2) driven by opamp 880 thus make the ballast potential equal to reference potential 890, assuming gain of opamp 880 is high enough to reduce the error voltage difference to a small level. In this manner, reference potential 890 commands a desired current $I_{BEAM}$.

Focusing electrode controller 930 controls potentials of focusing electrodes 630(20), 630(21), 630(22) and 630(23) as follows. An ADC 940 connects with gate electrode 625 (2) and generates a digital gate word 950 which is transmitted to a ROM 960. ROM 960 accepts digital gate word 950 as input and generates electron gun focusing words 970(1), 970(2), 970(3) and 970(4) as output; the electron gun focusing words are transmitted to corresponding DACs 980(1), 980(2), 980(3) and 980(4) which generate gun focusing potentials corresponding to each electron gun focusing word, and transmit the gun focusing potentials to focusing electrodes 630 (20), 630(21), 630(22) and 630(23).

In a focusing electrode controller (e.g., controller 930) each electrode driven by a ROM (e.g., ROM 960) increases a storage capacity required in the ROM by a number of input levels values resolved by a corresponding ADC (e.g., ADC 940), times the number of DACs, times the number bits of resolution required as input by the corresponding DACs. For example, in the case shown in FIG., if ADC 940 measures gate potential to 6 bit accuracy, the number of input levels resolved is 64; if each of DACs 980(1-4) requires a 7 bit word (e.g., electron gun focusing words 970(1-4)) as input, then the required ROM storage capacity is 64×4×7 bits (1792 bits).

The technique used in focusing electrode controller 930 may be extended to control all electrodes of an electron gun that are affected by a gate potential. Each electrode (e.g., electrodes 630) requires one DAC, and the required ROM storage capacity grows proportionately. There is no restriction on the number of bits in the electron gun focusing word supplied to a given DAC. Different DACs may resolve gun focusing potentials to different accuracy levels and may require correspondingly more or fewer bits per electron gun focusing word. For example, electrodes closest to the cathode may require high DAC accuracy and thus more ROM bits. Electrodes further from the cathode (in the microcolumn) may require less DAC accuracy and fewer ROM code bits. Generally, a first aperture plate of the electron gun (e.g., aperture plate 640(1) of FIG. 20A) will block defocusing effects of changes in control gate potential from propagating farther down a microcolumn, and focusing adjustments may be needed for only the first one or two lenses of the microcolumn Typical Mechanical Parameters Electron beam amplifier 10 may be designed or optimized for a parameter space of operation that may include gain, frequency response, bandwidth, power output, efficiency, noise, and drift time. Variables which may be manipulated as matters of design choice include electron gun energy, beam current, number of guns, number of deflection plates per electron gun (horizontal, vertical, cross-axis, blanking, offset centering), drift cavity acceleration, cavity length, detector size, shape and configuration, cascade and avalanche gain, diode material, voltage rating, bias, and output coupling method. Certain combinations of these parameters will result in amplifiers that may have vastly different mechanical dimensions and electrical specifications. For example, the mechanical dimensions shown in FIG. 16A and FIG. 16B for a microminiaturized electron-beam amplifier 10(2) include overall packaging dimensions $A_X$ and $A_Y$ of 5 mm. At this size, height $h_{ega}$ of electron gun array 100 may be in the range of 50 μm to 200 μm, and a drift cavity length $z_{drift}$ may be 2 mm. These numbers are merely representative and can vary significantly by application. For example, with a lower power output requirement a lower beam current may be used. With a higher tolerable noise figure, a smaller electron gun array may be used. With lower gain or linearity requirements, drift cavity length $z_{drift}$ may be shorter and this, in turn, may reduce the length of microcolumns. Smaller gun arrays in turn create smaller beams, so the drift cavity diameter (e.g., $d_{drift}$ in FIG. 16B) can also be smaller. Thus, a small change in one or two parameters (e.g., power gain and noise figure), may allow a much smaller electron-beam amplifier to meet all requirements.

Wideband Feedback

Certain systems require an amplifier with almost perfectly linear response such as, for example, a low noise amplifier ("LNA") which may be used at the front-end of an RF receiver. High gain may not be required of an LNA, but distortion free response may be required to help detect small signals when a large interfering signal is present. For example, an interfering signal may have 1V peak-to-peak ("p-p") amplitude, and a signal of interest may be 0.1 mV p-p (for example, when a jamming signal is present, or when a high-power transmitter is close to a receiver attempting to detect a distant signal).

In such applications, dynamic wideband feedback is often applied to a transistor amplifier to provide controlled gain with very low distortion. The transistor amplifier must be very wideband to operate with the feedback, since as is well known, this may be essential to achieving stable operation with the feedback. The wideband characteristic translates to a short delay through the amplifier; specifically, it is known that for feedback to be applied, the delay through the amplifier should normally be less than ½ cycle of a highest signal frequency for which the amplifier gain exceeds unity, or the feedback will be unstable and the amplifier will oscillate uncontrollably.

A delay time of an electron-beam amplifier may depend in part on a drift cavity length $z_{drift}$. For example, a 200 eV beam has a beam velocity of $8.4\times10^6$ m/s. With a 1 mm cavity, drift time is 119 ps. This is a short interval, but not short enough to use the amplifier with wideband feedback at frequencies for which it has useable gain. Since an electron-beam amplifier may offer significant gain at frequencies of 100 GHz or more (as described below), some embodiments may require a drift time of 5 ps or less. Based on this criterion, if stable feedback is to be applied at 100 GHz, a maximum drift cavity length $z_{drift}$ is 40 um for a 200 eV beam.

A short drift cavity length $z_{drift}$ has significant impact on parameters of an electron-beam amplifier. Short $z_{drift}$ may mean that a smaller array of fewer electron guns may be used, since there is less distance over which to focus beams on a detector; but conversely, since less beam spreading occurs over the short $z_{drift}$, the guns may operate at a correspondingly higher current. For example, with $z_{drift}$ of 40 μm, a gun array may have a diameter of 20 μm and may include only 16 guns. Individual beam currents may be on the order of 10 μA, since there will be less beam spreading over a short drift time, while a greater drift cavity length $z_{drift}$ might only be compatible with beam currents on the order of 1 μA. Total beam current could therefore be 160 μA; not much different than in a long cavity, but higher beam energy may be used to reduce drift time and increase output current with higher cascade gain. For example, an 800 eV beam may provide a drift time of 2.4 ps. This is one-half the time of a 200 eV beam. Thus, feedback can be applied over 200 GHz bandwidth. With a 20 μm drift length, feedback bandwidth may be over 400 GHz.

Thus, it can be appreciated that many matters of design choice may be used to optimize an electron-beam amplifier 10 for a particular application, and that feedback may be applied to some electron-beam amplifier configurations to enable very low-distortion performance at high frequencies.

Typical Electrical Parameters

In typical configurations of an electron-beam amplifier 10, with or without feedback, beam energy may be 200-300 eV, individual electron beam currents may be on the order of 1 μA, detector gain may be 1000, and maximum deflector voltage drive may be 100 mV to 1V.

Like mechanical parameters, electrical parameters may range widely according to an intended application. Some parameters are related to mechanical dimensions, while others are more constrained by physics. For example, in most applications, one design objective is to generate an electron beam of maximum current without large spreading forces. At 300 eV energy, this translates to a maximum electron beam current of about 1 μA, based on electron density in the beam (though a shorter or longer drift cavity may increase or decrease the maximum electron beam current somewhat).

Another physical limitation is maximum beam energy. High beam energies at higher beam currents can cause excessive heating of a detector. High voltages (thousands of volts) which may be used to generate high beam energies can also cause arcing in a microminiature device, even at low beam currents. High energy also is not compatible with most integrated bias circuitry, which may withstand only a few hundred volts. Thus, a maximum beam energy in a range of 300 eV to 1000 eV is currently preferred.

Minimum beam energy is another limitation. If a beam energy is too low, cascade gain of a detector may be inadequate. As discussed above, low cascade gain cannot always be compensated by larger avalanche gain, since avalanche gain is limited by detector junction leakage and radiation sensitivity.

Another physical limitation is a minimum beam current which can produce a desired noise figure. Even with an ideal detector, electron beam shot noise (the effect of discrete electrons, rather than a smooth stream of current, striking a detector) is still amplified.

Many factors may drive deflector voltage drive range, including individual electron beam diameter, minimum plate spacing that can be manufactured reliably, drift cavity length $z_{drift}$, detector size, amplifier gain and input signal range. Since one application of an electron-beam amplifier 10 is as an antenna coupled LNA, its input signal may vary from microvolts to more than 1V. A maximum tolerable deflector voltage is set by the arc-limit of the plates, and may be around 10V per micron of space; if electron-beam amplifier 10 is fed from a solid-state amplifier, a lower limit of about 1V may be set by a voltage breakdown of high-frequency (GHz bandwidth) solid-state transistors.

These are not the only factors that constrain the electrical parameters, but illustrate some of the principles underlying the electrical parameter limitations.

Deflection Gain

Microminiaturization of e-beam dimensions and deflector plate spacing to micron or even submicron dimensions provides two benefits: high deflection gain and fast response. Thus, if plate spacing (e.g., spacing of deflector plates 600) is small, small signal voltages may generate strong electric fields for beam deflection, in turn creating large transverse beam displacement over very short transit times (of a beam through the deflector plates), permitting deflectors with short plate length $L_P$. In practice, deflectors can be shorter than 1 μm, with transit times of much less than 1 ps.

A general relation for deflection force F is F=qE, where q is the electron charge and E is the electric field between two deflector plates, approximately $$E=V_{sig}/W_P, \quad (1.11)$$

where $V_{sig}$ is an instantaneous signal voltage applied across the plates separated by a spacing $W_P$.

Figure 33:
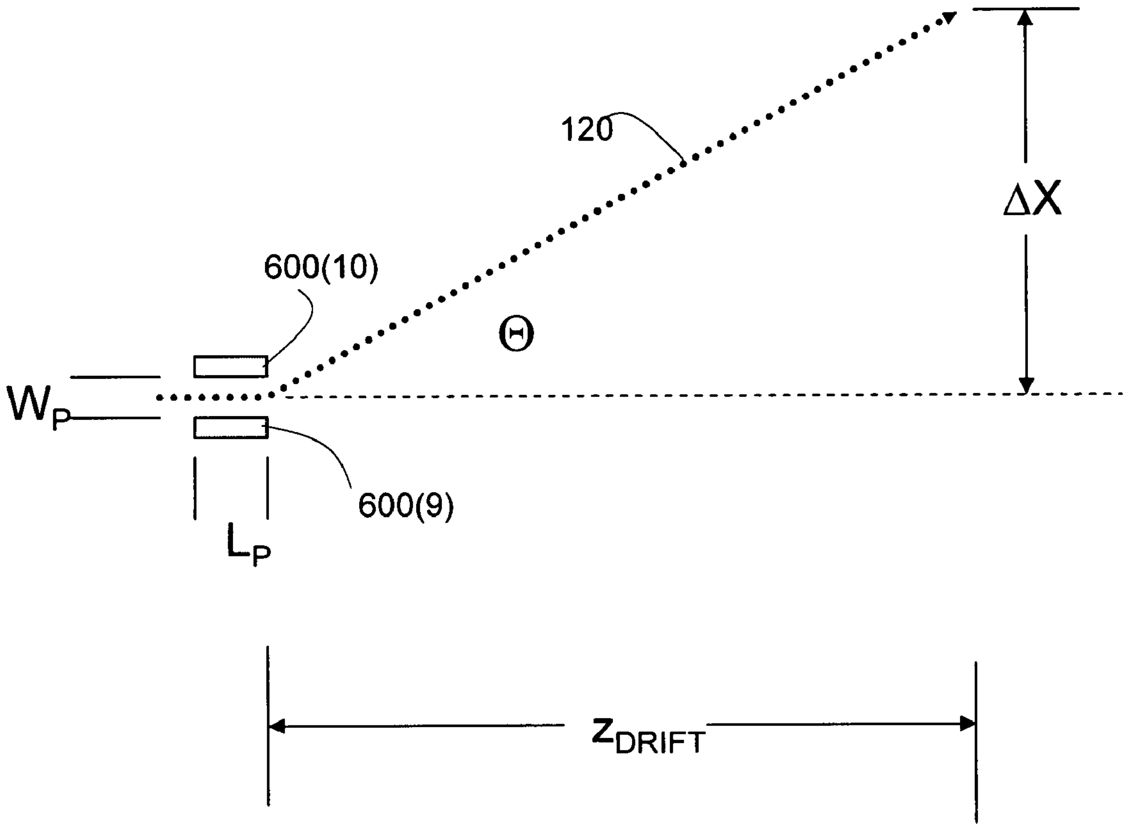
FIG. 33 shows how a deflection angle relates to a drift cavity length and a beam displacement across the drift cavity.

FIG. 33 shows how a deflection angle θ relates to a drift cavity length $z_{drift}$ and a beam displacement ΔX across the drift cavity. A voltage applied across deflector plates 600(9) and 600(10) deflects beam 120 by deflection angle θ, resulting in a displacement ΔX as the beam passes through a drift cavity with length $z_{drift}$.

Deflector plates only approximate parallel plates, both in physical construction and in transfer function, but the parallel plate approximation may be used for most calculations. The essence of the approximation is that a one-dimensional, uniform electric field exists between two plates; from this, a basic relation may be derived for the deflection angle θ in response to an input signal ΔV. For a parallel plate deflector of plate spacing $W_P$ and plate length $L_P$, a ratio of lateral transverse beam velocity $v_x$ (imparted by the deflection process) to a longitudinal beam velocity $v_z$ is $$\frac{v_x}{v_z} = \sqrt{\frac{\Delta V}{2V_{BEAM}}} = \tan\Theta = \frac{W_P}{L_P}\frac{\Delta X}{z_{drift}} \tag{1.12}$$

where beam energy is $V_{BEAM}$ (in volts). ΔX is lateral displacement of a beam after propagating across a drift region of length $z_{drift}$ between the deflector and the detector plane.

Within an electron-beam amplifier, a ratio $G_{BEAM}$ of lateral beam displacement to a corresponding change in a deflection signal is $$G_{BEAM} = \frac{\Delta X}{\Delta V_{SIG}} = z_{drift}\frac{L_P}{W_P}\frac{1}{2V_{BEAM}} \tag{1.13}$$

For example, with appropriate choice of $W_P$ and $L_P$, a spot of a 100 eV beam may be deflected 71 μm per volt of signal at the detector when drift length $z_{drift}$ is 1 mm. Longer drift lengths, longer deflectors and smaller plate spacings increase $G_{BEAM}$; higher beam energies reduce $G_{BEAM}$.

A collection gain $G_{coll}$ is a differential current collected by the detector with respect to a change ΔX in beam spot position. $G_{coll}$ may depend on width and geometry of a detector. As discussed above, an electron-beam amplifier may be constructed so that its detectors collect substantially all available beam current when a beam is fully deflected across a detector width $X_D$:

$$G_{coll}=I_{BEAM}/X_D. \tag{1.14}$$

With $k_C$ and $k_A$ representing detector cascade and avalanche gain factors respectively, and $k_D=k_C\cdot k_A$ representing total detector gain, the above formula for $G_{coll}$ may be multiplied by $k_D$ to give the total amplifier transconductance gain $g_m$, the change in differential output current between the detector segments, with respect to a change of input signal:

$$g_m = \frac{\Delta I_{out}}{\Delta V_{in}} = G_{BEAM}\,G_{coll}k_Ck_A = z_{drift}\frac{L_P}{W_P}\frac{1}{2V_{BEAM}}\frac{I_{BEAM}}{X_D}k_D \tag{1.15}$$

Parameters $W_P$, $L_P$, $z_{drift}$ and $V_{BEAM}$ can be selected so that:

$$g_m = \frac{I_{BEAM}}{\Delta V_{in(\max)}}k_D \tag{1.16}$$

For example, if $I_{BEAM}$=100 μA, $\Delta V_{in}$=1V p-p (i.e., +/−0.5V) and $k_D$=1000, the transconductance gain is 100 mS (A/V). However, longer drift regions, smaller detectors and other parametric variations may allow an electron-beam amplifier to provide substantially higher gain from the amplifier, and ganging electron-beam amplifiers can provide even higher gain. Moreover, amplification may be very linear, so an electron-beam amplifier 10 may provide more usable gain than known amplifiers.

Deflector Frequency Response

Microfabrication also offers an advantage in terms of high frequency performance. When deflector plates (e.g., deflector plates 600) are shrunk to micron-scale dimensions, frequency response between input and output increases dramatically. Physically, the finite bandwidth of a deflector (e.g., deflector 130(1) consisting of matched deflector plates 600) can be understood as the time it takes a single electron to pass through the deflectors, since dynamic changes in deflector drive voltage will filter and average the deflection. For example, first define a transit time τ as the time it takes an electron to traverse the region between deflector plates. If a drive voltage is positive for half of τ and equally negative for the other half of τ, it can be appreciated that the net deflection will be zero. Thus, transit time τ should be designed as much less than a period of a maximum signal frequency. In a parallel plate deflector, a relation of 3 dB bandwidth to τ, or to beam velocity $v_z$ and plate length $L_P$, may be derived as $$f_{3DB} = \frac{.442}{\tau} = 0.442\frac{v_Z}{L_P} \tag{1.17}$$

When beam velocity is expressed in terms of the total electron gun accelerating potential $V_{BEAM}$, the response is $$f_{3DB} = \frac{262\cdot 10^3}{L_P}\sqrt{V_{BEAM}} \tag{1.18}$$

where $f_{3DB}$ is the frequency at which the deflection gain is reduced to 0.707 (3 db) of the low frequency response.

Table 1 shows electron-beam amplifier physical and electrical parameters for selected values of $V_{BEAM}$, $V_{in}$ and $L_P$. All entries in Table I assume $W_P$ is 1 μm and $z_{drift}$ is 1000 μm. As shown in Table 1, frequency response of the deflector may exceed 1 THz. $X_{DET}$ The calculated values of $f_{3DB}$, tan Θ, and

TABLE 1

| $V_{BEAM}$ (volts) | $V_{in}$ (mv) | $L_P$ (μm) | $f_{3DB}$ (GHz) | tanΘ | $X_D$ (μm) |
|---|---|---|---|---|---|
| 10 v | 30 mv | 25.8 | 32 | .0387 | 154.8 |
| 10 v | 300 mv | 8.2 | 101 | .123 | 492 |
| 50 v | 30 mv | 57.7 | 32 | .0173 | 31 |
| 50 v | 300 mv | 18.25 | 101 | .055 | 98.4 |
| 200 v | 30 mv | 115 | 32 | .0087 | 7.7 |
| 200 v | 300 mv | 36.5 | 101 | .0274 | 24.6 |
| 1000 v | 30 mv | 10 | 828 | .0274 | 0.6 |
| 1000 v | 300 mv | 3 | 2760 | .0274 | 1.8 |

Dimensions and construction of detectors permit similar bandwidth, for example, where these bandwidths are where the gain is only down by 3 db compared to a low frequency response. Unity gain frequency response, or gain-bandwidth product, is another common measure of amplifier performance. With a voltage gain of 10, the gain-bandwidth product of an electron-beam amplifier may be 10 THz. Though an electron-beam amplifier has the potential for THz performance, gain-bandwidth product can be used as a figure of merit to assess usable gain at any frequency, or to determine the ultimate performance potential, or to make comparisons to other technologies. By way of comparison, a single-stage HEMT amplifiers may have gain-bandwidth products of about 400 GHz.

High Power Output.

Power output may be increased substantially by ganging amplifiers. A 100 gun array may have only 0.9 fF loading capacitance, so small that many amplifiers can be ganged and driven in parallel with little loss of bandwidth. For example, one electron-beam amplifier driven by a 50 ohm source may have an input bandwidth of 3.6 THz. Ten electron-beam amplifiers driven in parallel by a common 50 ohm source impedance may have an input bandwidth of 360 GHz, still high enough to pass most input frequencies, and the parallel gang provides 10 times the power output of a single amplifier. Similarly, a gang of 100 electron-beam amplifiers may have 100 times the power output, at 36 GHz.

With a hierarchical or "corporate" power input distribution system (see FIG. 64) amplifiers may "fan out" to drive progressively more and more amplifiers.

By this means, a microfabricated electron-beam amplifier array may include as many as millions of amplifiers on a single silicon wafer, and the entire amplifier array may be driven from a single source. The total coherent power output of the amplifier array may exceed 10 kW, while preserving the wide bandwidth of individual amplifier elements. It can be appreciated that the ability to gang many amplifiers is one characteristic of electron-beam amplifiers for applications that require very high, wideband power output.

Efficiency

Another benefit is power-added efficiency ("PAE"). This is the RF power that is added to the output of an amplifier (i.e., $P_{OUT}-P_{IN}$) as a percentage of total amplifier power $P_{IN}$, including thermal losses:

$$PAE = 100\% \times \frac{P_{OUT} - P_{IN}}{P_{TOT}} \tag{1.19}$$

Conventional semiconductor amplifiers can provide high power gain, but often have low efficiency, or somewhat higher efficiency over a narrow band of operation at relatively low frequencies (up to around 10 GHz). TWTs can provide much higher power output over an octave or more of bandwidth, with PAE approaching 50% in the best devices, but with a significant power overhead required to heat thermionic cathodes and generate a high-voltage collector bias (10 kV or more). For this reason, TWTs rarely operate with less than 100 watts of power, which is undesirable in many applications.

In contrast, an electron-beam amplifier 10 may provide high power gain (60 dB or more) in a miniature device dissipating as little as milliwatts of total power, or as much as many watts, at a PAE exceeding 50%.

A total amplifier power is approximately $P_{TOT}=P_{BEAM}+P_{supp}$, where $P_{BEAM}$ is the beam power and $P_{supp}$ is the total detector power into the output power supply, $V_{supp}$. The total beam power is $P_{BEAM}=I_{BEAM}V_{BEAM}$., where $V_{BEAM}$ is the beam energy in electron-volts (i.e., the acceleration potential) and $I_{BEAM}$ is the beam current.

The supply power due to detector current is $P_{supp}=I_0V_{supp}$ when a constant power supply absorbs a constant total current $I_0=k_{DET}I_{BEAM}$ from two detector segments (i.e., nearly 100% of the beam is over one detector segment or the other). If each detector segment terminates in a load resistor of value R, the optimum amplifier efficiency occurs for the largest output voltage swing within $V_{supp}$. That is, if the signal is sinusoidal, the current output waveform from a single detector is $$i(t) = \frac{I_0}{2}(1 + \cos \varpi t) \tag{1.20}$$

and the maximum voltage across the load resistor is $V_{supp}=I_0R$. Detector current causes an output voltage to swing between 0 to $V_{supp}$ across the load R (ignoring certain factors such as a minimum detector bias for generating detector gain $k_{DET}$, but this is a reasonable approximation). Given these assumptions, supply power is $$P_{supp}=I_0V_{supp}=I_0^2R \tag{1.21}$$

If all of the RF power from one detector segment is dissipated in the load, the RF power output is $$P_1 = \frac{1}{T}\int_0^T i^2 R\,dt, \tag{1.22}$$

averaged over one period T of the RF. Normalizing over an angle θ from 0 to 2π, $$\begin{aligned} P_1 = {} & \\ & \frac{1}{2\pi}\int_0^{2\pi}\left(\frac{I_0}{2}(1+\cos(\theta))^2 R\,d\theta = \frac{I_0^2R}{4}\frac{1}{2\pi}\int_0^{2\pi}(1+\cos(\theta))^2\,d\theta = \right. \\ & \frac{I_0^2R}{4}\frac{1}{2\pi}\int_0^{2\pi}(1+2\cos(\theta)+\cos^2(\theta))\,d\theta = \\ & \frac{I_0^2R}{4}\frac{1}{2\pi}\int_0^{2\pi}\{1+2\cos(\theta)+0.5(1+\cos(2\theta))\}\,d\theta = \\ & \frac{I_0^2R}{4}\frac{1}{2\pi}\left\{\theta+2\sin(\theta)+0.5\left(\theta+\frac{1}{2}\sin(2\theta)\right)\right\}_0^{2\pi} = \\ & \frac{I_0^2R}{4}\frac{1}{2\pi}\{2\pi+\pi\} \end{aligned} \tag{1.23}$$

and finally the RF output power from one detector segment is $$P_1 = \frac{3}{8}I_0^2R, \tag{1.24}$$

The total RF output load power $P_{LOAD}$ from both detector segments is twice $P_1$, or $$P_{LOAD} = 2P_1 = \frac{3}{4}I_0^2R \tag{1.25}$$

While certain RF amplifiers do not have a simple resistive load from which to calculate a transmitted $P_{OUT}$, a good first approximation is to use $P_{OUT}=P_{LOAD}$.

Assuming an e-beam of 50 μA accelerated to a 200V potential, beam power $P_{BEAM}$ is 10 mW. If a detector has a gain of 2000, $I_o$=100 mA. If an output load is 20 ohms, $P_{LOAD}$=200 mW and $P_{OUT}$=150 mW. Using these assumptions, $P_{TOT}$=110 mW. If the input is from a 50 ohm source with an amplitude of $V_{IN}$=0.1V (peak), then $P_{IN}=V_{IN}^2/(2\times 50)=0.1$ mW. From these numbers, $$PAE = 100\%\cdot\frac{150\text{ mW} - 0.1\text{ mW}}{210\text{ mW}} = 71.4\%$$

This PAE compares favorably with solid-state or TWT amplifiers, but at higher frequencies and wider bandwidth.

Even higher PAE can be achieved in a specialized device that excites a resonant load with a non-sinusoidal pulsed current drive. If a detector is overdriven to operate as a photoconductive switch in such a case, the efficiency can approach 90% or more. Thus, it can be appreciated that electron-beam amplifier 10 may provide performance comparable to, or exceeding, that of known devices.

If amplifier power gain $G_P$ is high, the input power $P_{IN}$ is small with respect to the output power $P_{OUT}$. An electron-beam amplifier 10 may can achieve values of $G_P>10^6$, so $$PAE = 100\%\times\frac{P_{OUT}-P_{IN}}{P_{TOT}} = 100\%\times\frac{P_{OUT}}{P_{TOT}}\left(1-\frac{1}{G_P}\right)\approx 100\%\times\frac{P_{OUT}}{P_{TOT}} = 100\%\times\frac{\frac{3}{4}I_0^2R}{I_0^2R+P_{BEAM}} = 100\%\times\frac{0.75}{1+\frac{P_{BEAM}}{I_0^2R}} \tag{1.26}$$

$$PAE = \frac{75\%}{1+\frac{P_{BEAM}R}{V_{supp}^2}}$$

This brings out the useful result that increasing output power supply voltage increases the efficiency (for example, by using a high breakdown strength detector material with high detector current), and decreasing the load resistance or the beam energy increases the efficiency, but the maximum efficiency can never be greater than 75%.

To understand the relation between detector gain, detector breakdown $V_{BV}$ and beam energy, let $$V_{supp}=V_{BV}=I_OR=k_{DET}I_{BEAM}R. \tag{1.27}$$

As discussed above, detector gain is the product of the cascade and avalanche gain, $k_{DET}=k_Ck_A$, and the cascade gain $k_C$ is given approximately by $k_C=V_{BEAM}/V_{CI}$, where $V_{CI}$ is the cascade ionization energy of the detector material. Solving for $I_{BEAM}$, $$I_{BEAM} = \frac{V_{BV}}{k_{DET}R} = \frac{V_{BV}V_{CI}}{k_AV_{BEAM}R}. \tag{1.28}$$

Substituting into $P_{BEAM}=I_{BEAM}V_{BEAM}$, the power added efficiency is $$PAE = \frac{75\%}{1+\frac{V_{BEAM}R}{V_{BV}^2}\frac{V_{BV}V_{CI}}{k_AV_{BEAM}R}} = \frac{75\%}{1+\frac{V_{CI}}{V_{BV}k_A}}. \tag{1.29}$$

Notably, the beam energy and load resistance does not affect PAE. PAE is highest with a detector material that has the highest ratio of $V_{BV}/V_{CI}$, and a detector structure with a high avalanche gain. Table 2 gives material parameters $V_{CI}$, $E_{BV}$, and $V_{BV}$ for certain materials.

TABLE 2

$V_{CI}$, $E_{BV}$, and $V_{BV}$ for various materials and heterostructures

| Material | Cascade Ionization Energy, $V_{CI}$ (V) | Breakdown Field, $E_{BV}$ ($\times 10^7$ V/m) | Breakdown voltage, $V_{BV}$ (V) @ $t_{DET}$ = 1000 Å | $V_{BV}/V_{CI}$ |
|---|---|---|---|---|
| InAs | 1.8 (est) | <1 | <1 | <0.55 |
| Ge | 2.8 | 1 | 1 | 0.36 |
| Si | 3.6 | 3 | 3 | 0.83 |
| GaAs | 4.3 | 4 | 4 | 0.93 |
| InP | 4.2 | 5 | 5 | 1.2 |
| 3CSiC | 7.2 | 10 | 10 | 1.4 |
| 4HSiC | 9.5 | 40 | 40 | 4.2 |
| GaN | 8.9 | 50 | 50 | 5.6 |
| | | heterostructures | | |
| Ge—Si | 2.8 | 3 | 3 | 1.07 |
| Ge—GaAs | 2.8 | 4 | 4 | 1.43 |
| InAs—GaAs | 1.8 | 4 | 4 | 2.22 |
| InAs—InP | 1.8 | 5 | 5 | 2.78 |

Thermal Heating.

High PAE corresponds to high thermal efficiency, which may be another benefit of electron-beam amplifier 10. With high detector gain and low beam current, little joule heating of the detector by a high energy beam occurs, so little power is wasted. For example, a 280 eV beam of 100 μA dissipates only 28 mW of power in detector heating, while generating 100 mA of diode current. Actual temperature rise of a detector is insignificant, on the order of a few degrees for typical semiconductor coefficients of thermal conductivity (eg, 100 degrees C. per watt).

Power Transformation

Electron-beam amplifier 10 is also an efficient power transformer, insofar as it converts a high-impedance, low-power input signal (a deflection voltage) to a low-impedance, high-power output signal (a detector current into a load network). This is another benefit of a high gain detector. A power-transforming advantage provided by electron-beam amplifier 10 is evident in radiating embodiments, as explained below.

Noise Figure

Noise in electron-beam amplifier 10 is predominantly shot noise. In an electron beam (e.g., composite electron beam 110), shot noise current $i_{NB}$ for a bandwidth Δf is spectrally white and is described by $$i_{NB}=\sqrt{2qI_{BEAM}\Delta f}(RMS,\text{Amps}/\sqrt{\text{Hz}}) \tag{1.30}$$

This is true because field emission obeys Poisson statistics, which are characteristic of current across a barrier potential. The detector introduces noise primarily through the avalanche gain. The cascade gain is essentially noise free, but the beam noise is amplified by the total detector gain. It can be shown that with sufficient cascade gain, the noise introduced by an avalanche process is negligible.

Shot noise is characteristic of a quantized current flow. The quantization in normal semiconductors arises from discrete charge quantities of electrons moving across a potential barrier, such as a P-N or Schottky junction. Shot noise in an e-beam is similar, since the charge quantities are still electrons. The effect of cascade gain on detector noise can be inferred from this. Each beam electron that penetrates the detector generates a cascade of $k_C$ electrons in only a few femtoseconds. The time frame of the cascade is so short that the effect is equivalent to a single particle of charge $k_Cq$ (where $k_C$ is as defined above) striking a detector which has no cascade gain. Thus, the cascade-amplified beam current has a noise power $i_{ND}$ that is still described by shot noise power:

$$i_{ND}^2 = 2(k_C q)I_{BEAM}\Delta f = 2(k_C q)\frac{dQ_{BEAM}}{dt}\Delta f = 2(k_C q)(k_C q)\frac{dn_{BEAM}}{dt}\Delta f \quad (1.31)$$

where $I_{BEAM}$ is first rewritten as $dQ_{BEAM}/dt$ and then as $qdn_{BEAM}/dt$, with n being a number of electrons. In effect this can be rearranged as $$i_{ND}^2=2q(k_C^2 I_{BEAM})\Delta f. \quad (1.32)$$

This is exactly the noise of an ideal amplifier, showing that the cascade process introduces no excess noise. If a Noise figure NF is defined as $$NF=10\log(1+N_{ADDED}/N_{IN}), \quad (1.33)$$

where $N_{IN}$ is an ideal minimum input noise and $N_{ADDED}$ is the noise added by an amplifier, referred to the input, the cascade process is seen to have a noise figure near 0 dB. This can be understood by considering the noise added to a single beam electron—there is none, since the assumption is that each is exactly multiplied by the cascade factor $k_C$. The total noise power, however, increases as the square of the gain because gain refers to current amplification, not power; hence the factor $k_C^2$. This is characteristic of any kind of amplifier.

By contrast, avalanche multiplication introduces noise through two mechanisms: multiplication of diode leakage current, and excess noise factor, which describes the statistical fluctuations in the multiplication arising from the sequence of hole or electron impact ionization events. Neglecting leakage, avalanche noise is given by $$i_{NA}^2=2qFk_A^2 I_C\Delta f \quad (1.34)$$

where $I_C$ is the beam current after multiplication by the cascade, $k_A$ is the avalanche gain, and F is the avalanche excess noise factor. F is a device specific parameter that is typically greater than 2, varying from 3 in silicon to 9 for germanium. The total noise at the output of the detector is $$i_{ND}^2=2qk_A^2 k_C I_{BEAM}(k_C+F)\Delta f. \quad (1.35)$$

If $k_C$>>*F, this simplifies to*

$$i_{ND}^2=2qk_D^2 I_{BEAM}\Delta f \quad (1.36)$$

where $k_D=k_A k_C$, the total detector gain. Thus, a requirement for low noise detector operation is a cascade gain much higher than the excess avalanche noise. In one embodiment of the detector, the cascade occurs in a thin germanium layer and the avalanche takes place in a silicon layer. For example, a 280 eV beam will have a cascade gain of approximately 100 in germanium. A silicon avalanche diode can be optimized for F=3. Thus, it can be seen that the effect of avalanche excess noise is small, and for certain embodiments, the detector essentially operates as a noiseless amplifier (noise figure=0 dB). This is a key benefit of electron-beam amplifier 10.

Radiation Tolerance

Another benefit of electron-beam amplifier 10 is high radiation tolerance. An e-beam itself is inherently immune to radiation levels, and an energy flux of e-beams in electron-beam amplifier 10 is much greater than an energy flux of natural radiation (even in a low earth orbit of 700 km, where radiation is high). The primary effect of radiation on electron-beam amplifier 10 is leakage across diode junctions because of hole-electron pairs generated when high energy particles pass through semiconductors. High-energy electrons and protons are both significant, but the effect is similar. Under most natural conditions an effect of radiation may be a small increase in detector noise.

Beam Focusing in a Microminiaturized Amplifier

As discussed above, space charge induced beam spreading is mitigated by several means, including high detector gain to reduce beam current requirements, and by using electron gun arrays 100 to increase beam diameter. In a microminiaturized high-speed electron-beam amplifier 10 beam spreading may be significant, because small detector(s) 150 are necessary to achieve the high speed, and a beam spot 170 may be small, to match the detector. For operation above 100 GHz, a detector size of less then 10 μm is preferred. If a 100 μm diameter electron gun array is used, this means a 10:1 reduction in a diameter of a resulting composite beam 110 may be achieved by focusing action in a drift cavity 145. It can be appreciated that a means of overcoming space charge spreading forces to compress a composite beam diameter from approximately 100 um at an emission plane 20 (in a microminiaturized device) to a spot diameter that may be at least 10 times smaller at a detector plane 50 improves performance of an e-beam amplifier 10.

Improved Embodiment for Small Beam Spot

An improved electron beam amplifier 10 includes electron beam focusing in a drift cavity 145, providing higher beam current, higher power output, lower thermal heating, lower noise and higher efficiency.

Figure 34:
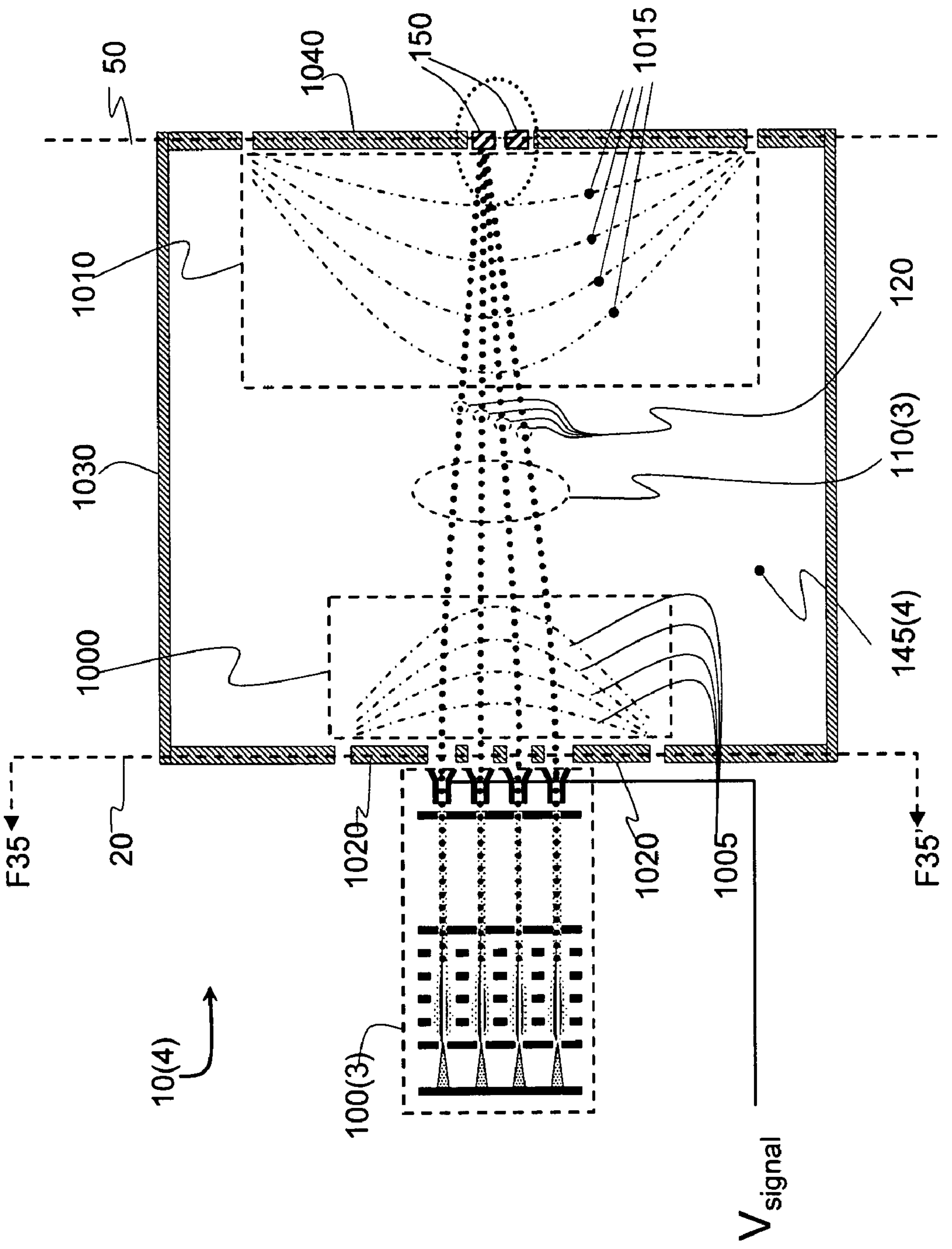
FIG. 34 shows a schematic cross-section of an electron-beam amplifier including array beam focusing.

FIG. 34 shows a schematic cross-section of an electron-beam amplifier 10(4) including array beam focusing. An array of parallel electron beams 120 forming composite beam 110(3) exits an electron gun array 100(3) at emission plane 20, into drift cavity 145(4). In drift cavity 145(4) composite beam 110(3) is subjected to focusing fields of an electron lens 1000 generated by a potential difference between two electrodes 1020 and 1030, as shown. The dashed rectangle indicating electron lens 1000 is an abstraction of its general position, and does not mean the lens acts only within the region of the rectangle. Equipotential lines 1005 show the action of a decelerating field in electron lens 1000 in the same manner as equipotential lines 760 of FIG. 26. These focusing fields impart an inwardly directed radial momentum to composite electron beam 110(3) so that the outer electrons arrive at a desired spot diameter when they reach detectors 150. The imparted momentum may also compensate for space charge repulsion effect as beam 110(3) compresses. Thus, electron lens 1000 focuses beam 110(3) via a constricting force that decreases the large diameter of beam 110(3) as it leaves emission plane 20 to a smaller diameter, rendering a small beam spot at detectors 150.

Doublet Lens System

A second electron lens 1010, using an accelerating potential at the detector plane, creates a doublet lens arrangement of electrodes 1020, 1030 and 1040 to provide improved beam compression, cascade gain, and aberration correction. As also shown in FIG. 34, electrodes 1030 and 1040 comprise electrodes of second lens 1010 (shown in an abstract sense by a dashed rectangle). A higher potential of electrode 1030 relative to electrode 1040 generates an accelerating field, and the relationship of electrodes 1030 and 1040 generates field gradients that create an inward radial force, compressing beam 110. Equipotential lines 1015 show the action of a accelerating field in electron lens 1000 in the same manner as equipotential lines 760 of FIG. 25. Additional energy imparted to beam 110 by the accelerating field contributes to detector cascade gain.

In electron-beam amplifier 10(4), electrodes 1020 and 1040 are circular discs surrounding the electron gun array and the detectors respectively. Electrode 1030 is an annular can or "drift can" partially closed at both ends by endplates, as shown in FIG. 34.

Figure 35:
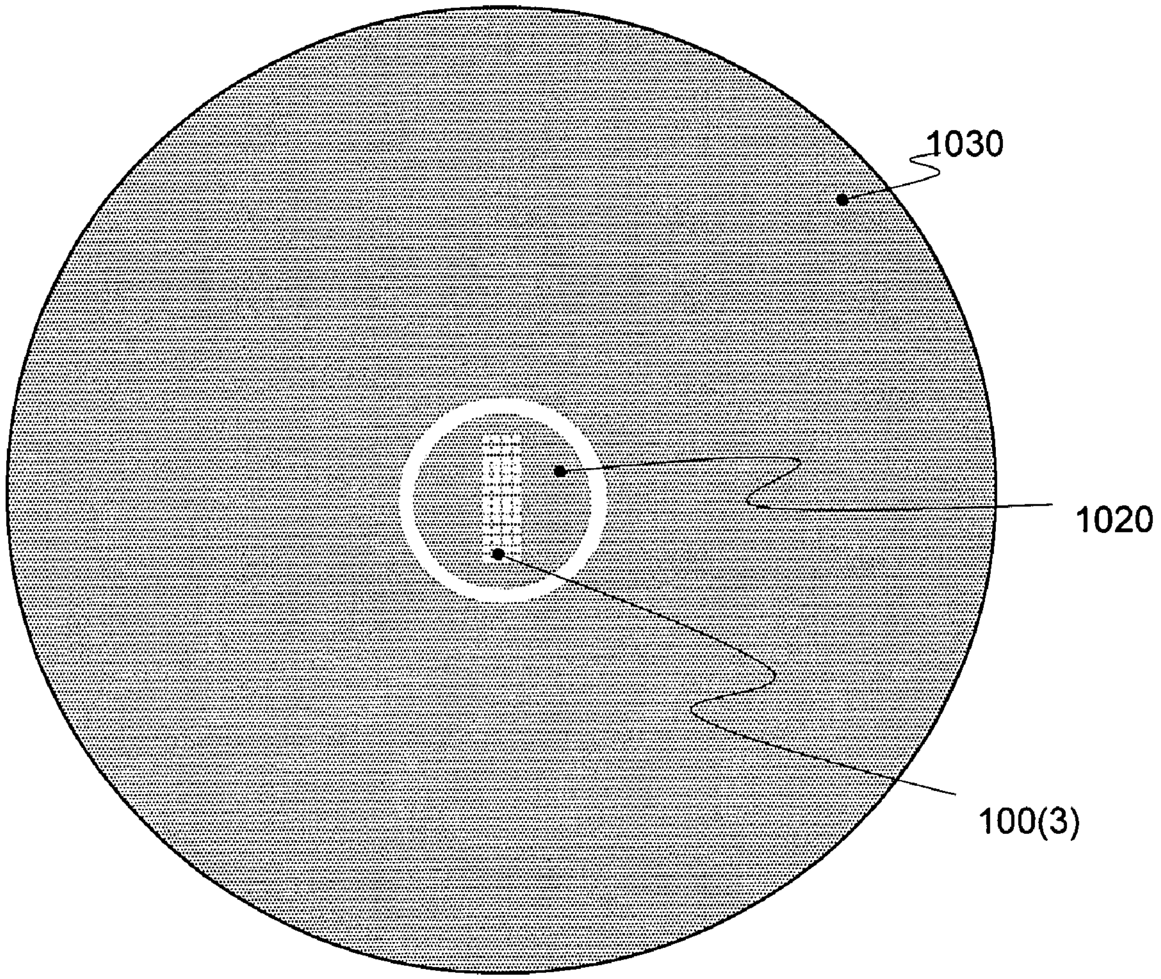
FIG. 35 shows a midsectional plan view of a drift cavity within the electron-beam amplifier of FIG. 34.

FIG. 35 shows a midsectional plan view of drift cavity 145(4) within electron-beam amplifier 10(4) along lines F35-F35' of FIG. 34. Electrode 1020 is centered in a perforation of electrode 1030 in emission plane 20. A small gap separates electrode 1020 from electrode 1030, as shown. Electrode 1020 completely surrounds electron gun array 100(3) in emission plane 20.

Similarly to FIG. 35, and as shown cross-sectionally in FIG. 34, electrode 1040 is centered in a perforation of electrode 1030 in detector plane 50, and electrode 1040 completely surrounds detectors 150 in detector plane 50.

In electron-beam amplifier 10(4), electrode 1030 may be at ground potential. Electron lenses 1000 and 1010 achieve focusing action through positive potentials on electrodes 1020 and 1040; the potential of electrode 1040 being substantially greater than the potential of electrode 1020, to provide acceleration through the drift cavity. For example, electrode 1020 might be at 50V and electrode 1040 might be at 300V.

The structure may be considered a doublet of two lenses. Both electron lenses 1000 and 1010 achieve lens action by the geometrical relationships of the sizes and the potential differences among electrodes 1020, 1030 and 1040, in a manner similar to that described above with respect to electron optics electron guns. The effect of using discs for electrodes 1020 and 1040, each in a common plane with electrode 1030, may be seen as making one of distances $x_{13}$ or $x_{23}$ in FIG. 25 equal to zero.

According to the electromagnetic theory of superposition, the fields of electron lenses 1000 and 1010 may overlap, but the lenses may be treated as if they act independently. Both lenses 1000 and 1010 may be considered "immersion lenses," since electron gun emission occurs inside lens 1000 and beam detection occurs inside lens 1010.

Since electron beam emission consists of parallel rays at emission plane 20, an optical "object" for the emission is virtually located at infinity behind the emission plane. The "image" of this "object" is a focal length away from a principal plane on an image side of a two lens system. The term "principal plane" from geometrical optics describes a point from which a focal length is measured in an optical system that has a non-zero thickness; there are two principal planes, one on an object side, and one on an image side (which in e-beam amplifier 10(4) is a region of drift cavity 145(4) towards detector plane 50).

An advantage of a doublet lens is that focusing and acceleration occur simultaneously. If only lens 1010 were used, the focusing action is not as strong because the short distance to detector 150 and the accelerating field reduce a transit time over which radial forces can act. If only lens 1 is used, the focusing action is strong because an inward momentum is imparted just past the emission plane, but a retarding field slows the beam, increasing transit time and reducing beam energy and detector cascade gain. A doublet lens provides the benefits of strong focusing and acceleration. Furthermore, a doublet lens provides extra degrees of freedom to correct for other well known optical phenomena such as spherical aberration, coma and field curvature.

Certain embodiments of an electron-beam amplifier may use only one electron lens. For example, in embodiments using single electron guns that are independently deflected by multiple signals, an electron lens like lens 1000 may be undesirable. In embodiments using multiple beams, an electron lens like lens 1010 may be undesirable. Several electron-beam amplifiers in which these considerations apply will be discussed below.

Parallel Beam Deflection and Focusing

In FIG. 34, electron gun array 100(3) delivers an essentially parallel array of electron beams 120 to lens 1000 within drift cavity 145(4). A distributed deflection apparatus (not shown) may deflect each electron beam 120 in response to a signal, but beams 120 remain parallel at emission plane 20. From the foregoing theory, beams 120 appear to come from a virtual object point at an infinite distance behind emission plane 20, at an angle determined by a deflection apparatus. Parallel beams are preferred because they are easily generated from an array of electron guns. Furthermore, the parallelism makes it possible to focus the rays at any deflection angle, since they all appear to come from an object at infinity.

Figure 36:
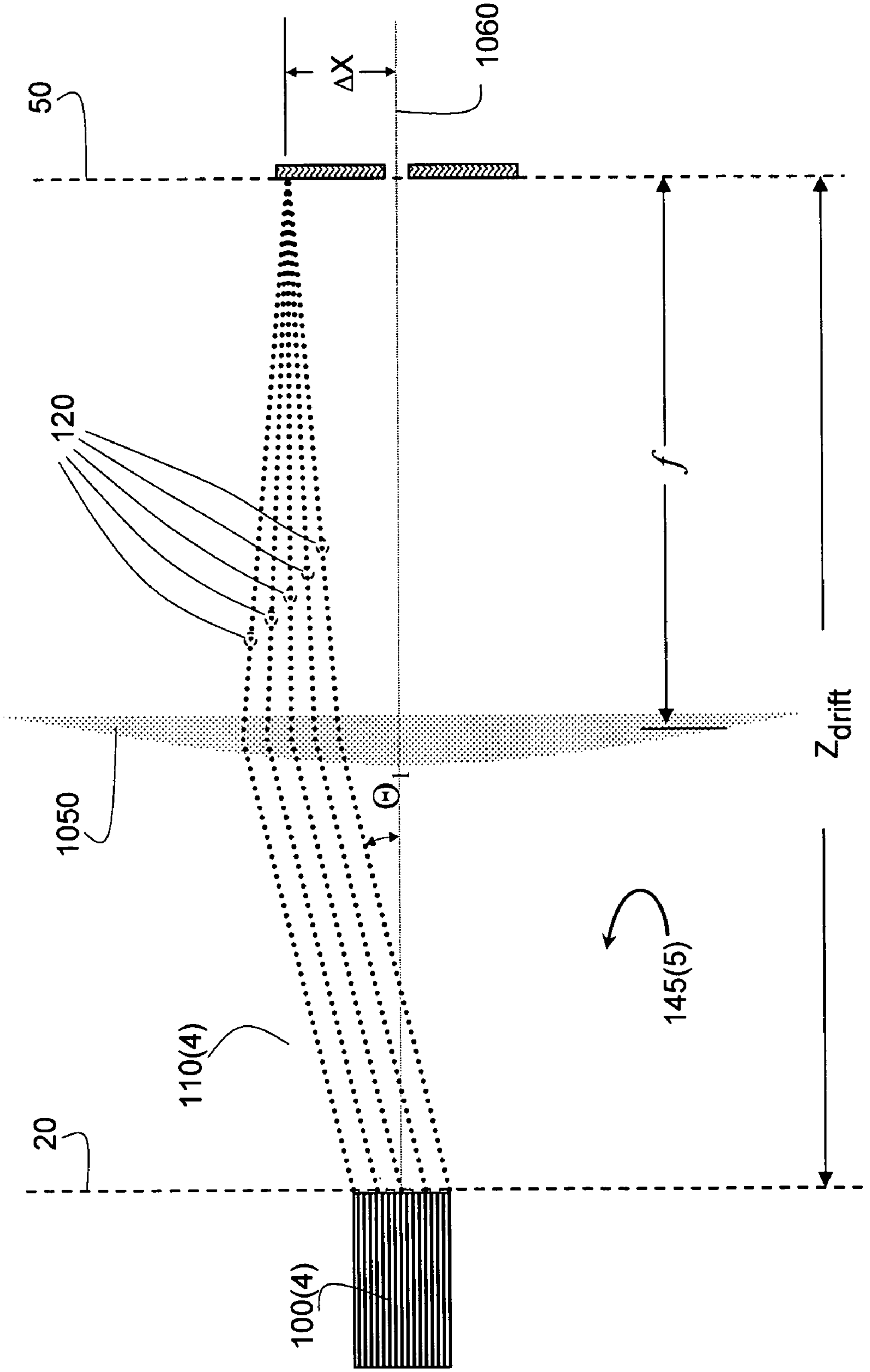
FIG. 36 shows a schematic cross section of a virtual lens focusing a composite electron beam in a drift cavity.
Figure 37A:
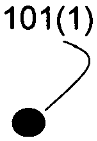
FIG. 37A through FIG. 37H show representative electron gun array shapes and corresponding electron beam spots.
Figure 37B:
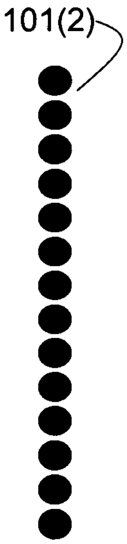
Figure 37C:
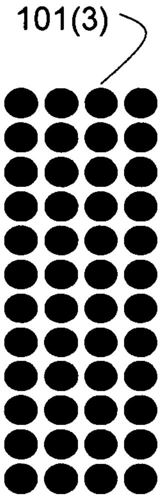
Figure 37D:
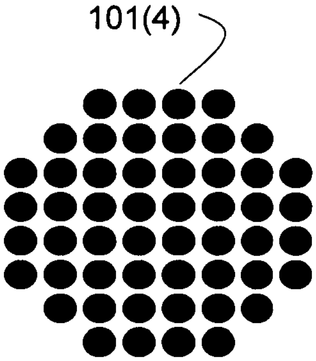
Figure 37E:
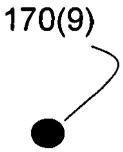
Figure 37F:
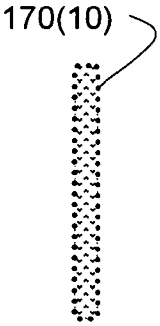
Figure 37G:
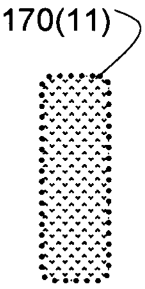
Figure 37H:
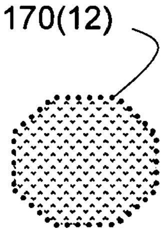

FIG. 36 shows a schematic cross section of a virtual lens 1050 focusing a composite electron beam 110(4) in a drift cavity 145(5). Deflectors (not shown) within electron gun array 100(4) deflect each electron beam 120 through an angle Θ at emission plane 20. Virtual lens 1050 illustrates the focusing action of an electron lens, and focuses parallel electron beams 120 on an image plane which is detector plane 50, a focal length f away from the virtual lens. According to geometrical optics, an angle of deflection is preserved across the principal plane, so a displacement ΔX of a focal point from an optical axis 1060, at detector plane 50 is related to the deflection angle Θ as $$\Delta X = f \sin \Theta. \quad (1.37)$$

For example, if Θ is 10 degrees and f is 1 mm, ΔX will be 174 μm.

Spot Formation

In a first method of spot formation, an electron gun array is arranged with an outline that is the same as an outline of an intended spot, and drift cavity optics image and demagnify electron beams from the array onto a detector. In a second method of spot formation, an array shape and astigmatic focusing optics are chosen to create a desired spot image.

Many spot shapes are possible, ranging from simple points, line spots and rectangles to circles, triangles and more complex shapes.

FIG. 37A through FIG. 37H shows representative electron gun array shapes 101(1-4) and corresponding electron beam spots 170(9-12). Space charge spreading forces are highest for beams corresponding to array shape 101(1); lower forces apply to array shapes 101(2) and 101(3), and the lowest space charge spreading forces apply to array shape 101(4).

Placement of a detector at a focal point of a composite electron beam is undesirable in embodiments of an electron beam amplifier 10 wherein correct operation of the amplifier uses a shaped beam spot by design. To create a shaped spot, a detector may be placed ahead of, or behind, an image plane.

Figures 38A, 38B, 38C:
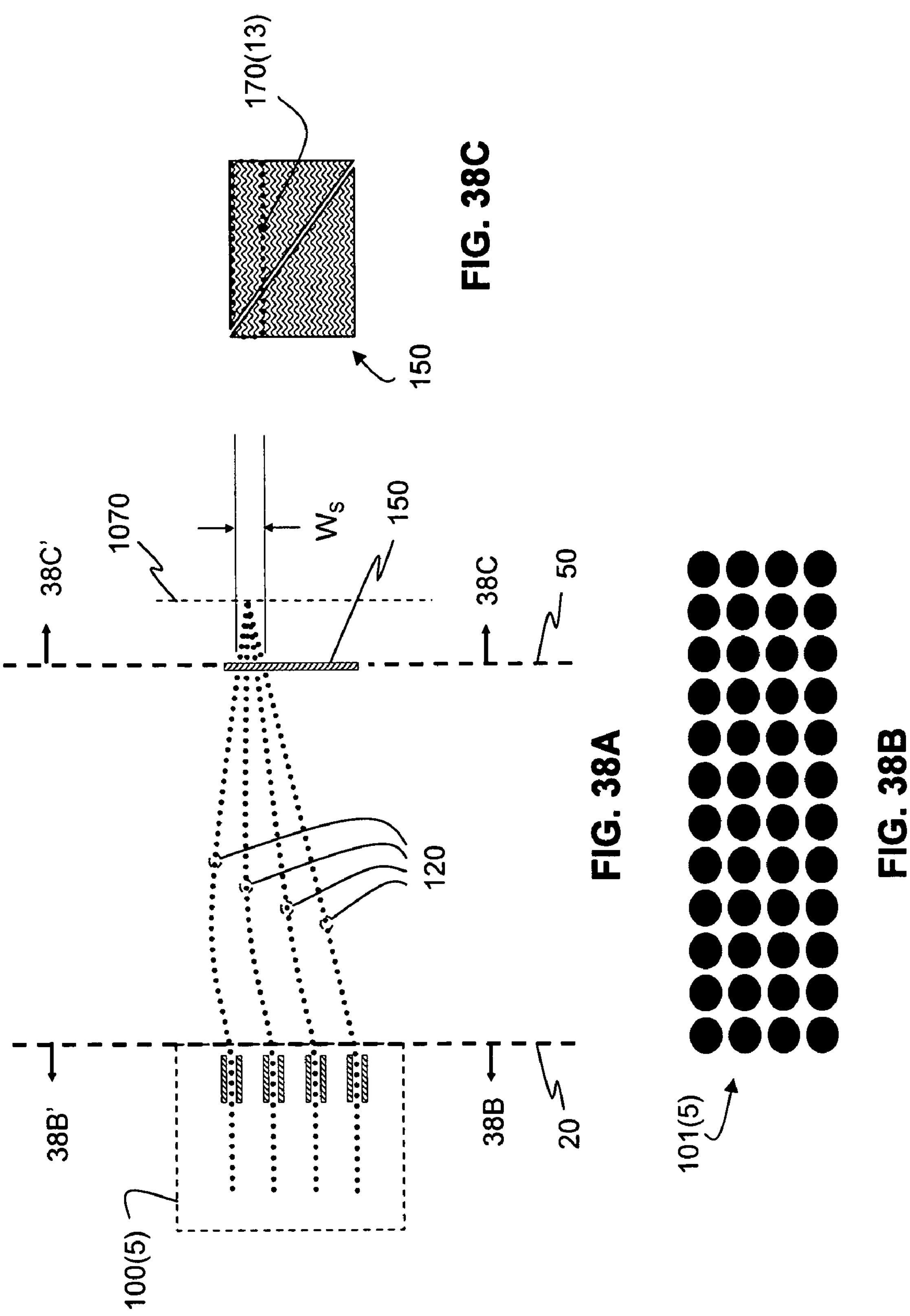
FIG. 38A through FIG. 38C show several views of an electron gun array shape and corresponding electron beams being imaged on detectors.

FIG. 38A, FIG. 38B and FIG. 38C show several views of an electron gun array 100(5), a corresponding electron gun array shape 101(5) and corresponding electron beams 120 being imaged on detectors 150. In FIG. 38A, electron gun array 100(5) emits electron beams 120 at emission plane 20. In FIG. 38B, electron gun array shape 101(5) is a midsectional view of electron guns of electron gun array 100(5) along lines 38B-38B' in FIG. 38A. Electron beams 120 are focused by electron lenses (not shown), aiming the beams so that they converge towards a point on an image plane 1070 in FIG. 38A. However, detector plane 50 and detector 150 are located in front of image plane 1070, causing detector 150 to intercept electron beams 120 before they fully converge. Detector 150 is shown in cross section in detector plane 50 of FIG. 38A, and again in FIG. 38C, in a midsectional view along lines 38C-38C'. Because electron beams 120 are initially parallel, an image of electron gun array 100(5) is preserved in a beam spot 170(13) that has a width $W_S$ on detector 150.

In FIG. 38B, the electron gun array shape 101(5) has an aspect ratio that is the same as an aspect ratio of beam spot 170(13) in FIG. 38C. However, an array shape can be rectangular, circular, oval or other shapes as necessary to match a desired spot shape. A non-uniform spot density can also be generated by selective placement of electron guns within an array.

Astigmatic Optics

An electron beam amplifier 10 may generate a desired focused beam spot 170 with an electron gun array shape 101 that differs from the shape of the beam spot through use of astigmatic focusing optics. Astigmatic focusing optics are asymmetrical about an axis, and have different focal lengths in different axial planes.

Figure 39:
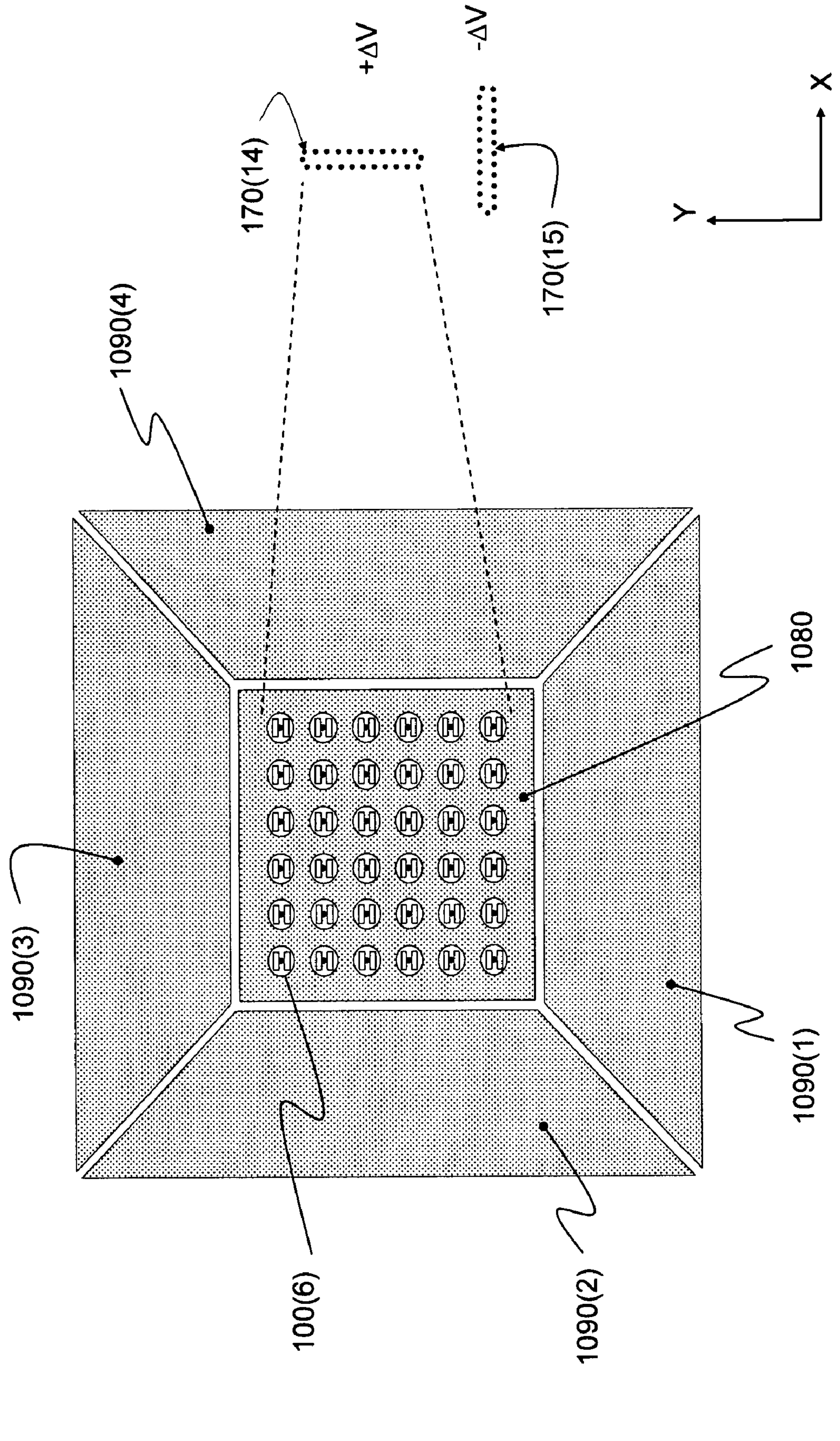
FIG. 39 shows an example of astigmatic focusing electron optics.

FIG. 39 shows an example of astigmatic focusing electron optics. A square electron gun array 100(6) (in midsectional view) emits electron beams through openings in a square first electrode 1080. Electrode 1080 is surrounded by four trapezoidal electrodes 1090(1-4), of which, electrodes 1090(1) and 1090(3) are oriented along the X-axis, and electrodes 1090(2) and 1090(4) are oriented along the Y-axis. Electrode 1080 is connected with a first potential $V_1$. Each opposing pair of trapezoidal electrodes 1090(e.g., 1090(1) and 1090(3), or 1090(2) and 1090(4)) have the same potential, but orthogonal pairs have potentials that differ by a potential $\Delta V$ about an average second potential $V_2$. The effect of a potential difference $V_2-V_1$ is to focus electron beams as they move across a drift cavity; the effect of $\Delta V$ is to create a focusing difference along the two axes that gives rise to two different focal lengths. When $\Delta V$ is positive, beam spot 170(14) will be present on a detector plane (not shown); when $\Delta V$ is negative, beam spot 170(15) will be present. When $\Delta V$ is zero, that is, each of electrodes 1090(1-4) are all at the same potential, a square beam spot (not shown) will be present.

Dynamic alteration of beam spot shape by electrical control of astigmatic electrodes is useful in other embodiments of an electron-beam amplifier, as explained below.

EBRX

From the foregoing, it can be appreciated that an electron-beam amplifier may include various combinations of the following elements: a two-dimensional electron gun array, low-current electron beams, composite electron beams, single or distributed beam deflectors, a drift cavity, drift cavity electron optics that provide focusing and/or beam acceleration, one or more high gain detectors, and one or more output networks; any of these elements may be made through microfabricated construction. Combinations of these elements may be termed here an "EBRX" for Electron Beam RF Amplifier ("X" being a common abbreviation for "amplifier"). As discussed below, certain of these elements are common to many embodiments of an electron-beam amplifier.

Time Delay Control

One embodiment of electron-beam amplifier 10 provides time delay control. Variable time delay is a feature of many RF systems such as, for example, phased array antennas and wideband electronic beam steering. In such systems, radio waves radiated by antenna(s) are timed to adjust a directionality and gain of receiving or transmitting antenna(s). True time delay shifting ("TTDS") has an advantage over simple phase shifting ("PS") in that control is broadband, rather than narrowband. Therefore TTDS is preferred, but traditionally both TTDS and PS have been expensive and complex to implement. Thus, a low cost time delay control of electron-beam amplifier 10 may provide a useful means of antenna beamforming.

In one embodiment, an output signal (e.g., output currents 180) from electron-beam amplifier 10 is variably time delayed by adjusting electron beam energy, thus adjusting electron velocity and transit time of electrons across a drift cavity to a detector. Variable time delay control is an almost free feature of electron-beam amplifier 10, since little extra power is required and physical elements of the amplifier (i.e., electron guns, drift cavity, focusing electrodes, detectors and so on) are not altered. A microfabricated electron-beam amplifier 10 may implement time delay control over a usable range of hundreds of picoseconds, which may support electronically steered antennas for narrow steering angles at millimeter and submillimeter wavelengths. For larger antennas or longer wavelengths, which may require total time delay control on the order of nanoseconds, specialized electron-beam amplifiers 10 may be used. For the largest antennas, multiple electron-beam amplifiers 10 may be cascaded for a control range of tens of nanoseconds, or an electron-beam amplifier 10 may be used as a delay fine-tuning mechanism in a hybrid arrangement, with large delays provided by other means, such as switchable delay lines.

Generally, the velocity of electrons in a beam is given by $$v_e=\sqrt{2qV_b/m_e}, \qquad (1.38)$$

where q is the electronic charge ($8.85\times10^{-19}$ C), $V_b$ is a beam accelerating potential, and $m_e$ is mass of an electron ($9.11\times10^{-31}$ kg). Transit time of a beam through a drift cavity of length $z_{drift}$ is simply $t_{DELAY}=z_{drift}/v_e$, and a change in delay is $$\Delta t_{DELAY}\approx\frac{\Delta V_{BEAM}}{V_{BEAM}}t_{DELAY}. \qquad (1.39)$$

Thus, by adjusting a beam accelerating potential $V_{BEAM}$, the transit time may be adjusted, and a signal at an output of a detector may be delayed. For example, if $Z_{drift}$=10 mm, $V_{BEAM}$=50 v, and $\Delta V_{BEAM}$=+/−10 v, $$t_{DELAY(min)}=2.67\text{ ns}$$

$$t_{DELAY(max)}=2.18\text{ ns}$$

$$\Delta t_{DELAY}=490\text{ ps.}$$

A $\Delta t_{DELAY}$ of 490 ps may be expressed as a phase shift $\Delta\phi$ of a period T of certain RF frequencies:

$$\Delta\phi=49\text{ T @ 100 GHz}$$

$$\Delta\phi=4.9\text{ T @ 10 GHz}$$

$$\Delta\phi=0.49\text{ T @ 1 GHz.}$$

Typical phase shifting applications delay a signal for a significant fraction of a period of an RF frequency. It can be seen that the time delay mechanism is suitable for the RF applications that operate above 1 GHz. Furthermore, electron-beam amplifier 10 introduces no dispersion (filtering) effects when a broadband signal is amplified, since electron-beam amplifier 10 is broadband, so all frequency components are delayed by the same amount. Thus, it can be appreciated that electron-beam amplifier 10 achieves true time delay control.

Detector Plane Adjustments for Time Delay Control

Figure 40:
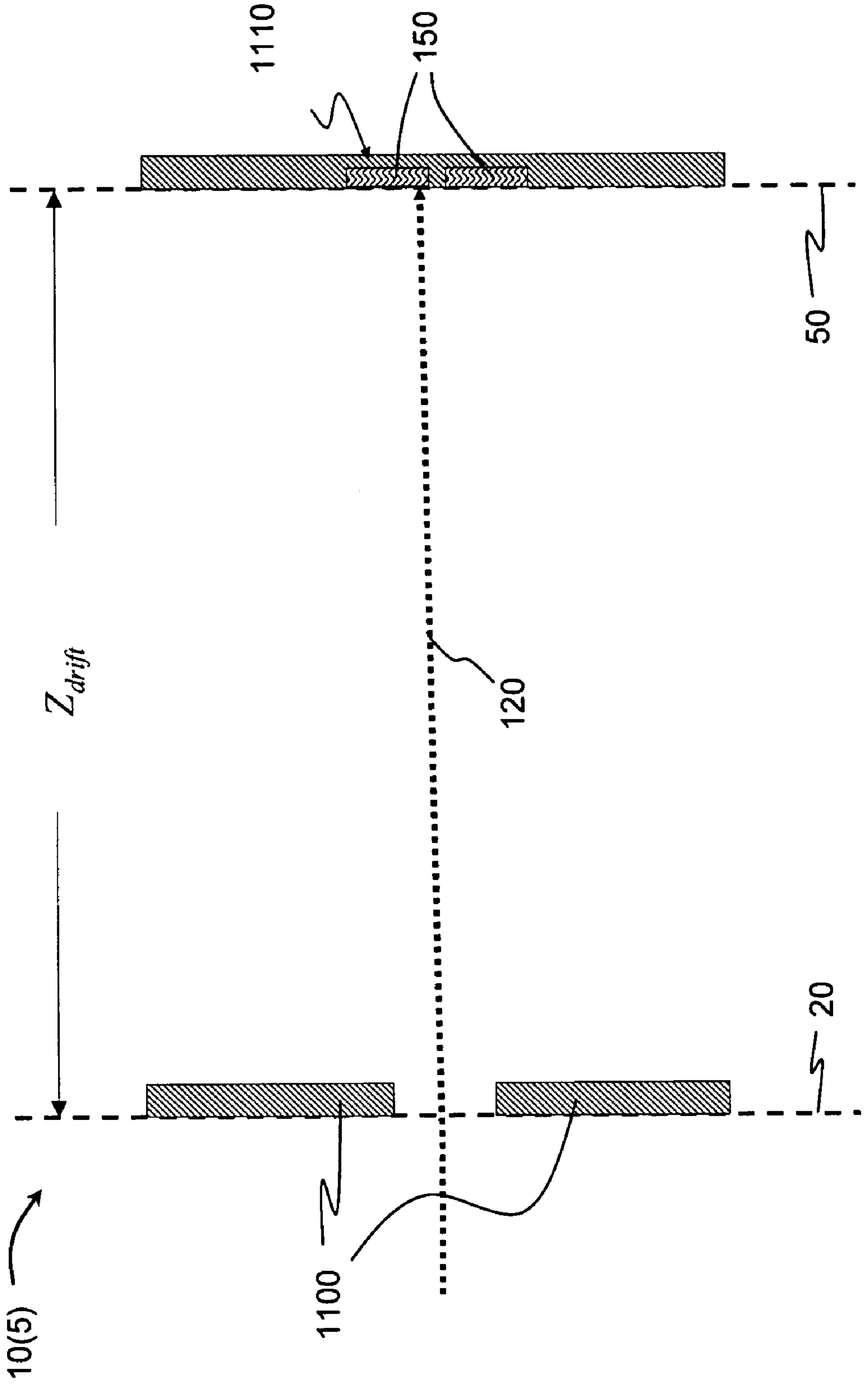
FIG. 40 shows an electron-beam amplifier that implements true time delay control.

FIG. 40 shows an electron-beam amplifier 10(5) that implements true time delay control. A potential $V_2$ of an electrode 1110 in detector plane 50 may be adjusted to change a transit time $t_{DELAY}$ of electron beam 120 moving across drift cavity length $z_{drift}$. Higher $V_2$ on electrode 1110 (relative to an electrode 1100 in emission plane 20) accelerates electron beam 120 and decreases $t_{DELAY}$ according to the above formula; decreasing $V_2$ increases $t_{DELAY}$.

One effect of changing a potential in detector plane 50 is to alter the focusing properties of electron focusing optics. For example, in electron-beam amplifier 10(4) of FIG. 35, if the potentials of electrodes 1020 and 1030 are held constant, the effect of changes to the potential of electrode 1040 is to change the focal length of the system. One method of correcting for such focal length changes is to simultaneously increase the potential of electrode 1030 as the potential of electrode 1040 increases.

This can be understood by recalling that electron-beam amplifier 10(4) has a retarding lens 1000 and an accelerating lens 1010. The retarding effect of lens 1000 occurs because electrode 1020 is more positive than electrode 1030; the accelerating effect of lens 1010 occurs because electrode 1040 is more positive than electrode 1030. Thus, if the potential of electrode 1030 is constant, making the potential of electrode 1040 more positive increases the focusing power of lens 1010. By increasing the potential of electrode 1030 as some fraction of the change in potential of electrode 1040, the focusing power of both lenses 1000 and 1010 can be decreased, offsetting the increased power of lens 1010 in the absence of a potential change on electrode 1040.

Figure 41:
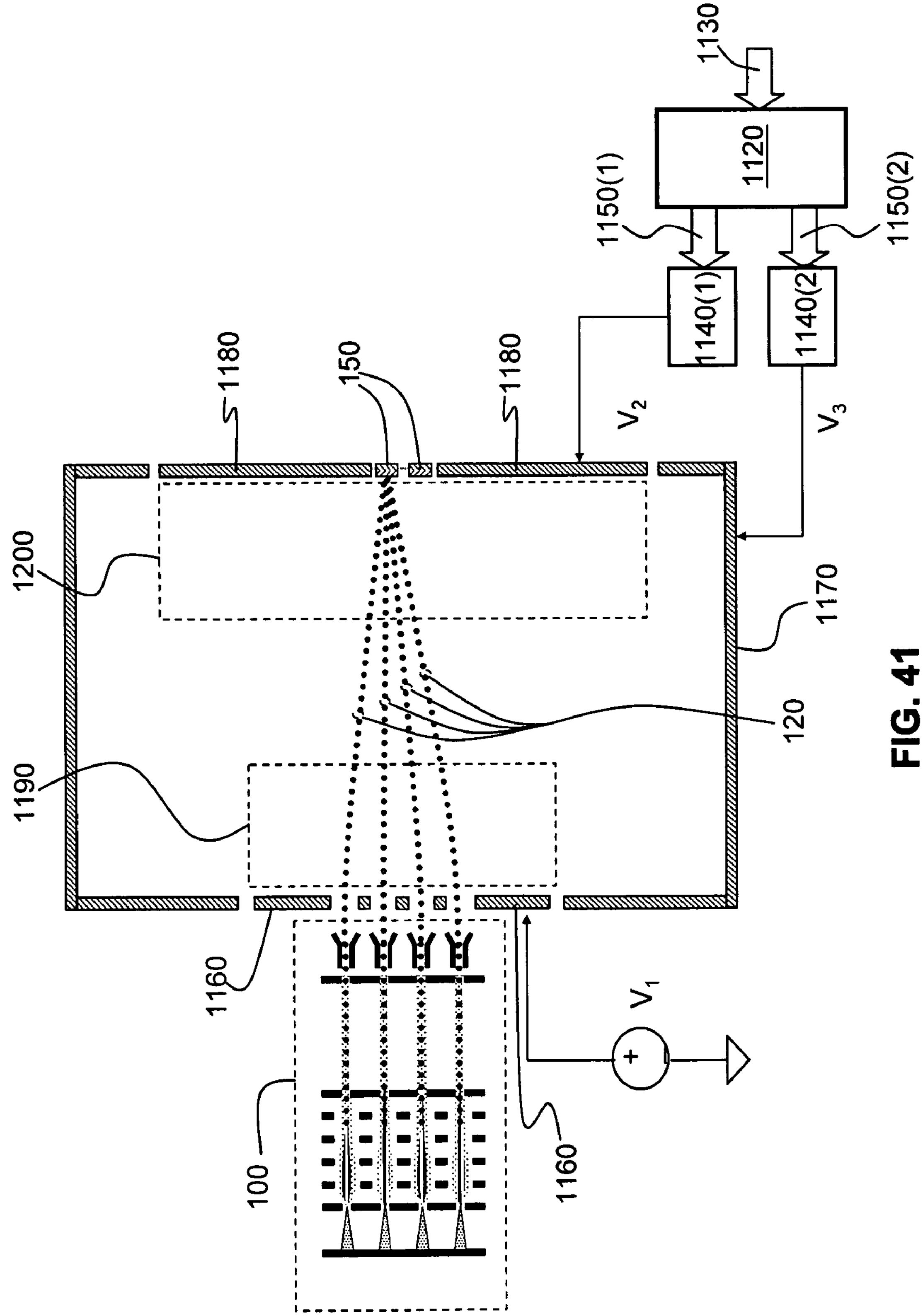
FIG. 41 is a schamatic diagram illustrating true time delay control implemented using a ROM and two DACs.

FIG. 41 shows true time delay control implemented using a ROM 1120 and two DACs 1140(1), 1140(2). An electron gun array 100 transmits electron beams 120 through perforations in an electrode 1160 that is maintained at a potential $V_1$. ROM 1120 receives a time delay control command 1130 and transmits digital word values 1150(1), 1150(2) to each of DACs 1140(1), 1140(2). As a matter of design choice, ROM 1120 may be, for example, one device with enough output bits to drive the inputs of DACs 1140(1) and 1140(2) simultaneously, or ROM 1120 may be two devices, one connected with DAC 1140(1) and the other connected with DAC 1140 (2). Digital word value 1150(1) causes DAC 1140(1) to set a potential $V_2$ on an electrode 1180 to produce a desired time delay; digital word value 1150(1) causes DAC 1150(2) to set a potential $V_3$ on a drift can electrode 1170. Potentials $V_2$ and $V_3$ are potentials which preserve the collective focusing characteristics of electron lenses 1190 and 1200; digital word values 1150(1) and 1150(2) are previously determined optimum focusing potentials, which may be derived through testing or simulation of electron lenses 1190 and 1200 for certain potentials $V_2$.

Because changes in electron acceleration accompany adjustments of time delay, changes in deflection gain may also occur, even when a lens system is adjusted to maintain focal length. Even when transverse momentum imparted to beam electrons by a signal deflector is constant (since as-emitted beam energy of electron beams 120 remains constant), when transit time is reduced by increasing acceleration, lateral displacement less time to accumulate. Accordingly, deflection of electron beams 120 is reduced by increased acceleration.

Figure 42A:
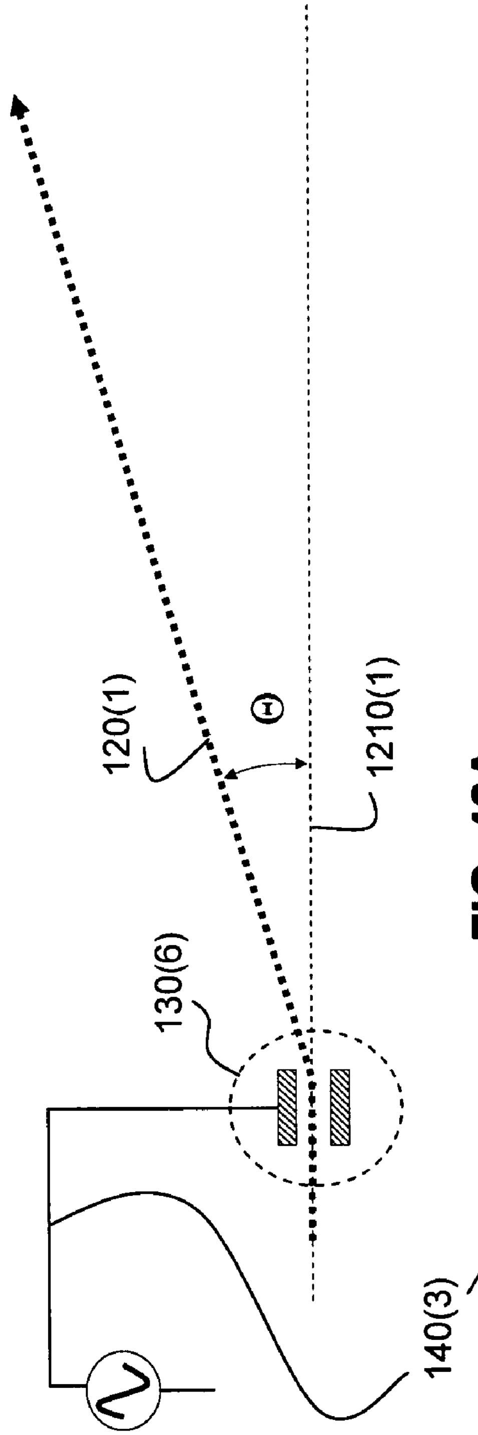
FIG. 42A is a schamatic diagram illustrating acceleration induced beam focusing, as is FIG. 42B.
Figure 42B:
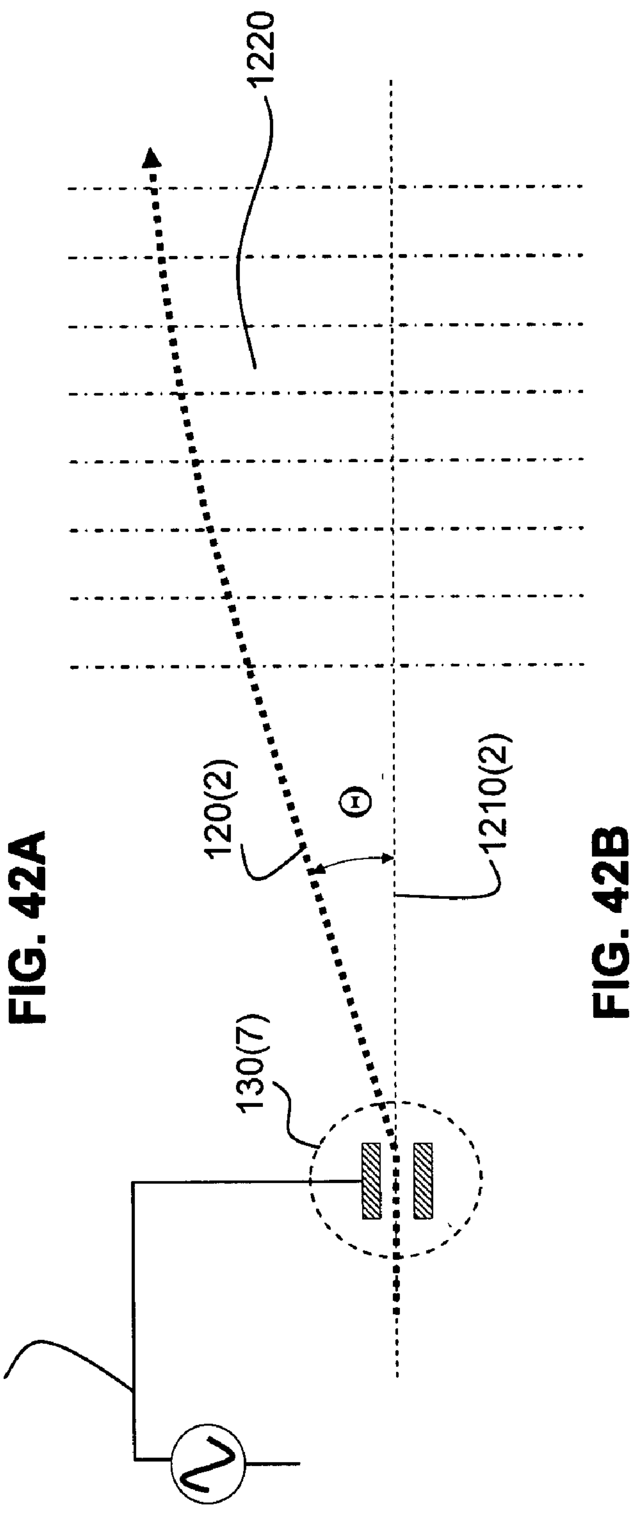

FIG. 42A and FIG. 42B show the effect of acceleration on beam displacement. Initial deflection of electron beam 120(1) and 120(2) by deflectors 130(6) and 130(7) in response to an identical voltage signal 140(3) are an equivalent amount Θ from respective axes 1210(1) and 1210(2). However, accelerating field 1220 accelerates electron beam 120(2), reducing lateral displacement from axis 1210(2) within accelerating field 1220(relative to the lateral displacement of electron beam 120(1) from axis 1210(1)).

A change in deflection gain caused by acceleration is independent of lensing action of a detector plane electrode (e.g., electrode 1180 of FIG. 41). The focal length of an accelerating lens alone is infinite. When electrodes 1170 and 1180 of FIG. 41 are constructed to generate lensing action with a finite focal length (through a doublet arrangement as discussed above), a change in deflection gain is more pronounced. Thus for time delay adjustments, it is useful to minimize lensing action of a detector plane electrode.

Figure 43:
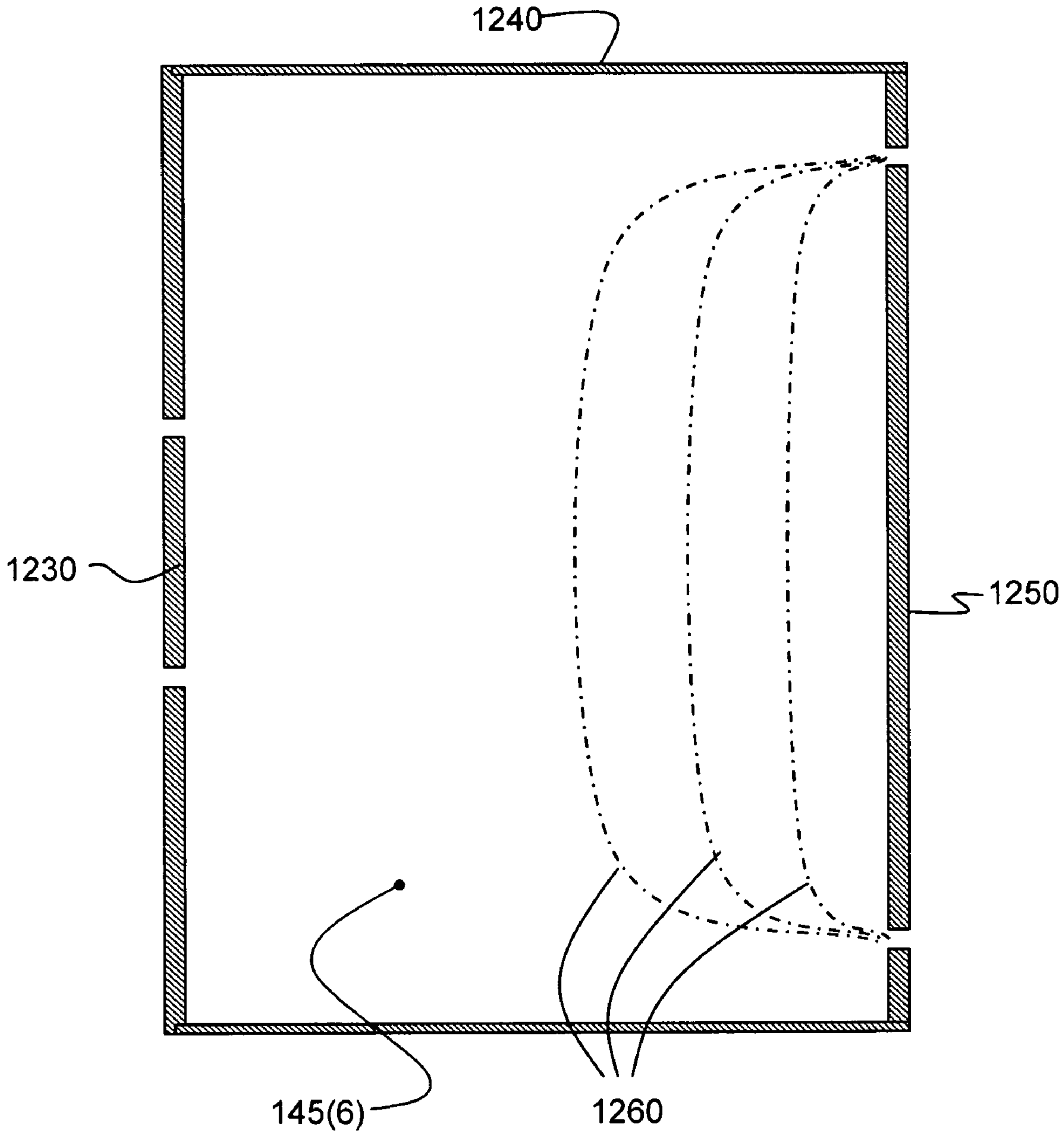
FIG. 43 is a midsectional view of electrodes within an electron-beam amplifier configured for time delay adjustment.

FIG. 43 shows a schematic cross section of electrodes 1230, 1240 and 1250 within an electron-beam amplifier 10 configured for time delay adjustment. Electrode 1250 is wide in diameter, relative to a diameter of a drift cavity 145 (6); accordingly, equipotential lines 1260(formed through an interaction of potentials of electrodes 1240 and 1250) are nearly parallel with electrode 1250. In this configuration, changes in the potential of electrode 1250 have little effect on beam focusing. No substantial inward radial momentum is imparted to beam electrons; changes in the potential applied to electrode 1250 increase only a field gradient and thus acceleration of electrons (not shown).

Figure 44:
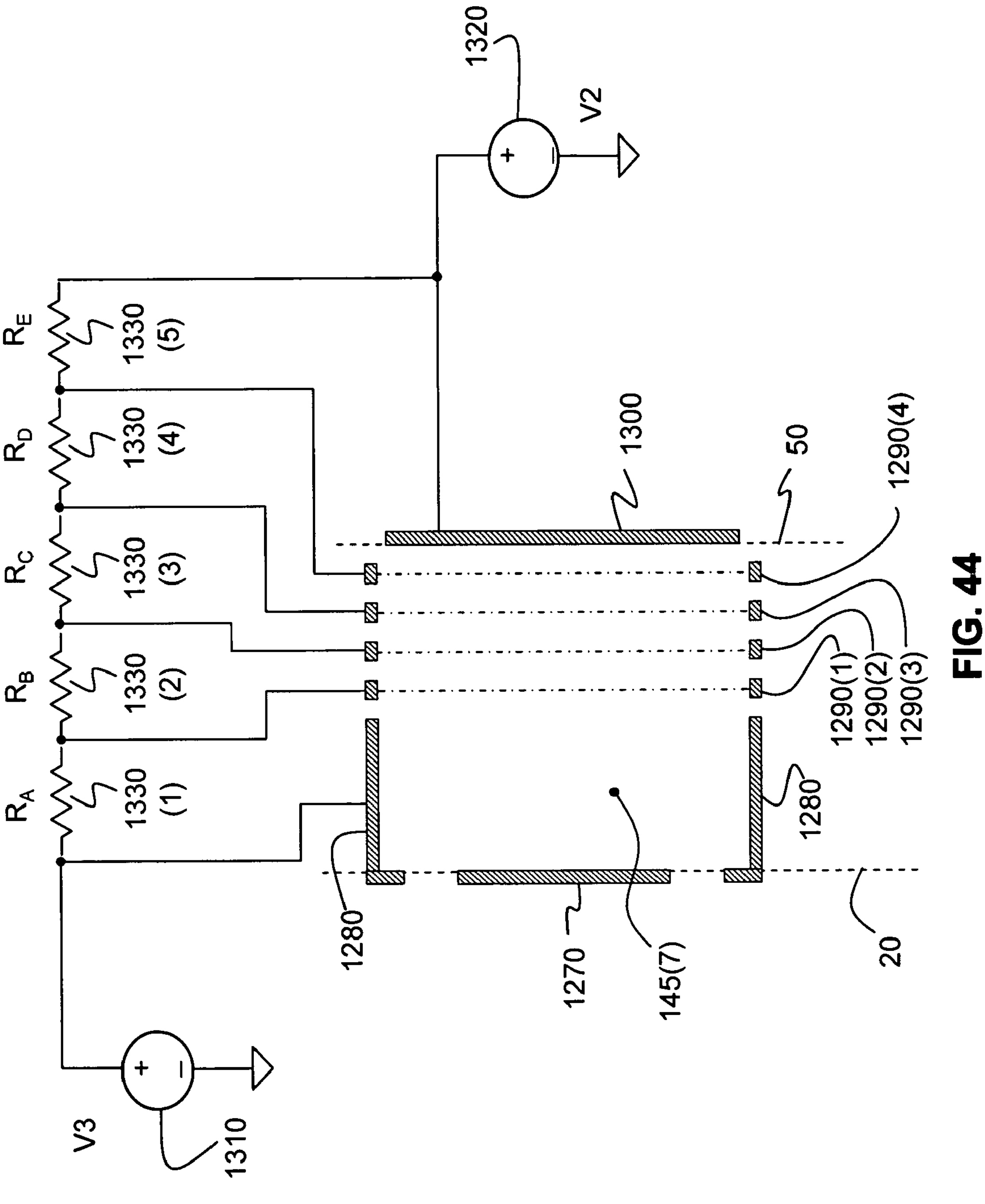
FIG. 44 is a schematic diagram that shows electrodes around a drift cavity, together with a bias circuit for the electrodes.

FIG. 44 shows a schematic cross section of electrodes 1270, 1280, 1290(1-4) and 1300 around a drift cavity 145(7), and a bias circuit for the electrodes. Electrode 1270 is in an emission plane 20 and electrode 1300 is in a detector plane 50. Drift cavity 145(7) is surrounded by a partial drift can electrode 1280 and ring electrodes 1290(1-4). Dashed lines across drift cavity 145(7) show electrical continuity of each ring electrode 1290(1-4) from a portion seen on one side of the drift cavity to a portion seen on the other side of the drift cavity. Ring electrodes 1290(1-4) have progressively greater potentials applied to them, in the manner previously described with respect to electron gun focusing electrodes (see FIG. 31), to shape electric fields (not shown) within drift cavity 146(7). Field lines (not shown) within drift cavity 145(7) may be shaped substantially the same as field lines in the center of drift cavity 145(6) of FIG. 43; further, the size of drift cavity 145(7) (and the overall dimensions of an electron-beam amplifier 10 incorporating drift cavity 145(7)) may be reduced. It is understood that the number of electrodes indicated in FIG. 44 is representative, and more or fewer electrodes may be employed.

One means of biasing ring electrodes 1290(1-4) includes potentials derived from a set of resistors 1330(1-5) with respective values $R_A$, $R_B$, $R_C$, $R_D$ and $R_E$, connected in series. As shown in FIG. 44, a power supply 1310 connects a potential $V_3$. with partial drift can electrode 1280 and with one end of resistor 1330(1). Connections between successive resistors 1330(1-5) also connect with successive ring electrodes 1290 (1-4), and an end of resistor 1330(5) connects with electrode 1300 and with another power supply 1320 at an acceleration potential $V_2$. Certain resistor values $R_A$, $R_B$, $R_C$, $R_D$ and $R_E$ (which may be determined through simulation or experimentation) adjust the potentials on ring electrodes 1290(1-4) to produce approximately planar accelerating fields near electrode 1300 for different values of $V_2$. Resistors 1330(1-5) may also be variable resistance devices (e.g., potentiometers) so that resistor values $R_A$, $R_B$, $R_C$, $R_D$, $R_E$ may be modified if necessary. By this means, a planar acceleration field can be established.

Figure 45:
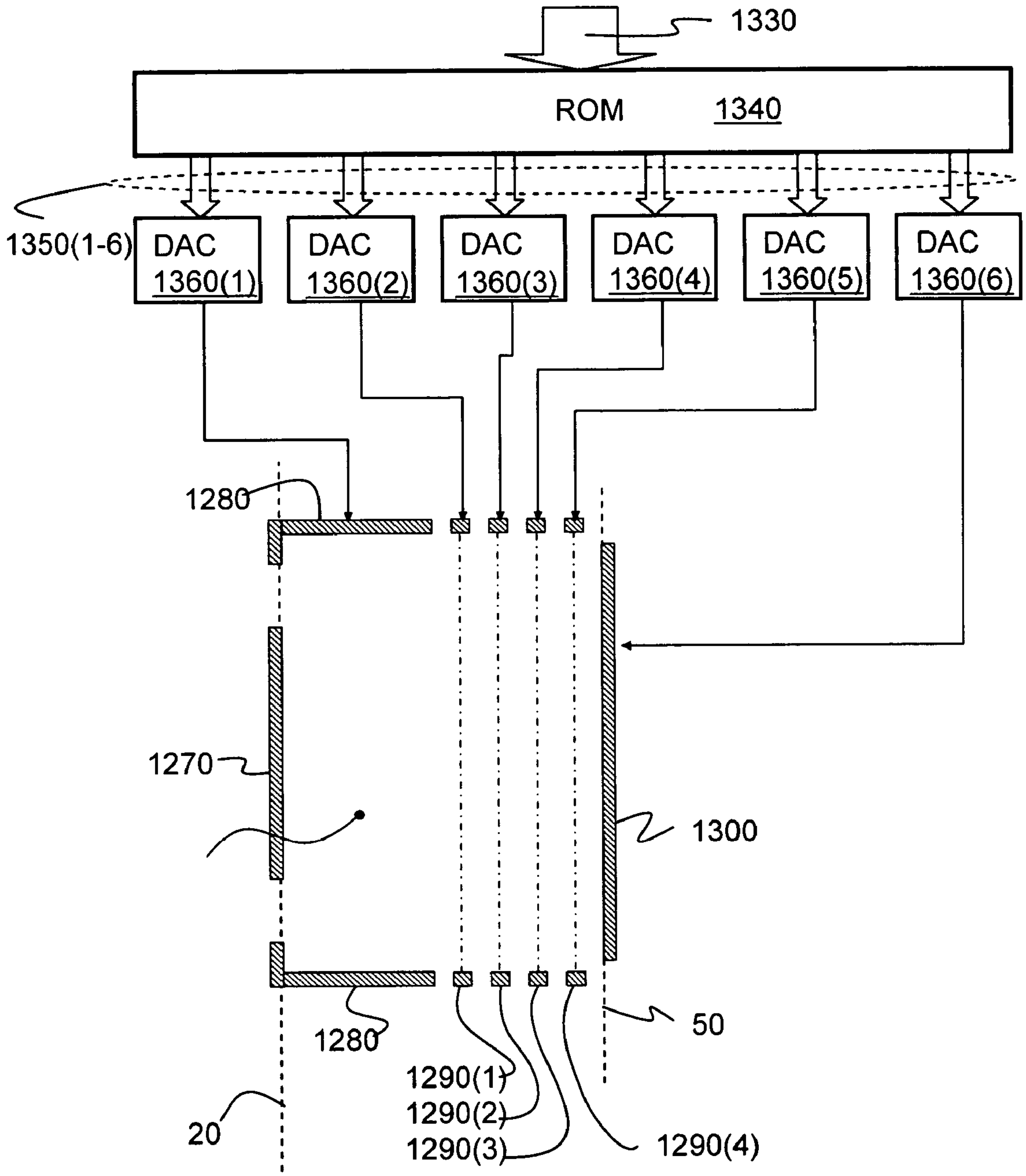
FIG. 45 is a schamatic diagram of the electrodes and drift cavity of FIG. 44, with a different bias circuit for the electrodes.

FIG. 45 shows a schematic cross section of electrodes 1270, 1280, 1290(1-4) and 1300 around drift cavity 145(7), with a different bias circuit for the electrodes. With electrode

1270 set at a reference potential (not shown), each of electrodes 1280, 1290(1-4) and 1300 are driven by a corresponding DAC 1360(1-6) under control of a ROM 1340. In similar manner to the arrangement of FIG. 32, control words are provided to the ROM, which provides a digital control word to each DAC; each DAC then drives a corresponding potential for an electrode. In the arrangement of FIG. 45, each control word is a time delay control command word 1330 and each digital control word is a ring-electrode voltage word 1350(1-6). The digital control words may be determined by simulation or experimentation and stored in ROM 1340 to provide optimum electrode potentials for a desired range of time delays.

Electron Gun Adjustments for Time Delay Control

Adjusting potential of an electrode in detector plane 50 has advantages over adjusting an electron gun acceleration potential; adjusting potentials in an electron gun may affect deflection gain, and beam energy adjustments to a electron gun may be difficult due to complex electron gun electrode structure. Thus it is preferred, for most applications, to keep electron gun beam energy constant. Nonetheless, some applications of electron-beam amplifier 10 may benefit from a constant detector plane potential, such as for example applications which employ multiple independent e-beams, as discussed below. In these applications, time delay control may be achieved by adjusting electron gun acceleration potential.

Figure 46:
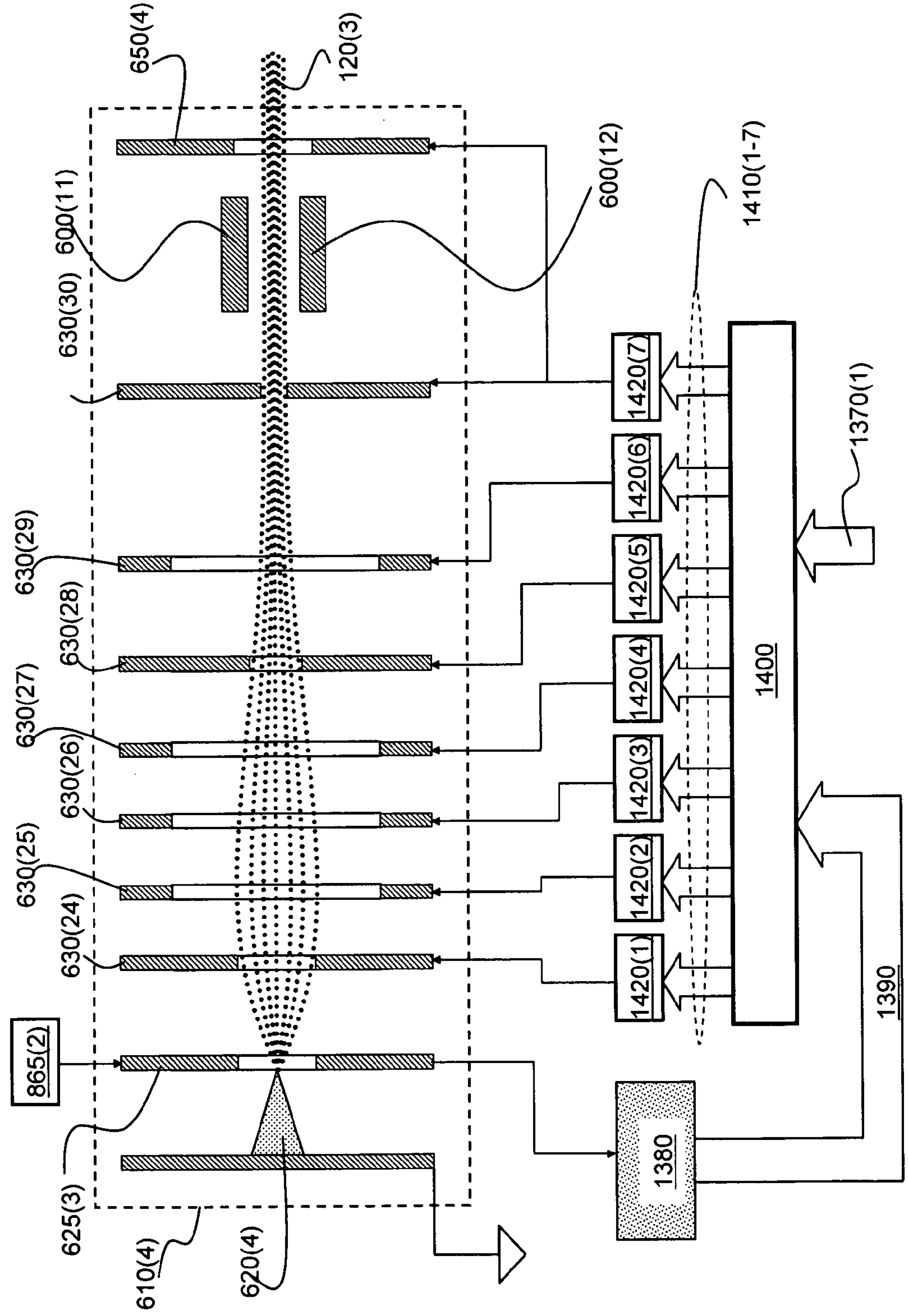
FIG. 46 is a schematic midsectional view of an electron gun and circuitry for beam energy and current control.

FIG. 46 is a schematic cross-sectional drawing of an electron gun 610(4) and circuitry for beam energy and current control. A cathode 620(4) emits electrons that are focused into electron beam 120(3). A current control loop 865(2) (e.g., as shown in FIG. 32) adjusts the beam current of beam 120(3) through adjustments to a potential of a gate electrode 625(3). The potential of gate electrode 625(3) connects with ADC 1380, which transmits a digital gate word as input to a ROM 1400. ROM 1400 also receives a time delay control command word 1370 as input, and transmits a digital focusing command word 1410(1-7), corresponding to the combination of the digital gate word and the time delay control command word received, to each of DACs 1420(1-7) respectively. Each of DACs 1420(1-7) drives a potential that corresponds to the digital focusing command word received to a focusing electrode 630(24-30). A shield plate 650(4) on an exit plane of electron gun 610(4) is held at the same potential as final focusing electrode 630(30), so that potential differences do not exist around two deflector plates 600(11) and 600(12). Shield plate 650(4) may be, for example, electrode 1160 in the doublet lens system of FIG. 41. As in the circuits discussed above that use a ROM and DACs to control potentials, the optimum potentials applied to focusing electrodes 630(24-30) can be determined by simulation or experimentation; the number of focusing electrodes may be varied; ROM 1400 may be replaced by a plurality of ROMs, or may be replaced by other means for generating digital focusing command words, such as a processor.

Once electron beams 120 exit electron guns at an emission plane and enter a drift cavity, changes in beam energy affect beam focusing in this method, unless otherwise compensated. The reason is that the potentials of electrodes in a doublet lens system (e.g., electrodes 1160, 1170 and 1180 forming lenses 1190 and 1200 in FIG. 41) are optimized for a particular beam energy. The effect of beam energy on beam focusing can be compensated by an arrangement that adjusts a potential difference of the emission plane optics consisting of electrodes on each side of the drift cavity. For minor focusing adjustments, potential of a detector plane electrode may be adjusted. Again, a DAC responding to a ROM can set the potential of the detector plane electrode. For larger focusing adjustments caused by larger beam energy adjustments, potentials of a drift can electrode and a detector plane electrode may be adjusted.

Gain Stabilized Time Delay Control

Time delay changes effected by altering the beam energy, either by electron gun adjustments or detector plane acceleration adjustments, may be accompanied by changes in both deflection gain of the beam and cascade gain of the detector. Thus, the overall amplifier gain is changed. As described earlier, amplifier transconductance is given by $$g_m = \frac{\Delta I_{out}}{\Delta V_{in}} = G_{BEAM}\, G_{call} k_C k_A = z_{drift} \frac{L_P}{W_P} \frac{1}{2V_{BEAM}} \frac{I_{BEAM}}{X_D} k_D. \tag{1.40}$$

This calculation assumes that one detector segment receives all available beam current at a maximum deflection signal voltage. Altering deflection gain is effectively the same as changing detector width $X_D$. For example, increasing beam energy reduces transit time of beams through a cavity; $X_D$ decreases correspondingly. At the same time, increasing beam energy increases detector gain $k_D$. The changes in $X_D$ and $k_D$ both increase $g_m$ when beam energy increases Likewise, decreasing beam energy decreases $g_m$.

For this reason, amplifier gain may be stabilized by adjusting e-beam current. From the preceding equation, it is clear that changes in $X_D$ and $k_D$ can be compensated by changing the beam current. As beam energy is increased, beam current is decreased, and vice versa. For each change in detector plane potential, the electron gun currents are adjusted to maintain constant average output current.

Figure 47:
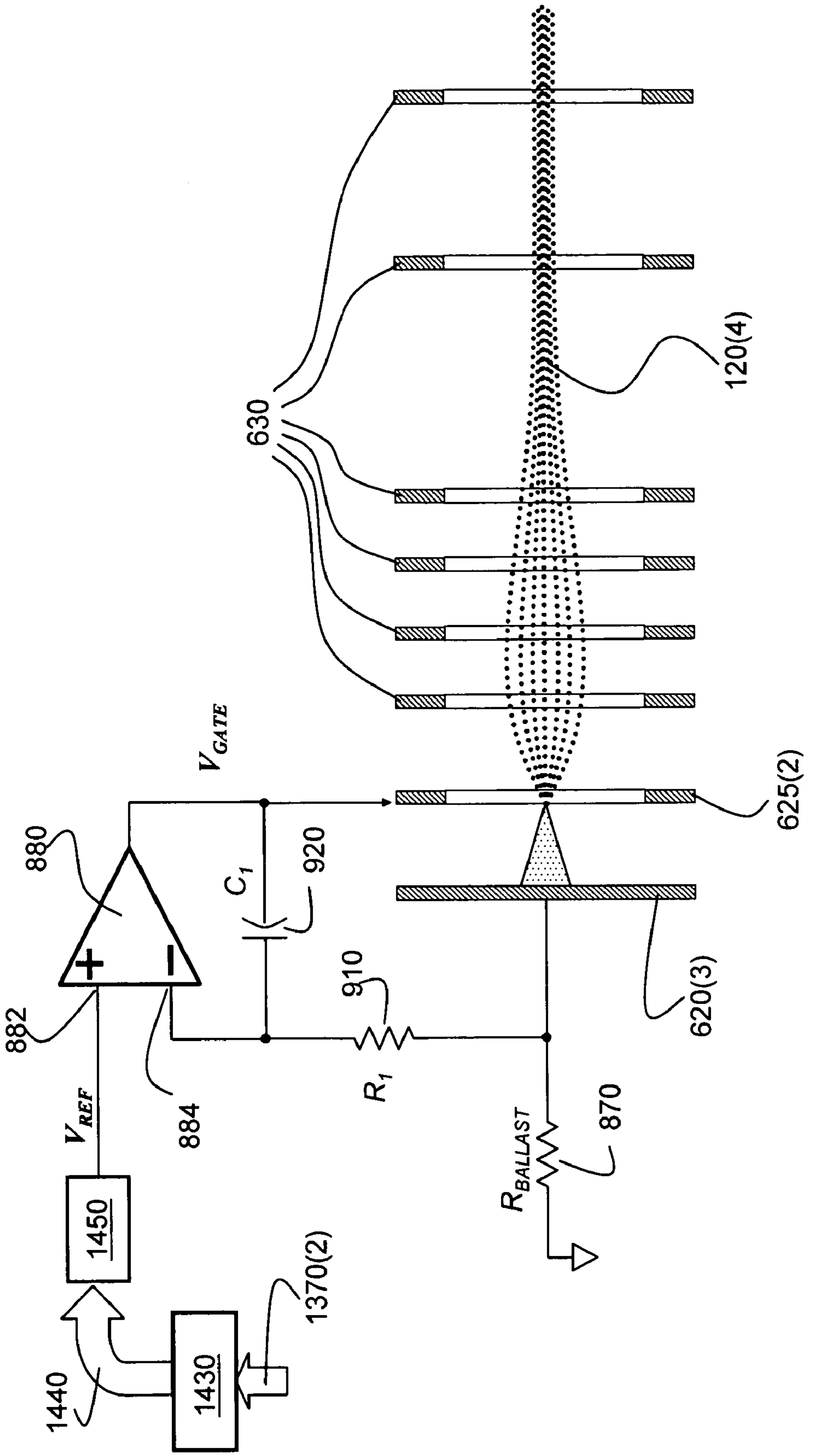
FIG. 47 shows a circuit for gain-stabilized time delay control.

FIG. 47 shows a circuit for gain-stabilized time delay control. A ROM 1430 stores codes 1440 corresponding to current reference values for every beam energy. In response to a time delay command 1370(2), a ROM code 1440 is transmitted to a DAC 1450, which generates a voltage reference for the electron gun current control loop consisting of the opamp 880, resistors 870 and 910, and capacitor 920 of FIG. 32. Opamp 880 drives the potential of gate electrode 625(2), regulating the flow of electrons emitted by cathode 620(3) that form electron beam 120(4).

Gain Controlled Amplifier

From the preceding, it can be appreciated that an electron-beam amplifier 10 may use a gain controlled amplifier. One method by which this can be accomplished is by implementing any of the methods of time delay control, but without current controlled gain stabilization. Another method is by a current controlled beam without beam energy adjustments. Finally, amplifier gain can be adjusted via beam energy adjustments working in concert with a current controlled beam, a difference being that current control works in the opposite sense of gain stabilization, so that it enhances the gain variation induced by the time delay control.

Pulsed Operation

Electron gun beam blanking is easily implemented in an electron beam amplifier 10. One application of electron gun beam blanking is an RF transmit amplifier that generates pulsed beams. This is beneficial for applications like radar and Ultra-Wideband (UWB) communications. With beam blanking, a continuous RF signal can be applied to deflection plates, and the amplifier output can be turned rapidly on and off with pulse widths as short as 10 picoseconds, without interrupting the RF signal.

Pulsing can be achieved by various means, for example, through gate electrode control, and through the inclusion of an extra deflector in each electron gun, called here a "blanking deflector." Cathode control may involve a high loading capacitance and a slow response time. In many applications, such as radar and UWB, sub-nanosecond switching is desirable and cathode controlled gating is too slow. A blanking deflector has high-speed characteristics like other deflectors described above (e.g., deflector 130(1)) including very low loading of a driving source.

Figure 48:
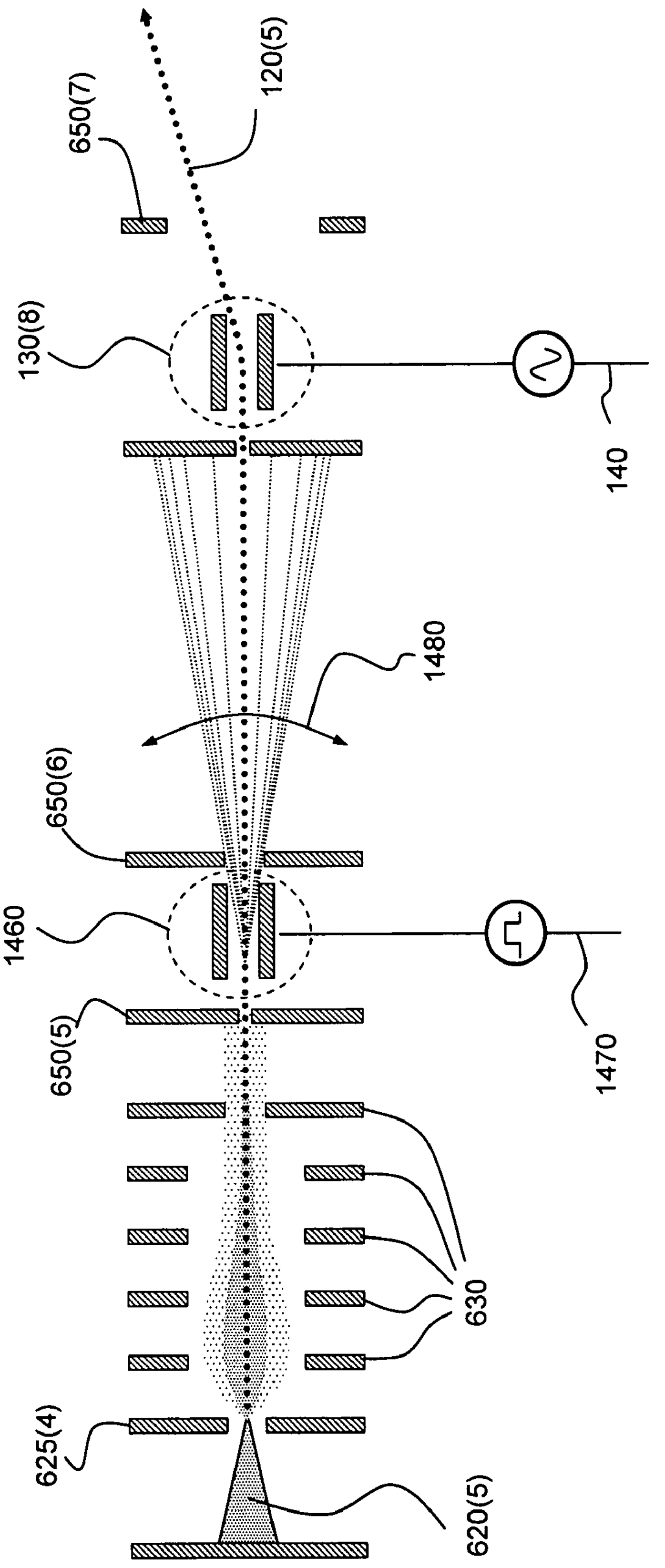
FIG. 48 shows an electron gun configured for beam blanking.

FIG. 48 shows an electron gun configured for beam blanking. An electron gun is shown schematically that includes a cathode 620(5), a gate electrode 625 (4), focusing electrodes 630, a shield plate 650(5), a blanking deflector driven by a blanking signal 1470, a shield plate 650(6), an aperture plate 1480, a signal deflector 130(8) driven by a voltage signal 140, an emission plane shield plate 650(7) and an e-beam 120. E-beam 120(5) is emitted by cathode 620(5) through gate electrode 625(4), focused by focusing electrodes 630, and propagates through shield plate 650(5). the blanking deflector, aperture plate, and signal deflectors. When blanking signal 1470 is in an "off" state, a zero bias is applied across blanking deflector 1460. When blanking signal 1470 is in an "on" state, a positive or negative bias is applied across blanking deflector 1460, causing beam 120(5) to be deflected away from a hole in aperture plate 1480, so that beam 120(5) is stopped by the aperture plate. This blocks ("blanks") beam 120(5) from propagating through the signal deflectors, thus "turning off" the beam. With no beam current, there is no detector excitation and no amplifier output.

As in other electron beam amplifiers 10, electron guns with blanking capability can be arrayed to create a composite e-beam from many individual beams, and all such blanking deflectors may be coupled together under control of a single blanking signal.

Frequency Multiplication

Some high frequency applications utilize both frequency multiplication and amplification; for example, high-frequency oscillators, high-frequency references for TWTs and other high-power amplifiers, and RF carriers for radar transmitters and communications systems.

Frequency multiplication at RF frequencies is sometimes achieved by driving a non-linear element with a sinusoidal signal and filtering a resulting waveform with a tuned filter to extract a higher order harmonic. The principle can easily be grasped by considering simple second order non-linearity, $y=x^2$. If the value $x=\cos \omega t$, the value $y=(1+\cos 2\omega t)/2$, so the frequency has been doubled. Higher order non-linearities can generate higher frequency multiples. However, extra filtering is required to extract the desired harmonic, and the process may be inefficient, since harmonics have energy that diminishes roughly in proportion to the order of the harmonic. For example, a $5^{th}$ harmonic normally has much less energy than the $3^{rd}$ harmonic.

A frequency multiplying electron beam amplifier 10 may provides efficient harmonic generation, even for higher orders. The method employs a detector with a multiplicity of segments greater than two, and may use one or two deflectors arranged for deflection in two orthogonal directions (e.g., directions X and Y of FIG. 1).

Figure 49:
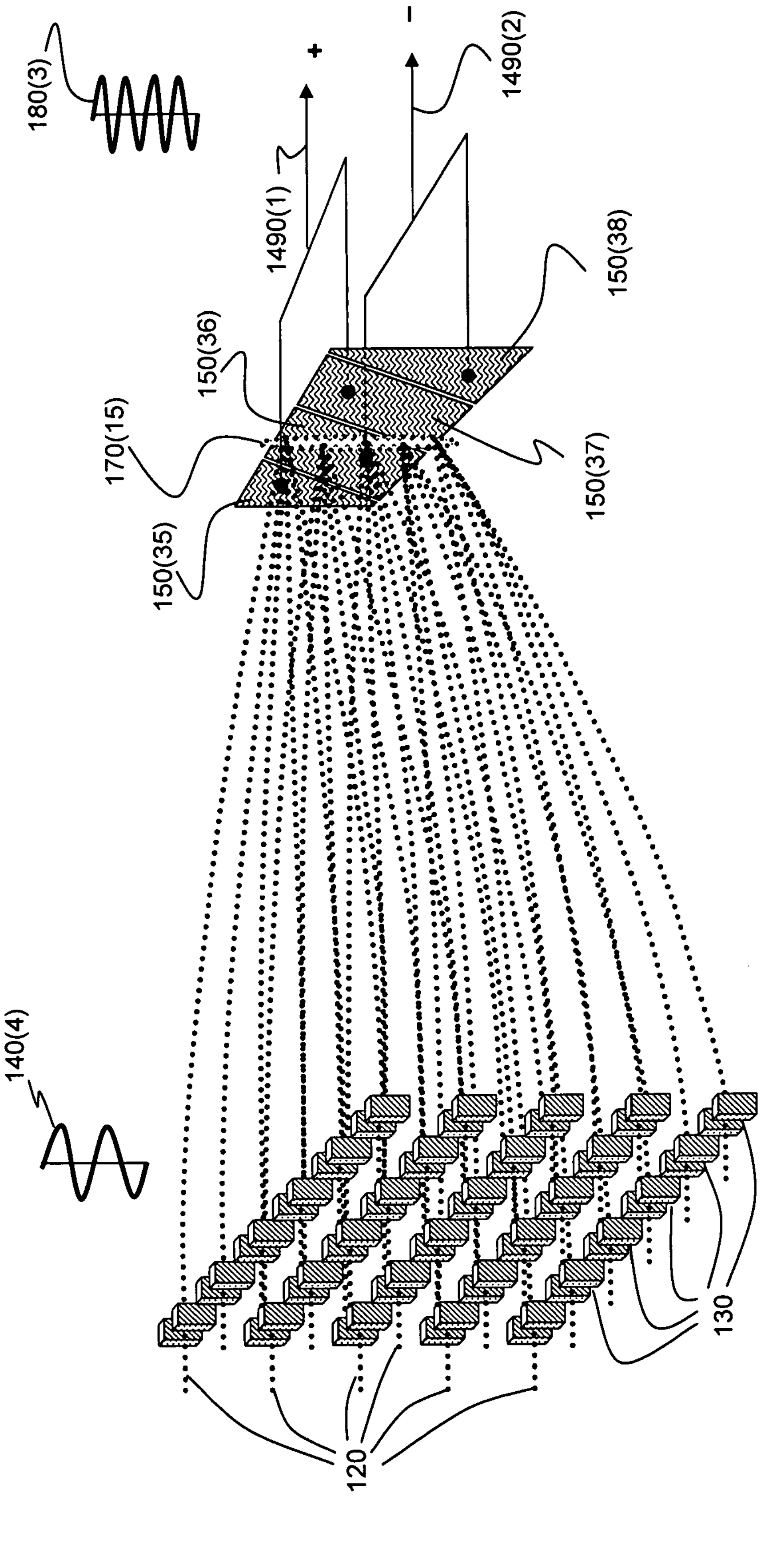
FIG. 49 shows a detector arrangement configured for frequency doubling.

FIG. 49 shows a detector arrangement configured for frequency doubling. Electron beams 120 pass through ganged deflectors 130 configured to deflect the individual beams in a common direction in response to a common voltage signal 140(4); beams 120 are focused to form a beam spot 170(15). Detector segments 150(35), 150(36), 150(37) and 150(38) are arranged in a linear row and connected to an output load in an alternating arrangement, whereby segments 150(35) and 150(37) are connected to a positive (+) output 1490(1), and segments 150(36) and 150(38) are connected to a negative (–) output 1490(2). Detector segments 150(35-38) are separated by diagonal slots, as described above, with diagonal slots indicated in FIG. 49 by way of illustration only. Voltage signal 140(4) having frequency $f_1$ and amplitude $V_0$ is applied to deflectors 130 to scan beam spot 170(15) across detector segments 150(35-38). Each cycle of voltage signal 140(4) passes across all four detector segments 150(35-38) in each direction, and the coupling of four segments to two output nodes, as shown, generates two cycles of output current for each input cycle. Current 180(3) on output 1490(1) is illustrated for comparison with input voltage 140(4); current 180(4) on output 1490(2) is of identical frequency but 180 degrees out of phase with respect to current 180(3). Proper shaping of beam spot 170(15) and detectors 150(35-38), may be used to ensures an output of frequency $2f_1$ with tonal purity, low residual harmonics, and small DC component.

By increasing a number of detector segments, higher order frequency multiplication may also be achieved. With a linear row arrangement, 6 segments achieves frequency tripling, 8 segments achieves quadrupling, and so forth; furthermore, frequency multiplication can be controlled by controlling the amplitude of an input voltage.

Figure 50:
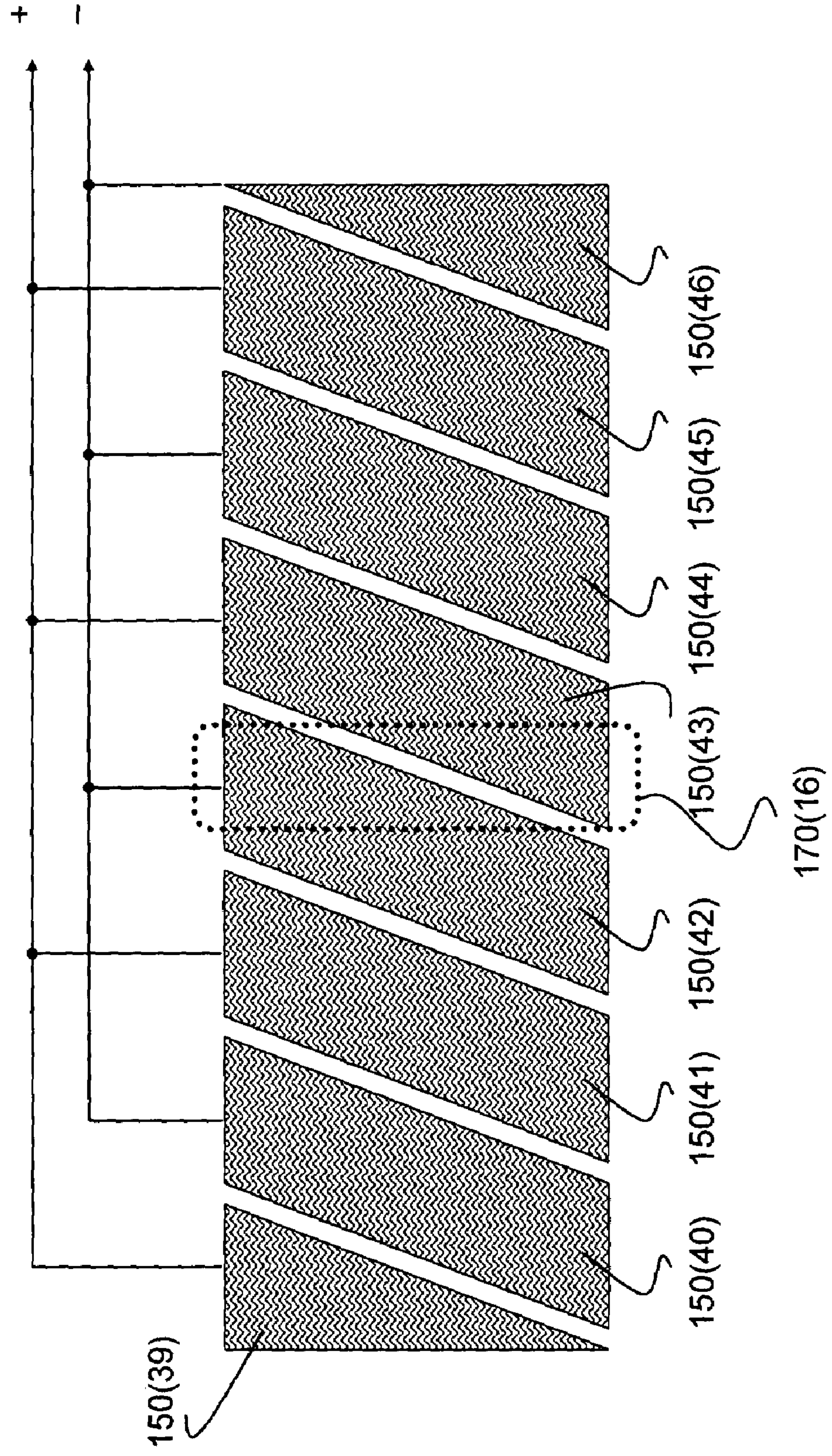
FIG. 50 shows an arrangement of detector segments configured for frequency multiplication of 1, 2, 3 or 4 with high tone purity.

FIG. 50 shows an arrangement of detector segments configured to provide frequency multiplication factors of 1, 2, 3 or 4 with high tone purity. For small beam deflection amplitudes, only detector segments 150(42) and 150(43) will be excited by a beam spot, and the output frequency will be the same as the input frequency driving the deflection. The multiplication factor for this case will be 1. If the signal amplitude is increased to scan the beam across segments 150(41), 150(42), 150(43) and 150(44), the frequency multiplication factor will be 2. If the deflection amplitude is increased to scan across segments 150(40), 150(41), 150(42), 150(43), 150(44) and 150(45), the frequency multiplication factor will be 3, and so forth.

There are two limitations of the simple linear array. First, high orders of multiplication may require a wide layout of detector segments, and require a correspondingly large scan angle which may exceed the range of a deflector and voltage signal. Second, it may be difficult to achieve exactly periodic spacing of zero-crossings of a multiplied frequency output with a linear array of segments. The effect of aperiodic zero-crossings may depend on an application. In an RF mixer, spurious tones may be generated that can limit the sensitivity of a receiver. If an application is as a frequency reference for an analog-digital-converter (ADC), the aperiodic crossings may create sampling errors and limit conversion accuracy.

Figure 51:
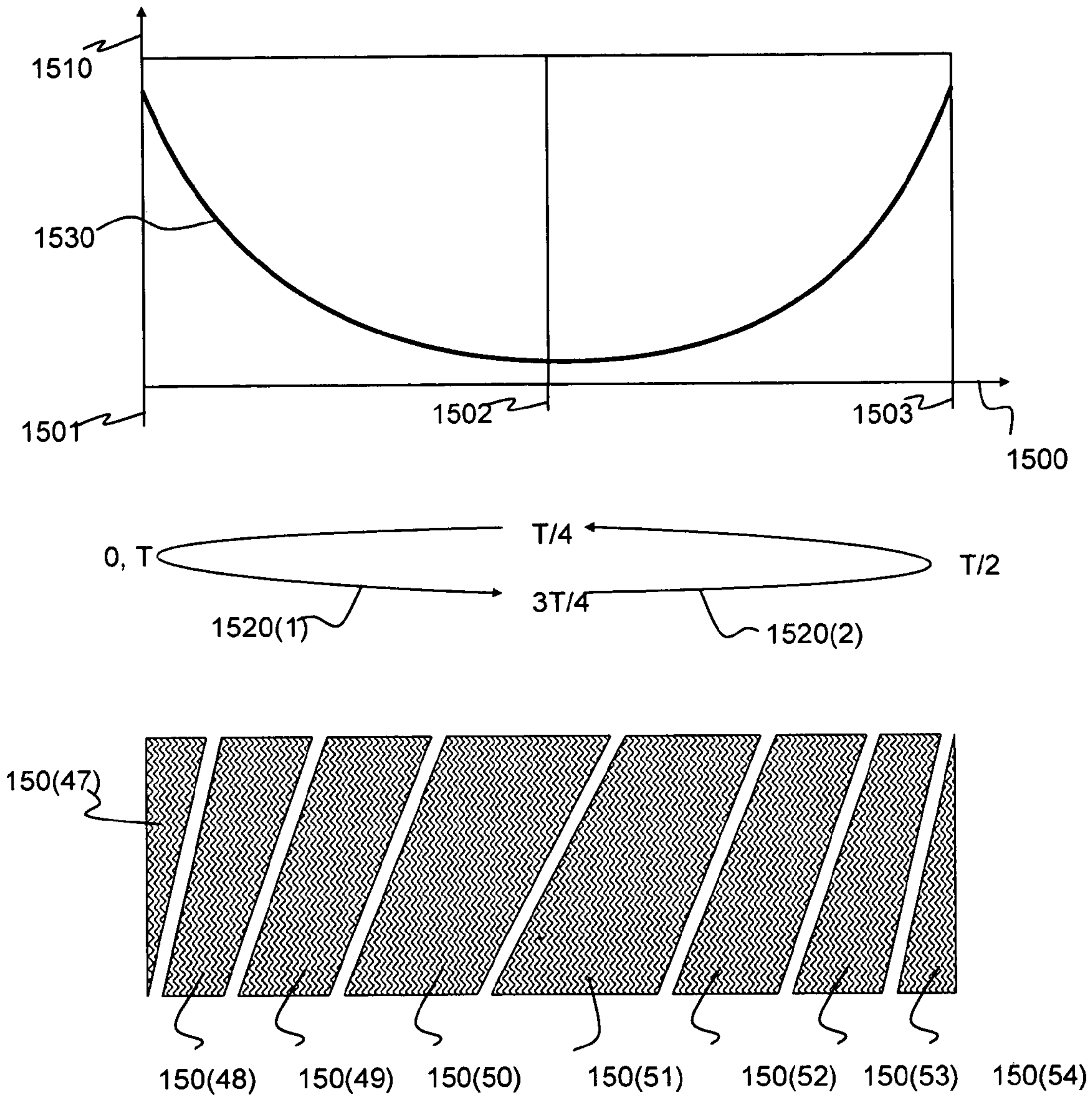
FIG. 51 shows an arrangement of detector segments configured for frequency multiplication of 1, 2, 3 or 4 with high tone purity, positionally aligned with respect to an associated response curve.

FIG. 51 illustrates time statistics of a sinusoid, and an arrangement of detector segments arranged to compensate for the time statistics. Axis 1500 is a distance axis. Position 1501 indicates one end of a sinusoidal sweep (i.e., the path traced by a beam spot 170 being driven by deflectors 130 in response to a sinusoidal voltage signal 140). Position 1503 indicates the other end of the sweep, and position 1502 indicates the midpoint of the sweep. Thus, a single cycle of a sinusoidal input voltage may sweep a beam spot 170 from position 1501 at a time 0, past position 1502 at a time T/4, to position 1503 at time T/2, past position 1502 again at a time 3T/4, and back to position 1501 at time T that is the period of the sinusoid, as indicated by arrows 1520(1) and 1520(2). Axis 1510 is a time axis, and curve 1530 shows the relative time spent at a given position along time axis 1500 by a sinusoidal sweep. As shown, when all detector segments in a linear row are uniform in size, a beam spot may spend more time dwelling on outermost detector segments and less time on inner segments.

One method of achieving periodic zero-crossings is to adjust detector segment geometry to balance dwell times of a beam over all segments to lower the undesired harmonic content in the output. Detector segments 150(47-54) are arranged to compensate for the effect of a sinusoidal sweep pattern that spends more time on outermost regions of a sweep and less time on inner regions of the sweep. A beam spot (not shown) may scan all of segments 150(47-54), but the beam spot will spend more time on wider segments 150(50) and 150(51) due to their width, will spend less time on narrower segments 150(49) and 150(51), and so on.

Circular Frequency Multiplier

Another method of achieving periodic zero-crossings employs a circular detector with "pie-slice" segmentation and two-dimensional scanning that sweeps a beam in a circular pattern (for example, forming traces known as "lissajous figures" in the field of electron beam oscilloscopes).

Figure 52A:
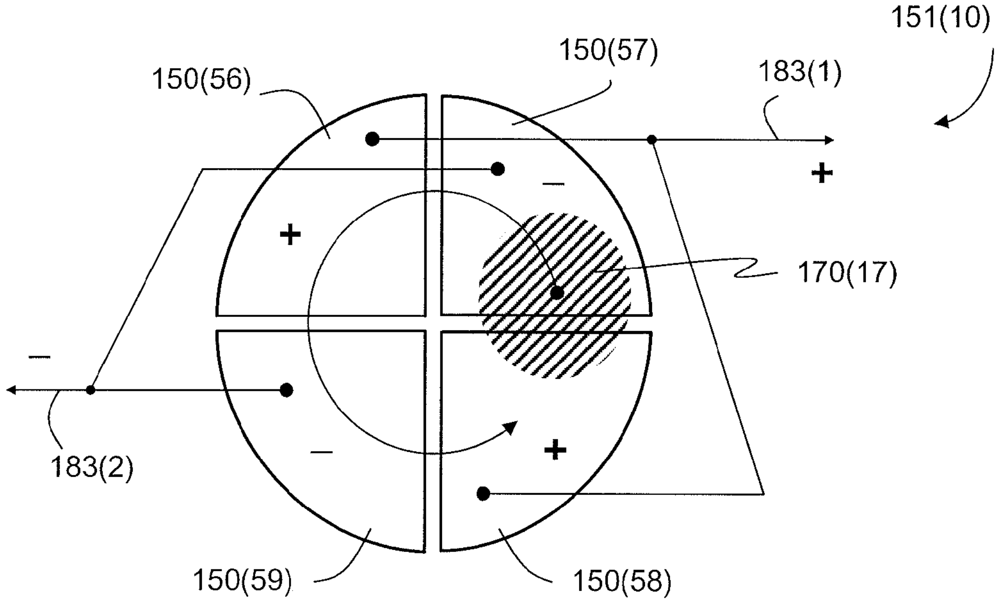
FIG. 52A and FIG. 52B show two circular detectors configured for frequency multiplication.
Figure 52B:
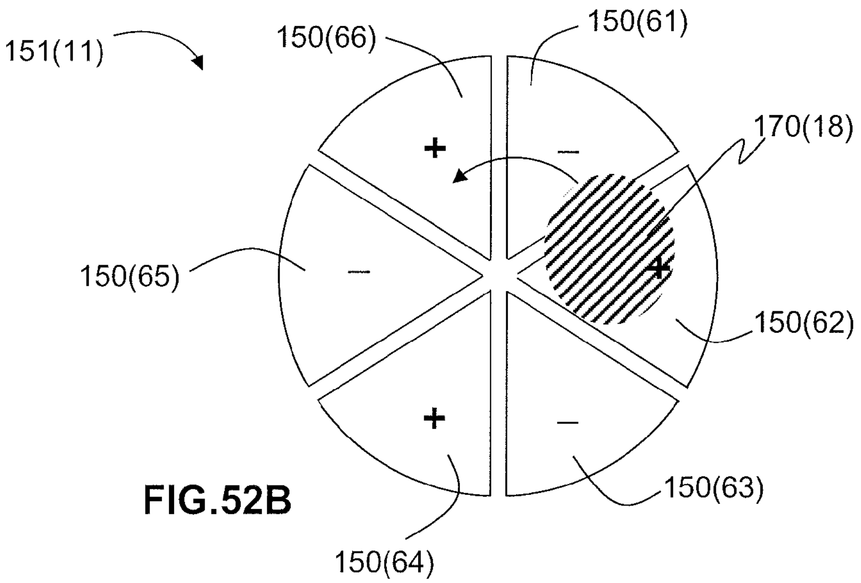

FIG. 52A and FIG. 52B show two circular detector configurations 151(10) and 151(11) configured for frequency multiplication. Configuration 151(10) includes detector segments 150(56), 150(57), 150(58) and 150(59) as shown. A beam spot 170(17) travels in a circular path around detector segments 150(56-59). Beam spot 170(17) is created by electron guns (not shown) including deflectors driven by a pair of sinusoidal voltage signals $V_x$ and $V_y$ that have identical amplitude and frequency, but differ in phase by 90 degrees. As in electron-beam amplifiers 10 with linear arrays of detectors configured for frequency multiplication, segments 150(56-59) are coupled in alternating-fashion to output lines 183(1) and 183(2), as shown. An output waveform of output lines 183(1) and 183(2) will have twice the frequency of voltage signals $V_x$ and $V_y$. The four segments in detector configuration 151(10) is again equal to twice the frequency multiplication factor.

A circular detector used with a beam swept in a lissajous pattern has an inherent tolerance with respect to variations in input signal amplitude. As long as a lissajous pattern formed by beam spot 170(17) stays centered on and within segments 150(56-59), the amplitude of $V_x$ and $V_y$ may vary without affecting an amplitude or duty cycle of an output waveform on output lines 183(1) and 183(2). Centering of the lissajous pattern on the detector may be ensured by means of beam centering arrangements, as described above. Nonetheless, there may be an optimum amplitude of $V_x$ and $V_y$ for a given beam spot shape that will minimize harmonic distortion in the output waveform.

The phase offset between voltage signals $V_x$ and $V_y$ may also be useful where phase offsets other than 90 degrees may lead to aperiodic zero crossings, which are equivalent to skews in duty cycle from the 50% duty cycle characterizing a sinusoidal output centered about a value of zero. Altering a phase offset between voltage signals $V_x$ and $V_y$ may be used to tune the duty cycle of an output waveform.

Detector 151(11) includes six output segments 150(61) through 150(66), with alternating segments connected to positive and negative output terminals as shown by the + or − sign within each segment. Detector 151(11) generates an output waveform with a frequency that is triple an input frequency applied to X and Y deflectors used to steer beam spot 170(18).

Other embodiments of an electron-beam amplifier 10 using X-Y deflection may optimize detector shape for low distortion or high frequency operation, such as, for example through use of an elliptical detector, or a segmented ring detector.

Other Frequency Multipliers

A multiply segmented detector is only one means of achieving frequency doubling. For example, in another electron-beam amplifier 10, frequency multiplication is achieved with a single detector segment. By appropriately shaping a detector and/or a beam spot, harmonic components may be emphasized as the beam spot sweeps across an edge of the detector. Emphasis of harmonic components results from a non-linear change in beam current collection with respect to beam spot position. An electron-beam amplifier 10 that multiplies an input frequency through shaped, single beam spots and detectors may generate output frequency tones that are not as pure (i.e., free of harmonics) as in multiple segment embodiments, but smaller, faster detectors and simpler microcolumns (i.e., with only one deflector instead of two) may be used.

Figure 53A:
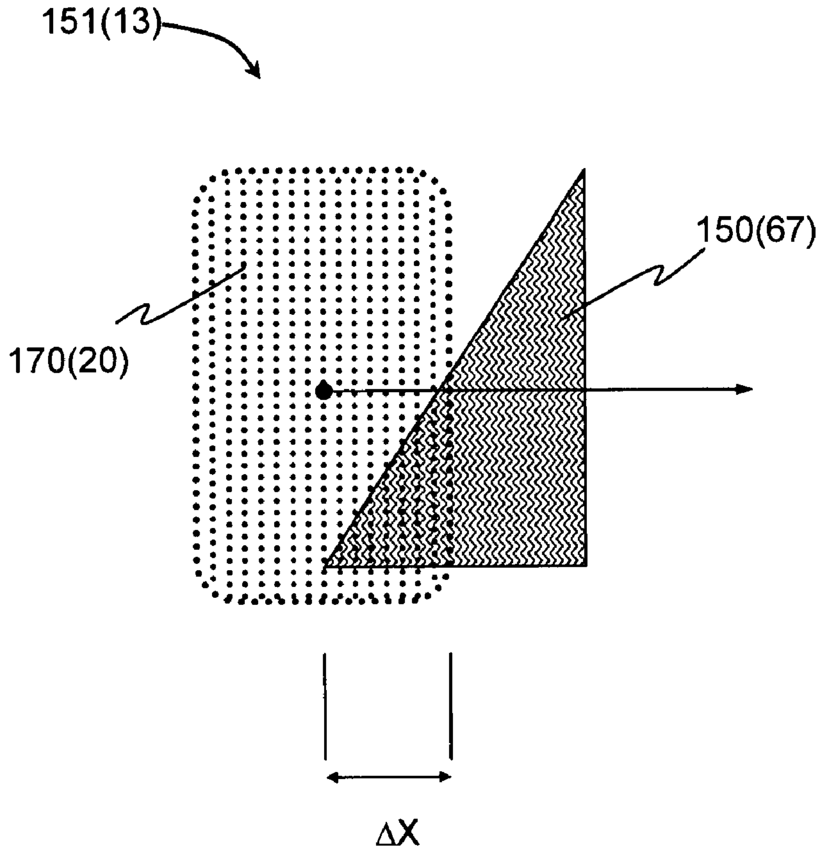
FIG. 53A and FIG. 53B shows two beam spot and detector configurations for frequency multiplication.
Figure 53B:
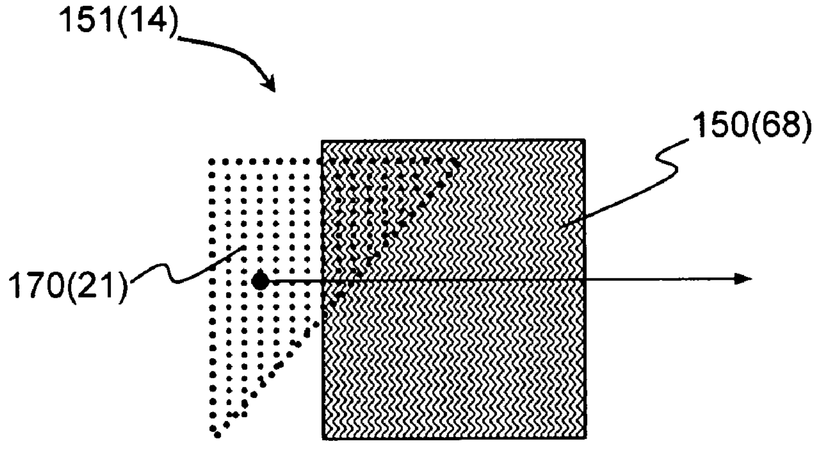

FIG. 53A and FIG. 53B show two beam spot and detector configurations for frequency multiplication. Beam spot and detector configuration 151 (13) includes a rectangular beam spot 170(20) and a triangular detector segment 150(67). Beam spot 170(2) sweeps through a position ΔX corresponding to an angle θ (measured with respect to an undeflected beam from a microcolumn array, not shown). Beam current collected by detector segment 150(67) thus changes quadratically, as $I=a\theta^2$ (where a is a proportionality constant representing variables including beam current and detector size). From trigonometry, if θ changes in response to a deflector voltage $V_0$ which varies sinusoidally with a frequency ω, then $\theta=V_0 \sin(\omega t)$, and the collected current will have a frequency component 2ω according to $$\sin^2\varpi t = \frac{1}{2}(1-\cos 2\varpi t) \tag{1.41}$$

It is also possible to make a beam spot 170(21) triangular and a detector segment 150(68) rectangular, as shown in configuration 151(14). Again, collected current changes quadratically in relation to a sinusoidal beam sweep. The triangular shape of beam spot 170(21) may be generated by the methods discussed above, including use of a triangular shaped microcolumn array imaged onto a detector plane. Configuration 151(14) may offer a somewhat smaller, faster detector, and illustrates the principle that it is the relation of beam spot to detector shape that is useful in generating a desired output.

Figure 54A:
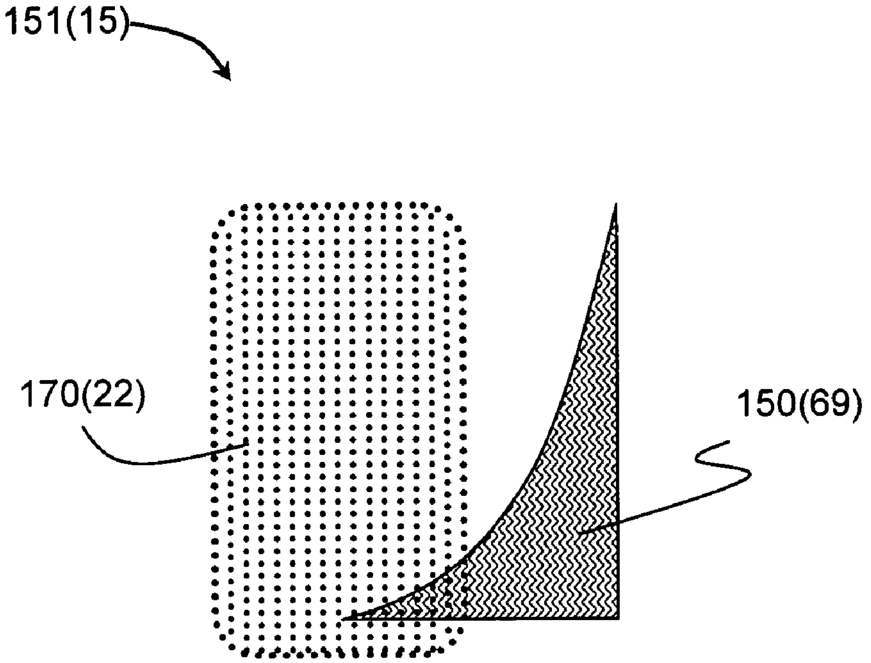
FIG. 54A and FIG. 54B shows two configurations that produce third harmonics of an input frequency.
Figure 54B:
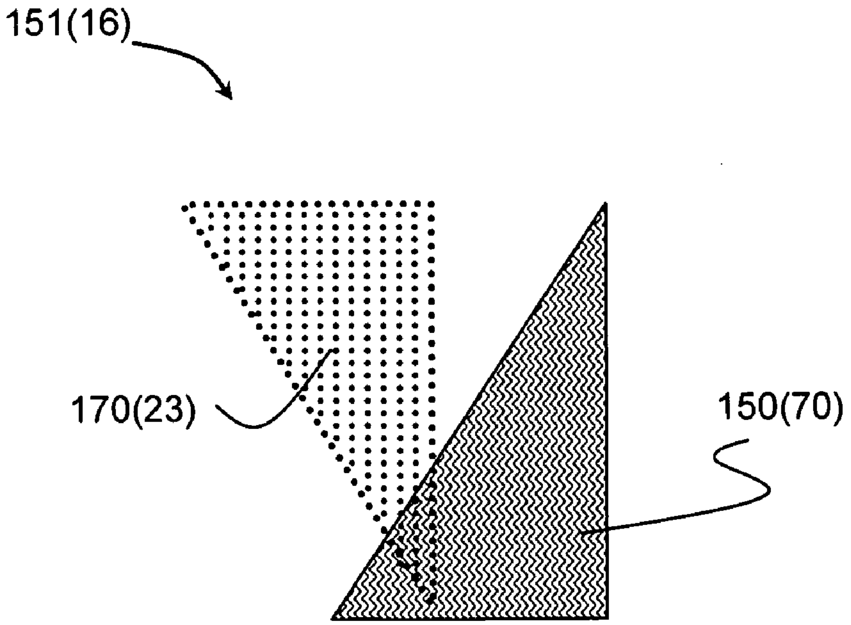

Other shapes may be used to generate even higher frequency multiplication factors. FIG. 54A and FIG. 54B show, by way of example, two configurations that produce third harmonics of an input frequency. Configuration 151(15) has a rectangular spot and a detector 150(69) with a quadratic shape; configuration 151(16) has a triangular spot and a triangular detector 150(70), as shown. Fourth harmonics may be generated by quadratic spot shaping in relation to a triangular detector, fifth harmonics may be generated by a quadratic spot in relation to a quadratic detector shape, and so on.

Mixer

Figure 55:
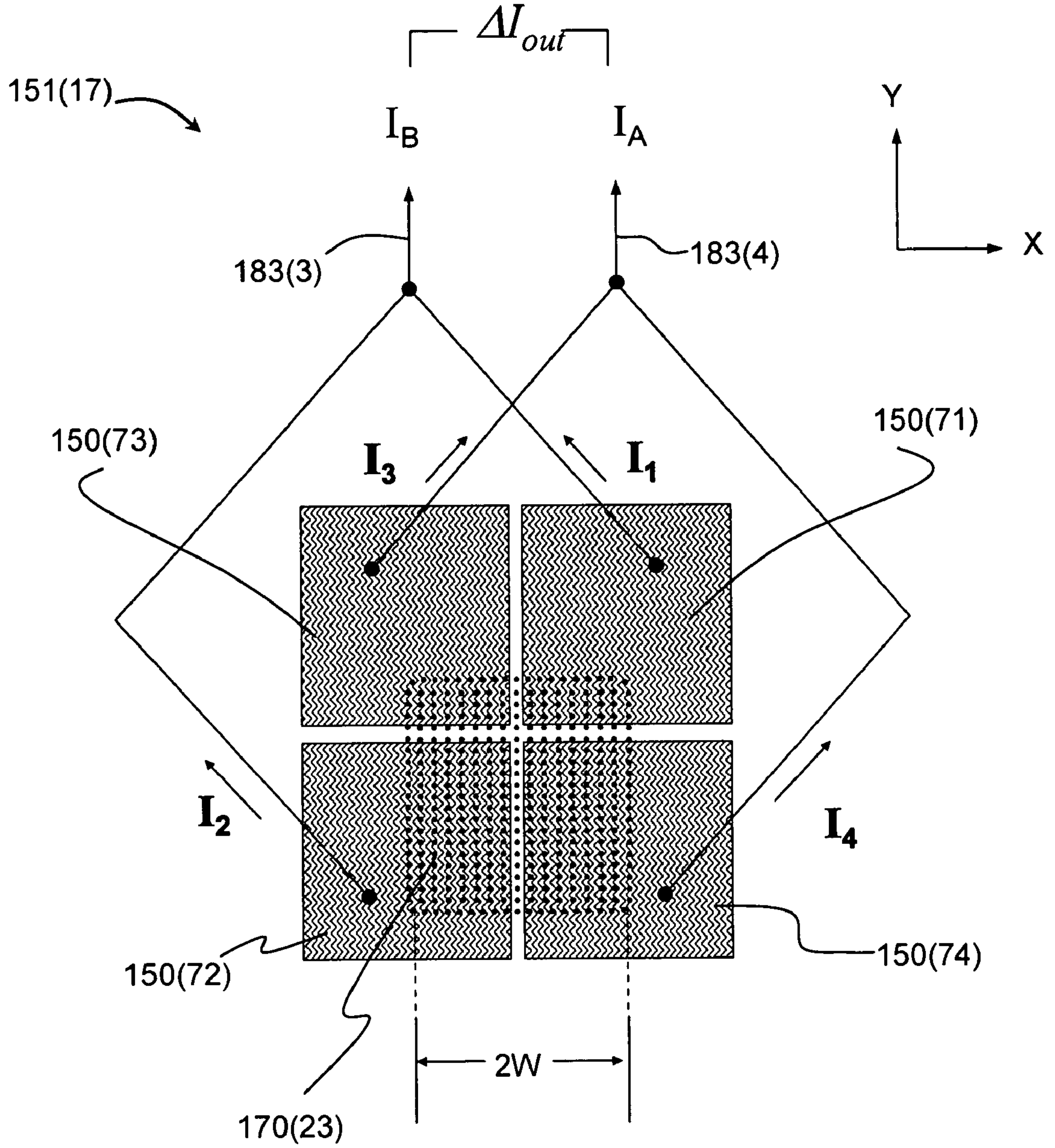
FIG. 55 is a schematic diagram of a multiplier/mixer.

RF mixing is another application of an electron-beam amplifier 10 that may multiply a frequency and generate intermodulation products of two frequencies. FIG. 55 shows a detector and beam spot configuration 151(17) configured for use as an RF mixing device. A microcolumn array (not shown) with X-Y deflection apparatus driven by voltage signals $V_x$ and $V_y$ scans a square beam spot 170(23) across a two-dimensional array of four equal, square detector segments 150(71-74), as shown. RF signals $V_x$ and $V_y$ are coherently demodulated, as discussed below. Detector segments 150(71-74) are cross-connected to detector outputs 183(3) and 183(4), as shown. $V_x$ has frequency $f_1$ and is the voltage signal applied to an X deflector; $V_Y$ has frequency $f_2$ and is the voltage signal applied to a Y deflector.

Beam spot 170(23) will move in the X and Y directions across detector segments 150(71-74) so as to cause a differential current $\Delta I_{out}$ across detector outputs 183(3) and 183(4) to have a fundamental frequency component at a frequency difference $f_1-f_2$. Harmonics that may exist in $\Delta I_{out}$ may be filtered according to means known in the art.

In configuration 151(17), detector segments 150(71-74) each have a width and height of 2 W; square beam spot 170(23) is also of width and height 2 W, and has a uniform cross-sectional current density J. Beam spot 170(23) is deflected in an X direction in response to $V_x$ and in a Y direction in response to $V_y$, instantaneous deflections in these directions are called Δx and Δy respectively, and Δx and Δy are linearly proportional to signals $V_x$ and $V_y$. Currents generated from each of detector segments 150(71-74) are $I_1$, $I_2$, $I_3$ and $I_4$, respectively. These currents vary in response to beam spot deflections Δx and Δy, as shown below $$I_1=J(W+\Delta x)(W+\Delta y)$$

$$I_2=J(W-\Delta x)(W-\Delta y)$$

$$I_3=J(W-\Delta x)(W+\Delta y)$$

$$I_4=J(W+\Delta x)(W-\Delta y) \quad (1.42):$$

When the beam spot is centered, each segment receives a current J $W^2$. Currents $I_1$ and $I_2$ are coupled to drive terminal 183(3) to form current $I_B$ and segment currents $I_3$ and $I_4$ are coupled to drive terminal 184(4) to form current $I_A$. Net output currents $I_B$ and $I_A$ to terminals 183(3) and 184(4), respectively, are $$I_B=I_1+I_2=2J(W^2+\Delta x\Delta y)$$

$$I_A=I_3+I_4=2J(W^2-\Delta x\Delta y) \quad (1.43):$$

Differential output current $\Delta I_{out}$ is given by $$\Delta I_{out}=I_B-I_A=4J\Delta x\Delta y \quad (1.44)$$

Thus, the action is that of a multiplier.

As known in the art of RF receivers, a multiplier is a basic element of many mixers. This may be seen when Δx and Δy are proportional, respectively, to sinusoids of amplitudes $X_0$ and $Y_0$, and frequencies $f_1$ and $f_2$:

$$\Delta x=X_0\sin(2\pi f_1 t)$$

$$\Delta y=Y_0\sin(2\pi f_2 t) \quad (1.44):$$

As may be derived using the Law of Cosines, $$\begin{aligned}\Delta I_{out} &= 4J\Delta x\Delta y = 4J\cdot X_0\sin(2\pi f_1 t)Y_0\sin(2\pi f_2 t) \quad (1.45)\\ &= 2JX_0Y_0\{\sin[2\pi(f_1+f_2)t]+\sin[2\pi(f_1-f_2)t]\}\end{aligned}$$

This shows the sum and difference frequencies characteristic of a mixer. In certain RF applications, the sum frequency is removed by filtering, leaving a difference frequency $(f_1-f_2)$ representative of an intermediate (IF) or modulation frequency.

It may be appreciated that e-beam spot deflections Δx and Δy are generated according to the basic principles of electron-beam amplifier 10. When scan deflections Δx and Δy are small with respect to the dimensions 2W of the spot, a linear multiplication is effected. When the scan deflections are large such that Δx and Δy approach or exceed the spot half dimension W, then a "bang-bang" rectifying type mixer is achieved, operating similar to known circuits which employ active switches, such as MOS transistors, or diodes.

Combinational Logic

Combinational logic is an application for an electron-beam amplifier 10 that resembles the mixing and frequency multiplying embodiments discussed above, but which operates in a different parameter space and for a different purpose. A combinational logic embodiment may include a short drift cavity and multiple deflectors, and may have only one electron gun per logic element. Detectors in combinational logic embodiments may have two or more segments. Voltage signals for Deflectors may be logic signals of binary or multiple quantized voltage levels. Combinations of quantized voltage input states correspond to quantized beam deflections, each quantized beam deflection being representative of a logic state formed by the combination of input states. By positioning detector segments at locations corresponding to quantized beam positions, the detector outputs may be representative of respective logic states. By this means, logic operations, such as AND, OR, XOR, and even complete functions (such as, for example, a full adder) may be constructed. With the inherent advantages, including high-frequency operation and microfabrication, it can be appreciated that combinations of logic elements can be incorporated as complex arithmetic units, digital multipliers or memory elements that operate at picosecond speeds.

The basic principle of a combinational logic embodiment is that if a signal representing a quantized logic value, for example a signal that may be −1V or +1V, is applied to an e-beam deflector, then the corresponding beam may be deflected to one of two states, corresponding to deflection angles, for example $\theta_1$ or $\theta_2$. If a second deflector that is likewise responsive to a signal representing a quantized logic value is incorporated, the number of possible states increases to four, such as beam angles $\theta_1$, $\theta_2$, $\theta_3$, $\theta_4$. With three deflectors, the number of possible states is 8, and so on. The principle may also be extended to multi-valued logic; for example, if 4-level logic signals are applied to two deflectors, the beam angle may have 16 states.

Figure 56:
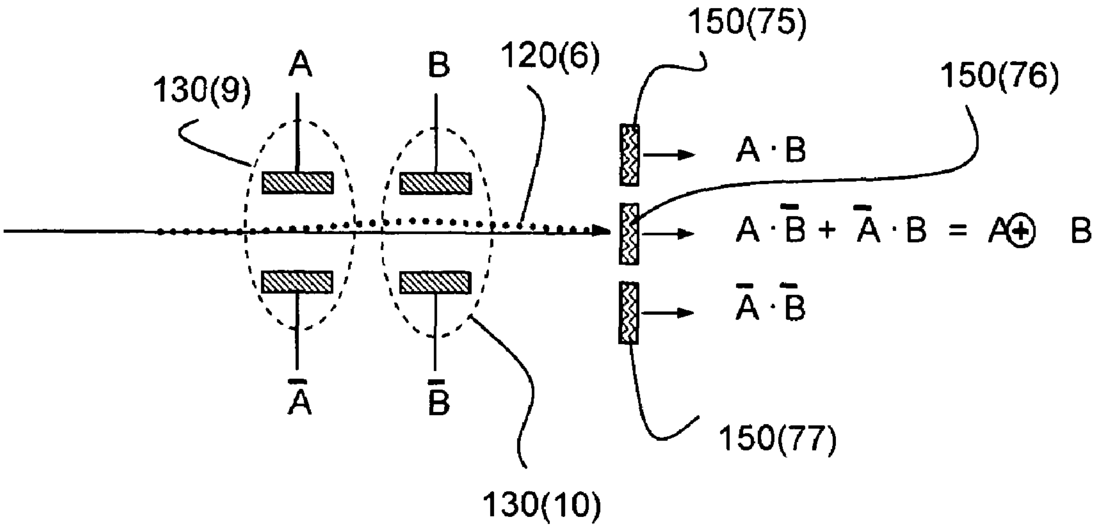
FIG. 56 shows a two-deflector combinatorial e-beam logic system with three linearly arranged detector segments.

FIG. 56 shows a two-deflector combinatorial e-beam logic system with three linearly arranged detector segments 150 (75), 150(76) and 150(77). Signalling in FIG. 56 is binary; two inputs A and B are applied to a deflector 130(9) and a deflector 130(10) respectively. In FIG. 56, four possible deflection states of an electron beam 120(6) exhibit a degeneracy when input A is the inverse of input B. This can be understood with a truth table where A and B take on binary voltage values of +1V and −1V that correspond to deflections +θ and −θ as logic 0 and logic 1 states:

TABLE 3

Two-input logic gate

| State | A | B | Θ |
|---|---|---|---|
| 1 | −1 | −1 | ~2θ |
| 2 | −1 | +1 | 0 |
| 3 | +1 | −1 | 0 |
| 4 | +1 | +1 | .2θ |

Only one detector is activated for each state, but this shows that two of the binary states have the same deflection angle (0). This is reflected in FIG. 56 by the fact that there are only three detector segments. FIG. 56 shows the logic value of each detector segment, the value of the middle detector being an exclusive—or (⊕) of inputs A and B.

A linear arrangement of deflectors and detectors may require a large deflection range when multiple inputs are used. For example, a binary deflection state corresponding to identical deflection angles applied to three successive deflectors may involve three times the deflection angle of a state in which only one deflector is active. Accommodating the deflection range necessary for all logic states may be difficult; this can be mitigated by use of a long drift region, but this increases the drift time of the beam, thus slowing the maximum switching speed and the latency of associated logic operations.

Figure 57:
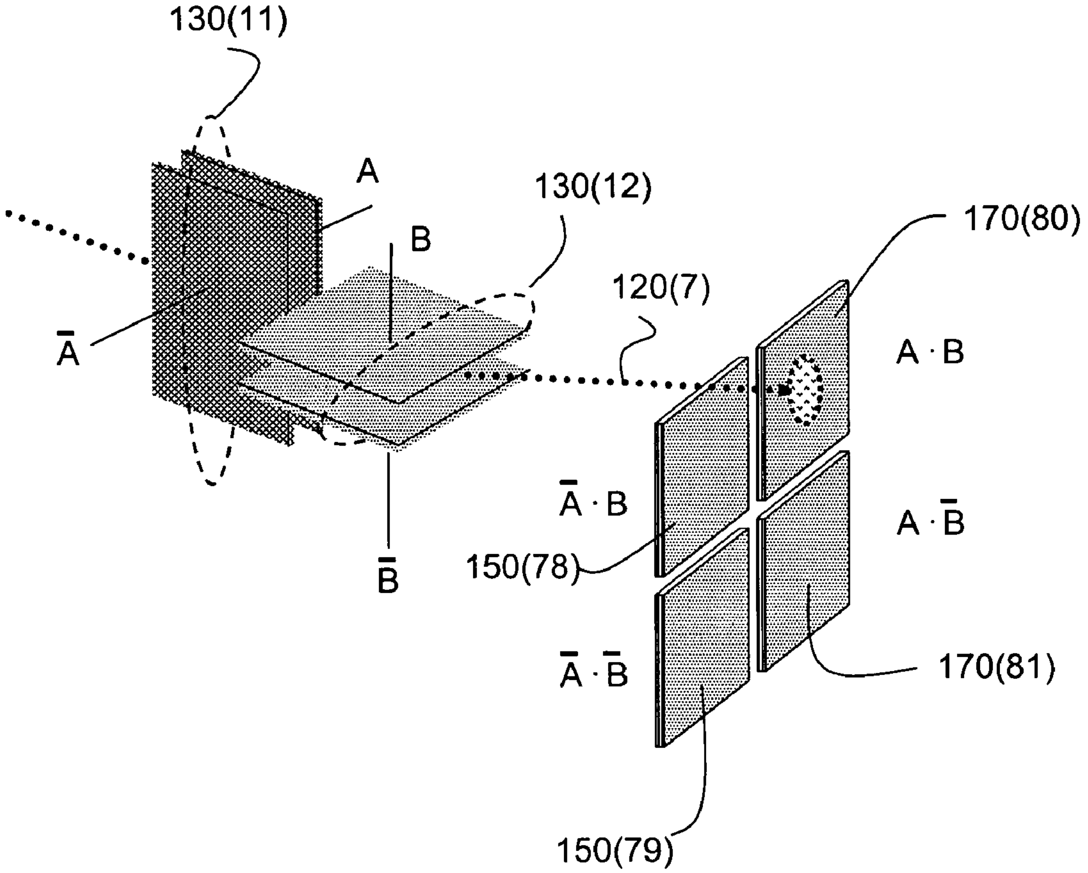
FIG. 57 shows a two-deflector combinatorial e-beam logic system with four detector segments arranged as a two-dimensional array.

FIG. 57 shows a two-deflector combinatorial e-beam logic system with four detector segments 150(78), 150(79), 150 (80) and 150(81) arranged in a two-dimensional array. In FIG. 57, a deflector 130(11) provides X deflection, and a deflector 130(12) provides Y deflection, for electron beam 120(7). The separation of A and B inputs into orthogonal directions removes the degeneracy of states 2 and 3 shown in Table 3.

An electron gun microcolumn 610 may have multiple X and Y deflectors for logic involving more than two inputs. For example, for three logic inputs, a microcolumn may have two X deflectors and one Y deflector. For four logic inputs, a microcolumn may have two X deflectors and two Y deflectors. With X and Y deflection, the logic states are described by a two-dimensional set of beam states, detected with a two dimensional array of detector segments. The result is similar to creating a physical Carnaugh map, as known in the art of logic devices.

Figure 58:
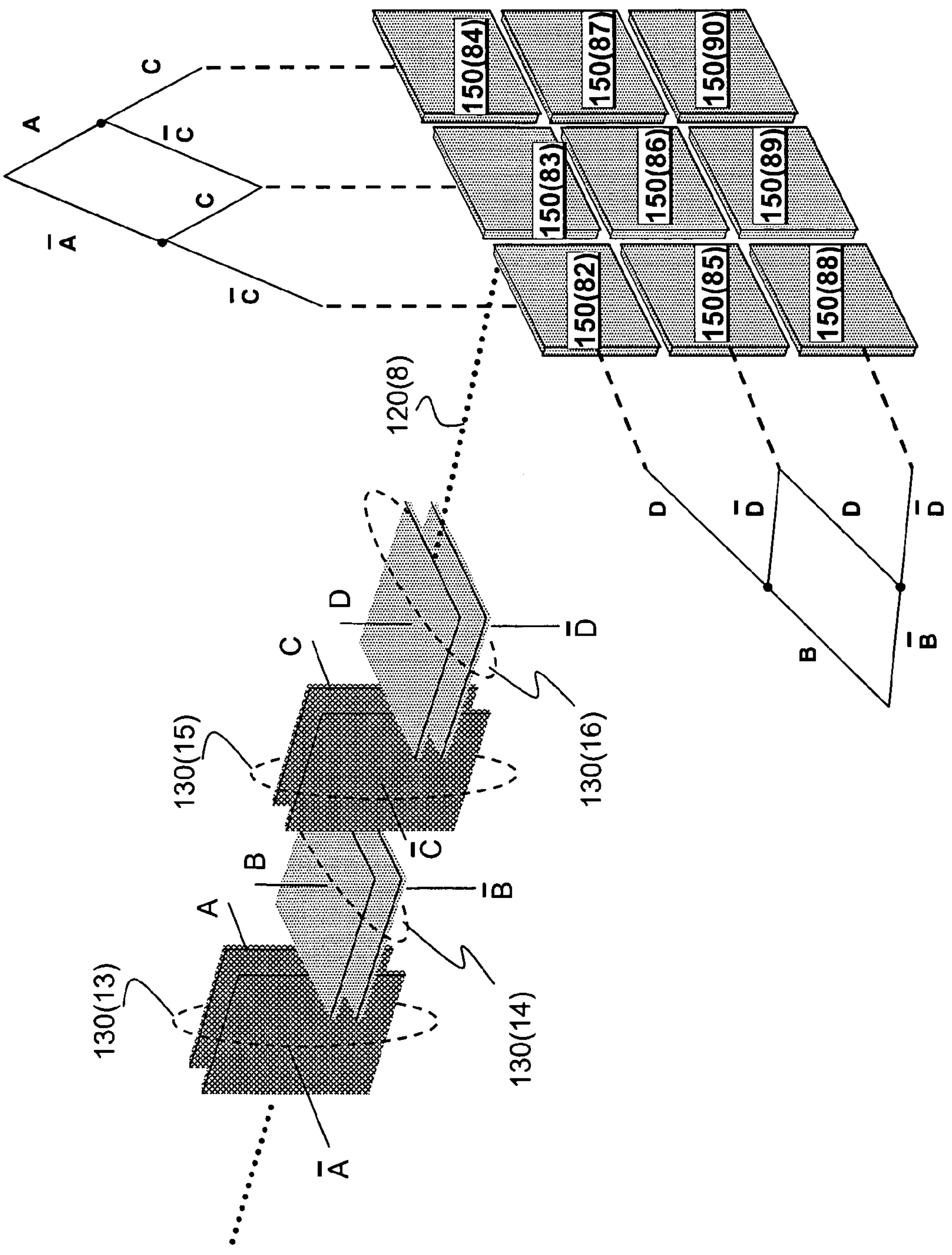
FIG. 58 shows a two-deflector combinatorial e-beam logic system with nine detector segments arranged in a two-dimensional array, and a corresponding map of input states mapped to the detector segments.

For the case of four logic inputs described above, the corresponding 16 logic output states are detected with a matrix of three rows and three columns of detector segments. FIG. 58 shows a two-deflector combinatorial e-beam logic system with nine detector segments 150(82-90) arranged in a two-dimensional array, with a corresponding diagram of input states mapped to the detector segments. Signalling in FIG. 58 is binary; each of inputs A, B, C and D is applied to a corresponding deflector 130(13), 130(14), 130(15) or 130(16) for deflecting electron beam 120(8). Again, there are fewer segments than states, because degeneracies exist with 2 or more deflectors in either of the X and Y directions. However, it can be seen that the number of degenerate states created by deflectors in two directions is less than if all deflectors acted in the same direction.

TABLE 4

Four-input logic states

| State | A | B | C | D | $\Theta_X$ | $\Theta_Y$ | Detector segment |
|---|---|---|---|---|---|---|---|
| 1 | −1 | −1 | −1 | −1 | 2θ | 2θ | 150(88) |
| 2 | −1 | −1 | −1 | 1 | 2θ | | 150(85) |
| 3 | −1 | −1 | 1 | −1 | ~ | 2θ | 150(89) |
| 4 | −1 | −1 | 1 | 1 | ~ | ~ | 150(86) |
| 5 | −1 | 1 | −1 | −1 | 2θ | ~ | 150(85) |
| 6 | −1 | +1 | −1 | +1 | −2θ | 2θ | 150(82) |
| 7 | −1 | +1 | +1 | −1 | ~ | ~ | 150(86) |
| 8 | −1 | +1 | +1 | +1 | ~ | 2θ | 150(83) |
| 9 | +1 | −1 | −1 | −1 | ~ | 2θ | 150(89) |
| 10 | +1 | −1 | −1 | +1 | ~ | ~ | 150(86) |
| 11 | +1 | −1 | +1 | −1 | 2θ | 2θ | 150(90) |
| 12 | +1 | −1 | +1 | +1 | 2θ | ~ | 150(87) |
| 13 | +1 | +1 | −1 | −1 | ~ | ~ | 150(86) |
| 14 | +1 | +1 | −1 | +1 | ~ | 2θ | 150(83) |
| 15 | +1 | +1 | +1 | −1 | +2θ | ~ | 150(87) |
| 16 | +1 | +1 | +1 | +1 | +2θ | 2θ | 150(84) |

An examination of this table for particular detectors segments shows that degenerate states correspond to some form of exclusive—or combination; for example, detector segments 150(83), 150(86) and 150(89) correspond to A ⊕C, while detector segments 150(85), 150(86) and 150(87) correspond to B ⊕D.

Despite the degeneracy observed, orthogonal deflection drive is a preferred construction; it still minimizes degeneracy as compared to a linear array configuration, and a deflection required in each of the X and Y directions is smaller than would be required in a linear detector array configuration. Smaller deflection allows a proportionately shorter drift region, shorter drift time and smaller deflection drive voltages. For example, with only two deflectors, one in X and the other in Y, drift distance and time may be reduced by one-half when compared to a pair of X deflectors; correspondingly, logic switching operations occur twice as fast. Alternatively, for a given drift distance, a deflection voltage may be smaller (for example, 0.5V versus 1V) so that power consumption may be reduced or switching speed may be increased.

It may be appreciated that degenerate states are not the only way to combine logic states. In the case of FIG. 57, the logic functions AND (A·B), OR (A+B), NAND $(\overline{A \cdot B})$, NOR, XOR (exclusive—or, ⊕) and XNOR (inversion of exclusive—or) can be created with nothing more than one or two wires to connect appropriate detectors to a load. With a single deflector and detector, inversion may also be achieved. With two deflectors, any of four possible boolean states may be represented. With three deflectors, more complex functions may be achieved. Furthermore, a logic input state may be inverted by simply reversing the coupling of signals to a deflector.

By "wire-oring" (as it is termed) deflector inputs and/or detector outputs using electrical connections, other logic functions may be implemented, providing great flexibility in a simple structure, since any of these means may switch almost as fast as any other. This is unlike conventional logic gates made from transistors, where certain gate types are much slower than others. For example, a CMOS NOR gate is slower than a CMOS NAND gate; also, conventional static CMOS logic lacks an inherent complement output, which must be generated with a second inversion gate, adding to switching delays. An ECL or current mode gate suffers loss in performance because multiple transistors are required for complex functions, and due to having a limited power supply range. In contrast, logic embodiments of e-beam amplifier 10 may be fast in almost any logic combination, because the logic function is encoded as a beam position (or state), rather than as a combination of switches.

Figure 59:
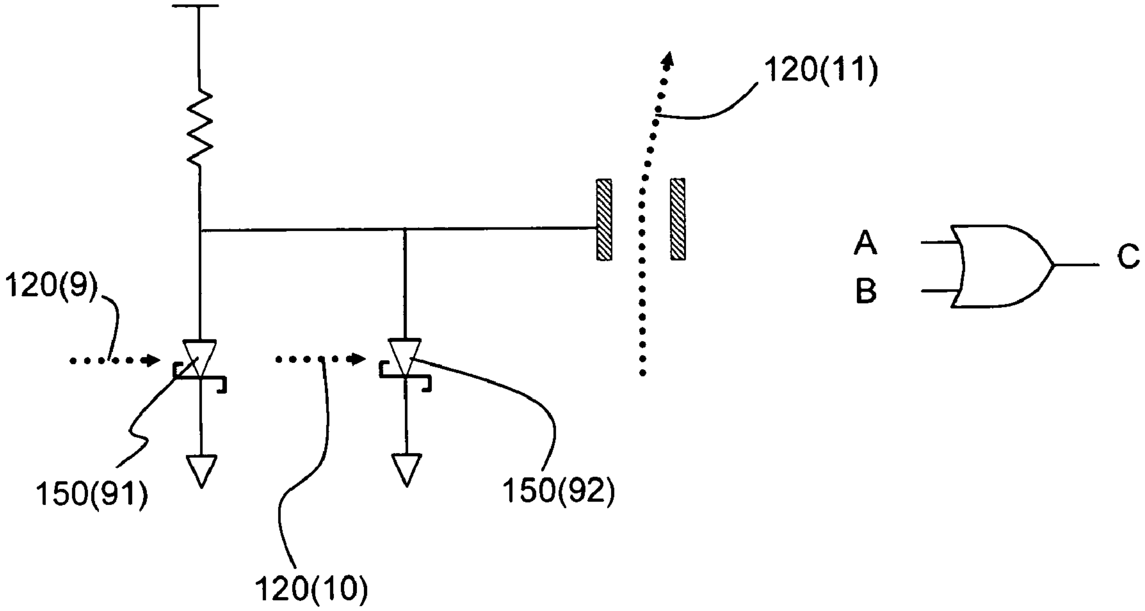
FIG. 59 shows schematically a logic device that may be formed by two electron beams and their associated detector segments acting collectively as a signal source for a deflector of a third electron beam.

FIG. 59 shows schematically a logic device with two electron beams 120(9) and 120(10) and their associated detector segments 150(91) and 150(92) acting collectively as a signal source for a deflector of a third electron beam 120(11). In the embodiment of FIG. 59, if electron beams 120(9) and 120(10) are respectively steered by deflectors according to logic inputs A and B, then electron beam 120(11) corresponding to a logic output C will be steered according to an AND function of A and B.

Other combinations are possible. For example, deflectors may be physically designed to achieve more or less deflection for a given input voltage ("deflection gain"). One deflector might have a deflection gain of 10 degrees beam deflection per volt of deflection drive, while another deflector might have a deflection gain of 5 degrees per volt. As described above, longer or shorter deflector plates will alternately increase or decrease deflector gain; spacing deflector plates more closely or further apart will also increase or decrease deflector gain, respectively. By using deflectors with varying amounts of deflection gain, beam deflection states may be gray-coded to eliminate degeneracies and make detection more resistant to errors. These two goals follow directly from use of multiple deflection gains.

Gray coding is a well-known method of digital word encoding whereby single bit errors in the word cause only one bit of error in a digital count represented by a word. Gray-coded operation is useful for specialized functions often found in communication systems, where robust signaling that is tolerant of small errors is necessary. In electron-beam amplifiers 10, gray-coded beam states make detection resistant to single bit errors in beam displacement.

Figure 60:
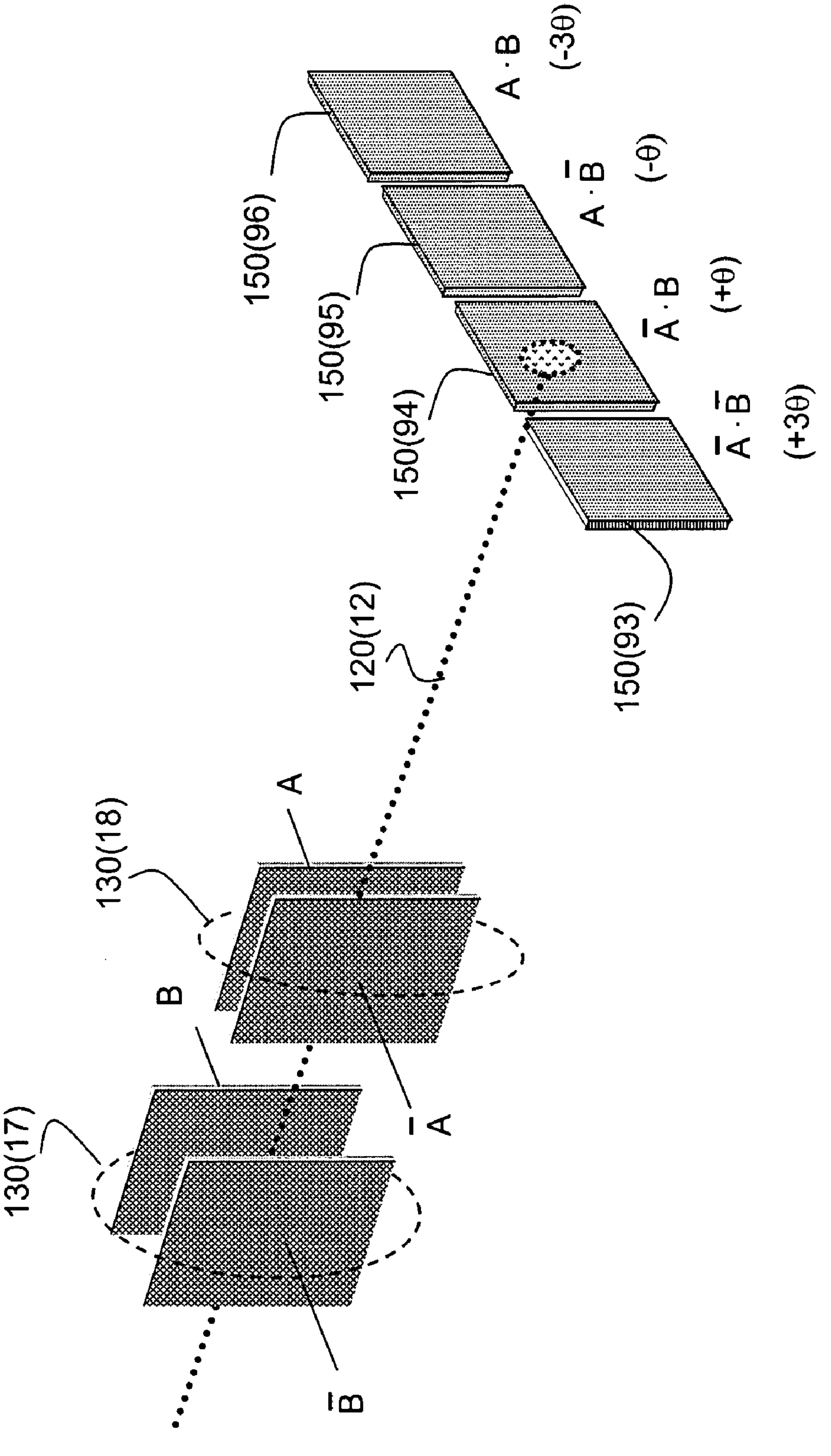
FIG. 60 shows a two-input gray-coded logic gate with four detector segments in a linear array, and a corresponding map of input states mapped to the detector segments.

FIG. 60 shows a two-input gray-coded logic gate with four detector segments in a linear array, and a corresponding map of input states mapped to the detector segments. A deflector 130(17) produces a deflection angle of +θ or −θ in response to values of an input logic state B. Deflector 130(17) has twice the plate spacing as a deflector 130(18) that produces a deflection angle of +2θ or −2θ in response to values of an input logic state A. (Alternatively, and not shown, deflector 130(17) could have half the plate length of deflector 130(18) but with identical plate spacing, to produce the same difference in deflection gain). Detector segments 150(93-96) are arranged such that deflection angle changes of 2θ move electron beam 120(12) to each succeeding segment, as shown. The deflection angle coding is as shown in Table 3 and FIG. 60.

TABLE 1

Gray-coded Deflections

| State | A | B | θ | Detector segment |
|---|---|---|---|---|
| 1 | −1 | −1 | +3θ | 150(93) |
| 2 | −1 | +1 | +θ | 150(94) |
| 3 | +1 | −1 | −θ | 150(95) |
| 4 | +1 | +1 | −.3θ | 150(96) |

For example, if logic states A and B represent a binary number with A the most significant bit ("MSB") and B the least significant bit ("LSB"), it can be seen that a maximum error in the output generated by a single logic state error (perhaps due to a noise glitch at an earlier stage of digital processing) may be 1 LSB. In contrast, the previous 2-input gate could exhibit a 1 MSB error. Gray-coding may be extended to more bits, as is known in the art.

One aspect of a logic gate may be that logic levels are compatible between gate inputs and outputs. In certain embodiments of an electron-beam amplifier, a difference in potential between detectors and deflectors may be up to several hundred volts. If the logic switching is dynamic enough, this potential difference may be accommodated with capacitive coupling.

Another means of logic level compatibility is to ensure that detector output levels are the same as deflector input levels. One method of keeping these potentials compatible is to use a zero bias drift cavity in which an exit plane of an electron gun is at the same potential as a beam contact and a detector plane (i.e., allowing electrons to drift from deflector to detector through a field-free region). Since a deflector is inherently a differential input device, a common mode level can be rejected to some degree, and detector output can be directly coupled to the deflector.

For logic operation, a suitable detector bias is less than 1V. This is consistent with an extremely high-speed device. Logic devices may use faster, lower bias detectors than amplifiers, since power is not required or desired. Operation at less than 0.5V is possible when detectors are Schottky diodes with turn-on potentials of around 0.2 to 0.3V.

A detector may be terminated in either a resistor or an active load, such as a resonant tunnel diode (RTD). When a resistor is used, beam current may pull down the output potential of the detector to the beam contact potential; this is a logic "0." Without beam current, the resistor acts to pull up the output potential to the power supply voltage, representing a logic "1." An RTD load behaves similarly, except that an RTD has a negative differential resistance, so the pull-up and pull-down are speeded up for faster operation.

As mentioned previously, it is desirable to operate e-beam logic elements with a single electron gun per gate. Because a very short drift region is required for low gate delay (a few microns), a single gun can tolerate higher beam current without space charge spreading causing beam defocusing during the drift time.

Nonetheless, a low beam current is still preferred to reduce detector heating. For this reason, detector gain should be as high as possible, but this conflicts somewhat with the requirement of high deflection gain. On one hand, high deflection gain is achieved with a low-energy electron gun; on the other hand, high detector gain is achieved with a drift cavity field that accelerates beam electrons to achieve high cascade gain. If the drift cavity is field free, all the cascade gain may come from the electron gun acceleration. One solution is to accept the lower cascade gain and compensate with higher avalanche gain in the detector. For example, photonic detectors with avalanche gains exceeding 1000 are relatively common. The downside is less radiation tolerance, which might be acceptable for many applications, and might be offset by a slightly higher beam current. For example, an electron-beam amplifier 10' for an amplifying application might have a beam current of 1 μA, a cascade gain of 100, an avalanche gain of 10 and an overall detector gain of 1000; an electron-beam amplifier 10" for a logic application might have a beam current of 2 μA, a cascade gain of 20, an avalanche gain of 25 and an overall detector gain of 500. The higher beam current of electron-beam amplifier 10" provides the same detector output current, and almost entirely compensates for an increased radiation sensitivity due to the 2.5× higher avalanche gain.

In electron-beam amplifiers 10' and 10" above, the detector current is 1 mA; this may be inadequate for the highest speed operation, so even higher beam current and avalanche gain may be required. For example, a 50 ohm load, 500 mV switching application may require at least 10 mA detector current; avalanche gain may be increased by a factor of 10, or beam current may be somewhat (which may be tolerated because of a very short drift cavity). Beam current might be increased to 4 μA and avalanche gain increased by a factor of 5, or the beam current increased by a factor of 3× and the avalanche gain increased by a factor of 3.3. An advantage of sharing the gain increase between beam and detector is, again, to reduce radiation sensitivity.

As mentioned, a drift cavity of an e-beam amplifier 10 in a logic application may be very short, to minimize transit time of a beam. Beam delay directly affects a maximum cycle time that the logic can operate at. For example, if two deflectors are 1 μm long each, with a 1 μm drift cavity, the total drift distance is approximately 3 μm. For a 50V beam (with a velocity of $4\times10^6$ m/s), transit time from the input of a first deflector to a detector is 750 femtoseconds ($10^{-15}$). This suggests an upper switching rate limit of around 1 THz.

Gate loading delays can also be estimated, by way of example. With a 1 um drift cavity, detectors may be on the order of 0.25 μm×0.25 μm in size. Junction devices such as Schottky diodes typically have capacitances on the order of 1 fF/$\mu m^2$. Thus, a detector capacitance may be approximately 0.125 fF. The loading of a single deflector with plate spacing of 1 μm, a plate length of 1 μm and a plate height of 1 μm is 0.009 fF. For a 50 ohm load, capacitance is very dependent on construction, but may be well under 1 fF, so a value of 0.5 fF will be conservatively assumed here. Thus, a total loading capacitance may be 0.125 fF+0.009 fF+0.5 fF, or approximately 0.75 fF. The fall time when a detector turns on is dominated by pull-down current times into the total loading capactance, given by dv/dt=I/C. With a 500 mV power supply and a 1 mA beam current, a fall time may be 375 fs. A rise time when the detector turns off is approximately the RC time constant of the load resistor and capacitance, or, 50 ohms× 0.75 fF=37.5 fs. These figures are approximate and will depend strongly on the application, but they demonstrate rise/fall times on the same order as the gate delay, thus an e-beam amplifier 10 used in a logic application may have switching speeds on the order of 1 THz.

As with other embodiments of an electron-beam amplifier 10, detectors provide gain with respect to collected beam current. This gain is essential if a single electron gun is to be used, which may be a preferred construction when many logic elements are combined in an integrated processor or other complex logic system.

Since detector gain is not precise, diode means may be used to limit detector output voltage to controlled binary logic levels. Schottky diodes are preferred, since they are readily available from the detector construction, and they are among the fastest clamping devices known.

Figure 61:
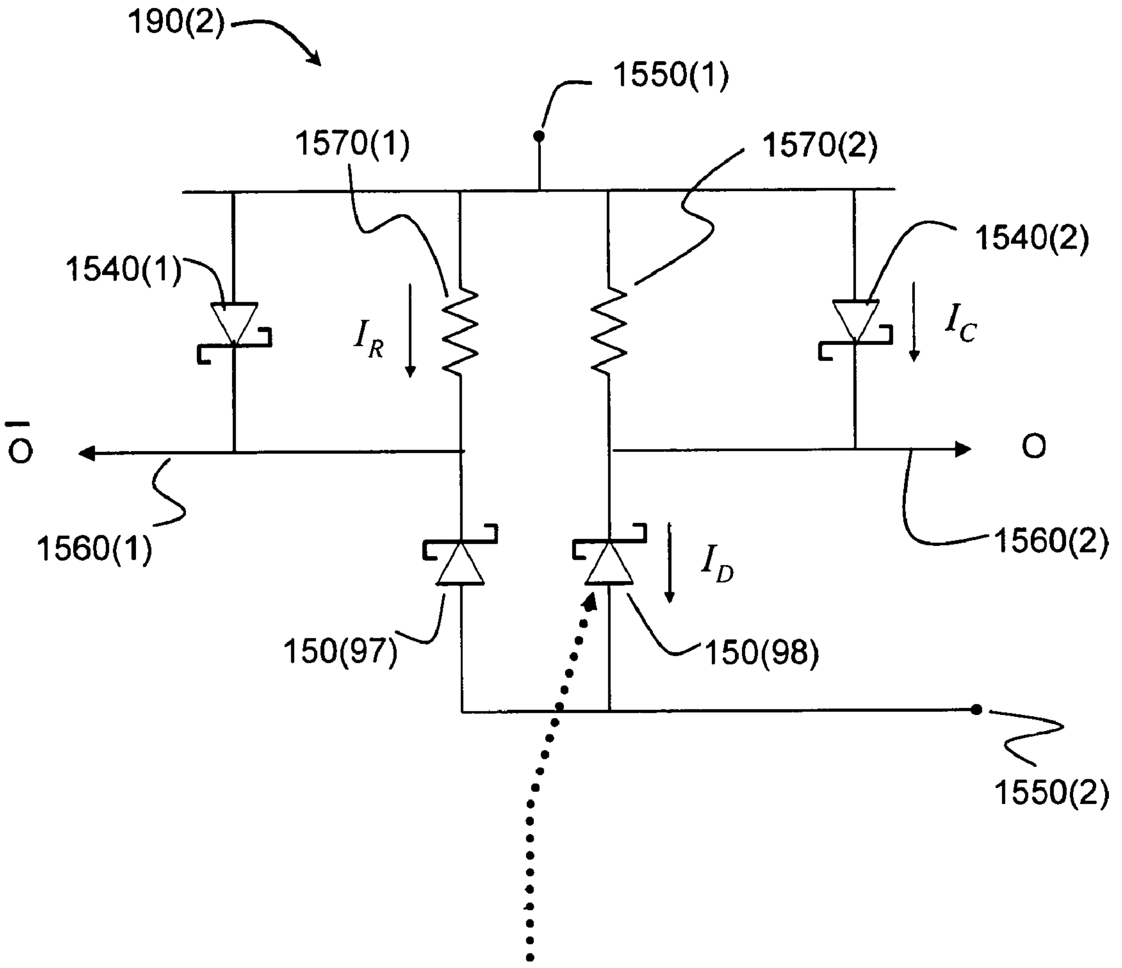
FIG. 61 illustrates a use of clamping diodes to control selective current flow.

FIG. 61 schematically shows an output network 190(2) using clamping diodes 1540(1) and 1540(2). Output network 190(2) is connected to two power supplies 1550(1) and 1550(2) and is configured to provide differential outputs 1560(1) and 1560(2) that are complementary logic states, as shown. Power supply 1550(1) is a reference potential that corresponds to an appropriate level for one of the complementary logic states; power supply 1550(2) is a potential that may be different from the reference potential by an amount that exceeds a desired difference between the complementary logic states. Each side of output network 190(2) includes a detector segment 150(97) or 150(98), a resistor 1570(1) or 1570(2), and a clamping diode 1540(1) or 1540(2), as shown.

A beam 120 is configured by an electron gun and focusing optics (not shown) to strike detector segment 150(97) or 150(98). A detector 150 that is not struck by beam 120 isolates a corresponding output 1560 from power supply 1550(2), allowing the corresponding resistor 1570 to pass a current $I_R$ so that the corresponding output 1560 reaches the potential of power supply 1550(1). In this illustration, detector 150(97) is not struck by beam 120, current $I_R$ passes through resistor 1570(1), and output 1560(1) reaches the potential of power supply 1550(1), but it will be appreciated that the circuit symmetry is designed to produce an equal effect on detector 150(98), resistor 1570(2) and output 1570(2) if the beam strikes detector 150(97).

A detector 150 that is struck by beam 120 emits an output current $I_D$ that drives the potential of a corresponding output 1560 until the corresponding output 1560 reaches a clamp potential of the corresponding clamping diode 1540. When current $I_D$ changes the potential of output 1560 to exceed the clamp potential $V_{clamp}$, clamping diode 1540 passes a current $I_C$ that prevents any further change to the potential of output 1560.

Thus the potential of an output 1560, corresponding to a detector 150 struck by a beam 120, will achieve the potential of power supply 1550(1) offset by the clamp potential $V_{clamp}$. It should be noted that the potential of power supply 1550(2) may be positive or negative with respect to power supply 1550(1) as a matter of design choice, for implementing suitable logic levels and choices of detectors 150 and clamping diodes 1540. The diode symbols used in FIG. 61 are not meant to limit a circuit implementation to the diode polarities indicated, but simply to show that a diode is used.

Radiating Amplifier Embodiments

Power Combining Arrays

Ganging amplifiers is one way to increase the power output of amplifier embodiments while maintaining a wide signal bandwidth. Ganging may exploit a high input impedance of the deflector apparatus, such that many amplifiers may be driven from a common low-impedance source, for example, a 50 ohm transmission line.

The principle obstacle to ganging amplifiers is not input loading, but power-combining many outputs. In conventional technologies, such as solid state amplifiers, this type of combining may present a formidable problem. Simple electrical networks made of transmission lines or waveguides have significant ohmic losses that can drastically reduce the efficiency of the power summing, especially in large arrays. Efficient power combiners generally take two forms: waveguide combiners and free-space summing of electromagnetic waves. Waveguide power combiners suffer from ohmic losses, and are difficult to construct in a microfabricated form. The hierarchical structure of combiners, such as the Wilkinson type, also makes them suffer from wave reflections at the many summing nodes, resulting in high standing wave ratio and more lost efficiency.

As described below, free-space summing of electromagnetic waves is a preferred method of power-combining since there are no ohmic losses or standing waves. With free-space summing, amplifiers are coupled to radiating antenna elements, and the radiated fields naturally combine by coherent superposition. It is only desirable that the amplifiers be driven from a common signal input or sources that have the same frequency and similar phase. In many applications, these free-space fields may be used directly, as in a radar or communications transmitter. The effect of the phasing may, for example, create a directional RF beam. In other applications where RF radiation is not desired, the coherent sum can be collected in another, larger antenna, such as a horn or parabolic dish.

Figure 62:
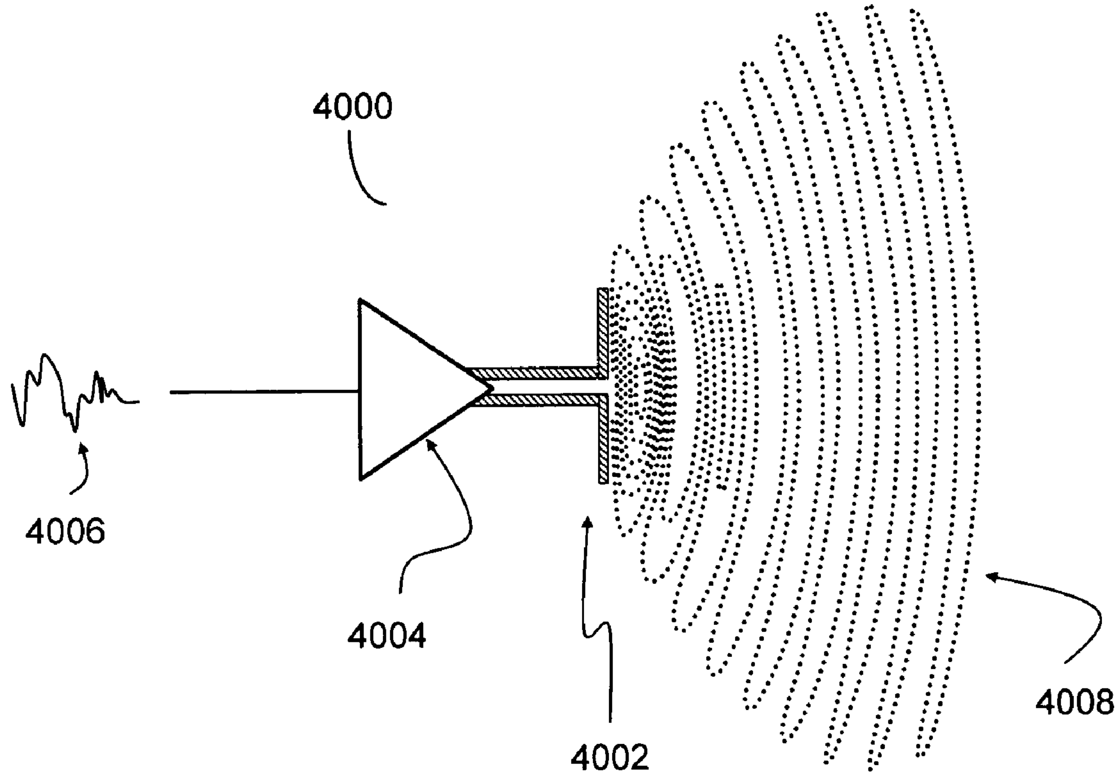
FIG. 62 illustrates an antenna coupled amplifier.

Thus, a radiating EBTX embodiment 4000 shown in FIG. 62 couples an antenna 4002 to a detector 4004, such as a clamping diode, to convert an incoming signal 4006 into a radiating field 4008. The incoming signal 4006 is pre-processed by an electron gun array as previously shown and described. In a preferred construction, the antenna 4002 is constructed with microfabrication and integrated with the detector 4004 to form a unitary assembly. In one variation, the detector 4004 and the antenna 4002 are separate components that are electrically coupled by intermediate wiring (not shown). In another variation the antenna 4002 is an integral part of the detector 4004. In a third variation, the detector 4004 is coupled to a waveguide (not shown), which is open-terminated to free-space as an aperture radiator. In a fourth variation the waveguide couples to a horn antenna which provides more directivity to the free-space radiation.

Figure 63:
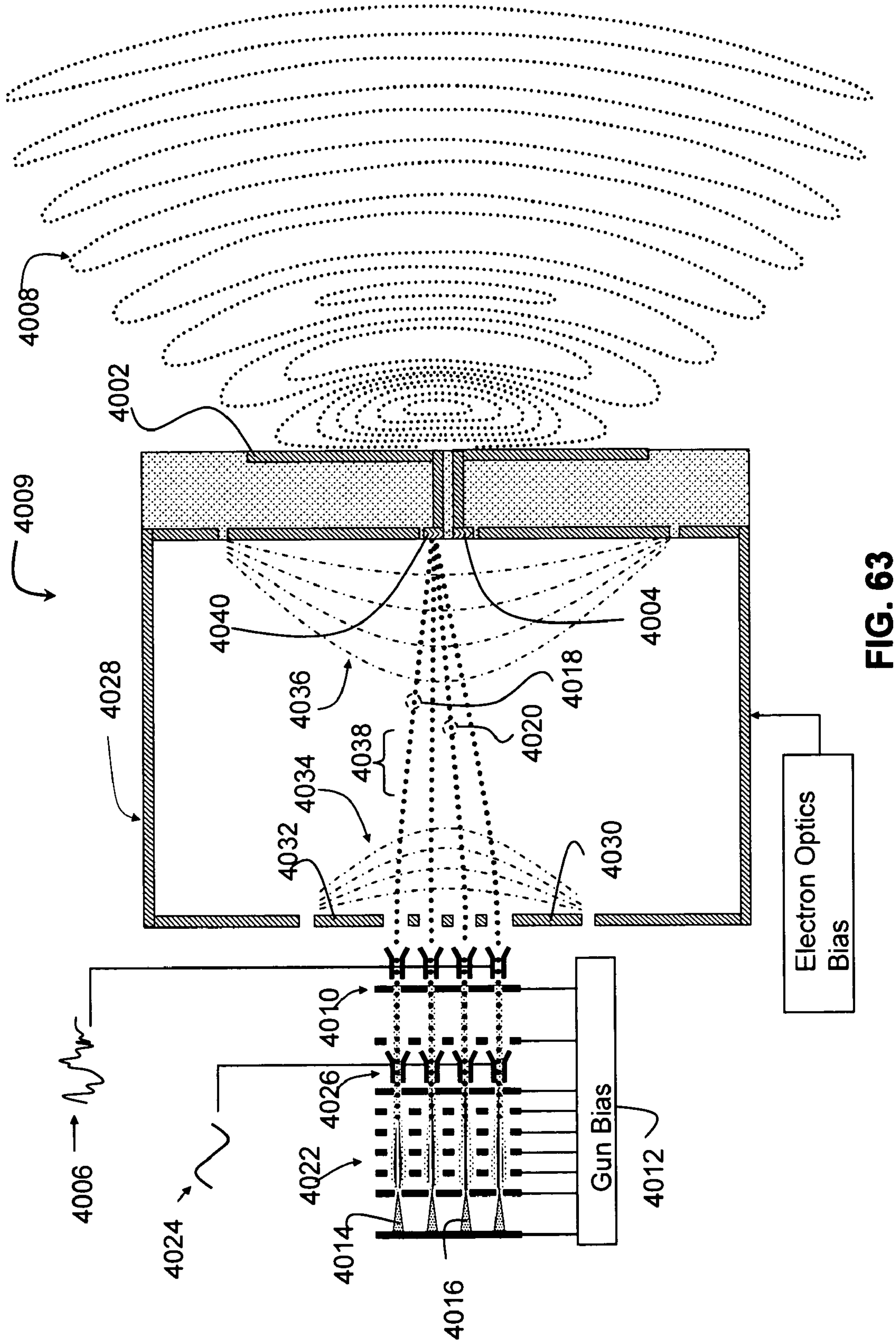
FIG. 63 is a midsection of an EBTX.

FIG. 63 shows one form of EBTX construction 4009 including the elements of FIG. 62. Incoming signal 4006 is applied to deflectors 4010 of an electron gun array 4012. A plurality of electron guns 4014, 4016 emit corresponding beamlets 4018, 4020, which are shaped using beam shaping electrodes 4022. Beamlets 4018, 4020 may be blanked by selective application of blanking signal 4024 to blanking electrodes 4026. A metal drift can 4028 is provided with lensing electrodes, such as electrodes 4030, 4032 to form a doublet lensing field 4034, 4036 that focuses an array of beamlets 4038 onto spot 4040, which mat be swept across detector 4004 to emit the radiating field 4008. Deletion of antenna 4002 would convert the EBTX construction 4009 into an EBRX device.

These radiating embodiments are termed here the EBTX (Electron Beam Transmit Amplifier) since they may amplify, as in a receiver mode, as well as transmit an electromagnetic field. Thus, free-space fields may be efficiently summed in large power generating arrays such as a phased array antenna.

Figure 64:
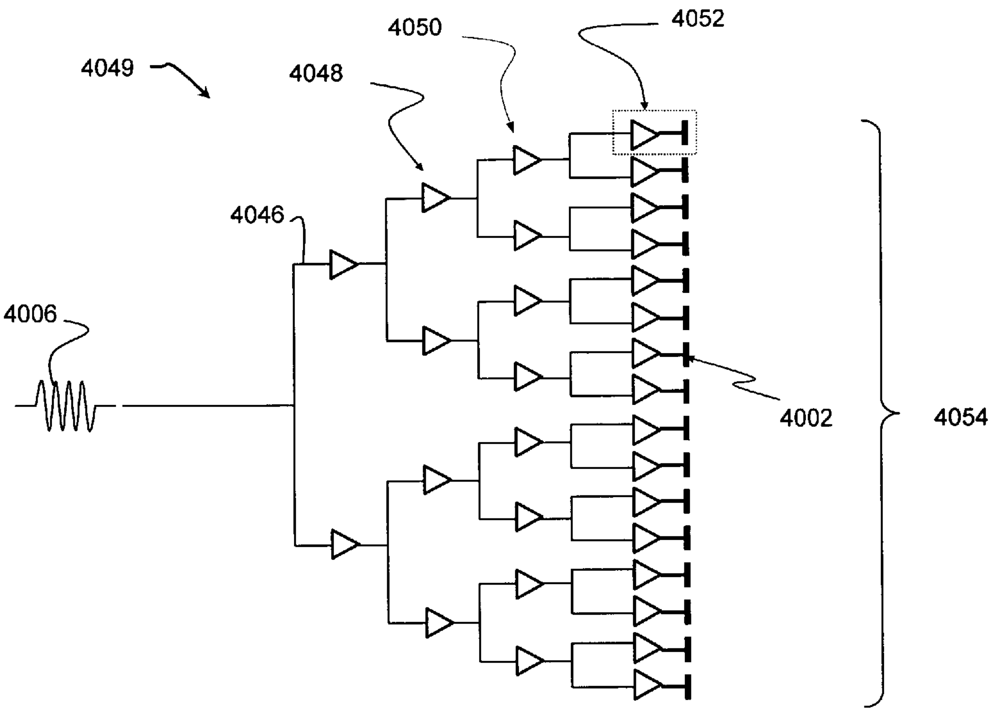
FIG. 64 shows use of ganged EBTX's for use in corporate feed.

Since EBTX amplifiers can be microfabricated the loading of many elements can be distributed by a hierarchical input feed constructed from EBRX amplifiers (EBTX sans antenna). By this method thousands or even millions of power combining elements can be constructed as entire wafer-based assemblies. FIG. 64 illustrates one form of an arrayed EBTX power construction 4044. An RF signal input 4006 is amplified by a hierarchical array of EBRX amplifiers 4046, 4048, 4050, 4052, for example, where array 4046 doubles the RF signal input 4006 with amplification, array 4048 quadruples the RF signal 4006 with amplification, array 4050 repeats the RF signal 4006 eight times with amplification, and array 4052 repeats the RF signal 4006 sixteen times with amplification for submission of sixteen signals that have each been amplified four times to an array of antennas 4054, such as antenna 4002. Thus, large arrays can exploit previously described features, including time delay control, mixing, variable gain control and frequency multiplication to make fully integrated antenna beamformers capable of transmission, reception, and electronic beam steering.

Antenna-coupled Embodiments

One radiating embodiment couples the detector of an EBRX to a separate antenna element via a short transmission line. In this case, the e-beam detector sees the network impedance of the transmission line, and the antenna accomplishes the impedance transform to free space. The antenna may be placed as closely as possible to the e-beam driven detector and uses integrated microfabrication technology to achieve a proximity of microns. Given the small dimensions of a microfabricated element, this may limit the antenna to a maximum size of some millimeters. Thus, radiating embodiments are most suitable for millimeter wave and sub-millimeter wave applications, which corresponds to a frequency spectrum of approximately 40 GHz and to 1 THz (K-band and above).

Figure 65:
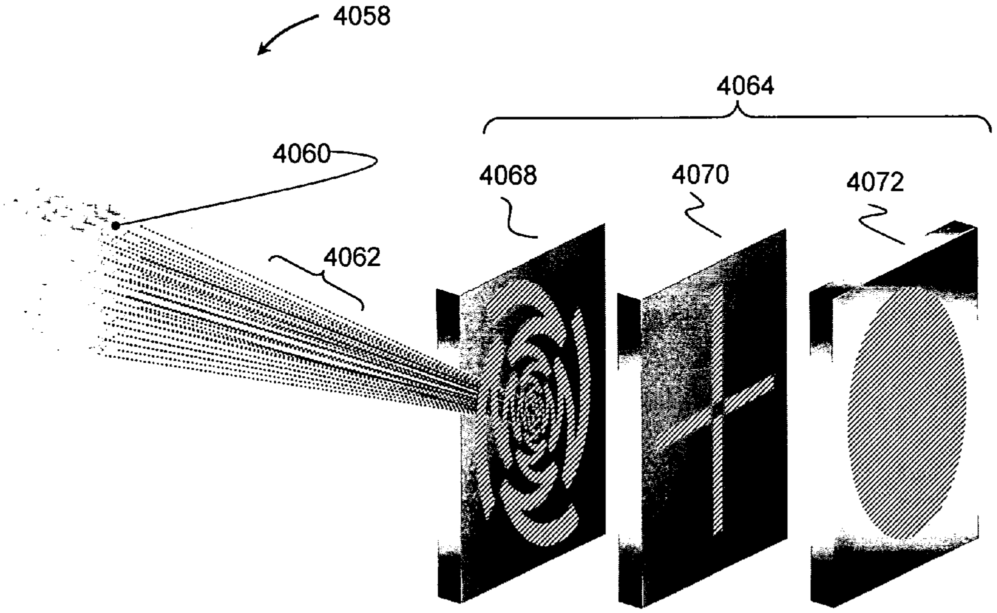
FIG. 65 shows various examples of amples of complex patch emitters.

The nature of the microfabricated construction makes various types of strip and slot antennas compatible for coupling to the detector in forming an EBTX. These can be formed, for example, using multi-level metallization processes that are found in many microfabrication technologies. The most common types of strip and slot antennas are resonant structures such as the dipole and patch antenna, but there are also many broadband types, including the log-periodic, various forms of wideband spiral antenna, the wideband vivaldi flared type, and ultra-wideband structures. FIG. 65 shows, by way of example, an EBTX device 4058 configured to emit an electron beam 4062 towards a detector (not shown) that is coupled to one of a plurality of alternative antenna types 4064 to provide radiating field emissions depending upon the environment of use. The alternative antenna types may be used interchangeably in place of one another and include, for example, a wideband spiral antenna 4068, wideband vivaldi flared antenna 4070, and ultra-wideband antenna 4072.

Dipole

Figure 66A:
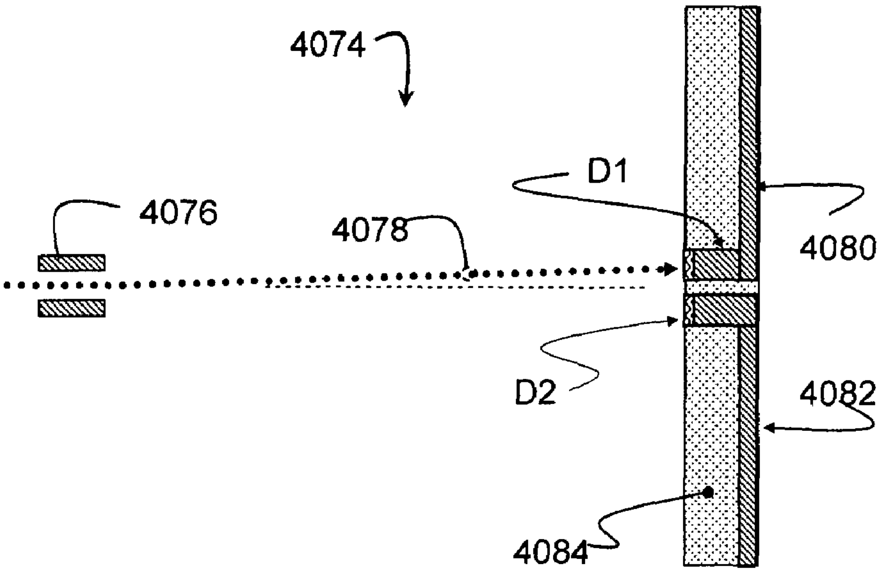
FIG. 66A, FIG. 66B, and FIG. 66C illustratre various aspects of a simple dipole antenna feed.
Figure 66B:
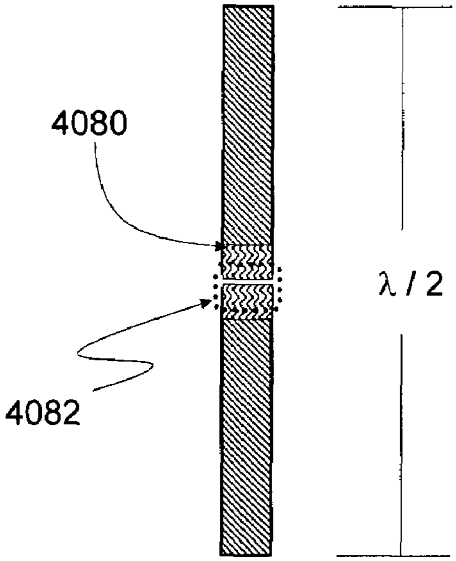
Figure 66C:
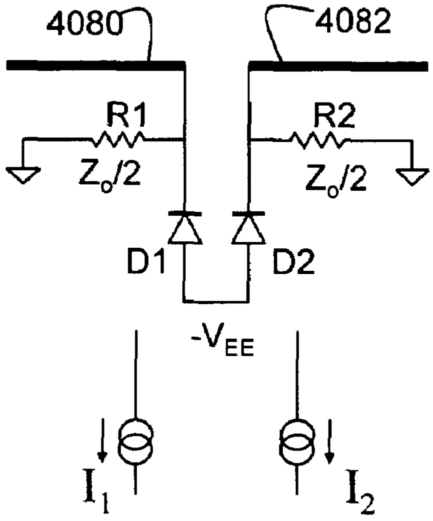

FIG. 66A shows a side midsectional view of a dipole antenna feed 4074. An EBRX 4076 sweeps beam 4078 across detectors D1, D2, which are respectively coupled to antennas 4080, 4082. In this case, the antennas 4080, 4082 are strip antennas forming a dipole antenna having an overall length of λ/2, and no balun is required, as shown in the front perspective of FIG. 66B. The antennas 4080, 4082 are formed by a layer of metallization, as shown, across substrate 4084 remote from detectors D1, D2. As shown in FIG. 66C, the feed includes load resistors R1, R2 for the detectors D1, D2, which are integrated on the detector substrate 4084, but are not shown in FIG. 66A. The load resistors R1, R2 provide detector bias and perform impedance matching $Z_0/2$ to the antenna feed. The ohmic value of the resistors R1, R2, is each one-half the feed impedance of the antenna. The detectors D1, D2 are connected to a reference potential—$V_{EE}$ and alternating currents $I_1$, $I_2$ are allocated to the respective dipoles. For an ideal half-wave dipole the feed impedance is 73 ohms.

Figure 67:
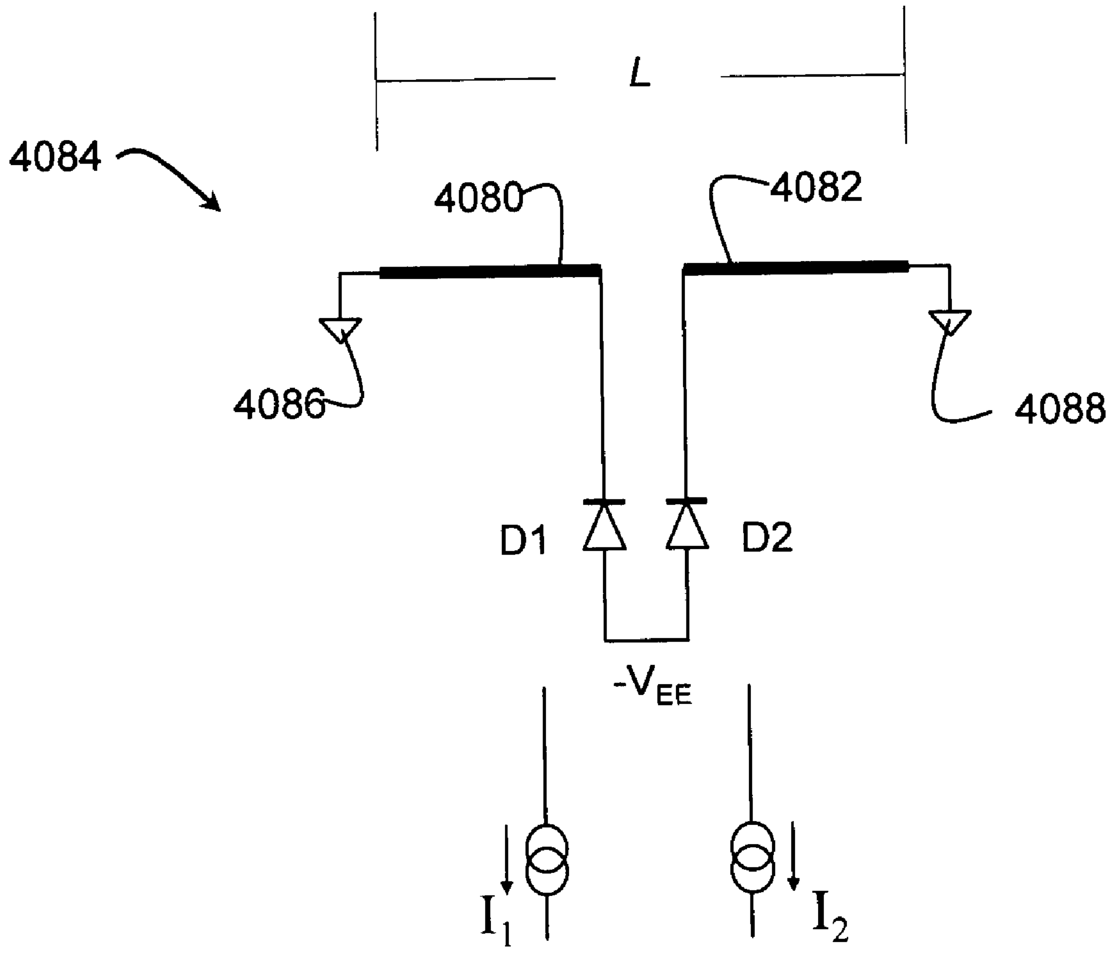
FIG. 67 shows a modified dipole antenna feed.

FIG. 67 shows a modified dipole antenna feed 4084 where a positive detector bias is applied from the ends of the dipole 4086, 4088. In this case, the detector segments D1, D2 directly drive the feed impedance. In this case, the differential detector D1, D2 eliminates the need for a balun. This arrangement has some advantage for certain embodiments that use dipole arrays. The length L of the dipole is approximately one-half wavelength, e.g., λ/2, or a multiple of one-half wavelength.

The power output of a single dipole can be estimated from $P=V_0^2/2Z_0$, where $V_0$ is the peak sinusoidal voltage fed to the antenna, and $Z_0$ is the theoretical feed impedance of the dipole. $V_0$ is approximately ½ the detector reverse bias voltage since voltage excursions outside this range will de-bias the detector. For a 2V reverse bias, $V_0$=1V. From these quantities, the power output of a dipole is approximately 7 mW.

Selectable Dipole Polarization

Figure 68D:
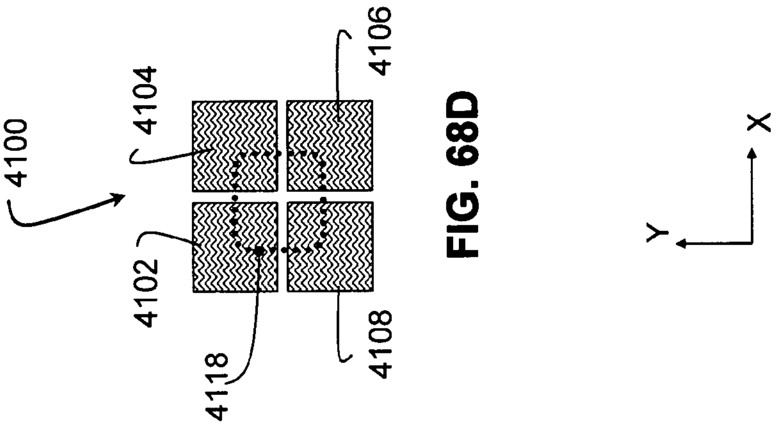
FIG. 68A, FIG. 68B, FIG. 68C and FIG. 68D show various aspects of a selectable polarization with dual dipole.
Figure 68B:
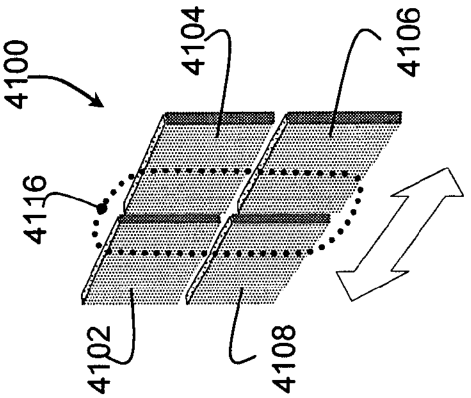
Figure 68C:
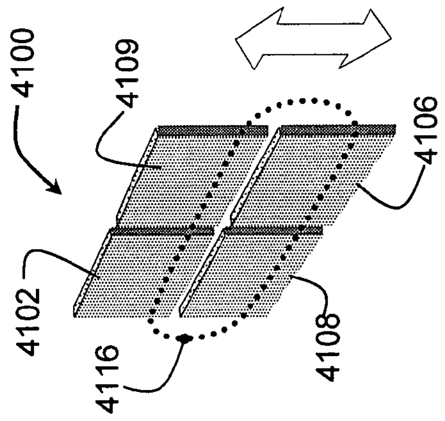
Figure 68A:
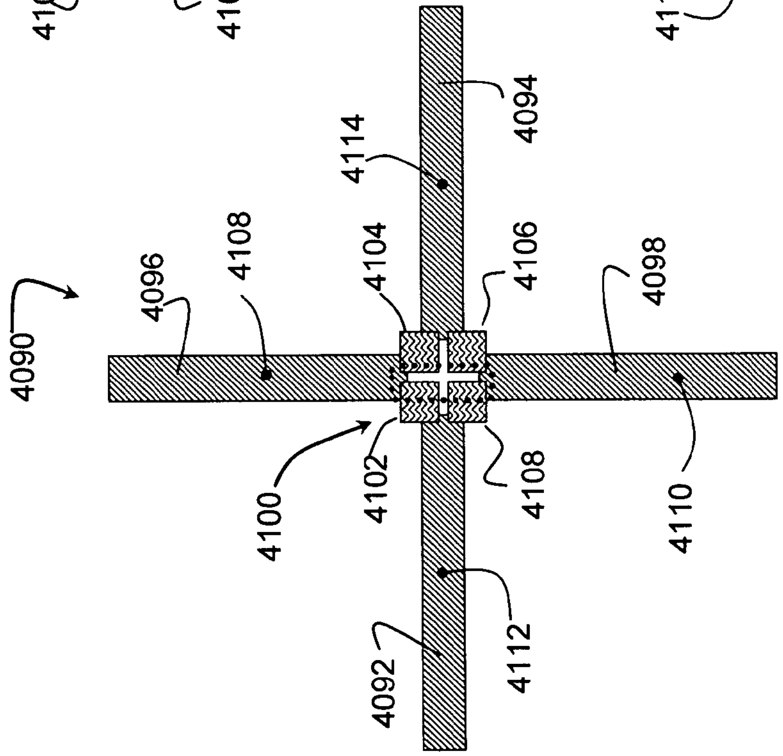

A dipole provides a single plane of polarized electromagnetic radiation. Many applications require selectable polarization. FIG. 68A shows one example of how an antenna 4090 can be constructed to provide selectable polarization from a pair of orthogonally arranged dipoles including a first dipole 4092, 4094 and a second dipole 4096, 4098. A quadrangular detector 4100 made of four square segments 4102, 4104, 4106, 4108 is coupled to the feed points of the two dipoles to implement a polarization schema, for example, with segments 4102, 4104 coupled to feedpoint 4108, segments 4106, 4108 coupled to feedpoint 4110, segments 4102, 4108 feedpoint 4112 and segments 4102, 4106 to feedpoint 4114. A programmable rectangular beam spot 4116 sweeps across the detector 4100 in either X fashion, as shown in FIG. 68B or Y fashion as shown in FIG. 68C. FIG. 68D shows an alternative beam spot geometry as a square beam spot 4118. The beam spot 4116 has a long dimension approximately equal to the detector diameter, and a short dimension less than one-half the detector diameter. The beam spot 4116 sweeps in the direction of the short dimension to modulate the current on that axis of the detector. When the spot sweeps in X, the spot modulates pairs of segments 4102, 4108 and 4104, 4106. The combination 4102, 4108 acts as one detector segment in this case, and 4104, 4106 acts as another. When the spot sweeps in Y, it modulates pairs of segments 4102, 4104 and 4106, 4108. The X-sweep excites the horizontal dipole 4092, 4094 and leaves the vertical dipole 4096, 4098 unaffected since the total current into the vertical dipole is constant. Similarly, the Y-sweep excites the vertical dipole 4096, 4098 and leaves the horizontal dipole segments 4102, 4104 and 4106, 4108. The X-sweep excites the horizontal dipole 4092 unaffected.

As for other embodiments, the X and Y sweeps may be achieved by arrays of electron guns that each have X and Y deflectors In another arrangement, a square beam spot 4118 is employed for both polarizations, as shown in FIG. 68D. In this case the beam spot 4118 is approximately one-half the diameter of the detector and the maximum sweep in either X or Y keeps the spot within the boundaries of the detector. The disadvantage of this embodiment is that the detector may be twice as large (area) than the previous embodiment for the same spot area. The spot area is assumed the same so that space charge spreading effects are similar. The advantage of the embodiment is that the beam spot does not need to be re-programmed for one of two rectangular orientations, and polarization switching can be faster.

Broadband Antenna

Figure 69:
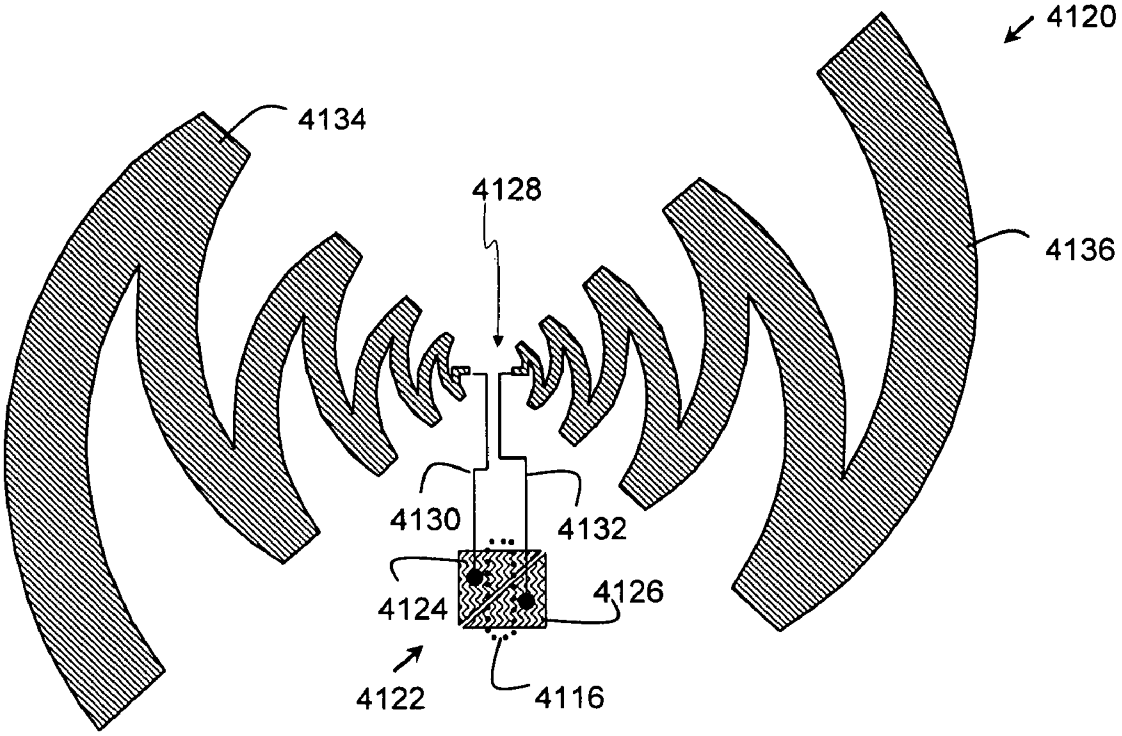
FIG. 69 shows a wideband single polarized planar antenna, in strip or slot form.

FIG. 69 shows one embodiment for a representative broadband antenna, to illustrate how the above concepts can be applied to other antenna geometries. Instead of simple strips of a dipole, the antenna 4120 is a folded log spiral antenna. This geometry has one advantage of a relatively constant polarization versus frequency. A detector 4122 includes triangular segments 4124, 4126 that are directly coupled to a center feedpoint 4128 on lines 4130, 4132. The detector 4122, as shown, is exaggerated in size for clarity. Antenna segments 4134, 4136 as shown may be metal or, alternatively, slots in a metal ground plane.

Figure 70A:
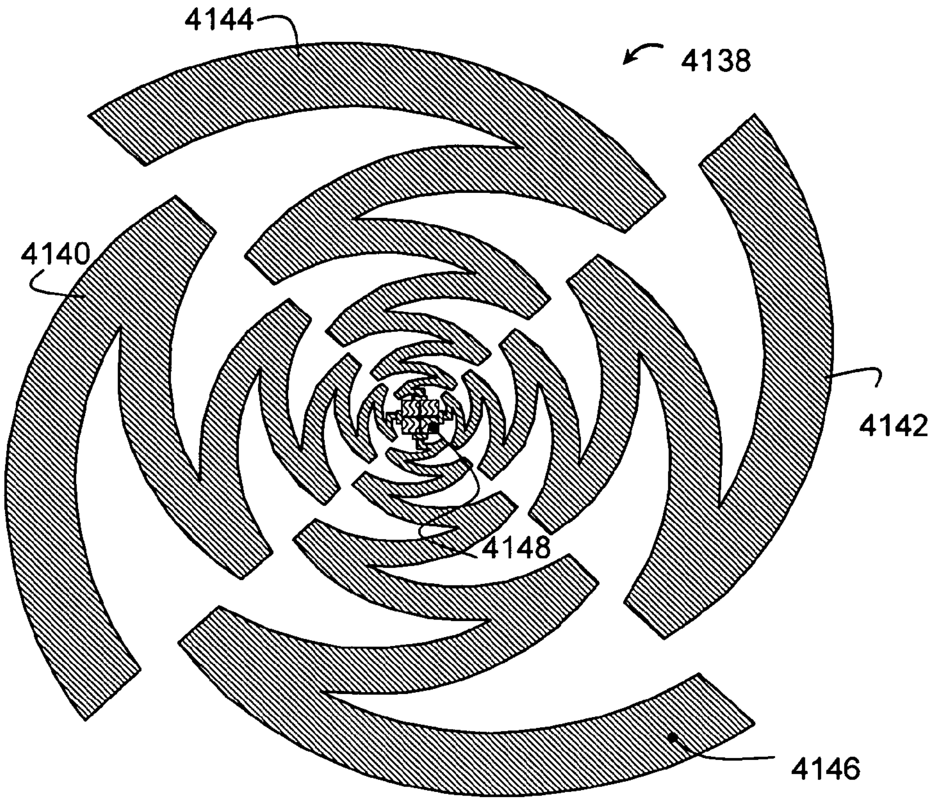
FIG. 70A, FIG. 70B and FIG. 70C show various aspects of wideband dual polarized planar antenna, in strip or slot form.
Figure 70B:
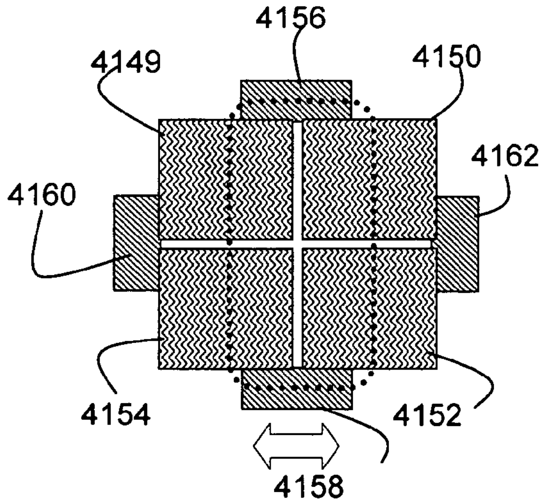
Figure 70C:
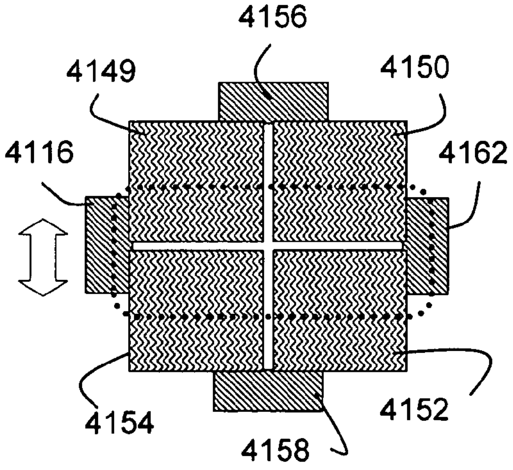

FIG. 70A shows a dual polarized version of a folded log spiral antenna 4138. Antenna 4138 is constructed to provide selectable polarization from a pair of orthogonally arranged dipoles including a first dipole 4140, 4142 and a second dipole 4144, 4146. A quadrangular detector 4148 made of four square segments 4149, 4150, 4152 and 4154 is coupled to feed points of the two dipoles to implement a polarization schema. For example, as shown in FIG. 70B, segments 4149, 4150 couple to feedpoint 4156, segments 4152, 4154 couple to feedpoint 4158, segments 4149, 4154 couple to feedpoint 4160 and segments 4150, 4152 couple to feedpoint 4162. A programmable rectangular beam spot 4116 sweeps across the detector 4148 in either X fashion, as shown in FIG. 70B, or Y fashion, as shown in FIG. 70C. Operation is the same as shown for antenna 4090 in FIG. 68A.

Figure 71:
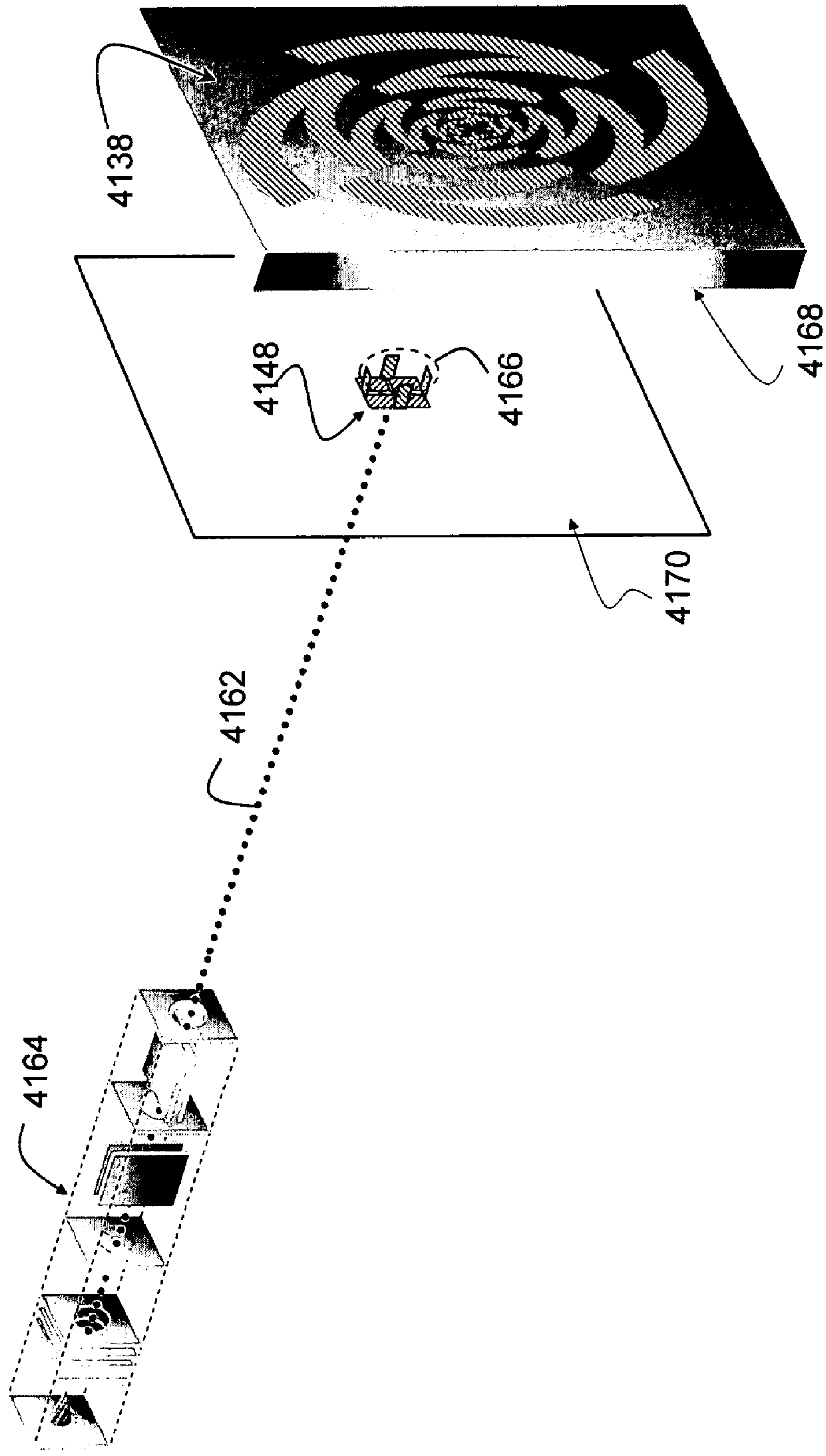
FIG. 71 shows e-beam excitation of a detector for a log-spiral antenna.

FIG. 71 shows a perspective assembly view of the detector—antenna coupling for use with the antenna 4138, and indicates with a representative e-beam 4162 from electron gun 4164 how the detector 4148 is excited. The detector 4148 is provided with electrical contacts 4166 extending through a substrate 4168 upon which the antenna 4138 is formed. The contacts extend behind detector plane 4170.

Patch Antenna

Figure 72:
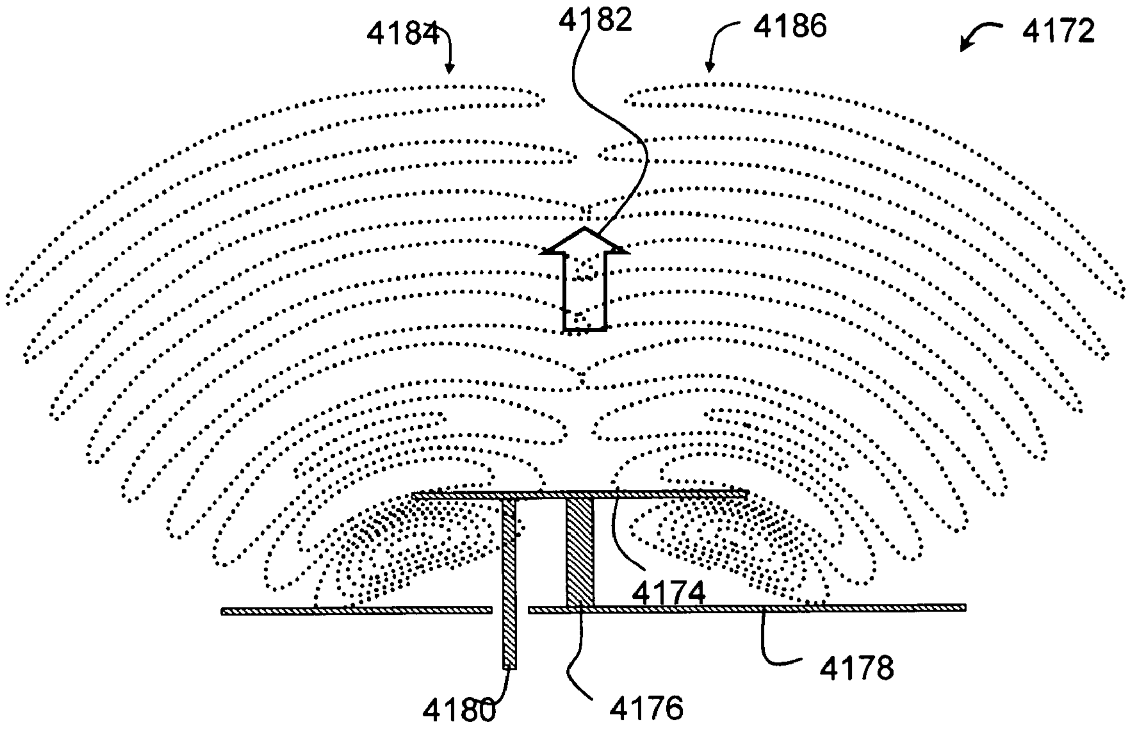
FIG. 72 illustrates RF emanations form a typical simple patch antenna.

A patch antenna 4172 is shown in FIG. 72. Many varieties of patch antennas exist where, for example, a strip dipole over a ground plane may be considered a patch. As shown in a side view, a square patch has a central ground termination 4176 connected to ground plane 4178 with a drive point feed 4180 that is offset to one side, though there are also many variations of slot-fed patches. The basic principle of radiation is the same as antennas discussed above, which is a resonance effect that is based on the propagation delay for the driving voltage to equilibrate across the antenna. When the delay approaches one-half period of the driving frequency, resonant fields can be established in preferred directions, thus giving rise to radiation as transmitted RF 4182. While a dipole is a symmetrical structure driven by a balanced bipolar signal source, the patch usually counts on some asymmetry in the single feedpoint 4180 to establish a bipolar field 4184, 4186 at opposite sides of the perimeter of the patch 4174. This creates a radiation field that is dominantly polarized in one plane, though cross-polarization levels may be high.

Selectable Patch Polarization

Figure 73A:
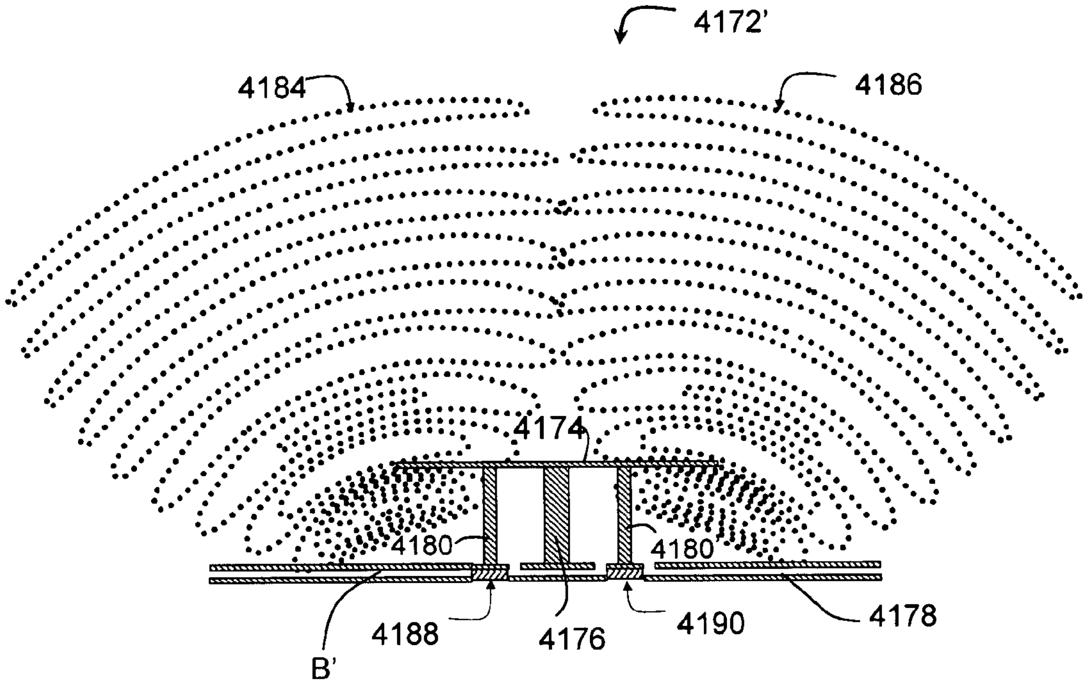
FIG. 73A, FIG. 73B, FIG. 73C and FIG. 73D show various aspects of a dual polarized patch antenna with selectable feedpoint.
Figure 73B:
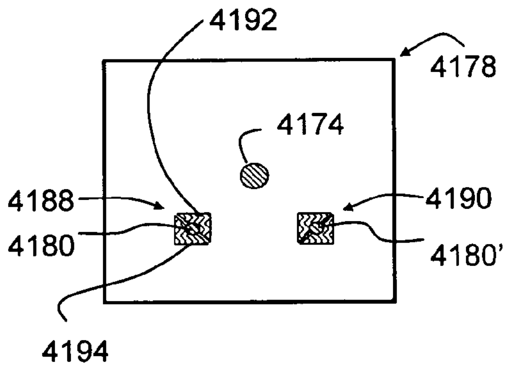
Figure 73C:
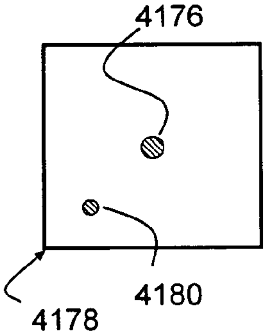
Figure 73D:
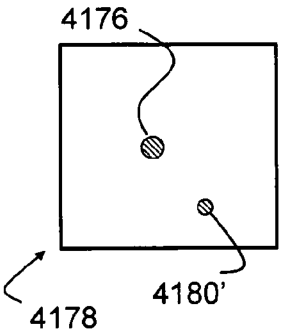

As with the dipole, a selectable polarization is possible with a patch antenna 4172, but in this case, by moving the feedpoint 4180. FIG. 73A illustrates patch antenna 4172', which is identical to antenna 4172 shown in FIG. 72, except for the addition of feed 4180' Detectors 4188 and 4190 are shown in additional detail in FIG. 73B, which is rotated 90° with respect to area B' of FIG. 73A. Detector 4188 may, for example, have two separate segments 4192, 4194 in detector plane 4178 to drive feed 4180. Thus, FIG. 73C shows a feed 4180 in active configuration for one polarization of patch 4174, for example, as an X feed. FIG. 73D illustrates a feed 4180' in active configuration for another polarization, for example, as a Y feed. In context of FIG. 73A, an e-beam is aimed at the X feed 4180. For another polarization, the beam is re-targeted at the detector coupled to the Y feed 4180'.

Figure 74:
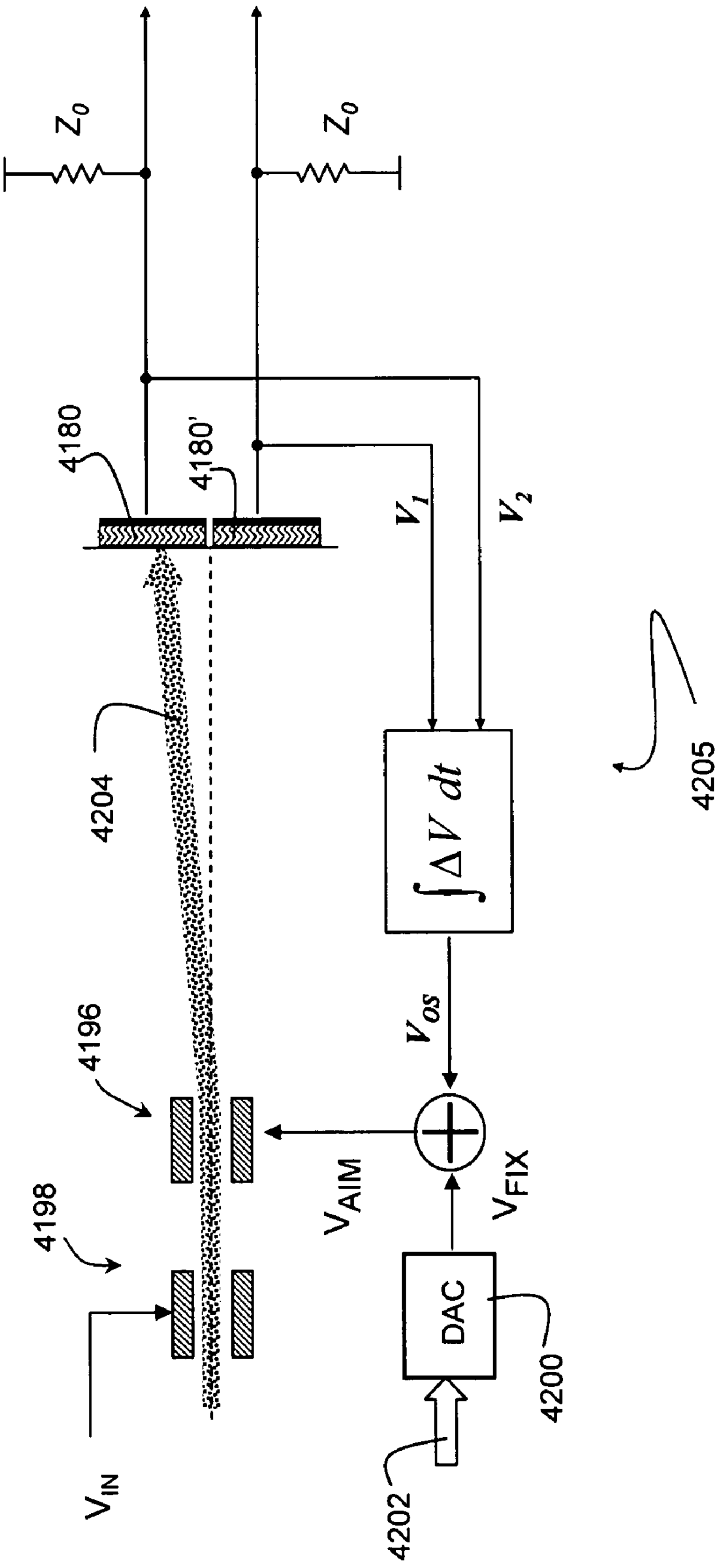
FIG. 74 illustrates a patch targeting control.

The aiming may be accomplished as shown in FIG. 74 by a controllable bias $V_{aim}$ applied to deflector 4196 of a microcolumn array 4198. The re-targeting is accomplished with a fixed voltage $V_{fix}$ provided by a DAC 4200 under control of a digital targeting command 4202 to reposition e-beam 4204 while permitting normal beam sweeping by the microcolumn array 4198 according to $V_{IN}$. If the targeting accuracy provided by the DAC 4200 is not accurate enough, it may be supplemented by a beam offset control loop 4205, as described previously, for example, as in control loops 375, 377.

Figure 75:
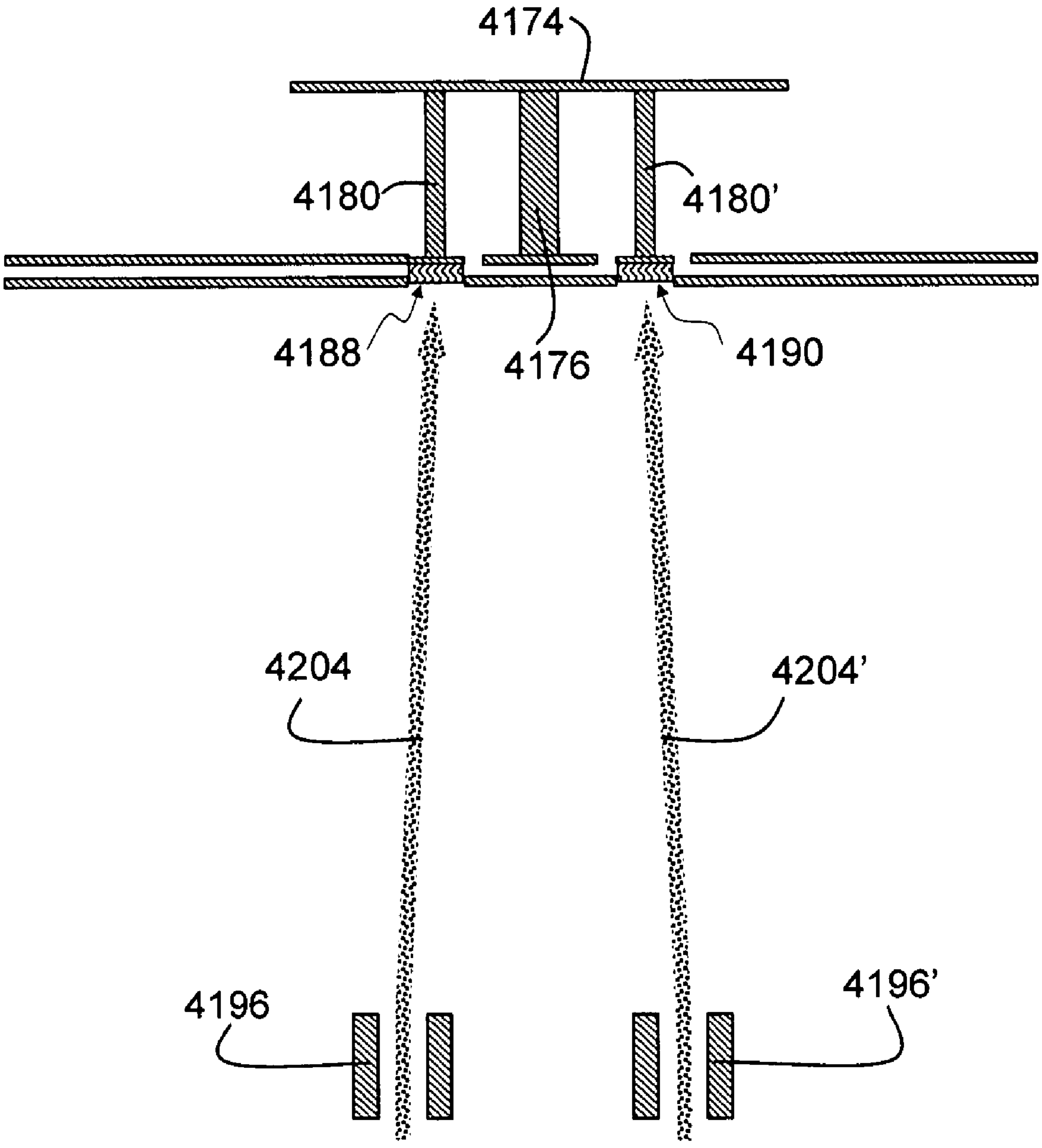
FIG. 75 illustrates a dual beam patch drive.

In another arrangement, two beams may be employed to achieve the selectable polarization, as shown in FIG. 75. Each of beams 4204, 4204' may be selectably turned on or off, either through current control or by the blanked electron gun described earlier. An advantage of this second arrangement is that both beams may operate simultaneously to achieve selectable cross-polarization (for example, a 45 degree polarization) or circular polarization. Circular polarization is achieved by a 90 phase shift between beam excitations applied to the detectors 4188 and 4190 for the X and Y polarization feeds. One approach applies the phase shift to the RF of the driving sources of deflectors 4196 and 4196'. In another approach the phase shift is achieved by time delaying one of the beams relative to the other, according to methods previously described.

Strip and Slot Antennas

In any antenna embodiment, the antenna can be constructed as either a strip of metal or a slot in a ground plane. These two configurations are based on swapping the conducting and non-conducting materials of the antenna geometries. Thus, a "slot" dipole antenna may look like strip, except it is mostly ground plane with two narrow slots in the shape of the antenna. Feeding arrangements between strips and slots are somewhat different due to the need to have a conductive contact, but performance is similar, though in some applications the slot can provide slightly better bandwidth and cross-polarization performance. In the literature, the strip and slots are known as "duals" of each other because of the geometrical similarity. Thus, it can be appreciated that the invention is not constrained to use one type or the other.

Integrated Detector/antenna

Figure 76:
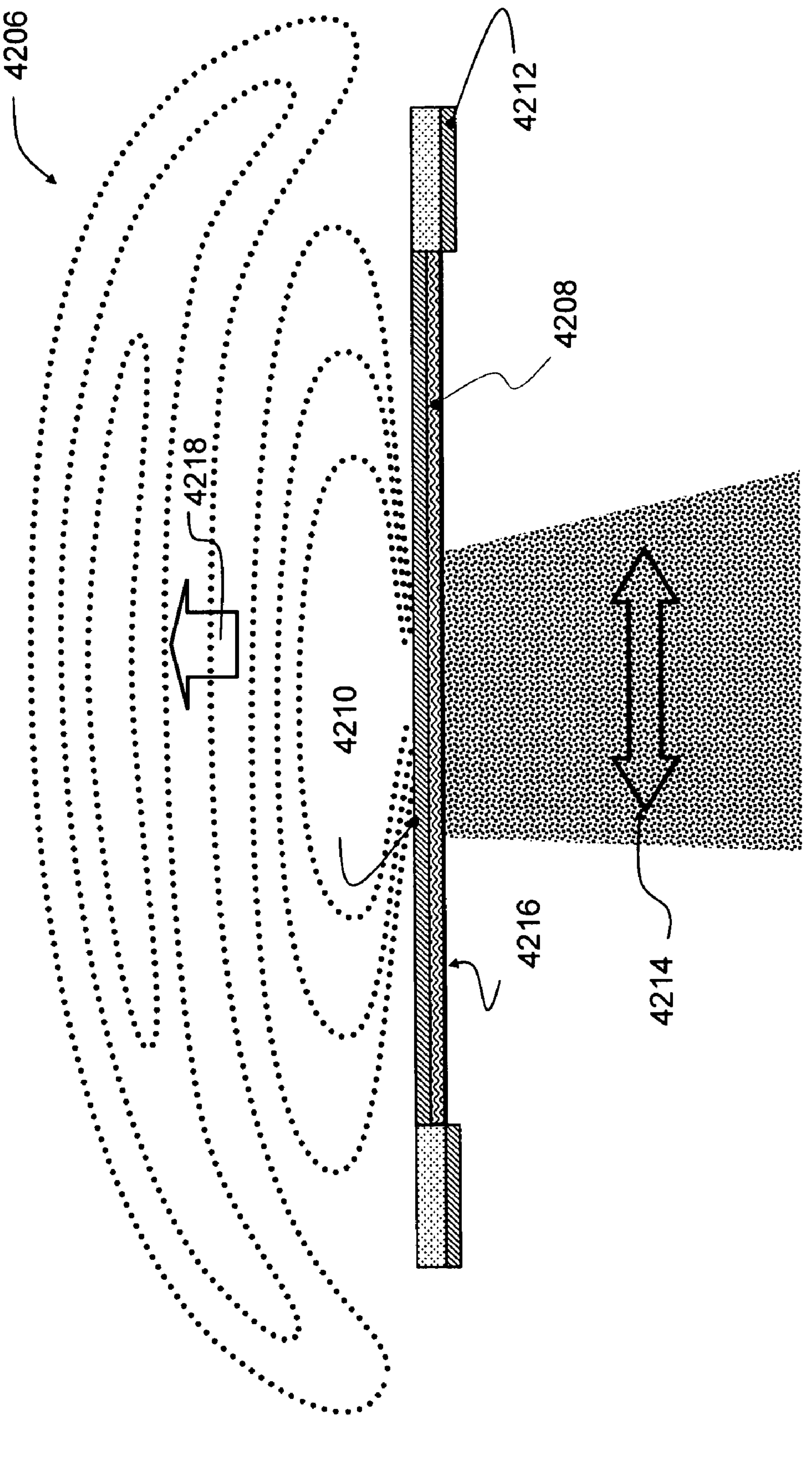
FIG. 76 shows an integrated detector/antenna.

In another embodiment as shown in FIG. 76, EBTX 4206, a detector 4208 and an antenna 4210 are constructed as a single or unitary device rather than two separate components that are separated in distance by contacts or leads. The output contact of the detector may be a patch antenna, or a portion of a patch antenna. In the following discussion the output contact will be called the antenna contact to emphasize the dual functionality. The detector 4208 may have dimensions that are coextensive with those of the antenna 4210 or a portion of the antenna 4210, for example, approaching a half-wavelength λ/2 or more of the signal frequency. A power plane 4212 is available as needed for bias of embedded circuitry, for example, as shown in FIG. 66A and FIG. 67. An e-beam 4214 is swept along beam contact 4216 in phase with beam sweep 4218 to activate the antenna 4210 for emission of RF field. The objective is to provide dynamic, variable spatial excitation of the detector/antenna. By this means, more modes of operation are possible than with respect to previous antenna embodiments that construct a separate detector and antenna.

Figure 77A:
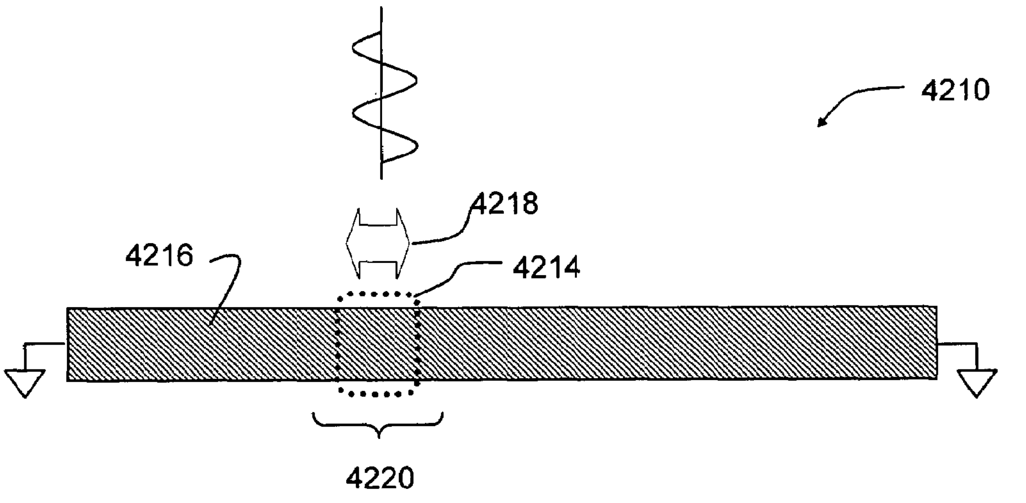
FIG. 77A and FIG. 77B show beam repositioning on a variable feedpoint dipole emitter.
Figure 77B:
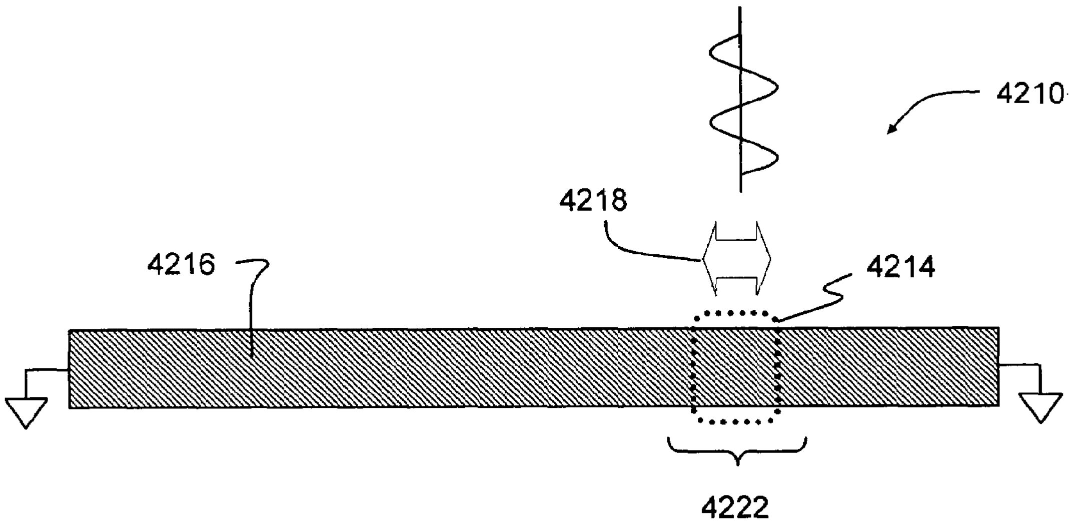

The operational modes of EBTX 4206 include antenna radiation, polarization control, and harmonic generation. The basis for these modes is the fact that the beam spot can be deflected over a large area of the antenna. The beam deflection may span up to a half wavelength or more of the highest signal frequency and move the full length of the antenna, or the spot can simply be repositioned anywhere along the antenna and modulated with a small signal amplitude. Large amplitudes generate harmonics, while small amplitudes at particular positions can generate different polarizations and phases. By way of example, where the antenna 4210 is in the form of a strip-patch antenna, FIG. 77A shows that excitation may be by a small amplitude spot deflection at a variable feedpoint 4220 in phase with signal 4218. FIG. 77B shows relocation of the variable feedpoint to position 4222. More complex combinations of large and small amplitudes at feedpoints 4220, 4222 can be used to generate fundamentals and harmonics with different polarizations.

The operation can be understood as follows. Where the e-beam 4214 strikes the beam contact 4216, relatively strong current flow between beam contact 4216 and the output contact (anode and cathode) because of the gain of the detector 4208 (see FIG. 76). This current ultimately flows from the power supply feed of the antenna contact, through semiconductor material of the detector 4208, to the beam contact (i.e., antenna 4210). In some respects, this sandwich behaves like a transmission line. The current generates a potential between the contacts 4216, 4210 that equilibrates across the detector 4208 as a traveling wave. When the wave reaches the edges of the antenna contact, it modulates the fringing fields there, causing them to radiate in the manner of a patch.

The traveling wave is such that the edges of the patch look something like a transmission line terminated by the radiation impedance. Any mismatch in the impedance of the transmission line and free-space causes the traveling waves to be reflected. The waves therefore propagate back and forth through the patch detector 4208 establishing complex standing wave patterns. If the beam spot moves very little, the wave patterns are modulated at the frequency of the spot movement, and the patch will radiate at the same frequency. If the spot moves over a larger area, non-linear effects emerge because of interactions between waves generated at different positions of the patch, and the patch radiates harmonics as well.

Figure 78A:
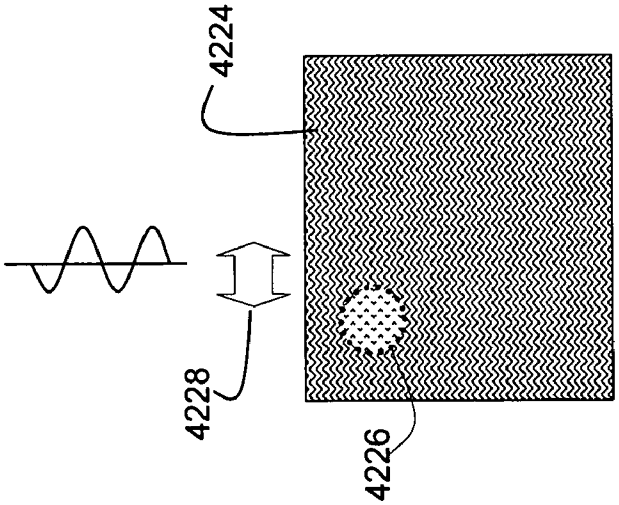
FIG. 78A, FIG. 78B and FIG. 78C show different beam interactions with a variable feedpoint patch emitter.
Figure 78B:
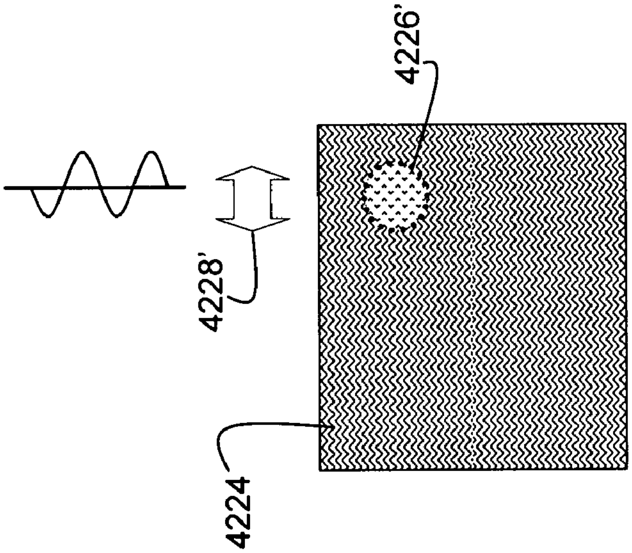
Figure 78C:
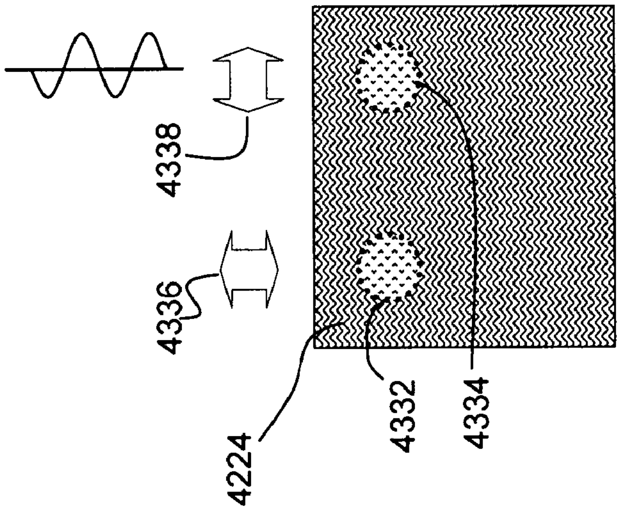

The patch is generally a unique two-dimensional shape that may be adapted for a particular environment of use, though FIG. 76 indicates a dipole-like shape. By way of example, FIG. 78A and FIG. 78B show a square patch/detector 4224 with variable beam-spot feedpoints 4226, 4226' with small deflection amplitudes 4228, 4228'. The structures shown in FIG. 78A and FIG. 78B, accordingly, are used to emit RF fields that are associated with a unique phase and a linear polarization. The selection of feedpoints 4226, 4226' swept according to signal 4228 cause differences between emitted RF fields of the two respective structures. FIG. 78C shows a dual beam excitation, where each beam-spot feedpoint 4332, 4334 may be positioned anywhere on the patch, for example with Y modulation 4336 or X modulation 4338 in phase with signal 4228. The structure shown in FIG. 78C is, for example, used to emit RF field having a unique phase and a circular polarization.

Figure 79A:
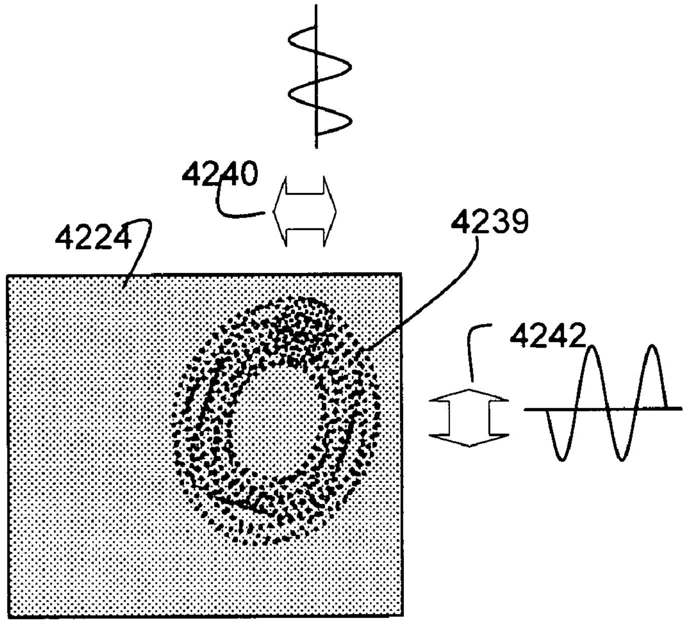
FIG. 79A and FIG. 79B show various patterns for variable feedpoint patch emitter w/lissajous feed.
Figure 79B:
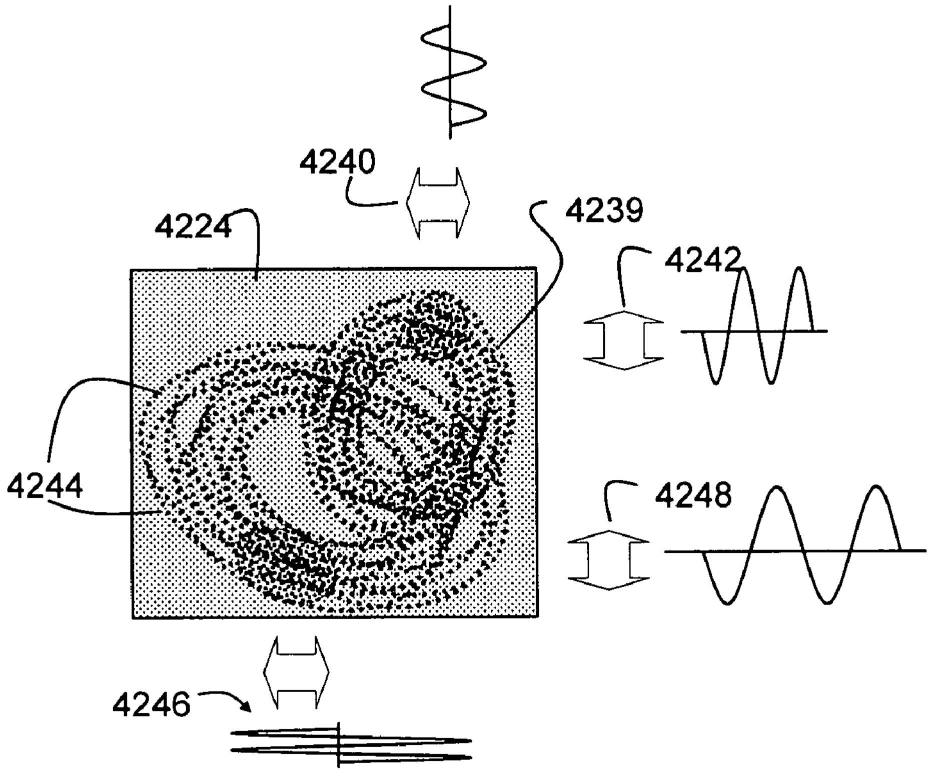

FIG. 79A shows excitation of patch/detector 4224 that is swept with a beam spot track 4239 in both an X phase 4240 and a Y phase 4242 with a large signal lissajous spot deflection on track 4239. FIG. 79B shows patch/detector 4224 being swept with two beam spot tracks 4239, 4244 where the X phases 4240, 4246 and the Y phases 4242, 4248 may be the same or different. The excitations and number of spots in all of these cases are shown to indicate flexibility of the design.

Figure 80A:
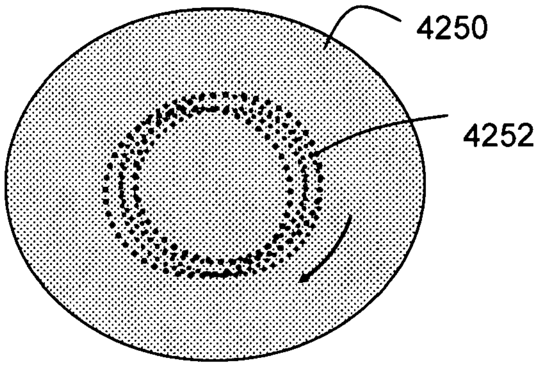
FIG. 80A, FIG. 80B, and 80C provide various examples of other complex patch emitters and drive patterns.
Figure 80B:
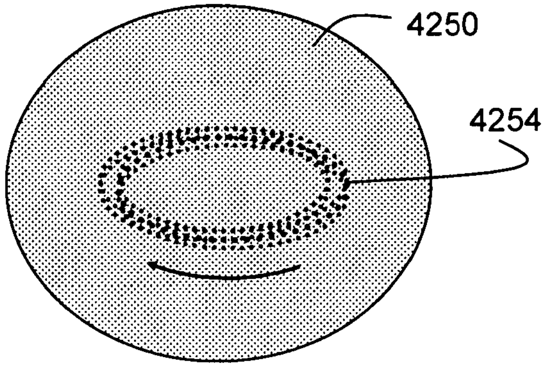
Figure 80C:
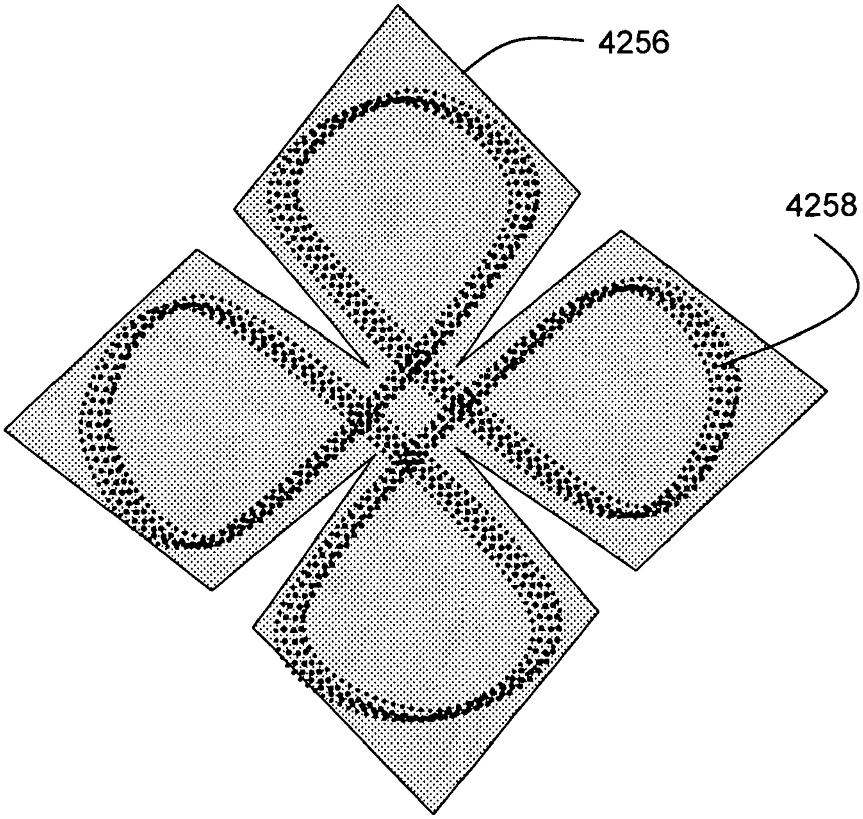

The patch/detector concept may assume any geometry, including novel geometries or shapes. For example, as shown in FIG. 80A, patch/detector 4250 may be a disk or ring or other shape, and may be activated by a substantially circular beam spot track 4252 or a substantially elliptical or oval beam spot track 4254 shown in FIG. 80B. A circular or elliptical lissajous beam motion on tracks 4252, 4254 can excite radiation with circular or elliptical polarizations. In other beam spot tracks (not shown), a linear spot motion can excite linear polarization, and the symmetry of the circular disk permits the e-beam scan pattern to be aligned to any axis to change the polarization. More complex shapes can have even more complex scan patterns, as indicated in FIG. 80C where a quadridentate patch/detector 4256 is activated by a clover-leaf beam-spot track 4258. Again, the excitation patterns and numbers of spots here shown by way of example.

Generally speaking, efficient excitation of a diode detector/antenna structure requires an e-beam scan pattern that closely approximates the surface current density pattern of the antenna when radiating in a desired mode. This is one reason why the embodiment may use multiple e-beam spots with complex excitation, or may employ unusual antenna/detector shapes.

Because of the complexity of the device operation, the types of antenna shapes and scan patterns can only generally be indicated here. In practice, the exact construction may benefit from computer simulation and experimentation to determine the exact number of independent beams, together with the amplitude, position and scan pattern of each beam sweep for an intended environment of use. This may in turn determine the other parameters of the amplifier, including the number of electron guns, deflector drive, drift cavity dimensions, and focusing requirements, among others. It can be appreciated, however, from the general principles exposited here that the embodiment can combine the functions of antenna, frequency multiplier, phase shifter and selectable polarizer in a single device and thus offers an unusual flexibility.

Horn

Figure 81:
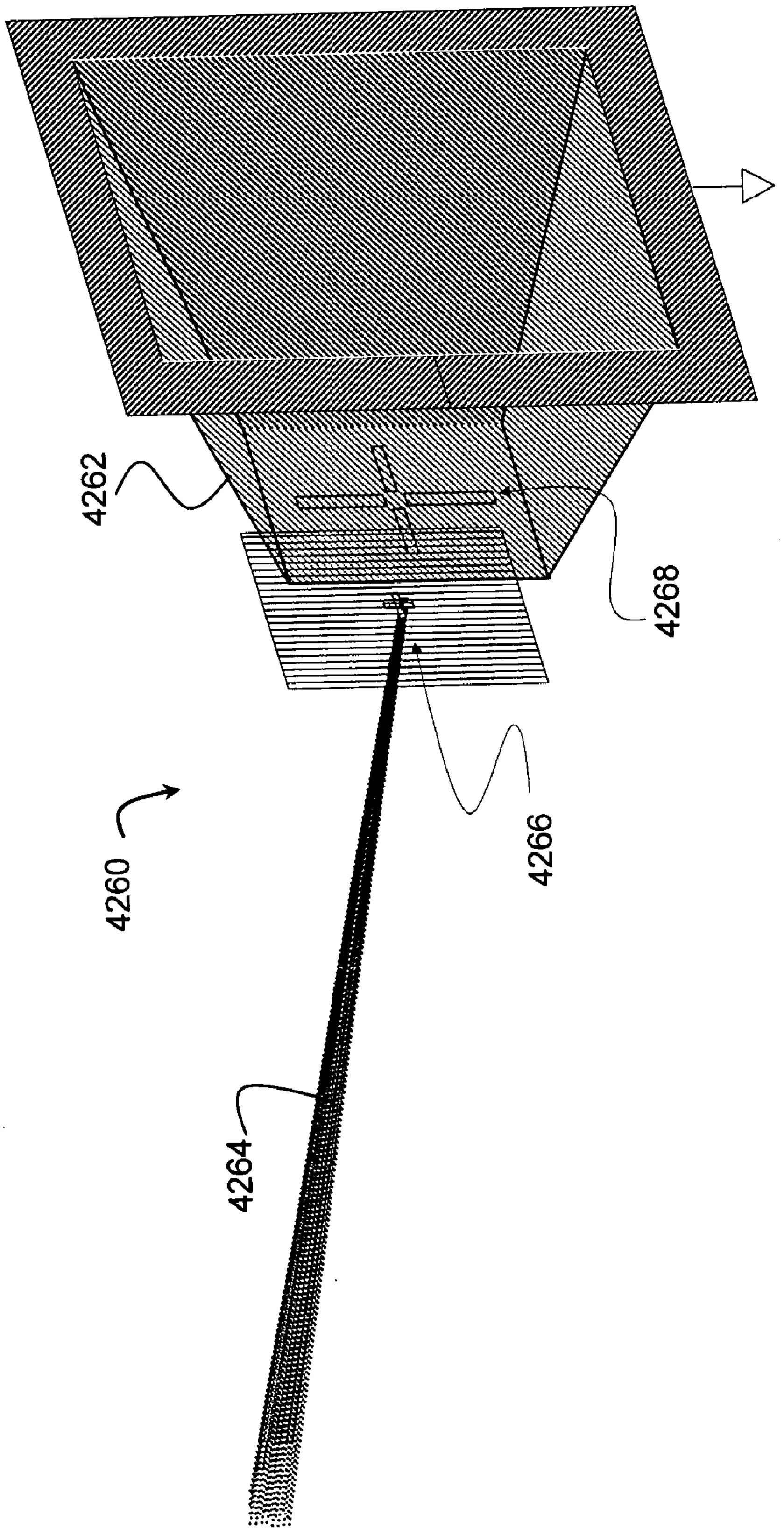
FIG. 81 shows direct horn excitation.

In another embodiment as shown in FIG. 81, EBTX 4260 includes a horn antenna 4262 to provide extra directivity in the radiation pattern. E-beam 4264 strikes detectors 4266 for excitation of antenna 4268. In one variation, the antenna 4268 may be a dipole or patch antenna that feeds the horn.

Figure 82:
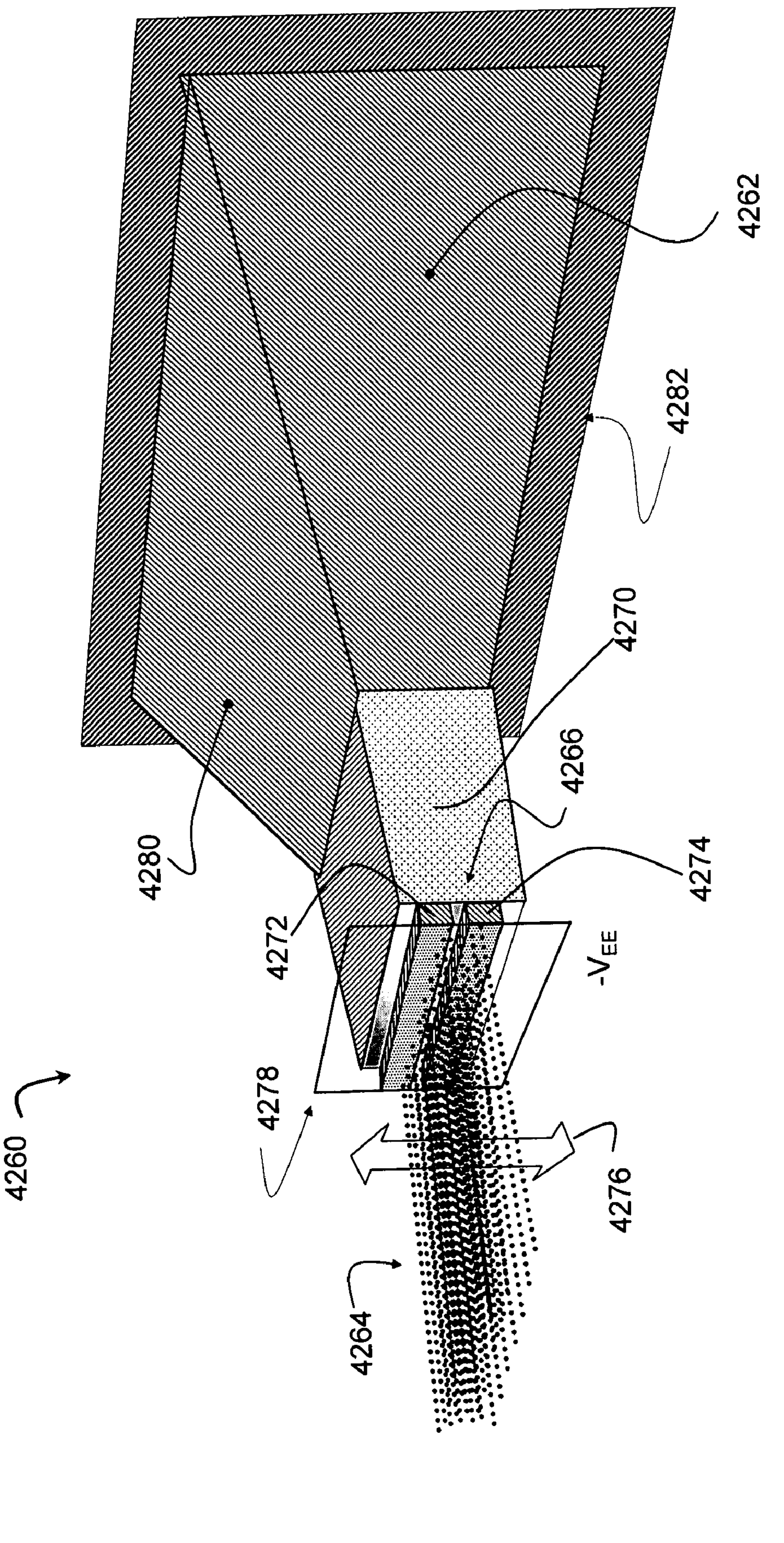
FIG. 82 shows a waveguide terminated in an antenna horn.

As shown in FIG. 82, EBTX 4260 may have a horn 4262 that is fed by a short section of waveguide 4270. The e-beam 4264 strikes a detector 4266 that is formed in two horizontally elongated segments 4272, 4274 that are driven by beam sweep 4276 over detector plane 4278. A flared horn segment 4280 may be connected to ground plane 4282. One advantage to waveguide 4270 includes benefit to broadband signaling, since the flare of the horn 4280 provides a gradual transition to free-space, efficiently radiating broadband RF without the resonant characteristics of most planar antennas (excepting some types like log spirals and vivaldi antennas).

Waveguide Coupling

Figure 83:
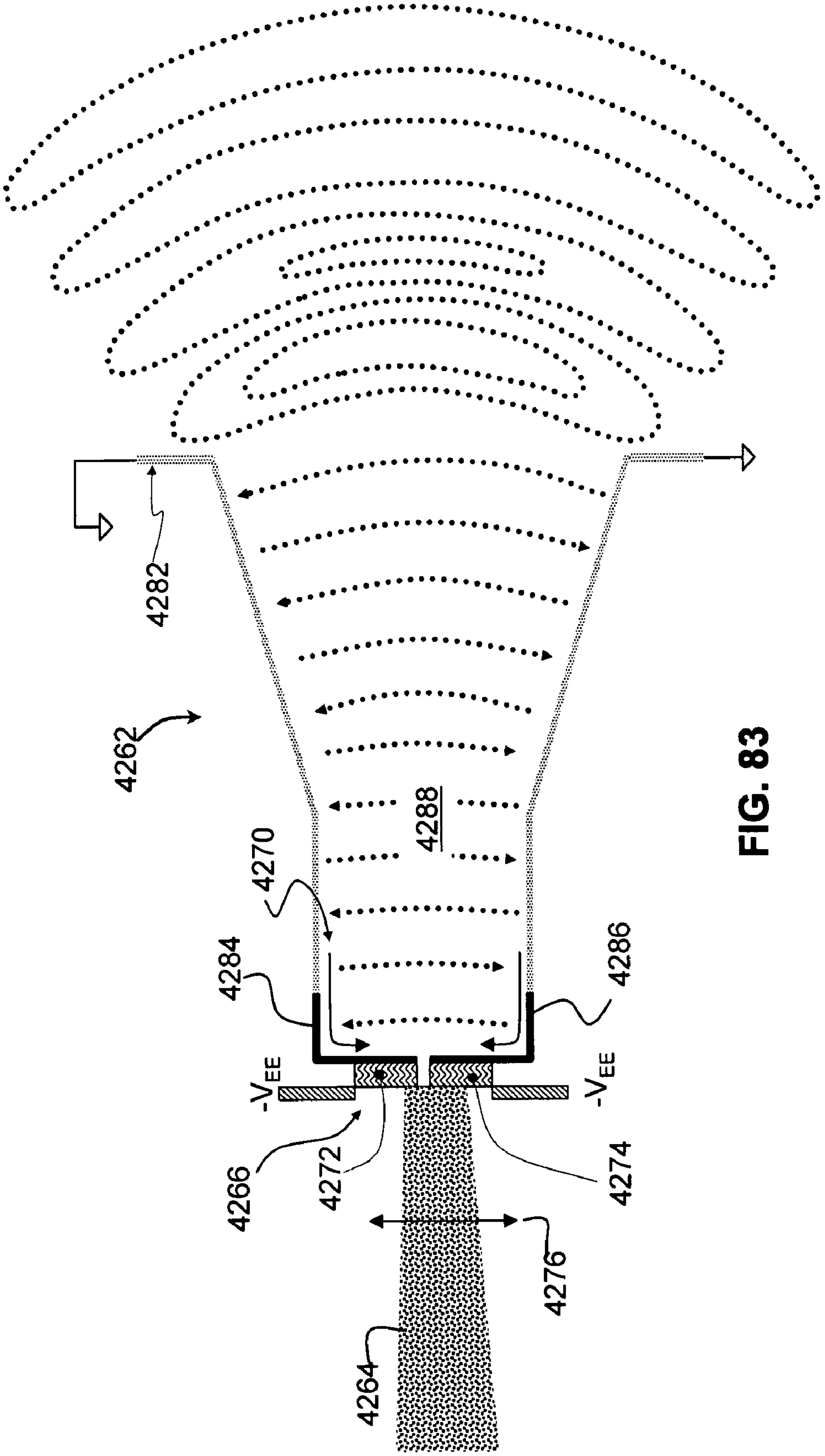
FIG. 83 shows a waveguide terminated in antenna horn.

FIG. 83 is a midsection view of FIG. 82 and shows one method of driving a waveguide-fed horn 4262. The split detector 4266 is made of two segments 4272, 4274 that span the width of the waveguide. Detector segment 4272 is coupled to an upper plane 4284 of the waveguide 4284, and detector segment 4274 is coupled to a lower plane 4286. When the e-beam 4264 excites the detector 4266, the configuration of the two detector segments 4272, 4274 drives the upper and lower guide walls 4284, 4286 to excite a current that is similar to the current density generated by a TE10-mode wave 4288 propagating down the waveguide 4270.

Figure 84:
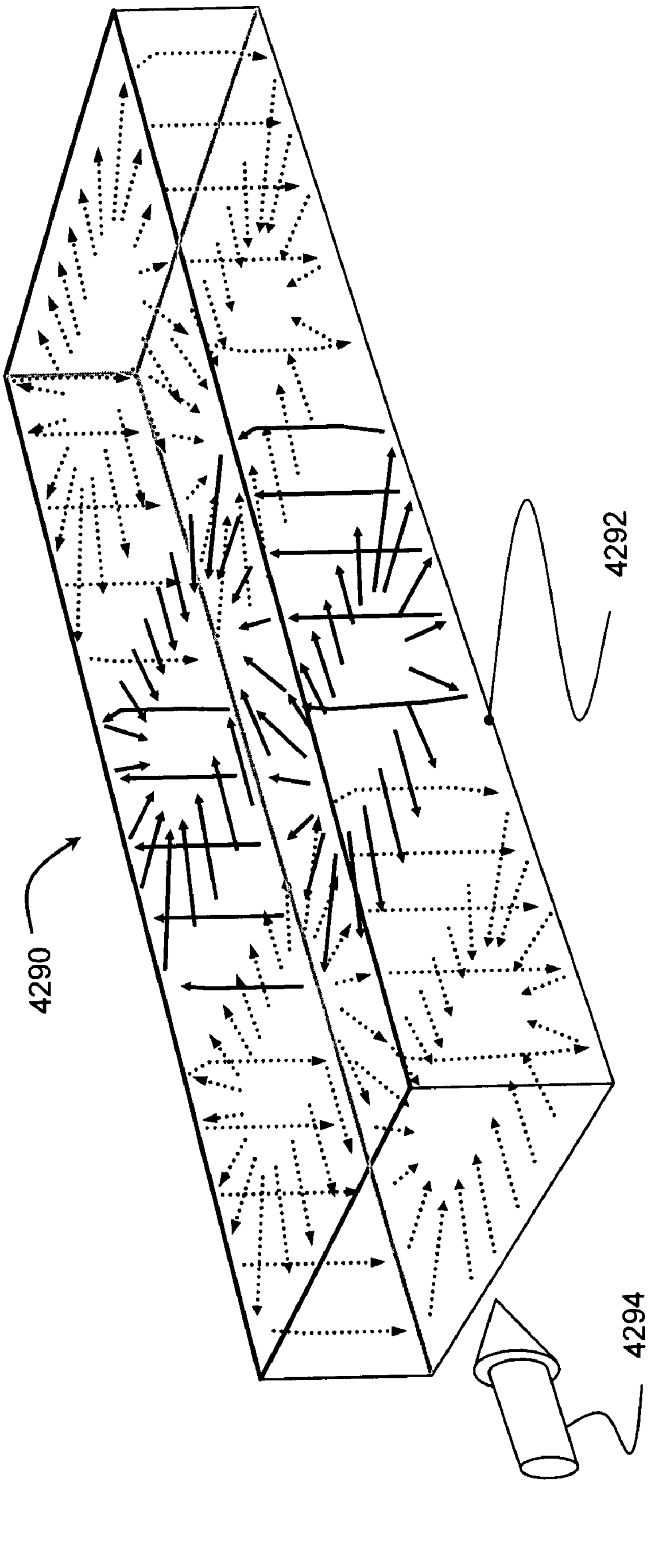
FIG. 84 illustrates guidewall current flow in waveguide for TE10 mode.

FIG. 84 shows, by way of example, a guidewall current flow 4290 in a rectangular form 4292 of guidewall 4270 at a moment in time commensurate with power flow 4294.

Figure 85:
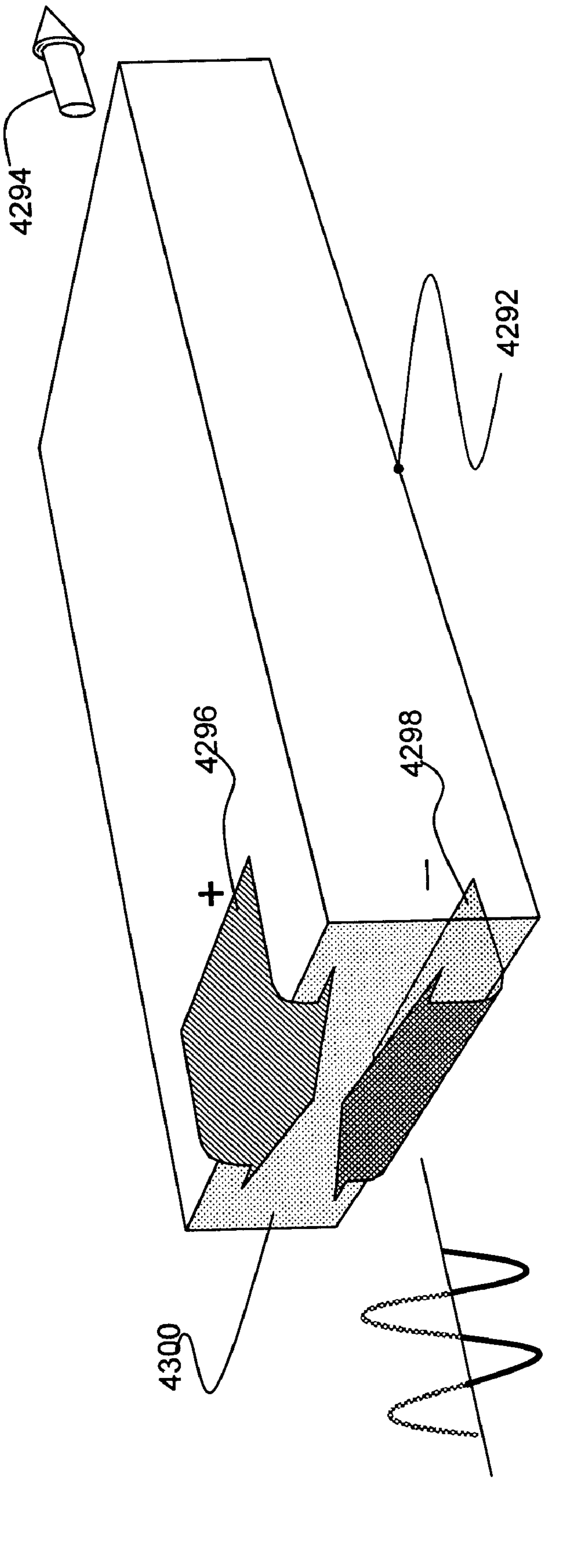
FIG. 85 shows a TE10 mode guidewall current drive in a waveguide.

FIG. 85 shows how current 4296 from the detector 4266 (FIG. 83) drives current 4296, 4298 into the short end 4300 of the waveguide 4292 to approximate the guidewall flow and excite a TE10 mode down the guide.

TE10 is not the only mode that can be excited in a guide, but it the easiest mode to implement and describe, and so is shown by way of example. Besides the relative ease of guidewall excitation, a TE10 mode also has the lowest cutoff frequency of any rectangular waveguide mode, therefore offering the widest bandwidth. This bandwidth can span many octaves, making the waveguide fed horn much more useful than resonant dipoles or patch antennas for many applications.

Figure 86:
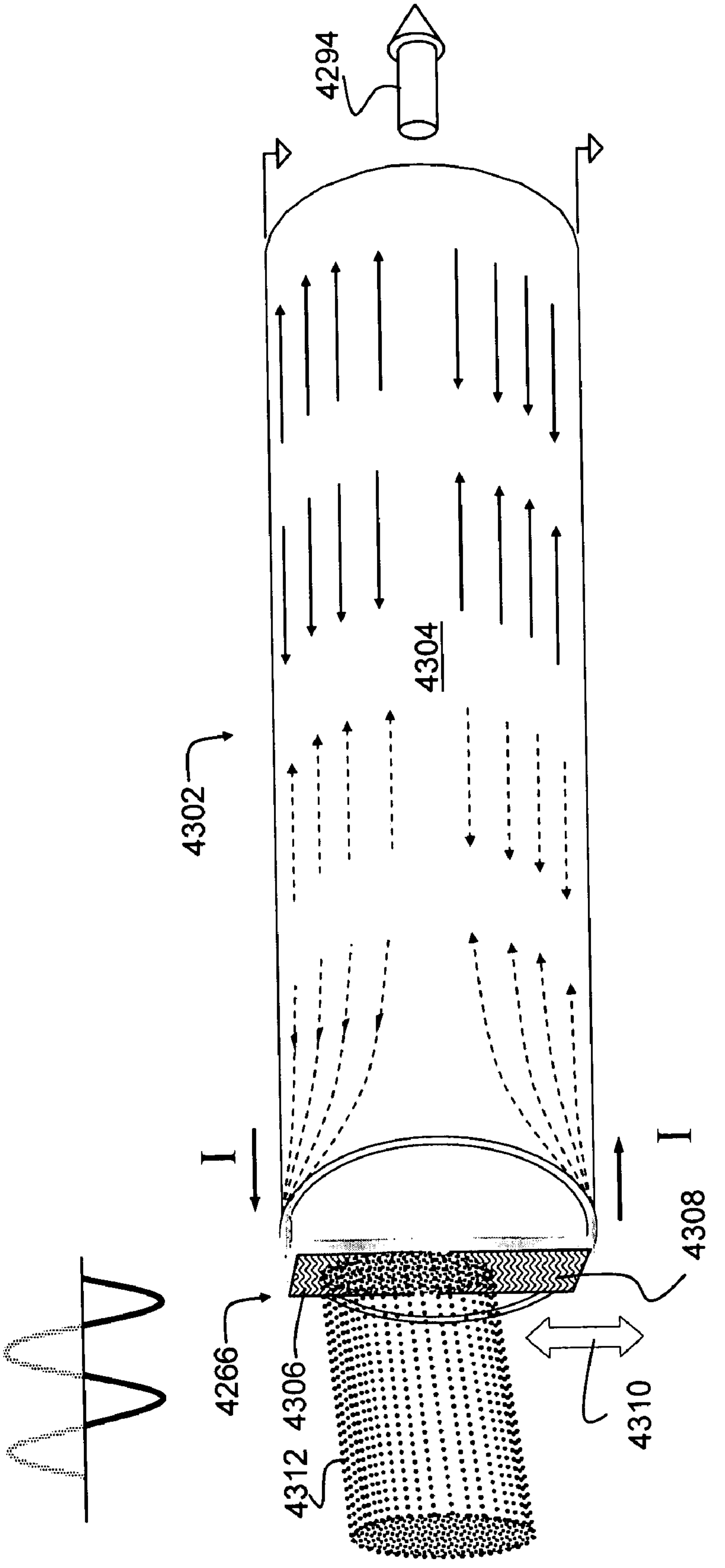
FIG. 86 shows a circular waveguide in TM11 mode.

A circular waveguide 4302 can also be used in place of waveguide 4270 (shown in FIG. 83), as shown on FIG. 86. A guidewall current density pattern 4304 is shown in the circular waveguide 4302 operating in TM11 mode at one instant in time. Detector 4266 is formed in longitudinally aligned rectangular segments 4306, 4308 to excite traveling waves by the sweep action 4310 of e-beam 4312. Like the rectangular guide 4292 shown in FIG. 85, a split detector 4266 drives the top and bottom of the guide where the guidewall current density is greatest.

Dual Polarization Circular Waveguide

Figure 87A:
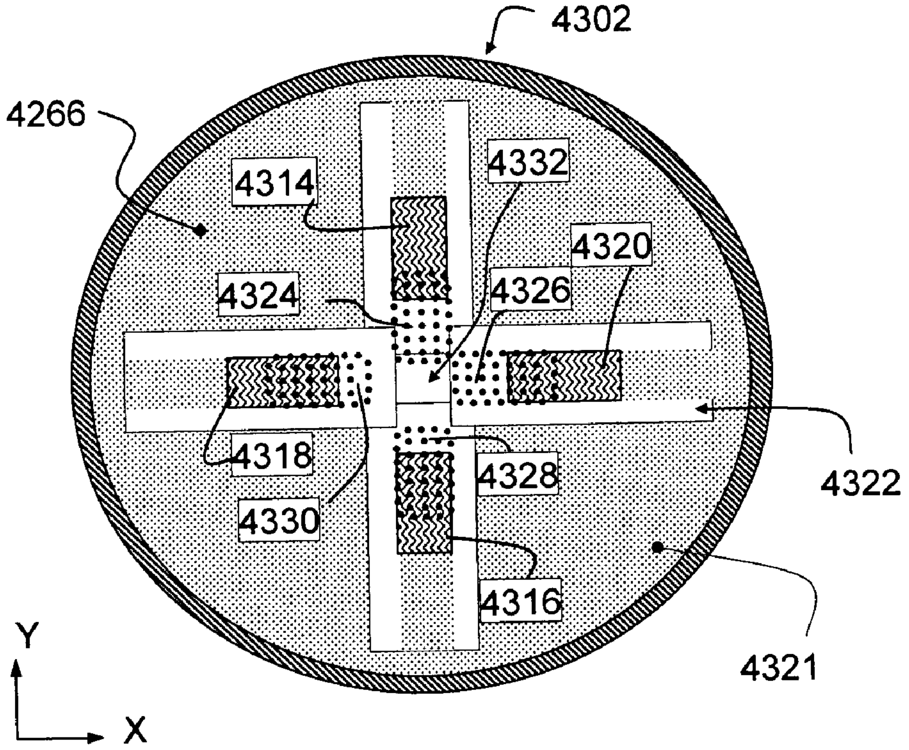
FIG. 87A and FIG. 87B show various aspects for use in a dual polarization drive for circular waveguide.

FIG. 87A shows a variation on the form of detector 4266 for use with the circular waveguide 4302 to provide simultaneous dual polarization. Here, two pairs of orthogonally oriented detectors drives one of two polarization axes. Segments 4314, 4316 drive the top and bottom of corresponding top and bottom antenna segments or areas (not shown). Segments 4318, 4320 drive the right and left segments or sides of the antenna. A shorting plane 4321 blocks RF from escaping the end of the waveguide 4302. Slots 4322 force the detector current to flow to the desired points of the guidewall, but are small enough at the frequency of operation (much less than a wavelength λ) that significant radiation cannot escape.

Beam spots 4324, 4326, 4328, 4330 excite the four detector segments 4314, 4316, 4318, 4320 with two independent deflections. Spots 4324, 4328 are moved vertically in unison to excite segments 4314, 4316. Spots 4330, 4326 move horizontally in unison to excite segments 4318, 4320. Spots 4324, 4328 move independently of spots 4326, 4330 to excite the waveguide 4302, and in this manner simultaneous dual polarization is achieved.

A central gap 4332 between segments prevents segments 4314 and 4316 from coupling to segments 4324 and 4326. A separation distance gap between beam spots 4324, 4328 matches the gap dimension between segments 4314, 4316, for example, so that as beam spots 4324, 4328 move up and down, the excitation of the segments 4314, 4316 changes in a uniform manner. The same considerations apply to the horizontal motion of spots 4326, 4330 exciting segments 4320, 4324. A diagonal polarization occurs when X and Y sweeps are driven in phase. A circular polarization occurs when X and Y sweeps are driven 90° out of phase at the same amplitude. An elliptical polarization occurs when X and Y sweeps are driven 90° out of phase at different amplitudes.

Figure 87B:
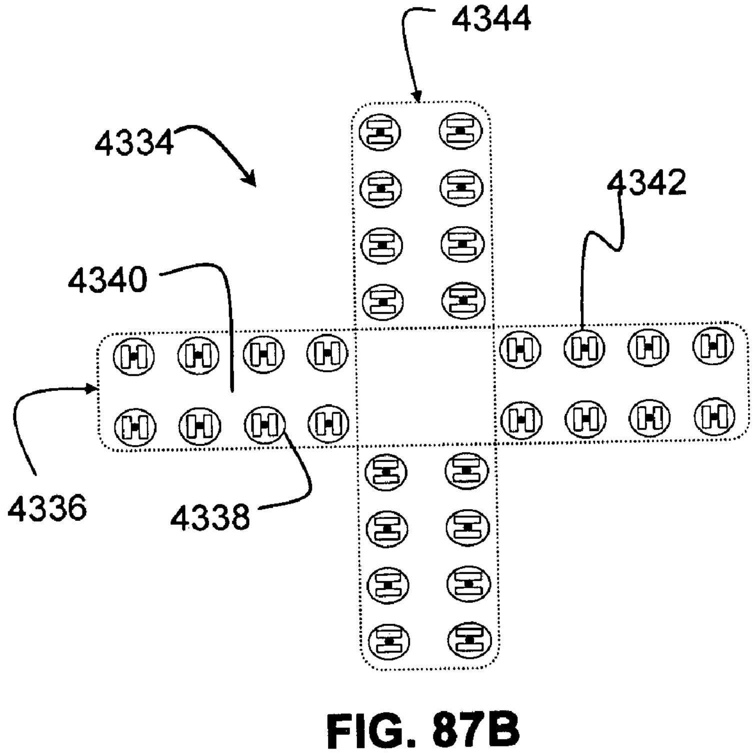

FIG. 87B shows an end view of a microcolumn array 4334 that may be used to generate the beam spots 4324, 4326, 4328, 4330 shown in FIG. 87A. The shape of microcolumn array 4334 is based on the method of optical imaging described previously. An X deflection array 4336 possesses a single X deflector in each electron gun, for example, in electron gun 4338, to move the beam spots 4326, 4330 with horizontal motion, and is formed in a row-column format with two lobes 4340, 4342. A Y deflection array is formed in an identical way aligned on the Y axis addressing beam spots 4324, 4328 with vertical motion. The X deflectors are driven with a first RF signal, and the Y deflectors driven with a second RF signal. A low beam current with high detector gain permits beam collection losses without loss of overall efficiency.

Capacitively Coupled Circular Waveguide

Figure 88A:
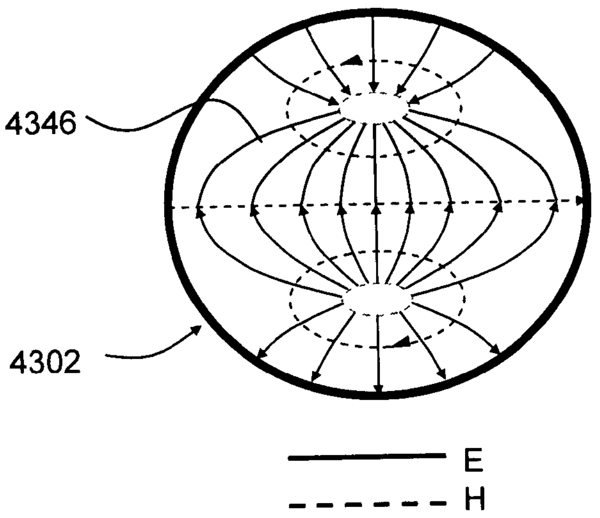
FIG. 88A and FIG. 88B show various aspects of a circular waveguide in TM11 mode.
Figure 88B:
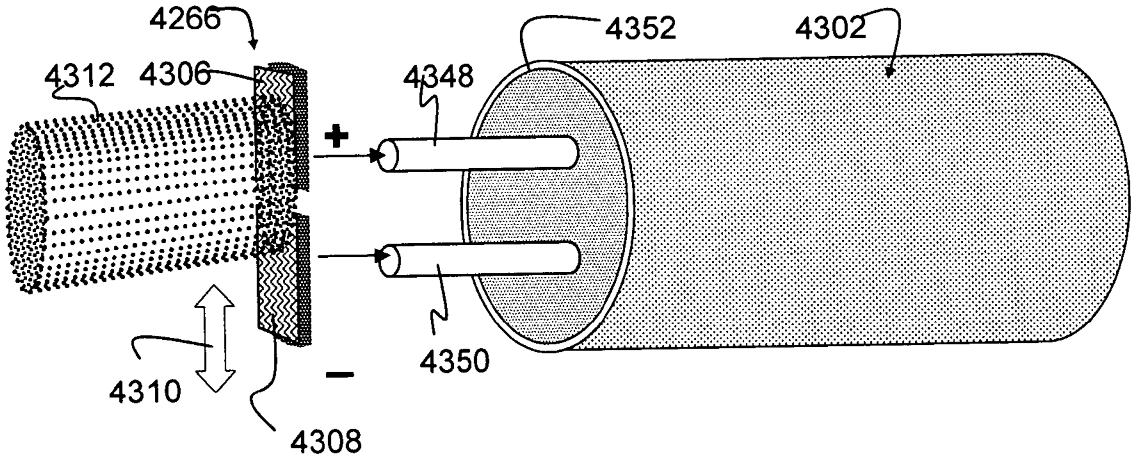

FIG. 88A shows a midsectional view of electric field patterns 4346 in the circular waveguide 4302 for the TM11 mode. FIG. 88B shows a second method of coupling power into the waveguide 4302 based on parallel conductors 4348, 4350 capacitively coupling to the guidewall 4352. This is based on the fact observable from FIG. 88A that the electric field lines E are radial from two points within the guide, which is similar to the effect of a capacitive coupling from two conductive rods to the guidewall. By placing the conductors at these points of electric field concentration, the power coupling is therefore optimum. Like the rectangular guide 4292 shown in FIG. 85, a split detector 4266 drives the top and bottom of the guide where the guidewall current density is greatest.

Aperture Antenna

A waveguide may also be used directly as an aperture antenna, without a horn. Though the directivity of a simple aperture is lower than a horn, in large arrays of apertures, free-space power combining improves the directivity substantially. In this kind of application the lesser directivity of the aperture is actually a benefit, since it permits beamsteering over a wider angle.

An aperture radiator also has one advantage of being much smaller than a horn, and therefore a high density of apertures can be used in large arrays for greater power output. Generally, horns are more appropriate for achieving high directivity from small arrays. Finally, the aperture retains the broad bandwidth of a horn, which far exceeds a dipole or patch.

That a waveguide has a broad bandwidth can be understood from the relation for group wave velocity of a guide:

$$v_g = c\sqrt{1-\left(\frac{\lambda/2}{a}\right)^2} = c\sqrt{1-\left(\frac{f_c}{f}\right)^2} \tag{1.46}$$

Generally, the shorter the wavelength (or higher the frequency f relative to cutoff $f_c$=c/2a), the more closely the group velocity approaches the free-space velocity of light, c. Thus, short wavelengths propagate at almost the same velocity and over short guide lengths there will be little dispersion. When the guide couples a detector on one side of a thin silicon wafer substrate (~300 um thick) to an aperture on the other side of the same wafer, the dispersion will be negligible even at 1 THz.

Waveguides offer significant power advantage per element over simple antennas such as a dipole or patch radiator. The reason is that dipoles and patches have a relatively high feed impedance relative to the area of the antennas, in the range of 50 to 100 ohms. This limits the maximum current drive for a given detector bias voltage. Higher electromagnetic power feed can be achieved in a waveguide because the driving impedance can be lower for the same area. If the transmission impedance for a TE10 mode of a rectangular waveguide is $Z_T$, the electrical impedance is $$Z_0 = 1.23 \cdot Z_T \frac{b}{a}. \quad (1.47)$$

for a guide of width a and height b. The TE10 mode propagates down the waveguide by reflecting back and forth off the two sidewalls separated by the width a. $Z_T$ is given by $$Z_T = \frac{\eta}{\sqrt{1-\left(\frac{f_c}{f}\right)^2}} = \frac{\eta}{\sqrt{1-\left(\frac{\lambda/2}{a}\right)^2}} = \frac{\eta}{\sin\theta}, \quad (1.48)$$

where the free-space radiation impedance η=377 ohms, the cutoff frequency $f_c$=c/2a, and the speed of light c=$3\times10^8$ m/s. The angle of reflection normal to the guidewall is given by θ. For guides of width a>>λ/2, the wave propagates nearly with the speed of light and the transmission and electrical impedances are minimum. For example, a guide that is a=2λ wide and b=λ/10 high will have $Z_T$=389 ohms and $Z_0$=20 ohms. At 100 GHz a=6 mm and b=0.3 mm. At 1 THz, a=600 um and b=60 um.

Thus, the lower electrical impedance of a wide guide permits more power to be transmitted from a low voltage source, such as an e-beam detector. This is one advantage of a waveguide over an antenna. Generally, the power down a guide as a function of the peak driving voltage is given by $$P = \frac{V_0^2}{2Z_0}. \quad (1.49)$$

$V_0$ is approximately one-half the detector reverse bias voltage, since voltage excursions outside this range will de-bias the detector. For example, if the detector bias is 2V and $Z_0$=20 ohms, the power output will be approximately 25 mW. This is over three times more power than the power from a half-wave dipole ($Z_0$=73 ohms).

Since the long dimension of the waveguide is approximately the same as a dipole antenna (a~λ, b<<λ), but the short dimension can be considerably less, arrays of guide-coupled EBTXs can have many more elements per unit area as arrays of dipole-coupled EBTXs, which are normally restricted to a one-halfwave separation in both directions. For example, a small array of 4 dipoles will be approximately λ×λ in area. This same area can have 10 waveguides of dimension λ×λ/10, and each guide will generate 40% more power than a dipole. The total array power will be 3.5 times more than the array of dipoles on a λ/2 element spacing. Thus, even a relatively narrow guide can generate higher power in an array.

Transmit Arrays

Figure 89:
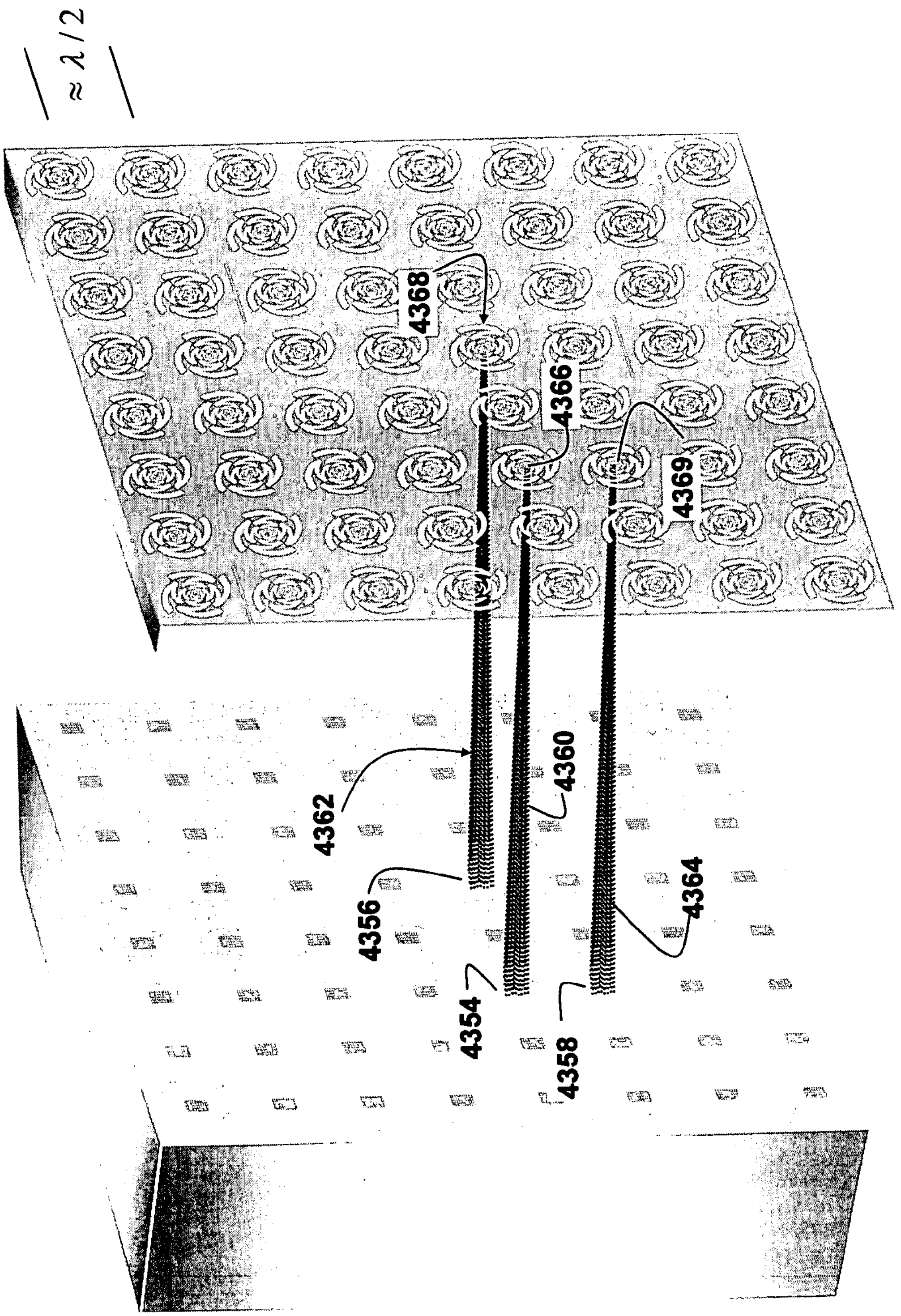
FIG. 89 shows an array of electron gun driven RF emitters.

As discussed previously, antenna coupled amplifiers provide means for coherent power combining via arrayed embodiments. FIG. 89 shows a plurality of EBTX's, for example, each including a microcolumn array 4354, 4356, 4358; beam, 4360, 4362, 4364 and antenna 4366, 4368, 4369, respectively in association. As shown in FIG. 89, the use of log spiral wideband antennas are merely by way of example.

Figure 90:
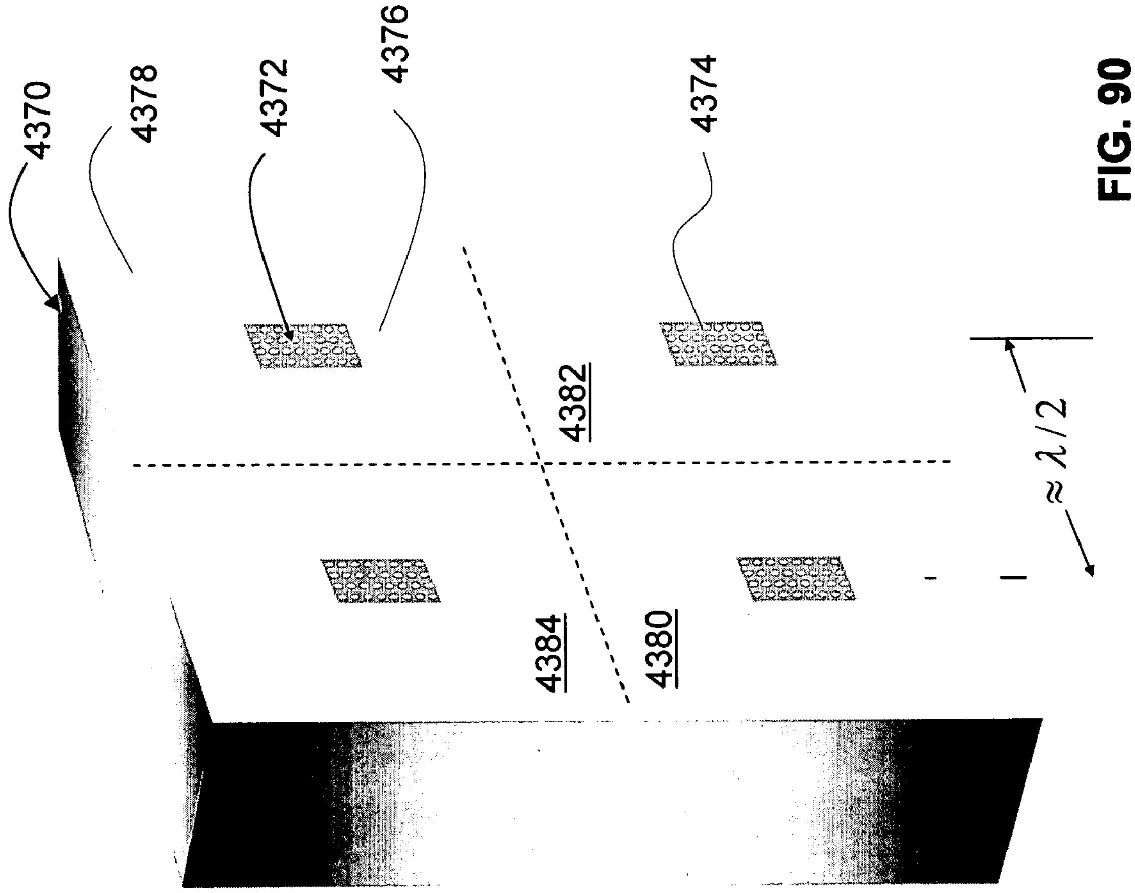
FIG. 90 shows a 2×2 array of microcolumn arrays.
Figure 91:
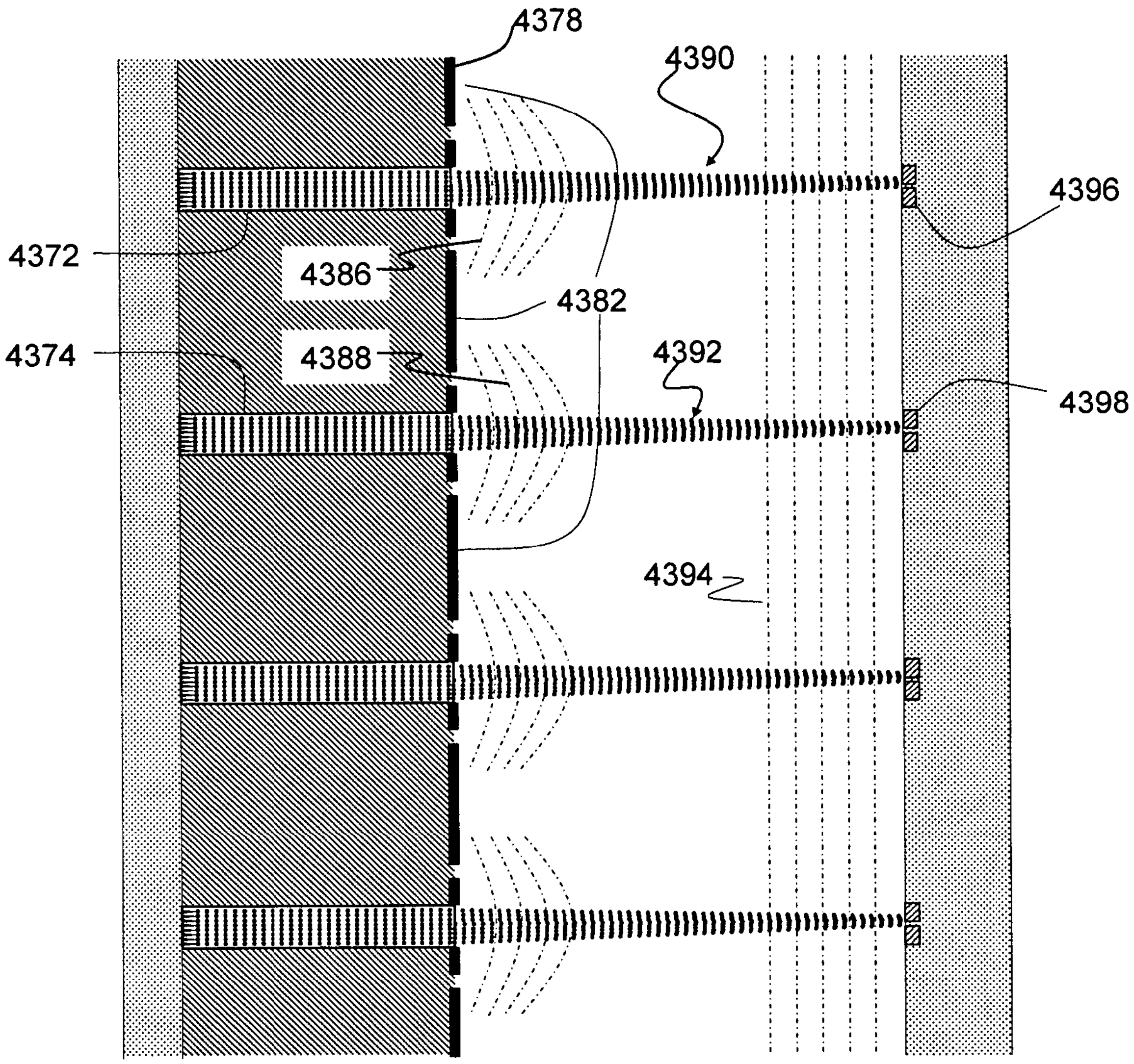
FIG. 91 shows a dense arrays of microcolumn arrays.

One way to provide an efficient power combiner is as a dense array 4370 of microcolumn subarrays 4372, 4374 with integral local focusing optics over each microcolumn subarrays 4372, 4374. This is shown in FIG. 90. Each microcolumn subarray 4372, 4374 emits electrons through lensing electrodes, for example, lensing electrodes 4376, 4378. The respective lenses for subarray 4372 is the fields generated by electrode 4378 in relation to electrodes 4376, 4380, 4382, 4384. FIG. 91 shows in cross-section how the independent lens fields are generated where electrodes 4378 and 4382 may have focusing fields 4386, 4388 that overlap to focus e-beams 4390, 4392. As shown, a planar acceleration field 4394 increases the energy of the beams 4390, 4392 for excitation of detectors 4396, 4398.

Figure 92:
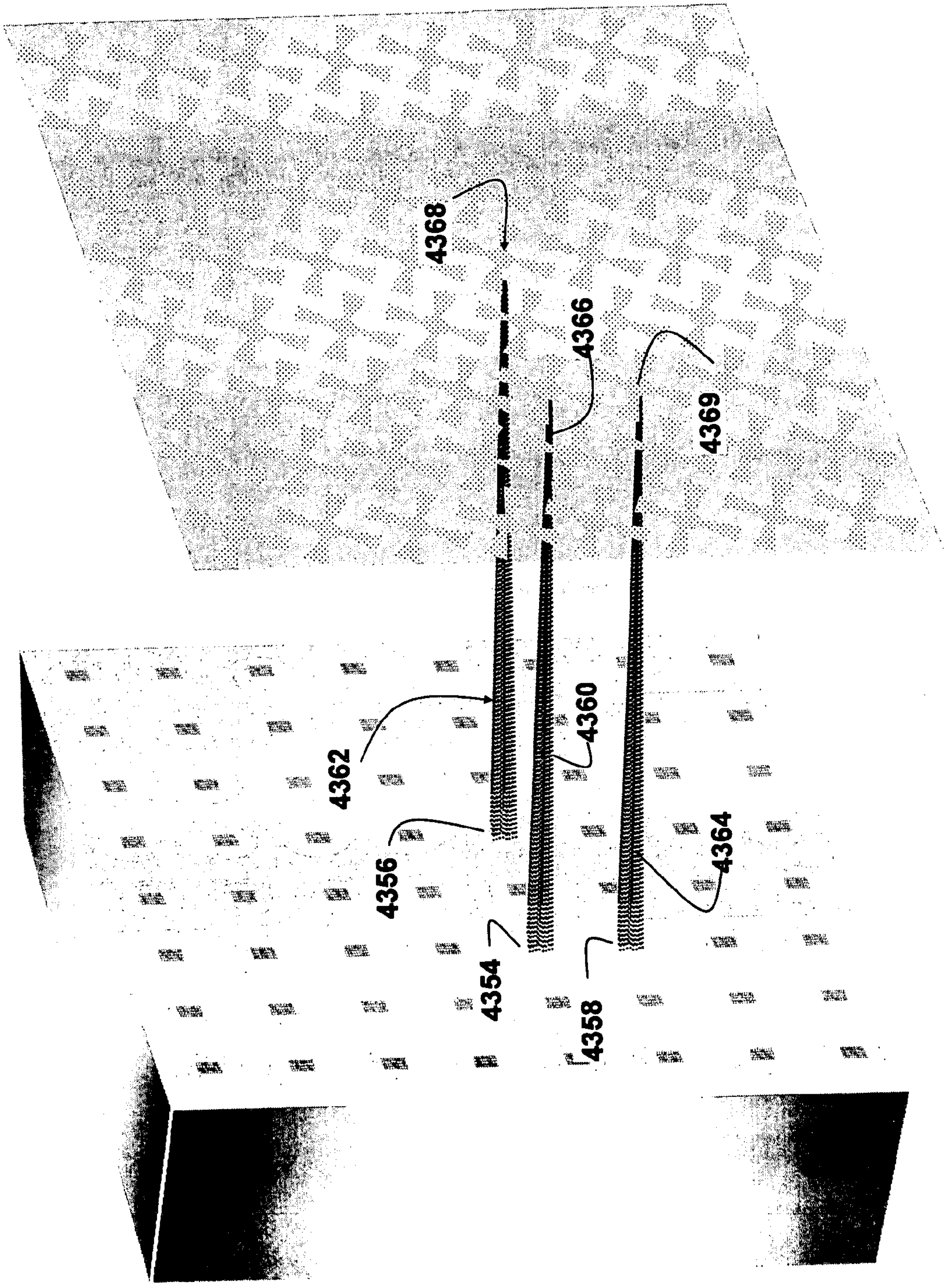
FIG. 92 shows dense emitter arrays.

Arrays of RF emitters can be packed more densely than λ/2, as shown schematically in FIG. 92 where like numbering of identical components is retained with respect to FIG. 89. Here, some crossed dipole-like segments overlap due to the close spacing of microcolumn arrays 4354, 4356, 4358. The benefit is more radiated power because of the higher concentration or density of antennas. Power is also increased because the tight packing increases the electromagnetic coupling between antenna elements and reduces the feed impedance to each. This is somewhat similar to the effect in a wide waveguide. This is often considered undesirable if power is fed from a standard 50 ohm source, but in e-beam excited antennas, the close proximity of detector and antenna feed permits an efficient drive into a low impedance.

With microfabrication, very large arrays and high radiated power are possible. A single wafer-fabricated transmit array might have more than 1 million elements. This is achievable at submillimeter wavelengths if standard 200 mm diameter silicon wafers are employed in the construction. This many elements cannot be driven directly, but as shown in FIG. 64 a hierarchical "corporate" feeding arrangement can be employed to drive the entire array from a single RF source through successive stages of EBRX amplifiers, and thereby spread out the load. The fanout per EBRX is illustrative only in FIG. 64, and there may be as many as 100 or more fanouts, depending on frequency of operation and the construction parameters of the EBTX elements.

Transmit Beamformer

Figure 93A:
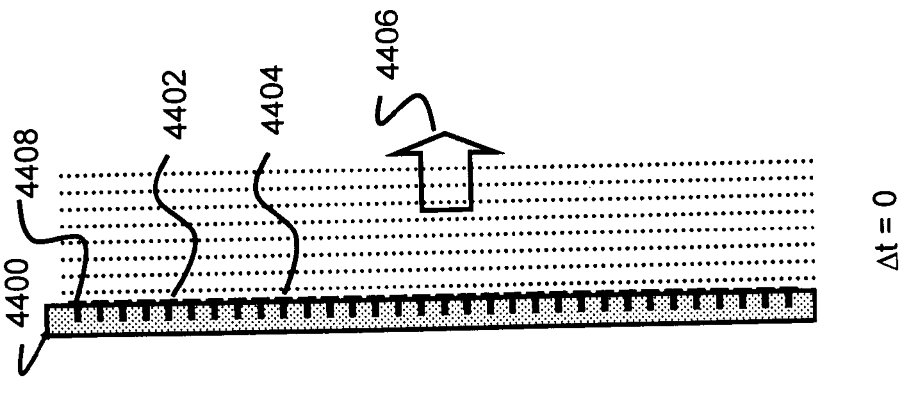
FIG. 93A, FIG. 93B, and FIG. 93C show true time delay beamforming.
Figure 93B:
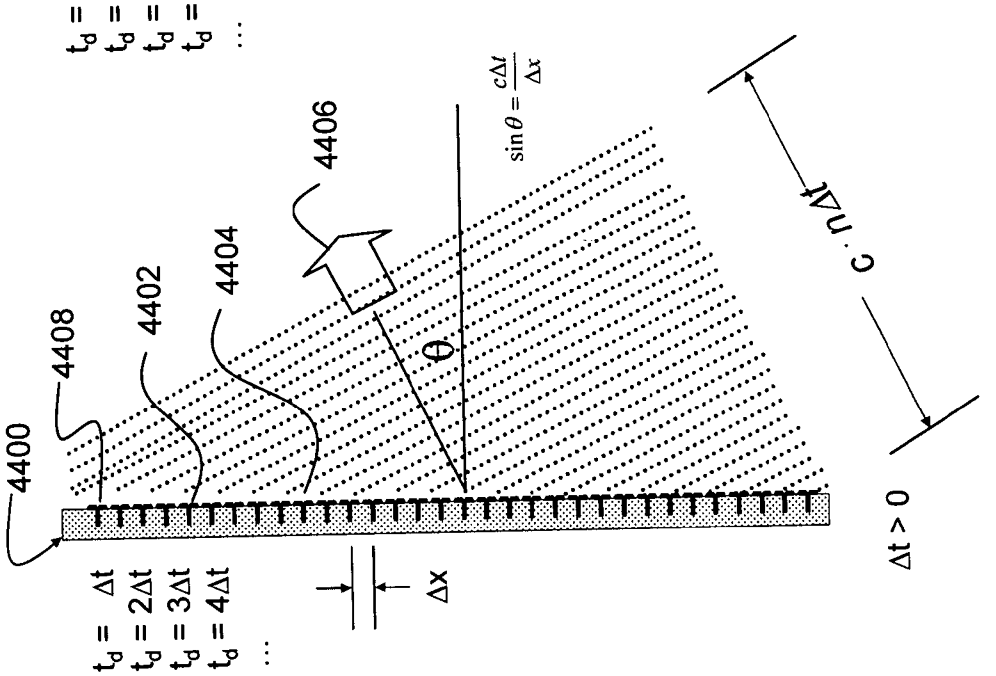
Figure 93C:
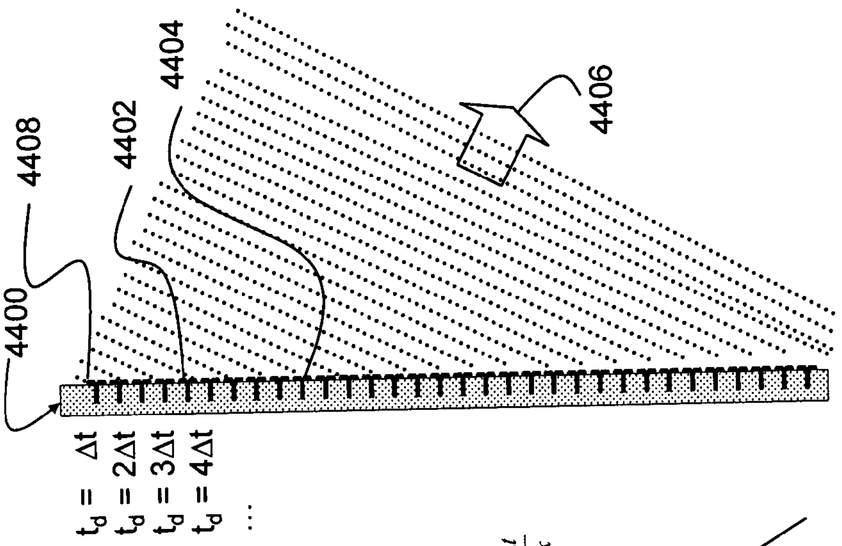

Transmit arrays can be extended to beamforming by employing time delay control of each amplifier element. The concept of a beamformer is an array of antenna elements that are independently controlled for time delay or phase to generate a beam or beams in designated directions. As mentioned before, phase control works for narrowband signals, and time control works for broadband signals. Time control is the more general concept, and the principle is shown in FIG. 93. In an antenna array 4400, if all emitter elements 4402, 4404 have the same time delay (Δt=0), RF radiation emitted by a very large array will combine as a plane wavefront in a single direction 4406 orthogonal to the array plane 4408, as shown in FIG. 93A. If each emitter element 4402, 4404 is delayed progressively by incremental delays Δt, 2Δt, 3Δt, etc., the plane wavefront will be turned by an angle θ given by:

$$\sin\theta = \frac{c\Delta t}{\Delta x} \quad (1.50)$$

where c is the speed of light and $\Delta x$ is the element spacing, as shown in FIG. 93B and FIG. 93C.

Figure 94:
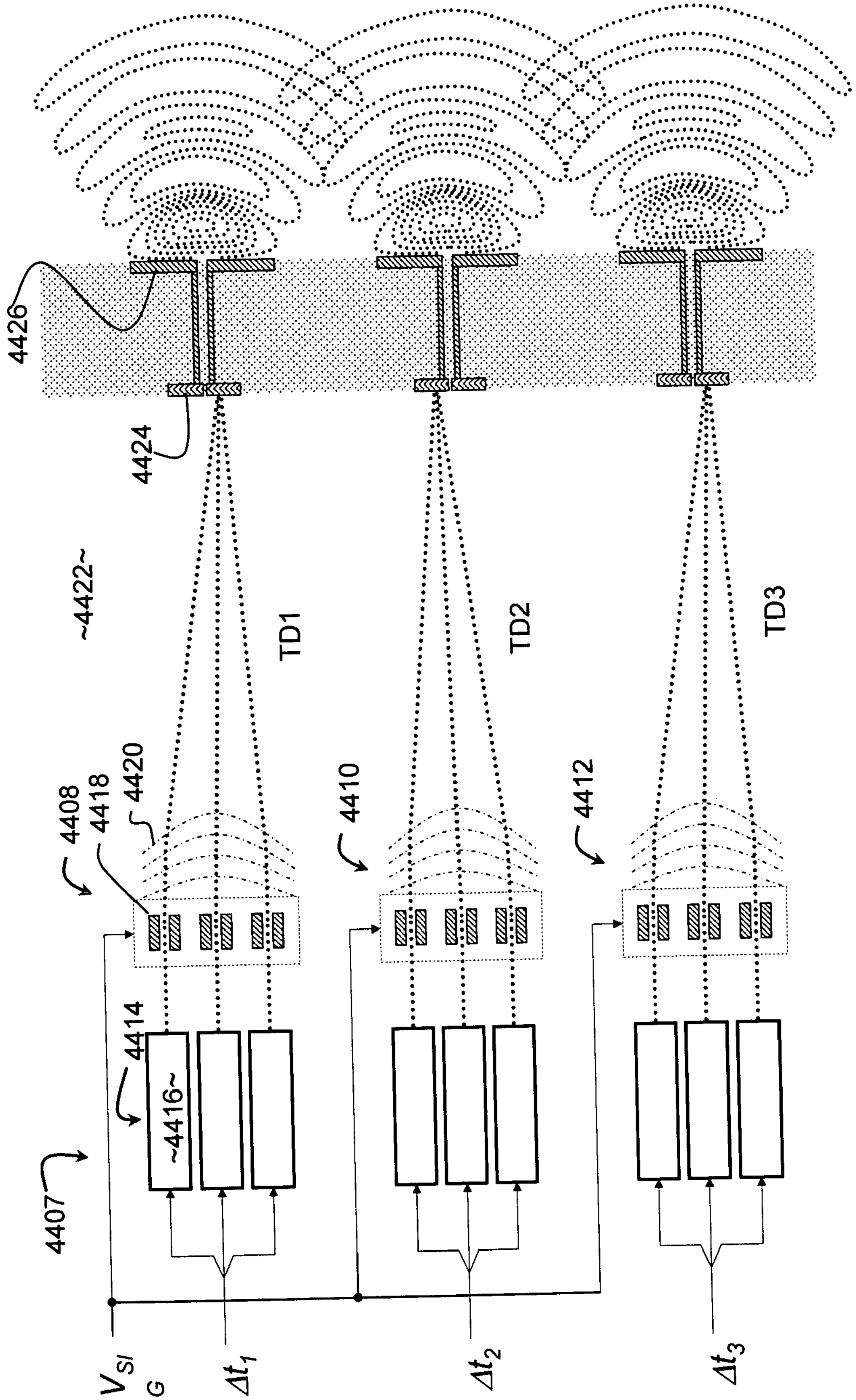
FIG. 94 illustrates a transmit beamforming array.

FIG. 94 shows an EBTX transmit array 4407, wherein each EBTX amplifier 4408, 4410, 4412 includes, by way of example, a microcolumn array 4414 with a plurality of electron guns 4416, associated deflector apparatus, e-beam focusing optics 4420, drift cavity 4422, e-beam detector 4424 and antenna 4426. Additionally, time delay control means are incorporated in each amplifier. All amplifiers are driven from a common RF source, $V_{SIG}$. Independent time delay control signals $\Delta t_1$, $\Delta t_2$, $\Delta t_3$, . . . are applied to each amplifier, as calculated by a beamforming algorithm in a separate processor (not shown) to generate e-beam delays TD1, TD2, TD3 in each amplifier.

Figure 95B:
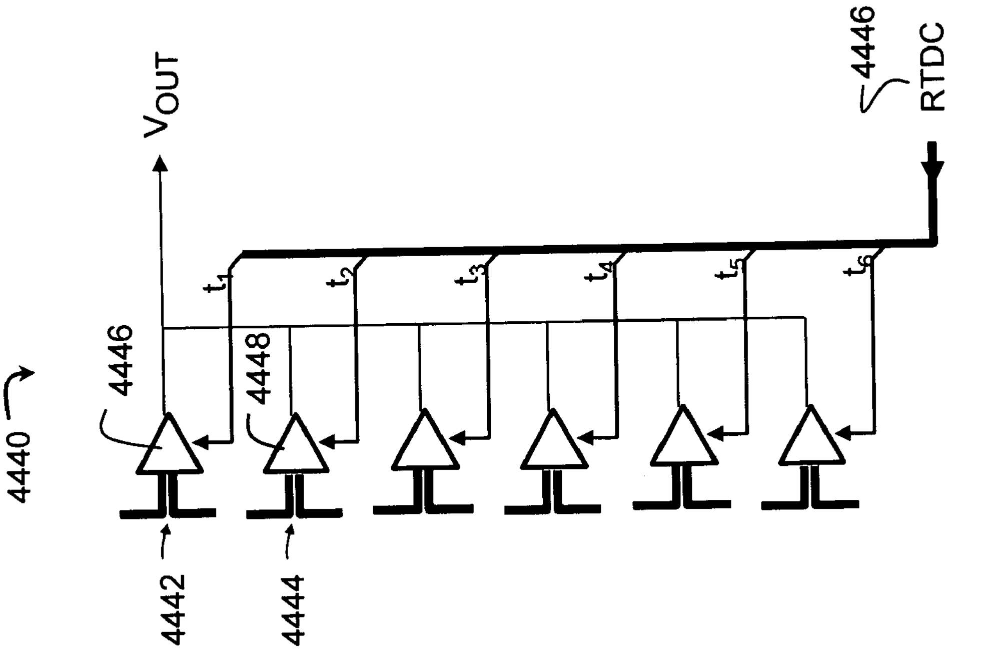
FIG. 95 shows trued time delay beamforming.
Figure 95A:
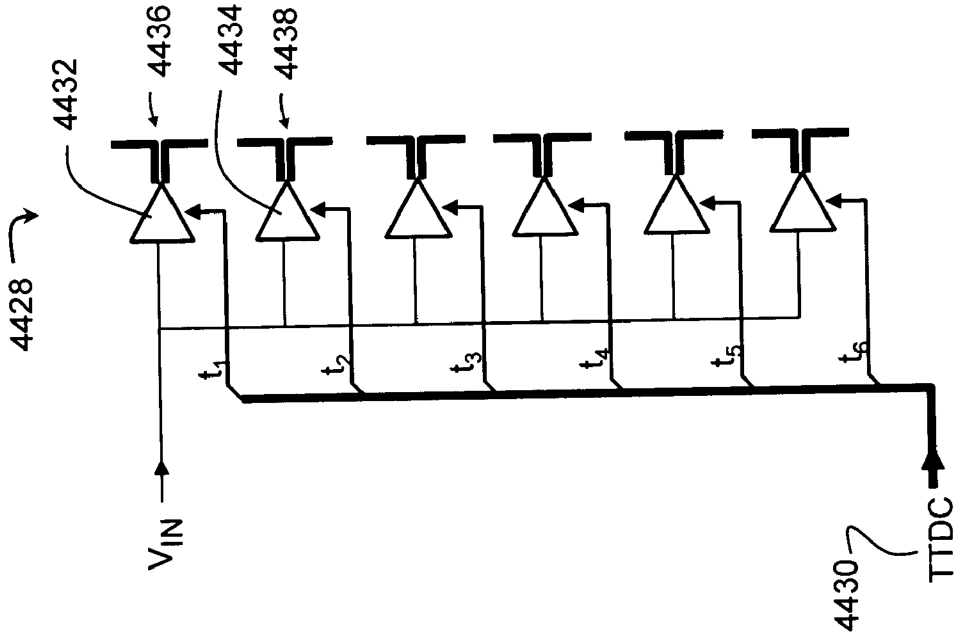

FIG. 95A shows schematically how the time delay commands may be transmitted to a transmit array 4428, where a transmit time delay control 4430 (TTDC) governs activation of EBTX's 4432, 4434 and, consequently, antennas 4436, 4438 by time control or phase adjusting signals $t_1$, $t_2$ . . . that adjust the phase of an incoming signal $V_{IN}$. FIG. 95B shows a similar concept applied to an antenna driven EBRX amplifier array 4440 where antennas 4442, 4444 drive ERBX's 4446, 4448. A receive time delay control 4446 (TTDC) governs activation of EBRX's 4446, 4448 by time control or phase adjusting signals $t_1$, $t_2$ . . . that adjust the phase of an outgoing signal $V_{OUT}$. By these means, RF delays are generated in the radiation from each antenna element and beamforming may be achieved.

Frequency Multiplying Radiating Beamformer

By constructing a detector according to the frequency multiplying embodiments described previously, the input frequency to the transmit beamformer can be a sub-multiple of the output frequency. One advantage is that very high frequency radiation can be generated from a low-frequency reference. Generally, a stable reference of pure tonal quality is more easily constructed if it is low-frequency, and is therefore preferred. In a large beamformer, there is the further advantage that a lower frequency signal can be distributed with lower losses through a corporate network of amplifiers and transmission lines.

Receive Arrays

EBRX amplifiers may be constructed in arrays to improve the performance of an RF receiver, in the same manner as EBTX amplifiers can be used to make transmit arrays. The same principles of beamforming apply, but in reverse.

Figure 96:
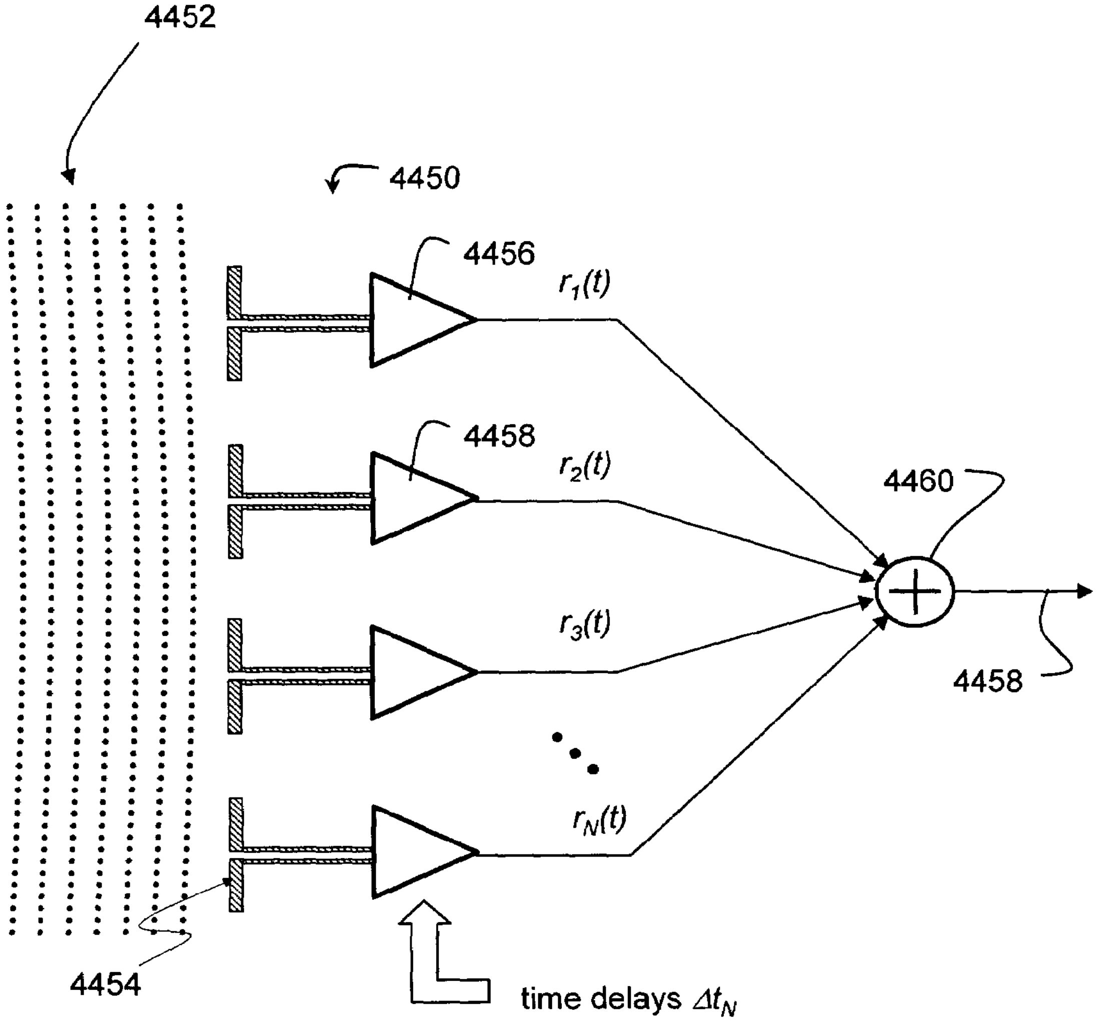
FIG. 96 shows a receive beamformer.

According to one embodiment, a large antenna is constructed from an array of smaller unit antennas such as dipoles, patches or horns. Each unit antenna is coupled to the input of an EBRX and the combination comprises an element of the array. As shown in FIG. 96, in an array 4450 driven by incoming RF 4452, an nth element 4454 generates an amplified output $r_n(t)$ in response to received RF energy. Beamforming delays $\Delta t_n$, are applied to each element 4456, 4458 in array 4450, such that the outputs $r_n(t)$ of all n elements are processed to detect RF energy in the desired direction of a beam 4458 or b(t) according to $$b(t)=\Sigma r_n(t-\Delta t_n). \quad (1.51)$$

This function can be realized by many methods. One employs mechanical switching of transmission lines to generate the elemental delays $\Delta t_n$, and electrical power combining to generate the summation. For example, one kind of power combiner 4460 is a corporate-fed Wilkinson combiner.

One embodiment generates a beam signal b(t) by quantizing the signals $r_n(t)$ with an analog-to-digital converter (ADC) coupled to the output of each element. The delays of each element and the power combining of all elements are generated with digital signal processing. This method can re-process the $r_n(t)$ signals M times with different sets of delays to generate M beams. Furthermore, the digital signal processing can selectively filter the resultant beams.

Another embodiment incorporates time delay control means in each EBRX to receive time delay control signals $\Delta t_n$. Each output $r_n(t)$ is summed in an electrical power combiner to generate the beam signal b(t). The limitation of this approach is that only a single beam can be generated, but the benefit is the simplicity of the time delay construction and the beam generation.

Figure 97A:
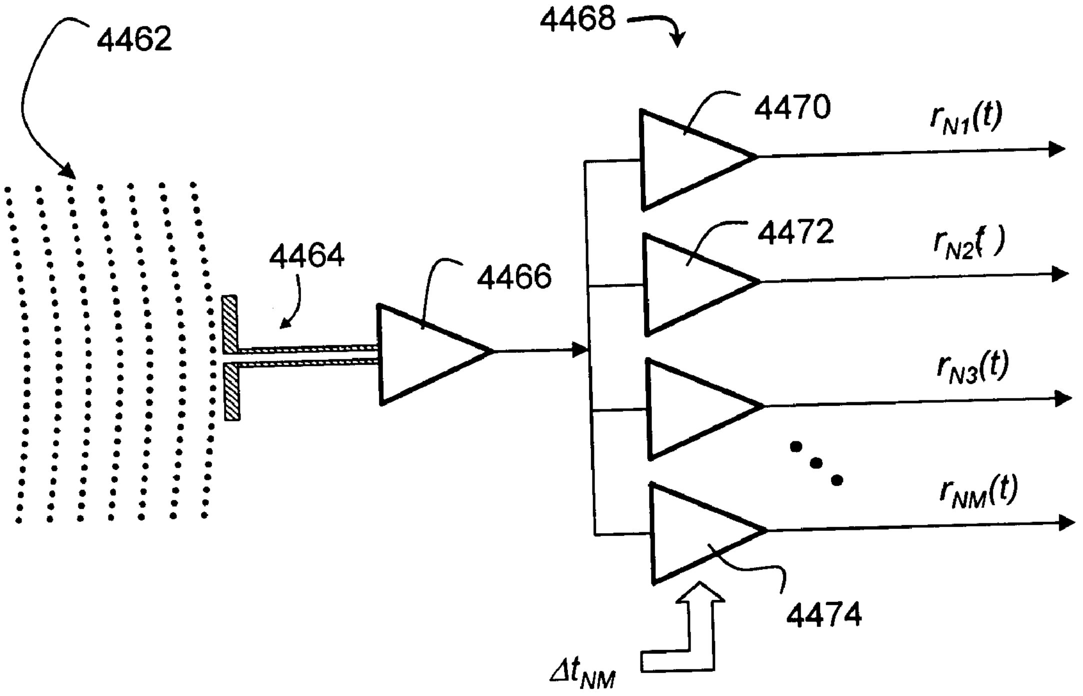
FIG. 97 shows various receive beamformer elements.
Figure 97B:
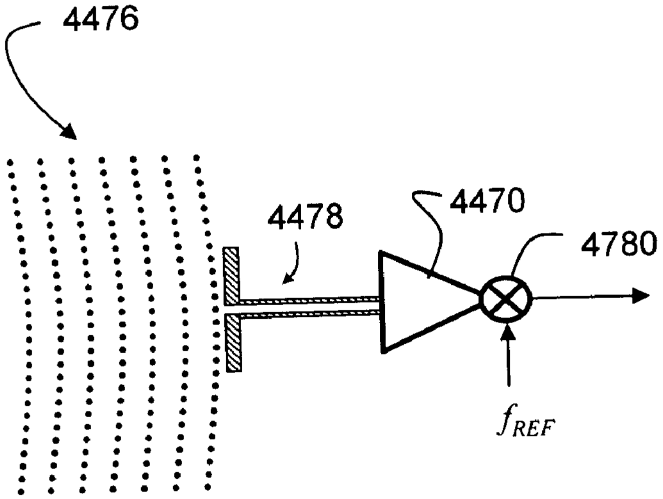

Another embodiment achieves multiple beam formation by incorporating multiple EBRX amplifiers in each antenna element. As shown in FIG. 97A, incoming RF 4462 drives antenna 4464 such that EBTX 4466 drives an EBRX array 4468. Each EBRX 4470, 4472 . . . down to an Mth EBRX 4474 is phase-adjusted by a time delay control signal Dtnm. FIG. 97B shows schematically how the time delay commands are applied to a receiver array, for example, as shown for EBRX 4470. RF 4476 emitted by EBTX 4466 strikes antenna 4478 to drive EBRX 4470, and responsive emissions from EBRX 4480 are phase adjusted by a phase adjusting signal FREF. Accordingly, EBRX array 4468 generates M signal power outputs rnm(t) that are summed by power combining means into M beams according to $$b_m(t)=\Sigma r_{nm}(t-\Delta t_{nm}). \quad (1.52)$$

In a further improvement on this embodiment, an extra EBRX (not shown) may incorporated in each element to isolate the antenna from the loading of the M beamforming EBRXs. In this manner, the signal power can be further amplified before power combining, thereby overcoming losses in the combiner and improving the signal level.

Analog Beamforming Mixer

A related improvement integrates mixing action into the receiver array. One variant of an EBRX includes a mixer element (e.g., including beam spot configuration 151(17) shown in FIG. 55) based on a quad-segmented detector. A mixer may be incorporated into each antenna element, either after the amplifier, or as part of the amplifier, for example, as shown in FIG. 97B. As part of the amplifier, a mixer 4780 simultaneously amplifies the antenna signal s(t), and demodulates it with a local oscillator reference frequency. The demodulated output has the sum and difference frequencies characteristic of mixing. Thus a single EBRX can simultaneously function as both a low-noise RF amplifier and a mixer. With filtering, the output is a lower intermediate frequency (an "IF"), and the signals from each antenna element can be more easily distributed and processed by subsequent circuitry.

Electron Beam Power Combiner

Another embodiment is an improved power combiner. The embodiment comprises k microcolumn arrays having independent deflectors, k beam offset means coupled to each deflector, a drift cavity, and a single detector. Each deflector of the kth microcolumn array receives a signal $s_k(t)$ that modulates the kth beam. Beam offset means keeps each average position of the beam centered on the detector according to embodiments described previously. The modulation then generates a detector signal. Since each beam excites the detector simultaneously, the detector output is the sum of all amplified signal components. Thus, power combining is achieved.

Figure 98:
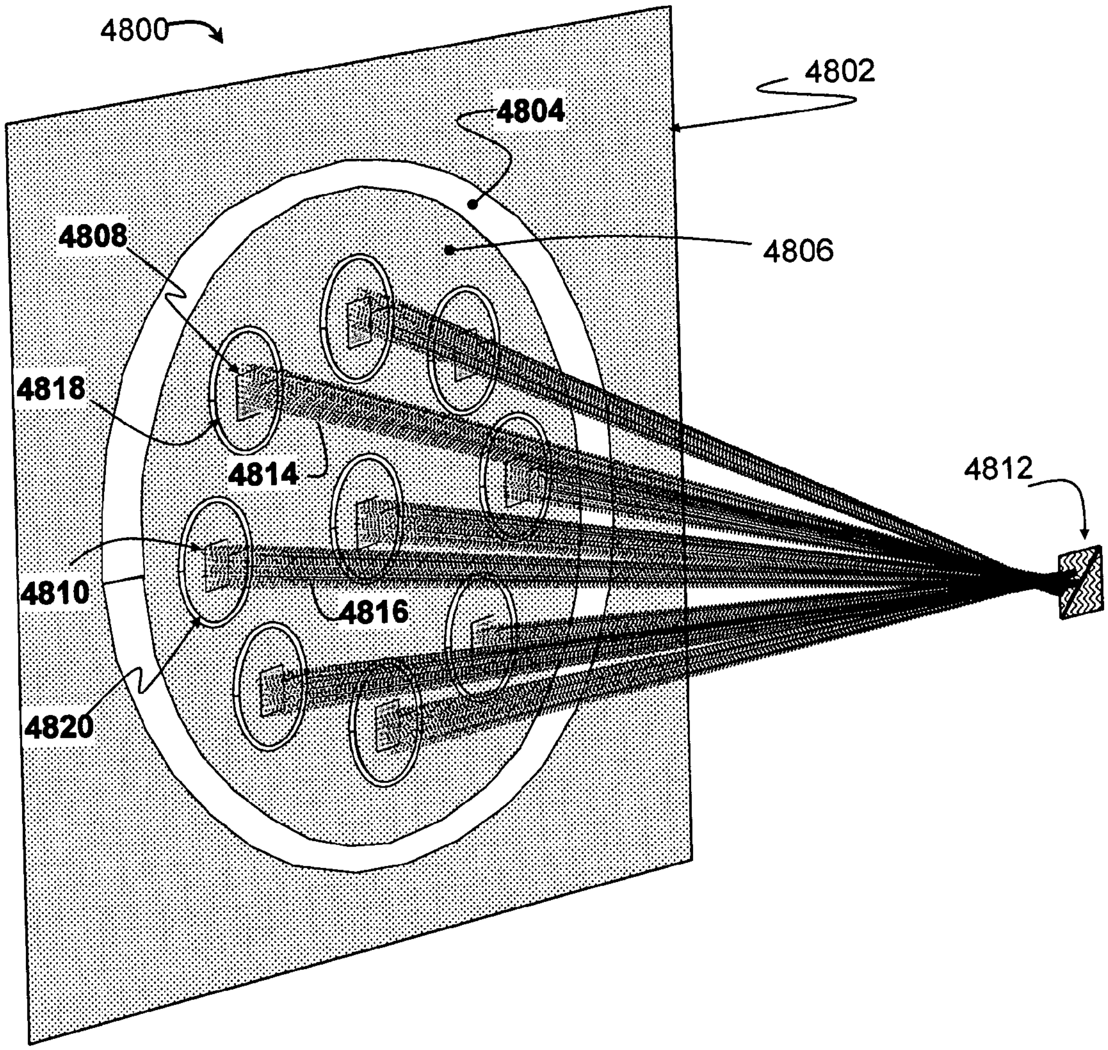
FIG. 98 illustrates an electron beam power combiner.

In another embodiment, the k beam offset means are achieved with electron optics. As shown in FIG. 98, a circularly disposed array 4800 includes lensing optics that include an outer electrode 4802 separated by slot 4804 from a generally circular inner electrode 4806. A plurality of microcolumn arrays 4808, 4810 are arranged in a circular pattern within the inner electrode 4806. A detector 4812 is axially and centrally located with respect to the plurality of microcolumn arrays 4808, 4810. Electrical potentials applied to electrodes 4802, 4806 generate a symmetrical field (not shown) that focuses each of beams 4814, 4816 onto the center of the detector 4812. Simultaneously, the potentials of electrodes 4818, 4820 in relation to 4806 generates focusing fields around each microcolumn array 4808, 4810 to focus each individual beam 4814, 4816 into a combined beam spot on detector 4812. The arrangement thus creates immersion lenses within immersion lenses, similar to that previously described for the drift cavity doublet. In this manner, each beam is focused to a desired spot shape, and the array beams is focused onto a single detector. Thus, multiple signals can be combined as well as amplified in a single device.

TR Arrays

Figure 99:
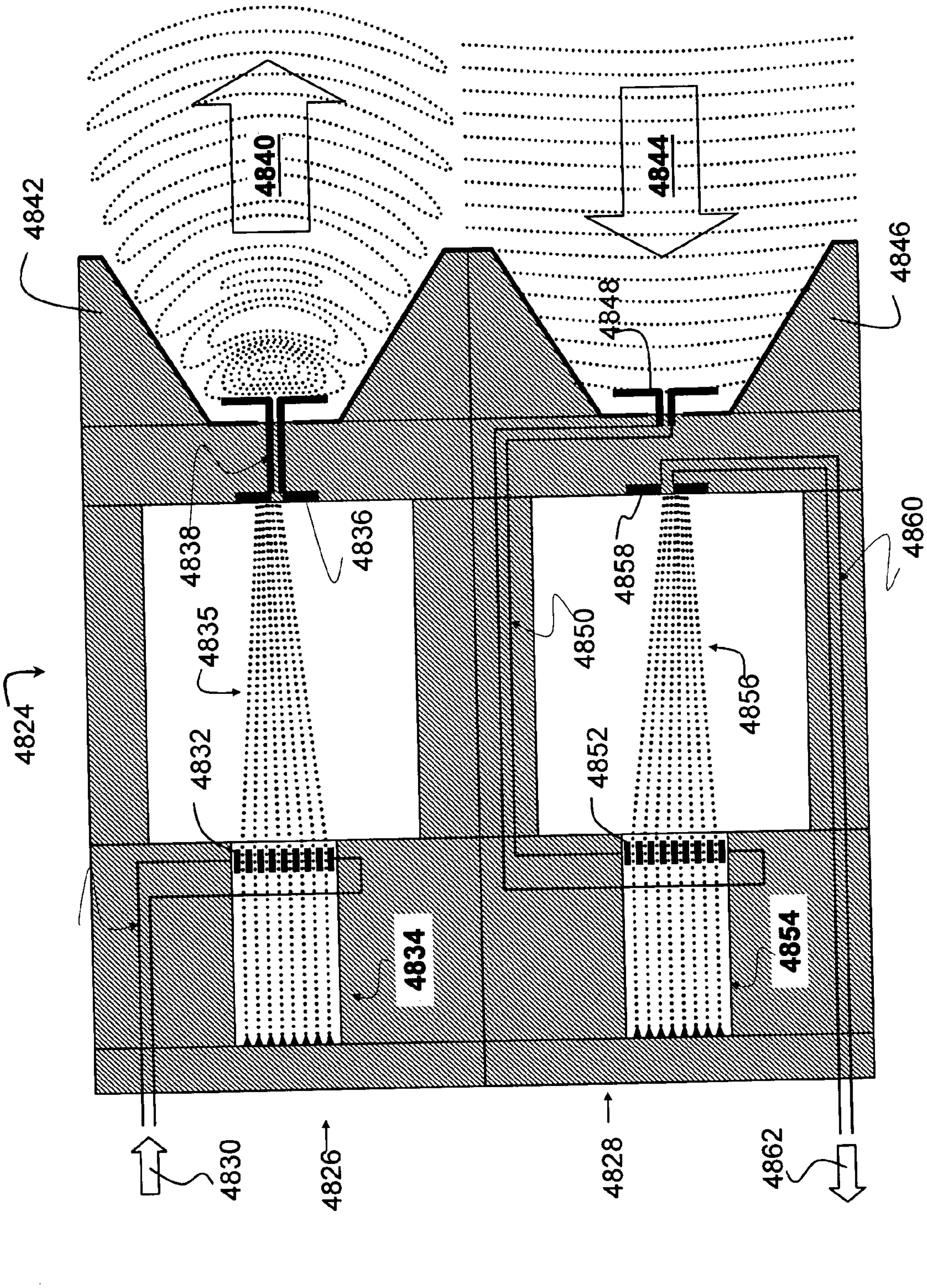
FIG. 99 shows an integrated transmit-receive (T-R) element.

It can be appreciated from the microminiaturized nature of the construction that the foregoing benefits of a transmit beamformer can be combined with a receive beamformer in a single integrated bidirectional transmit-receive or "TR" unit. FIG. 99 shows one embodiment of a dual directional beamformer or TR element 4824 comprised of an EBTX amplifier 4826 and an EBRX amplifier 4828. An incoming signal 4830 drives deflectors 4832 of microcolumn array 4834 to emit e-beams 4835 towards detector 4836 for excitation of antenna 4838 and directional RF emanations 4840 in a dipole-excited horn 4842. Return RF 4844 arrives through horn 4846 to strike dipole antenna 4848 for transmission of signal through coupling 4850 to drive deflector 4852 of microarray 4854. In turn, e-beams 4856 strike detector 4858 for transmission of signal on output coupling 4860 and delivery of output signal 4862.

Figure 100:
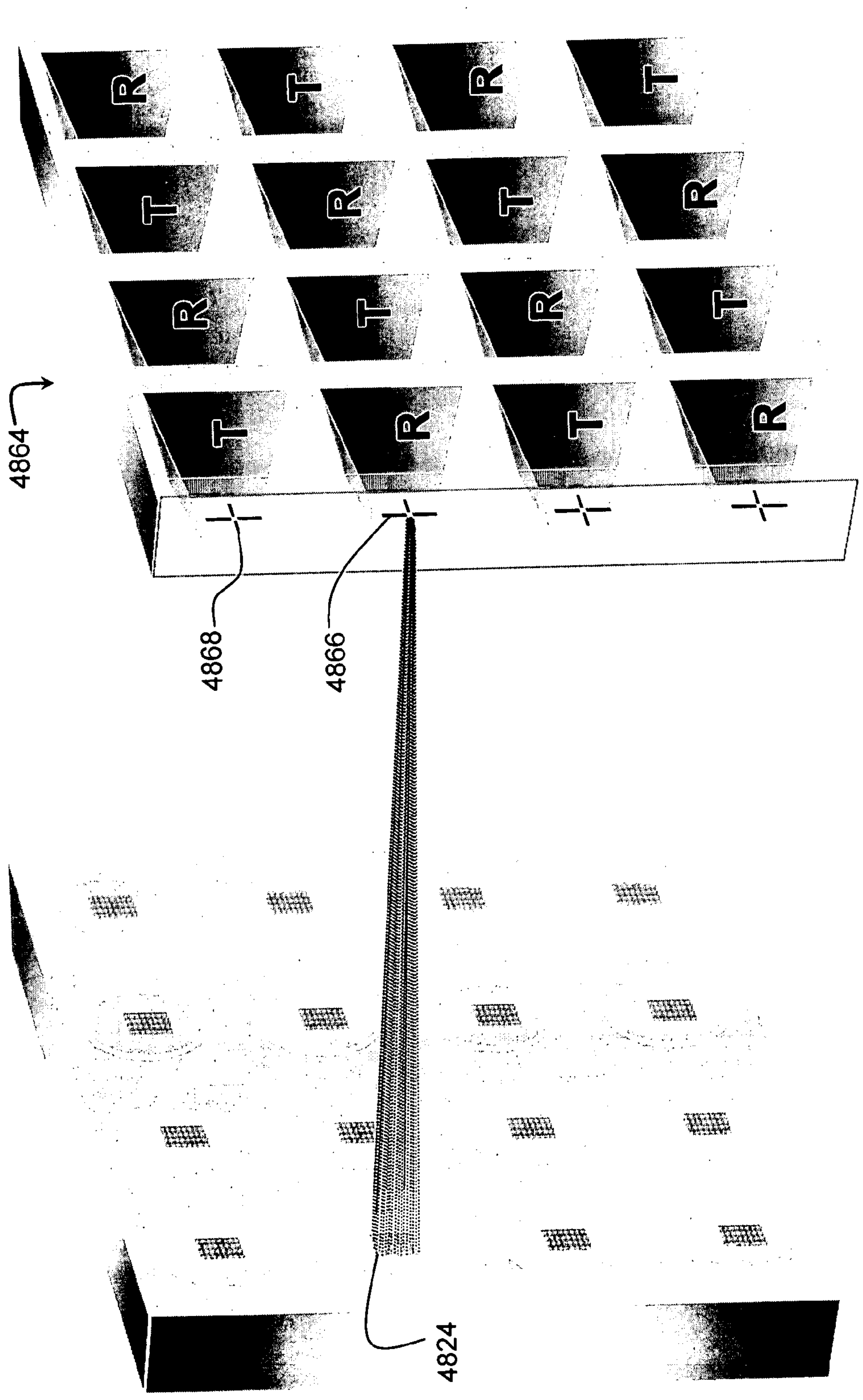
FIG. 100 shows a T-R array.

FIG. 100 shows how the TR element 4824 may be arrayed before a two-dimensional antenna 4864 employing alternating T and R elements, 4866, 4868.

Beamform Processor

In systems that employ digital signal processing to form RF beams, a plurality of signals $r_{nm}(kT)$ (received or to be transmitted) at successive times k of a sampling interval T are delayed by storing them in random access memory and selectively re-accessing them for beamform summation.

In some applications, the samples $r_{nm}(T)$ are multiplied by constants $c_{nm}$ so that each signal is not only delayed but scaled. Yet other applications may not use a simple progressive time-delay algorithm for beamforming, but may rely on specialized algorithms similar to the Fast Fourier Transform (FFT), which employs matrix mathematics to determine optimum time delays and scaling coefficients to achieve multiple beams with the low sidelobes. Even more complex beamforming algorithms are supplemented by adaptive nulling algorithms to suppress signals in certain directions where there may be interference (as in a receiver) or where interference must not be generated (as in a transmitter). In any of these examples, the beamforming might also have to form cross-polarization levels, which doubles the processing required. These are not the only types of processing, but are illustrative of the complexity of the processing that might be involved.

It can be appreciated that a beamform processor may have to accomplish many functions and require considerable computing power. In high performance systems, this is often achieved with multiple digital signal processors operating in parallel. These processors may have to access a common memory as well as the plurality of signals $r_{nm}(kT)$, and often have to transfer data between processors at very high rates.

Conventionally, data transfer between processors is via a shared input/output ("I/O") bus, sometimes termed a "backplane". Data is transferred between processors under the control of an arbitration arrangement, but since data transfer can only take place between one pair of processors at a time, the data transfer is necessarily sequential, and each processor waits its turn to transmit data to, or receive data from, another processor. The result is that processing slows significantly. As a number of parallel processors increase, the overall processing often improves no better than the logarithm of the number of processors. This limits multiprocessor computers, because the cost of parallel processing goes up dramatically with only minor performance improvements. Many real-time applications (such as, for example, synthetic aperture radar image processing or fast-fourier signal transforms) are severely constrained by data transfer delays.

Various methods have been employed to increase the performance of multi-processor systems. One method uses multiple buses between processors. Other methods use dedicated high-speed communication channels between each pair of processors. In general, the large number of data path combinations makes a full set of physical electrical paths prohibitively large, costly, power consumptive, slow and inefficient. Since for a number N of processors there are $(N^2-N)/2$ processor pairs, even a subset of the datapaths becomes prohibitively expensive to implement using conventional printed circuit boards and cables, for large N (e.g., N>1024). Another difficulty is that each processor must drive N buses or channels, and the loading becomes prohibitive for high-speed operation.

Figure 101:
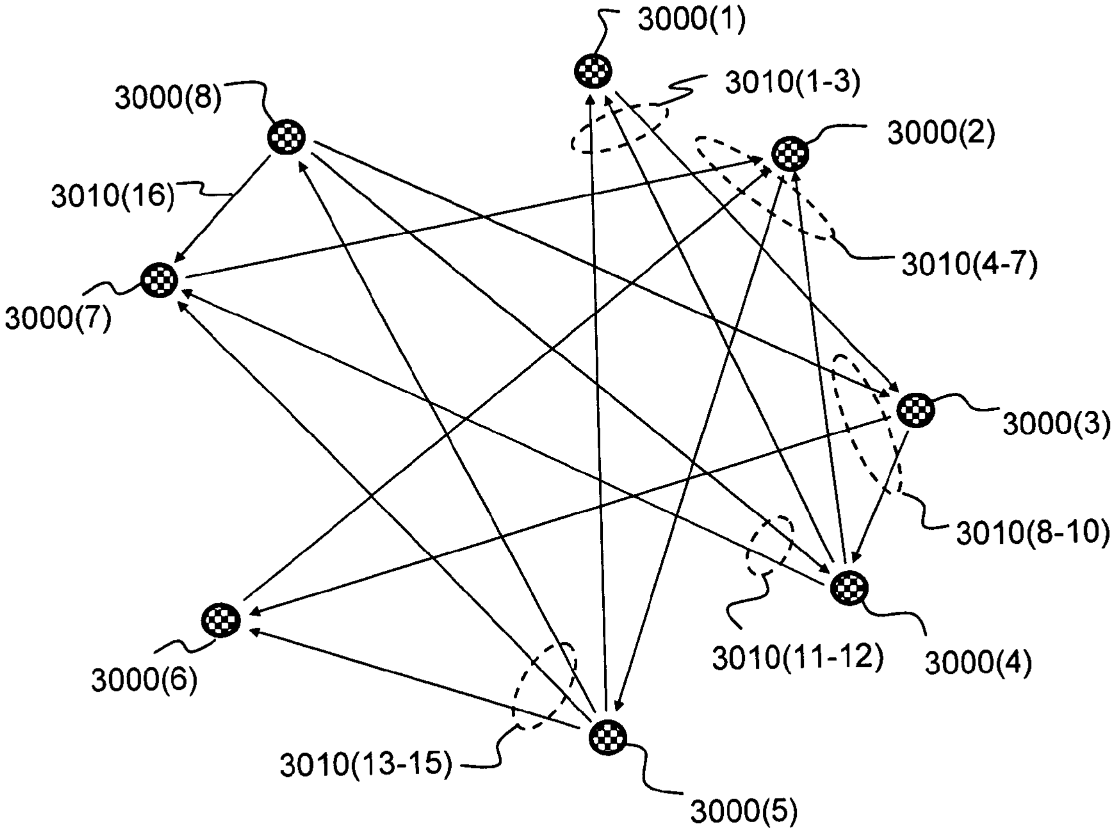
FIG. 101 shows schematically a set of processors and some of the possible connections that may be formed thereamong.

Some sophisticated systems use active circuitry to create a device that attempts to exchange signal paths such as digital data streams across a "crossbar switch matrix" or "crossbar." For example, a crossbar may dynamically reconfigure a fixed number of communication paths between processors on a demand basis, eliminating the loading effect by creating point-to-point connections between certain pairs of processors at one time. For instance, a crossbar may create a communication path between a processor A and some of any of N other processors, and a communication path between a processor B and some of any of N−1 other processors, and a communication path between a processor C and some of any of N−2 other processors, and so on. FIG. 101 shows schematically a set of eight processors 3000(1-8) and some of the possible connections 3010(1-16) that may be formed thereamong. Among the eight processors shown in FIG. 101, 36 connections are possible, but only 16 connections exist. Further, each connection 3010 is seen to be unidirectional, as indicated by each arrow.

This is only one application for a crossbar. The very nature of the device makes it of great utility for other applications as well. For instance, some types of crossbars can also be used as a switching element in reconfigurable computers and multiplexed data acquisition systems, among others.

Figure 102:
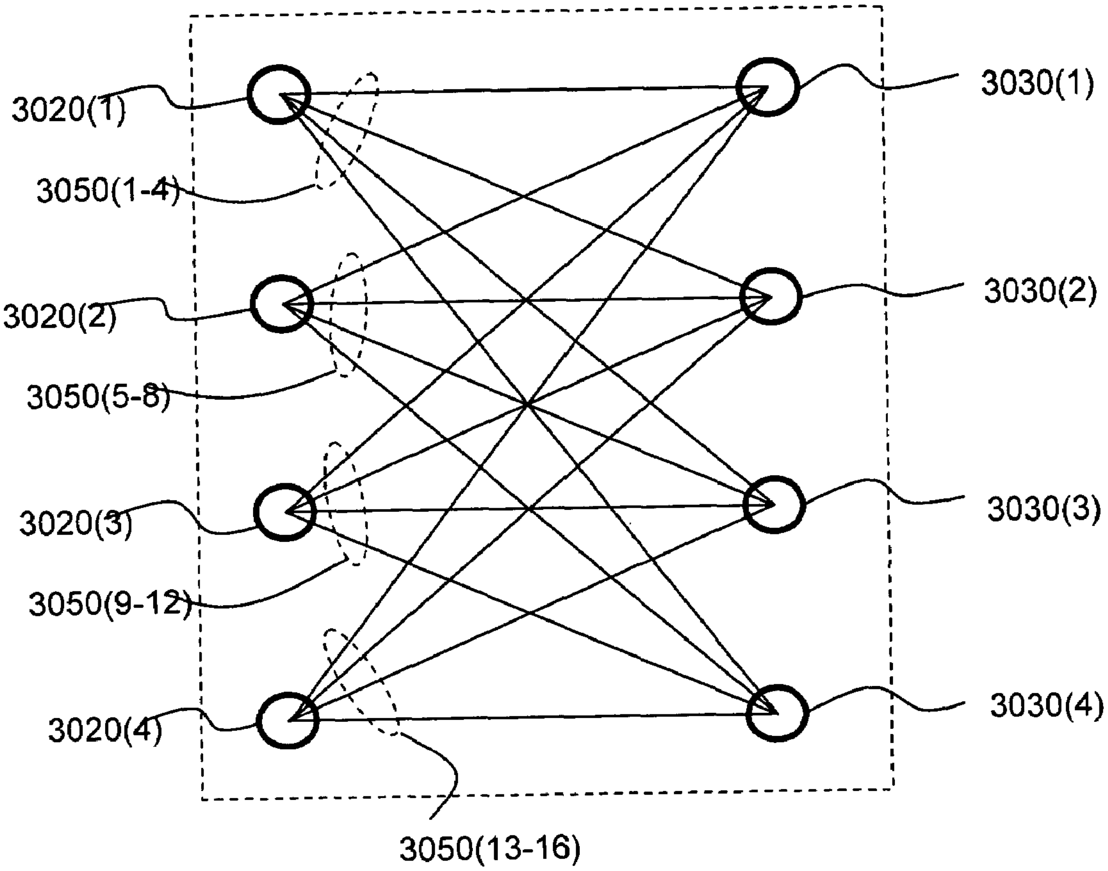
FIG. 102 shows possible connections of a crossbar element having 4 inputs and 4 outputs.

Crossbar switches have historically had only a relatively few number of inputs and outputs, such as, for example, the 16 inputs and 16 outputs shown in FIG. 101. FIG. 102 shows the possible connections 3050(1-16) of a crossbar element having 4 inputs 3020(1-4) and 4 outputs 3030(1-4). As discussed above, the number of interconnects increases quadratically in relation to the number of inputs and outputs. This is difficult enough with serial data channels, but many computer systems require I/O buses of 64 bits or more. For example, for a multiprocessor system with 1024 processor elements, a single crossbar would require a total of 64×($1024^2$−1024)/2≈33×$10^6$ bidirectional interconnects.

A traditional solution for dense interconnection has been to construct an array of many small crossbar switches. With appropriate cross-interconnection of small crossbar switches, the array can appear to be a much larger crossbar switch. One form of this is called an "active backplane". A "passive backplane" consists simply of wiring among multiple processors, or processors and peripheral systems such as disk drives. In contrast, an active backplane incorporates active switching elements such as small crossbars to dynamically configure point-to-point connections among processors. Generally, some kind of crossbar switch elements are preferred and configured for duplex signalling.

However, even an active backplane may not allow simultaneous transfer between all processor pairs. In this case, it is termed "blocking," to reflect the fact that communication paths between certain processor pairs will "block" simultaneous communication between some other processor pairs. When an active backplane can achieve simultaneous transfers between all processor pairs, it is termed "non-blocking". The disadvantage of a "blocking" active backplane is that the transfer of data between processor pairs must be performed sequentially (i.e., certain transfers must wait for other transfers to be completed). This slows the overall data transfer rate among all the processors and reduces the computing throughput.

Figure 103:
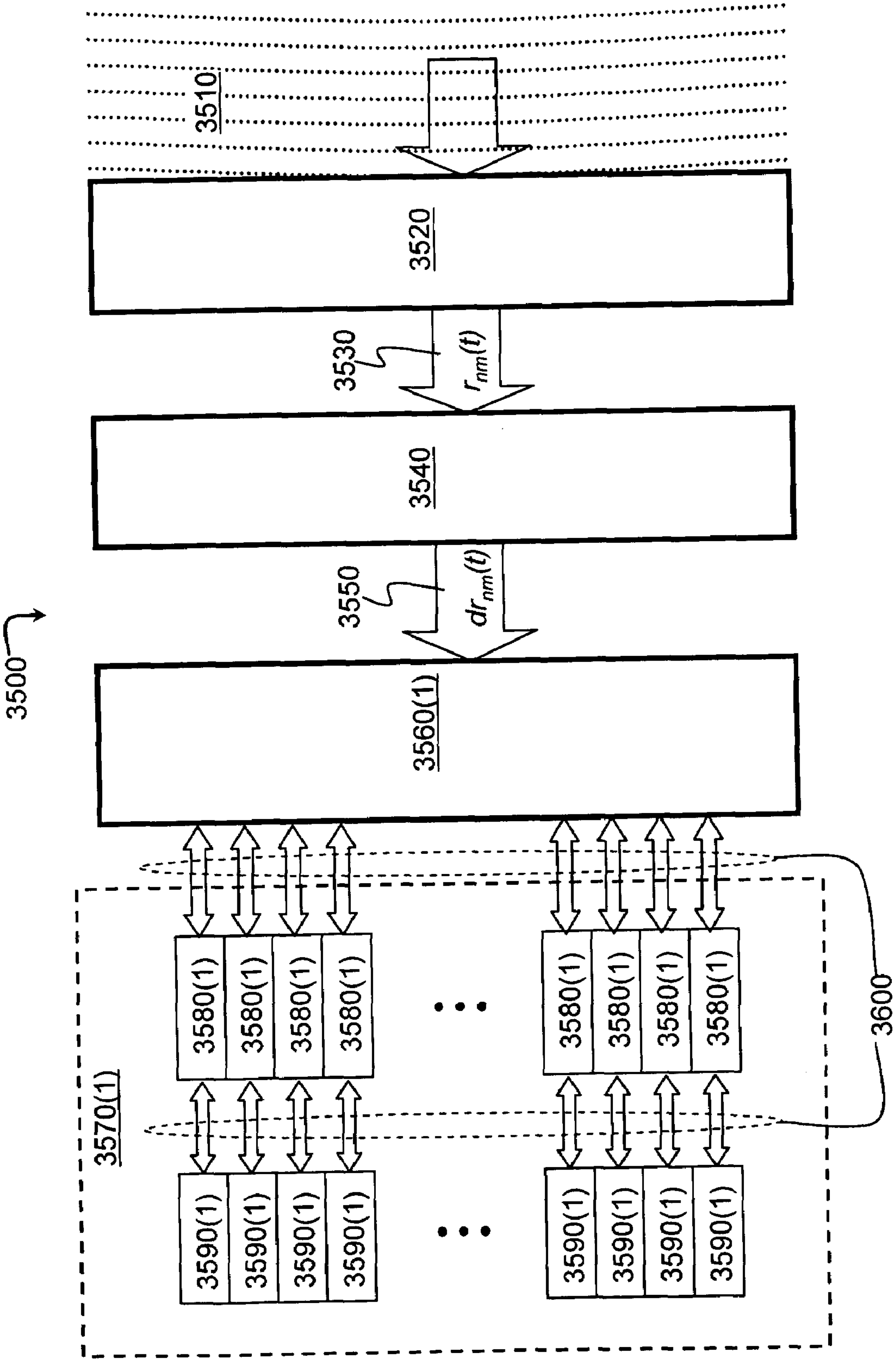
FIG. 103 shows schematically an application of an active backplane crossbar receiving beamformed RF signals.

FIG. 103 shows schematically an application of an active backplane crossbar 3500 receiving beamformed RF signals 3510. In this case, an N-element RX antenna array 3520 receives RF signals 3510, converts them to analog signals $r_{nm}$(t) 3530 and transmits them to an array of ADCs 3540. ADCs 3540 convert signals 3530 to digital signals $dr_{nm}$(t) 3550 that are transmitted to an active backplane 3560(1), where they are routed to a multiprocessor array 3570(1) as data 3600. Multiprocessor array 3570(1) includes a plurality of memory elements 3590(1), each of which correspond to one of a plurality of CPUs 3580(1). Multiprocessor array 3570(1) processes digital signals $dr_{nm}$(t) 3550 in CPUs 3580 (1), moves data 3600 from point to point within array 3570(1) through backplane 3560(1), and ultimately may generate beam signals stored in memory elements 3590(1).

Figure 104:
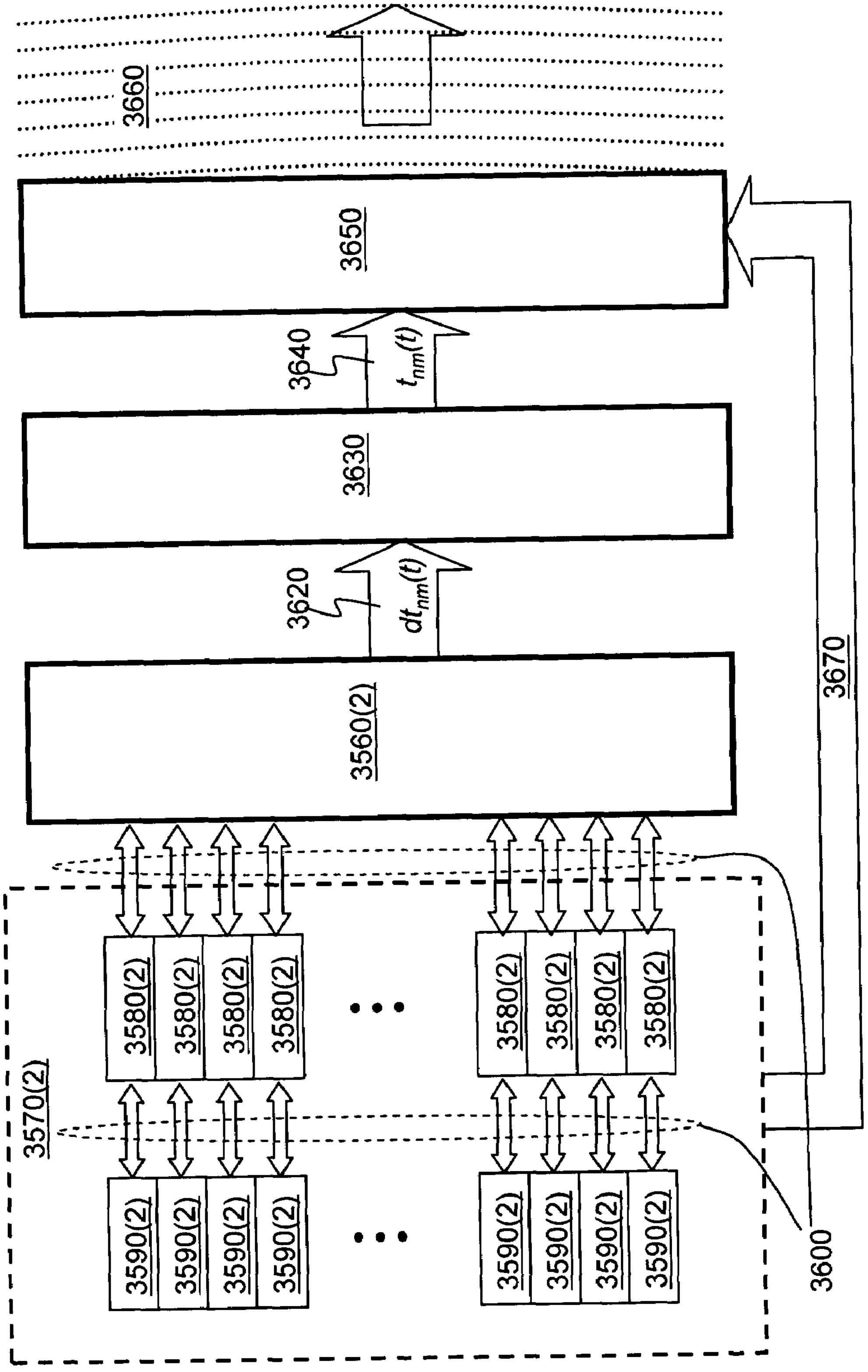
FIG. 104 shows schematically an active backplane crossbar in an application with an RF beamformer.

Similar considerations apply for a typical transmit beamformer. FIG. 104 shows schematically an active backplane crossbar 3570(2) in an application with an RF beamformer. By way of comparison to FIG. 103, data processing events in FIG. 104 occur in approximately reverse order. Multiprocessor array 3570(2) processes data 3600 in CPUs 3580(2), moves data 3600 from point to point within array 3570(2) through an active backplane 3560(2), and generates a digital representation $dt_{nm}$(t) 3620 of beam signals stored in memory elements 3590(2). As discussed above, representation $dt_{nm}$(t) 3620 is calculated so as to produce desired RF signals from an N-element antenna TX array 3650. Representation $dt_{nm}$(t) is transmitted to an array of DACs 3630, which converts them to analog representations $t_{nm}$(t) 3640, which are applied to amplifiers in N-element antenna TX array 3650, and RF signals 3660 are generated therefrom.

It may be appreciated that N-element antenna RX array 3520 of FIG. 103 may be constructed from various elements of an EBRX as previously discussed. Similarly, N-element antenna TX array 3650 of FIG. 104 may be constructed from various elements of an EBTX as previously discussed. If the EBTX elements support time delay control for beam steering, multiprocessor array 3570(2) may generate time delay commands 3670 and transmit them to N-element antenna TX array 3650.

Some crossbar switches developed for active backplanes to date have used both electrical and optical means; many of these have limitations with respect to bandwidth, cost, power, complexity, and heat generation.

E-beam Crossbar Switch

Figure 105:
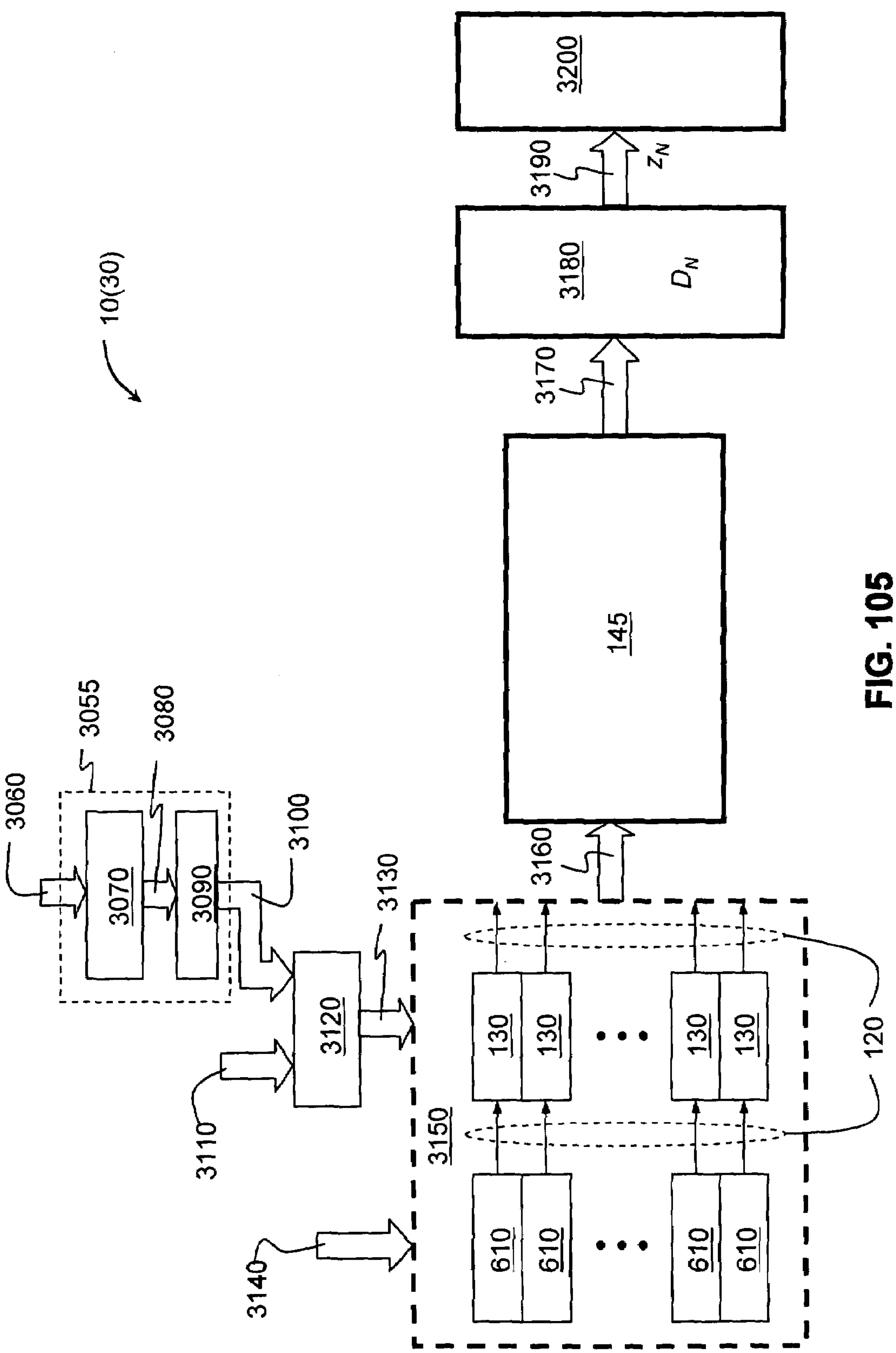
FIG. 105 shows schematically an electron beam amplifier configured as a crossbar switch matrix.

FIG. 105 shows schematically an electron beam amplifier 10(30) configured as a crossbar switch matrix. A control circuit 3055 of electron beam amplifier 10(30) is configured to receive matrix configuration commands 3060 that identify a correspondence of M input signals to N output signals that is to be implemented. Control circuit 3055 includes a memory 3070 (such as, for example, a ROM) which provides control words 3080 to a DAC array 3090. DAC array 3090, in turn, generates offset signals 3100 which are fed to a combining network 3120. Input signals 3110 (i.e., the data to be communicated from the inputs to the outputs) is also fed to combining network 3120, which combines each input signals 3110 with a corresponding offset signal 3100 to generate deflector voltage signals 3130. A microcolumn array 3150 includes M electron guns 610, each of which emits an electron beam 120 which is controlled and focused by a bias 3140. Each of M independent deflectors 130 deflects a corresponding electron beam 120 with the corresponding deflector voltage signal 3130. The M electron beams 120 enter a drift cavity 145 as array of electron beams 3160; drift cavity 145 may include focusing and/or accelerating electron optics. Electron beam array 3160 forms an array of beam spots 3170 on a detector array 3180 of N detectors $D_n$, connected with an array 3190 of output networks $Z_n$. Some or all of the elements discussed in electron-beam amplifier 10(30) may form what is called herein an "EBX" for Electron Beam crossbar.

In some EBXs, the number M of microcolumns may equal the number of detectors N, while other EBXs may have M≠N.

Programming (or re-programming) offset signal 3100 for any of electron beams 120 is achieved by delivering a matrix configuration command 3060 to control circuit 3055 that redirects a channel m coupling between a corresponding input signal $s_m$ and a detector $D_N$. Each signal $s_m$ modulates one of the M deflectors, thereby causing the signal $s_m$ to excite one of the N detectors. This causes a current output to be generated from detector $D_N$, thereby transmitting (and possibly amplifying) signal $s_m$ through a dynamic channel MN corresponding to targeting $m^{th}$ e-beam 120 onto detector $D_N$.

A data signal corresponding to signal $s_m$ may be a small proportion of each deflector voltage signal 3130, as the data signal need only deflect the corresponding beam 120 by an angle subtended by a single detector element $D_N$. Each detector $D_N$ may be formed, for example of one or two segments for digital signalling, but other arrangements are possible. Saturation means (e.g., high speed Schottky diodes) may be provided in the output networks $Z_n$ to clamp the output voltage levels, as discussed above with respect to FIG. 61. It may be appreciated that an EBX may be configured either for analog or for digital signals $s_m$.

The mechanical dimensions of an EBX may be appreciated from an example. For a 5 μm wide detector, a 100×100 array of detectors has dimensions of 500 μm×500 μm. Similarly, a 5 μm diameter electron gun permits a 100×100 array of electron guns with the same dimension. (However, as mentioned above, the detector and gun arrays do not have to have the same size or dimensional number.) Assuming a maximum beamsteering tangent of 0.2 (corresponding to a deflection angle of 11.3 degrees), a minimum drift cavity length is approximately 2500 μm if an e-beam from one corner of electron gun array 3150 is to be steered to an opposite corner of detector array 3180. These dimensions are consistent with the fabrication techniques discussed above.

The electrical parameters of an EBX may be appreciated from an example. It is assumed for this example that input signals $s_m$ have a peak-to-peak amplitude of 100 millivolts, and are to be reproduced at detector outputs $Z_n$ that are terminated in 50 ohm loads. A 2 mA peak-to-peak current is thus required from the detector. With a beam acceleration of 280 eV and a detector gain of 1000, a beam current of 2 μA is required to excite each detector. From the previous description of the effects of space charge spreading, it can be seen that this is within the range of acceptable parameters, and a 2 μA beam is low enough in current that a single electron gun may be employed for each of the M input channels.

Crossbar Array Construction

Many arrangements of microcolumn arrays and detector arrays are possible. In the simplest, the microcolumns and the detectors can be arranged in a line; however, in this configuration, large numbers of channels result in excessive beam-steering angles.

Figure 106:
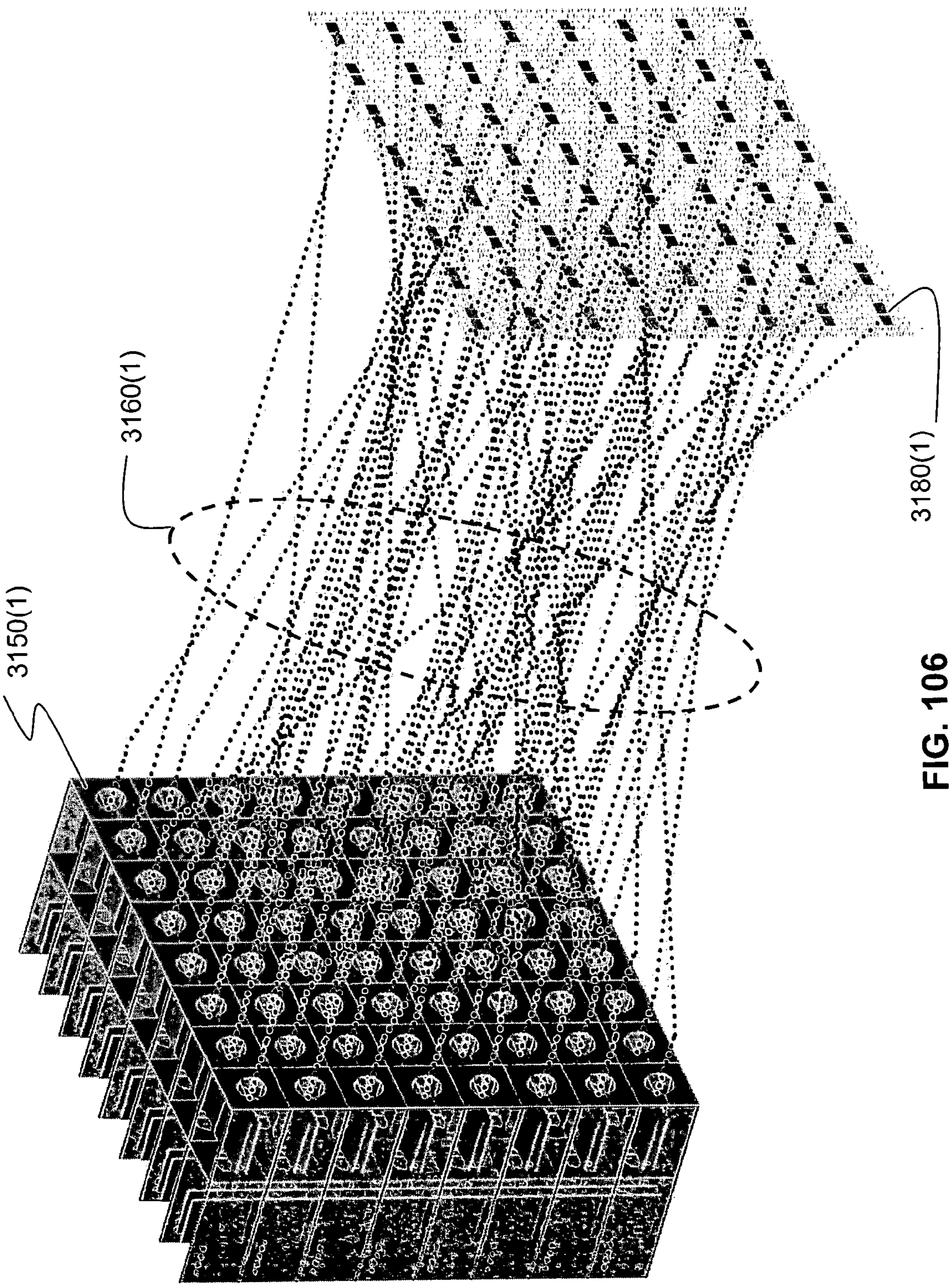
FIG. 106 shows a microcolumn array, an electron-beam array and a detector array operating in a crossbar configuration.
Figure 107C:
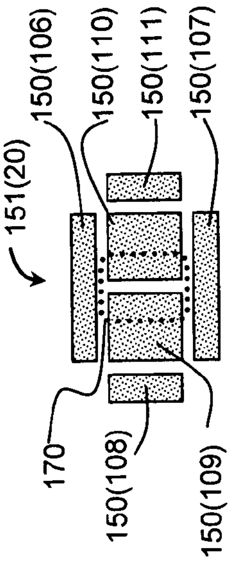
FIG. 107A through FIG. 107E show three detector configurations which may be used to generate beam offset information.
Figure 107B:
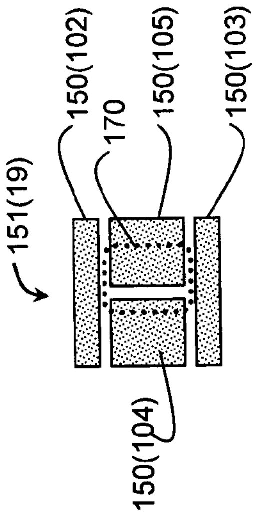
Figure 107A:
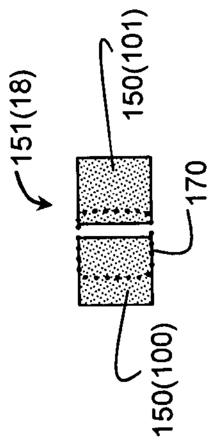
Figure 107E:
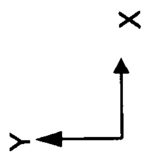
Figure 107E:
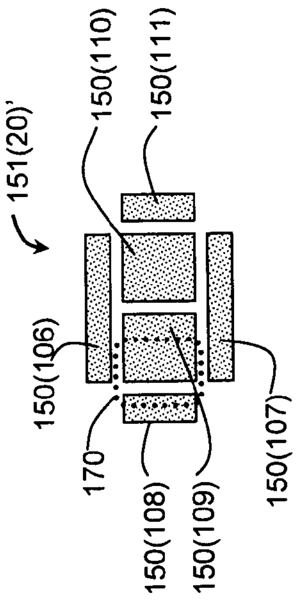
Figure 107D:
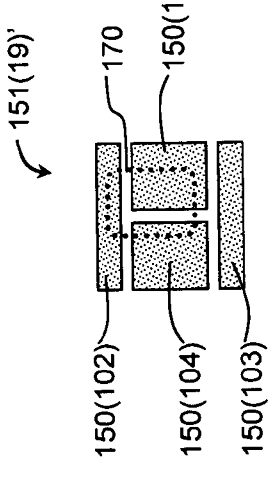

In another arrangement, each of the microcolumn array and the detector array is arranged in a two-dimensional matrix. FIG. 106 shows a microcolumn array 3150(1), an electron-beam array 3160(1) and a detector array 3180(1) operating in a crossbar configuration. Each of arrays 3150(1) and 3180(1) is shown as a square matrix for simplicity of illustration. In this arrangement, the beam steering is two-dimensional and comprises X and Y deflectors in each microcolumn, as described previously. In another arrangement (not shown) circular microcolumn and detector arrays may be used, to achieve the highest number of channels for the smallest beamsteering angle.

Generally, the diameter of the microcolumn and detector matrices should be as small as possible for a compact construction, but these matrices need not be the same size. For example, if each microcolumn has a diameter of 5 μm, an array of 100 microcolumns could be a circular matrix about 70 μm in diameter. A detector size might be as small as 2 μm in diameter, so a detector matrix could be a circle about 20 μm in diameter.

For a given microcolumn array diameter, a smaller detector array size reduces a maximum beam steering angle, allowing for more channels and a shorter drift cavity. Maximum beam-steering angle is primarily limited by the maximum beam-steering deflection voltage that can be delivered by circuitry such as a DAC. A short cavity is consistent with a compact device, and simplifies wafer-based mechanical construction.

By way of example, a maximum beamsteering voltage may be estimated. From previous discussion, the deflection tangent is $\tan \Theta = \sqrt{\Delta V / 2V_{BEAM}}$. For a beam energy $V_{BEAM}$ of 50V at an exit of an electron gun Oust before deflection) and a maximum tangent of 0.2, a the maximum beamsteering voltage $\Delta V = 4V$. This is consistent with circuitry that may be used to generate beamsteering voltages.

By way of example, a modulation amplitude may also be estimated. For a 5 μm detector and a 2500 μm drift cavity, the maximum tangent of the digital deflection is approximately 5/2500=0.002 (0.11°). Again, from the previous formula, the deflection modulation voltage for a 50V beam (at the emission plane) is 400 μV.

Crossbar Signalling Rate

A signalling rate of each channel of an EBX can be estimated from these considerations. From prior discussion, it can be appreciated that a frequency response of deflectors in an EBX may exceed 1 THz. For example, a 1 μm long plate with a beam velocity of $4\times10^6$ m/s (beam energy of 50V) may support a bandwidth of 1.7 THz. If a corresponding detector has segments that are 2.5 μm×5 μm, detector junction capacitance may be on the order of 10 fF. If a load is 50 ohms and other circuit parasitics are of similar magnitude, (for example, 10 fF parasitic capacitance), then the bandwidth of the detector will be 160 GHz. Non-Return to Zero ("NRZ") binary signalling may require a bandwidth that is 70% of the bit-rate, so a maximum bit-rate per channel may be over 200 Gbps.

Beam-steering

As discussed above, e-beams from a microcolumn array may be individually steered to a detector matrix by beam-steering signals applied to deflectors in a microcolumn array. In the case of a one-dimensional microcolumn array and a one-dimensional detector array, a single voltage applied to a deflector of a single microcolumn may position a beam from the microcolumn on a single detector. For a two-dimensional microcolumn matrix and/or a two-dimensional detector matrix, two voltages applied to an X deflector and a Y deflector in each microcolumn direct an e-beam from that microcolumn to a single detector. One of the X-Y deflectors may also be used for signal modulation, or a separate signal deflector may be provided.

With two-dimensional beam steering in an EBX with M input channels, there are 2M analog beam steering signals. Each pair of analog signals corresponding to an X-Y deflector pair is set to voltage levels corresponding to a physical offset (fixed by the mechanical design) between a particular microcolumn and a particular detector. Thus, for N detectors, each microcolumn will have associated with it N pairs of voltage levels. For example, if there are 100 detectors in a square detector matrix, each of an X and Y deflection voltage level may be chosen from 10 possible levels. A round or rectangular detector matrix may require more possible levels than a square matrix; additional range may be provided for channels near the ends of a microcolumn or detector array, since the corresponding e-beams may be deflected by greater angles than e-beams from microcolumns substantially within the matrix.

In one variant of an EBX, each beam steering voltage is generated by a DAC array 3090 controlled by an addressable memory 3070 and a matrix configuration command 3060 of X-Y matrix positioning signals (see FIG. 105). Memory 3070 stores predetermined control words 3080, each representing X and Y voltage levels to be supplied by DAC array 3090, to steer a beam 120 from a particular microcolumn to a particular detector. For two-dimensional microcolumn and/or detector arrays, DAC array 3090 may include one DAC for X-axis positioning and one DAC for Y-axis positioning. Steering voltages required for centering a beam from a particular microcolumn to a particular detector may be determined after construction of the EBX, via a calibration test, and corresponding control words 3080 may be programmed into the memory for each channel. If the EBX remains stable, (i.e., the steering voltages continue to direct beams to the appropriate detectors, over time) they may be measured once after manufacturing and corresponding control words stored in an addressable read-only memory (ROM). If the steering voltages are expected to vary over time, the memory can be a flash EEPROM or a RAM, and calibration may be performed periodically to update the control words corresponding to accurate steering voltages.

Crossbar Beam Centering Loops

Even after calibration, steering accuracy may be difficult to maintain in some EBXs. For example, high speed in each crossbar channel is achieved with a correspondingly small detector. It may be desirable to use a 1 μm wide detector, but it may be difficult to maintain beamsteering accuracy to a 1 μm tolerance, even with calibration. For example, temperature changes or vibration may cause beamsteering accuracy drifts which may be corrected to improve performance of an EBX.

One embodiment of an EBX includes a beam offset centering loop between each deflector and detector, which may operate the same as described for a simple amplifier (FIG. 12). A beam centering measurement signal is coupled to an integrator to generate an offset control voltage, and this voltage is coupled to a beamsteering deflector. For a two-dimensional matrix, there may be two beam centering loops per detector and 2N loops for N detectors. Two independent X and Y beam offset measurement signals may be generated, but a digital detector configuration of two segments can only generate one offset signal, so additional detector segments may be used.

FIG. 107 shows three detector configurations 151(18) (FIG. 107A), 151(19) (FIG. 107B) and 151(20) (FIG. 107C) which may be used to generate beam offset information. Detector configuration 151(18) consists of two detector segments 150(100) and 150(101); current output from 150(100) and 150(101) may be used to extract information about beam centering over the two segments, as discussed with respect to FIG. 12. Detector configuration 151(19) consists of detector segments 150(102-105) in which two signal detector segments 150(104) and 150(105) provide X direction beam offset information, and two additional segments 150(102) and 150(103) provide Y direction beam offset information. The Y direction beam offset information may be derived from a differential signal at the outputs of segments 150(102) and 150(103). For example configuration 151(19)' (FIG. 107D) shows a beam spot 170 shifted so that it partially overlies segment 150(102) but not segment 150(103); a current output of detector segment 150(102) will be correspondingly greater than a current output of 150(103) and beam offset information can be extracted therefrom, as discussed below.

Extracting, for example, X direction beam offset information from averaging is undesirable in a digital signalling context, because it may constrain bit patterns to have, on average, a same number of ones and zeros (for binary signalling), requiring special channel coding which may detract from signal throughput. However, if an averaging interval is very long relative to a signal bit rate, no special channel coding is required (for example, if the channel rate is 100 Gbps, and the averaging interval is 1 second). For long time intervals, averaging may be accomplished with a digital filter and a DAC for each channel; the DAC might be shared with a coarse "open-loop" beam-steering DAC.

Other arrangements are possible. For example, in configuration 151(20) of FIG. 107C, detector segments 150(109) and 150(110) are surrounded by measurement segments of a quadrature offset measurement detector. Segments 150(109) and 150(110) provide digital output signalling, two segments 150(106) and 150(107) provide Y direction beam offset information, and the segments 150(108) and 150(111) provide X direction beam offset information. Configuration 151(20)' (FIG. 107E) shows a beam spot 170 with a Y position that is centered but an X position that is misaligned.

X direction beam offset detector segments 150(108) and 150(111) of configuration 151(20) may operate in one of at least two ways. (It will be appreciated that in this discussion, the signal beam sweeps in the X direction; the same principles apply in other directions that are the same as a sweep direction.) In one method, a differential signal is averaged in an integrator of a control loop so that an average excitation of segments 150(108) and 150(111) is the same; this assumes the beam spot 170 is somewhat larger than segments 150(109) and 150(110) so that a one or a zero digital level will always excite segments 150(108) and 150(111). This requires a digital bit pattern with the same number of ones and zeros, on average, as in the previous detector embodiment.

In another arrangement, beam spot 170 may be made somewhat smaller than the segments 150(109) and 150(110). In this case, the digital modulation is designed so that with perfect spot centering, 150(108) and 150(111) are never excited, but if beam spot 170 is offset to the left (e.g. FIG. 107E), 150(108) is excited, and when beam spot 170 is offset is to the right, 150(111) is excited. An integrator is coupled to segments 150(108) and 150(111), and there is a "bang-bang" type of excitation, with only one detector on while the other is off. If beam spot 170 can be assumed to be coarsely centered within the boundary of these detectors by other means (such as for example, by using calibrated beamsteering voltages), then if 150(108) is excited, a control loop moves the beam to the right, and if 150(111) is excited, a control loop moves the beam to the left. This keeps beam spot 170 centered between 150(109) and 150(110).

If a width of beam spot 170 is somewhat less than the width of 150(109) and 150(110), and a spot deflection is approximately equal to the width of 150(109) and 150(110), then configuration 151 (20) does not require the same number of ones and zeros in a digital bit stream, on average or otherwise; this eliminates any need for special channel coding or long integrator time constants.

Beam centering loops may slow the rate at which a crossbar can be reconfigured. If an integrator time constant is long, transmission through the crossbar may have to wait for the integrator to settle so that signalling is reliably transmitted to the digital detectors.

Nonetheless, some applications may find beam centering loops advantageous, particularly when interconnection of many channels is required, since interconnection of many channels may only be achievable with very small (perhaps sub-micron sized) detectors. Such applications may tolerate a significant settling time delay. For instance, routing switches (e.g., for computer networking), may tolerate delays of tenths of a second or more. In applications requiring somewhat faster reconfiguration, it can be appreciated that a quadrature offset measurement detector is desirable, since it can have fast integrator time constants to quickly center a beam on appropriate detector segments.

Beam Centering Loop Reconfiguration Matrix

In a crossbar, beam centering loops may be dynamically reconfigured along with the connection that they support, so that they couple the correct offset measurements for a detector n back to an e-beam deflector steering a beam m.

Figure 108:
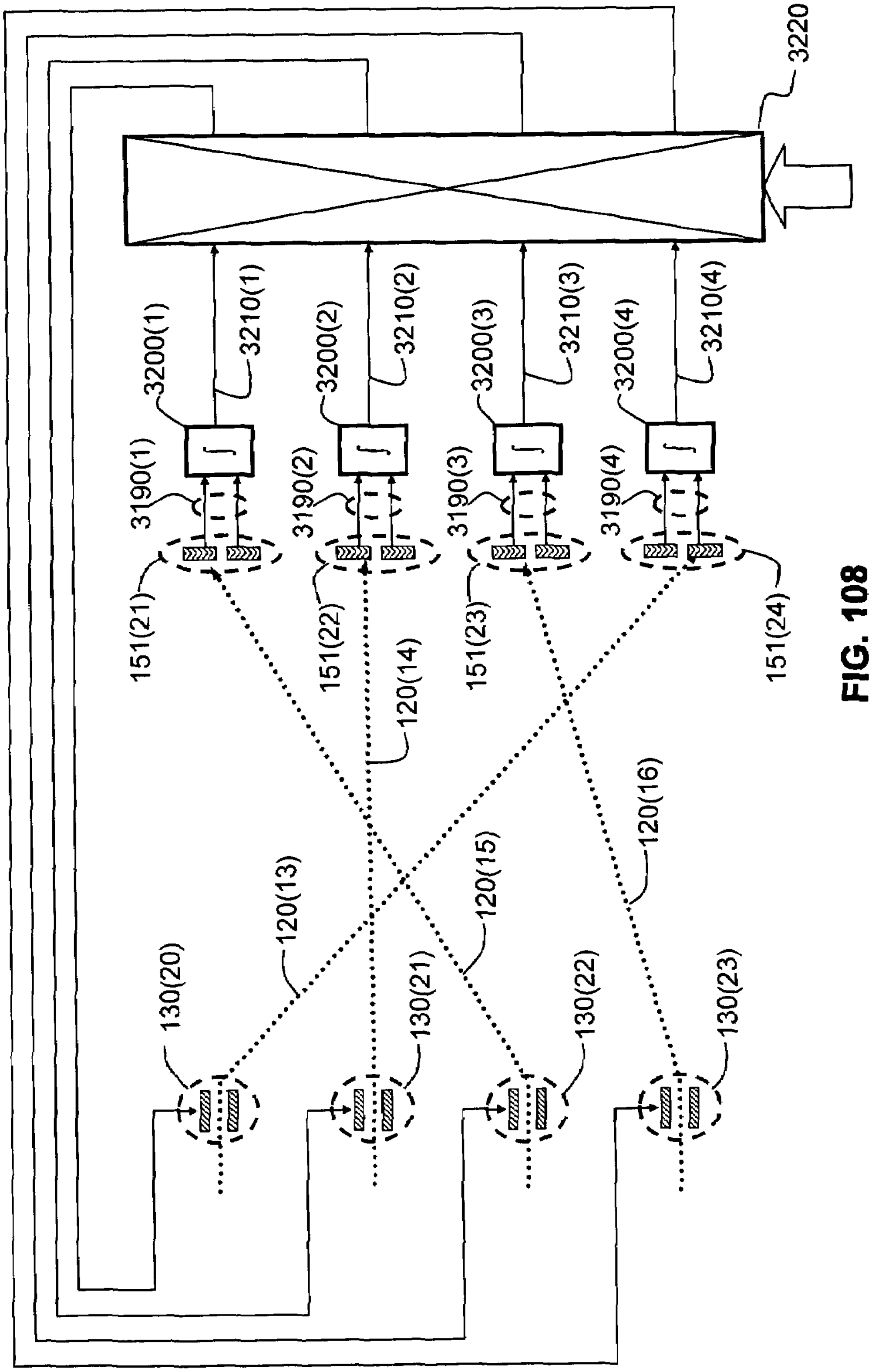
FIG. 108 shows four deflectors steering four electron beams to four detector configurations.

For instance, FIG. 108 shows four deflectors 130(20-23) steering four electron beams 120(13-16) to four detector configurations 151(21-24). Beams 120(13-16) may be directed programmably to any of detector configurations 151(21-24); it may be appreciated that detector configurations 151(21-24) may consist solely of detector segments for receiving signals, or may include dedicated offset sense detectors, as discussed above. Beam offset signals 3190(1-4) are transmitted to differential integrators 3200(1-4), generating offset control signals 3210(1-4) which may correctly be coupled back to the corresponding deflectors 130(20-23). For example, if beam 120(13) is targeted at detector configuration 151 (24) as shown, then offset control signal 3210(4) may be coupled to deflector 130(20), and so forth.

Thus, some kind of secondary crossbar matrix 3220 is necessary to connect the offset control signals 3210 back to the appropriate deflectors 130. Secondary crossbar matrix 3220 may be another e-beam crossbar, but since the beam centering loops may be much slower in operation than signals being transmitted, matrix 3220 may also be transistors integrated into an e-beam crossbar assembly.

A secondary crossbar matrix (e.g., matrix 3220) may be implemented by sequentially sampling the N detector offsets one at a time through a first multi-pole-single-throw switch, and then back through a second multi-pole-single-throw switch to the M input deflectors, calibrating the centering of each beam one at a time in a slow cyclic process. At any one time, a feedback signal may update a voltage on a storage capacitor coupled to a deflector of an input channel. This arrangement requires only a simple switching matrix, and works well when a slow loop update is preferred. Alternatively, a single ADC may measure beam offset at the detectors, and a sequential switching arrangement may transmit the ADC output as a digital correction through a bus structure to be stored in a register that controls a DAC coupled to an appropriate input channel. By way of additional examples, one or more ADCs may feed a processor which performs digital filtering, and may accelerate the initial error correction by non-linear means, or a ROM may be inserted between ADC and each DAC.

A number of ways of using offset corrections are also contemplated. For example, a memory which receives matrix configuration commands (e.g., memory 3070 of FIG. 105) may store coarse beam centering values as more significant bits in beam steering control words (e.g., control words 3080), while digital centering corrections supplied by an ADC of a beam centering loop may be written into less significant bits of the beam steering control words. Analog offset control signals (e.g., control signals 3210) may be supplied to an analog mixer to modify signals applied to a single deflector (e.g., deflector voltage signals 3130), or may be supplied to a second deflector to "fine tune" the position of a corresponding beam spot.

Photonic I/O Coupling

Coupling a large number of I/O channels between an EBX of microfabricated construction and external circuitry may present challenges. For example, an EBX with 10,000 channels may occupy a package of only $(5\text{ mm})^3$ in size.

Direct electrical coupling is not easily achieved with such a large number of high-speed channels. While it is possible to electrically mate packages using technologies such as ball-grid arrays ("BGA") or other high-density interconnect, coupling effects at speeds of 100 GHz or more may produce unacceptable signal distortion.

Figure 109:
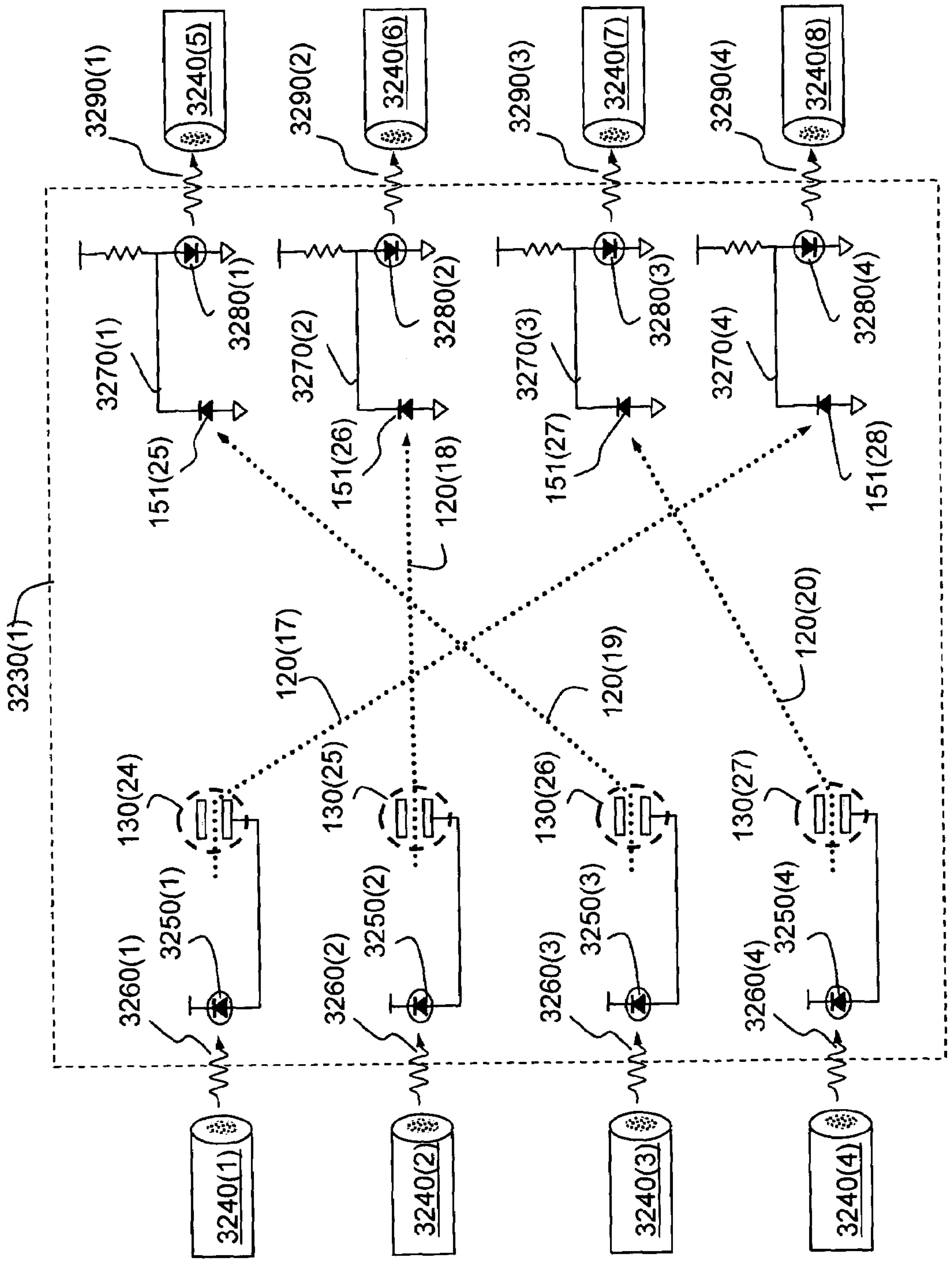
FIG. 109 shows schematically how inputs and outputs of an EBX may coupled through optical fibers.

One embodiment of an EBX couples its inputs and outputs to external inputs and outputs (such as a computer bus) by means of optical interconnect. FIG. 109 shows schematically how inputs and outputs of an EBX 3230(1) may coupled through optical fibers 3240(1-8). EBX 3230(1) includes an array of photodetectors 3250(1-4) coupled to deflectors 130(24-27) of a microcolumn array (not shown) to deflect electron beams 120(17-20). Light 3260(1-4) from each of optical fibers 3240(1-4) generates a signal in a corresponding photodetector 3250(1-4). The coupling of photodetectors 3250(1-4) to deflectors 130(24-27) may be direct, as shown, or may be indirect, such as for example an arrangement in which signals from the photodiodes are added to beam-steering offset signals.

Outputs 3270(1-4) of e-beam detector configurations 151(25-28) couple to laser diodes 3280(1-4); this coupling may also be direct or indirect, for example laser diodes 3280(1-4) may receive a DC bias current from a bias current source (not shown), with outputs 3270(1-4) capacitively coupled thereto. Light 3290(1-4) emitted by laser diodes 3280(1-4) is coupled to optical fibers 3240(5-8). Thus, in the e-beam configuration of FIG. 109, the signal present in optical fiber 3240(1) is coupled to optical fiber 3240(8), the signal present in optical fiber 3240(2) is coupled to optical fiber 3240(6), and so forth, as shown.

A photonic I/O coupled EBX preferably couples photodetectors in close proximity to deflectors, and couples laser diodes in close proximity to detectors, to minimize wiring-induced delays, and parasitic capacitance- and resistance-induced signal distortion.

Figure 110:
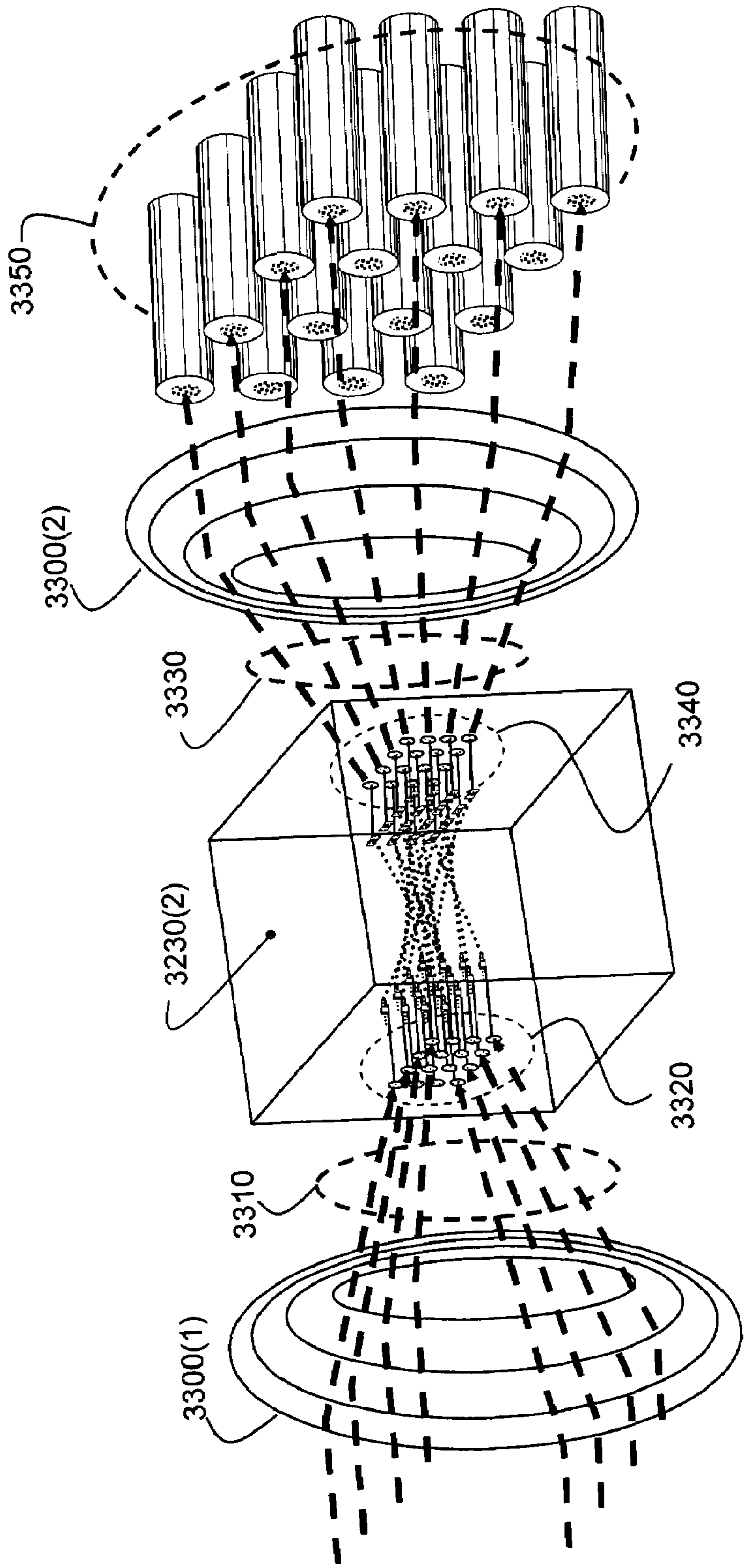
FIG. 110 shows schematically a first lens imaging an array of optical input signals onto a corresponding photodetector array of an EBX, and a second lens imaging an array of optical output signals from a laser diode array to an array of optical fibers.

FIG. 110 shows schematically a first lens 3300(1) imaging an array of optical input signals 3310 onto a corresponding photodetector array 3320 of an EBX 3230(2), and a second lens imaging an array of optical output signals 3330 from a laser diode array 3340 to an array of optical fibers 3350. An array of input optical fibers (not shown) has the same shape and layout as photodetector array 3320, and array of optical fibers 3350 has the same shape and layout as laser diode array 3340. The photodetector and laser diode arrays do not have to be the same physical size as the fiber matrix patterns, as long as they are the same pattern; lenses 3300(1) and 3300(2) may magnify or demagnify the corresponding arrays of input and output signals to match the physical sizes. For example, photodetector array 3320 and laser diode array 3340 may be physically much smaller than the corresponding optical fiber arrays.

Figure 111:
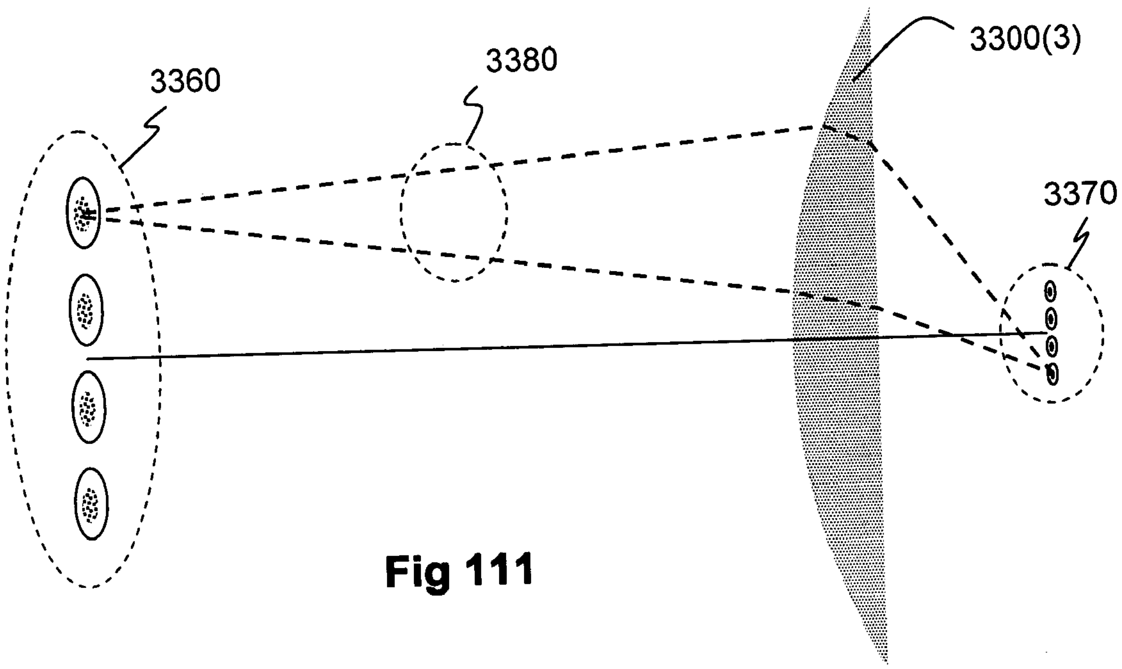
FIG. 111 shows a lens reducing exemplary light rays from an object to an image.

A lens system may make a reducing image of light from an input optical fiber bundle onto a photodetector array. FIG. 111 shows a lens 3300(3) reducing exemplary light rays 3380 from an object 3360 to an image 3370. By making the photodetector and laser diode array patterns match the fiber matrix patterns, a one-to-one association between a given optical fiber and corresponding photodetector or laser diode may be achieved through the use of a reducing lens, like lens 3300(3) of FIG. 111.

Thus one embodiment of an EBX with photonic I/O coupling may operate as follows: a modulated input optical signal from an input fiber $IF_m$ is transmitted optically to a single photodetector $PD_m$, wherein the input optical signal is converted to an electrical current and a voltage (by driving a resistive termination), and applied directly or indirectly to a deflector $P_m$ of an electron gun $EG_m$. The EBX directs an electron beam from gun $EG_m$ to a detector $D_n$, and an electrical current excited in detector $D_n$ by the beam drives a laser diode $LD_n$. The laser diode $LD_n$ generates an output optical signal with the same modulation as fiber $IF_m$. This output optical signal is magnified and imaged onto a single fiber $OF_n$ of an output fiber bundle. This sequence of steps is performed in parallel across M potential input fibers and N potential output fibers so that optical signals in any given input fiber may be coupled to any given output fiber.

Advantages of this arrangement include leveraging known methods of manipulating fiber bundles for making reliable physical interconnects of high bandwidth. Fiber bundles may have a very high density of fibers, permitting a large number of channels. The optical imaging arrangement may couple thousands of channels to an EBX, which may have physical dimensions as small as a few millimeters. Furthermore, optical I/O provides level-shifting and high voltage isolation, which may allow a high common mode voltage difference between electrical input and output levels of the EBX. Flexibility with respect to high common mode voltage difference may permit high beam acceleration in an EBX drift cavity, high gain, and a high signalling rate for a given EBX electron gun current.

EBX Size

Figure 112:
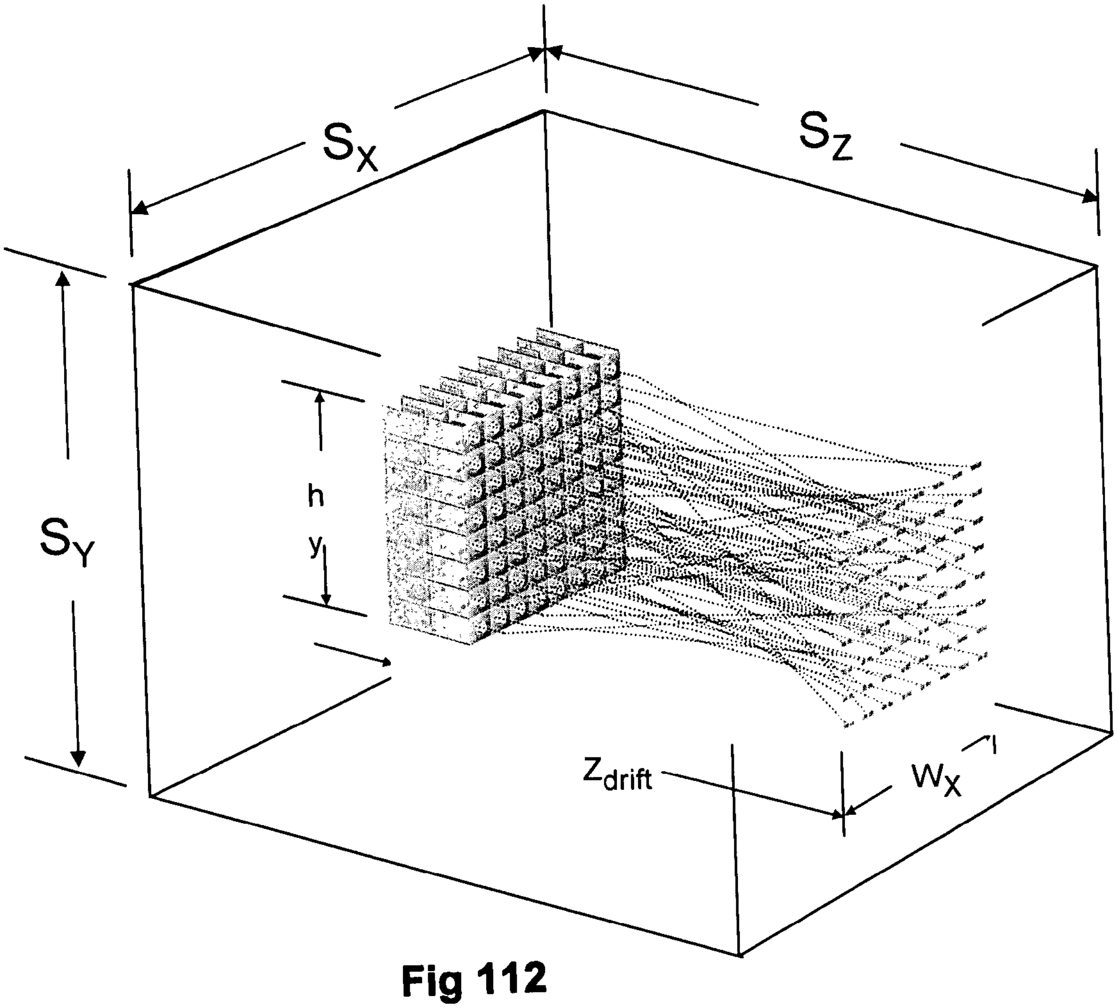
FIG. 112 shows the mechanical size of a typical EBX comprising 10,000 or more channels.

FIG. 112 shows the mechanical size of a typical EBX comprising 10,000 or more channels. An electron gun array and a detector array may each have a width $w_x$ and a height $h_y$ of 500 μm (the electron gun array and detector array are drawn with only 64 elements each, for clarity in the drawing). A drift cavity may have a length $z_{drift}$ of 2.5 mm, and electron gun microcolumns may have a length $L_{eg}$ of 1 mm. Reasonable sizes Sx, Sy, Sz of the final assembly are approximately 5 mm×5 mm×5 mm.

Other EBX Embodiments

From the foregoing it may be appreciated that many configurations and applications of a crossbar are possible other than digital signalling applications. By the nature of the deflection process and the many variants of the EBTX and EBRX, functions such as analog amplification, time delay control, mixing, pulsing, frequency multiplication and combinational logic may be incorporated in crossbar channels. Thus, both highly integrated and highly specialized functions may be constructed in a single device.

For example, a Combinational Crossbar Logic ("CXL") embodiment may be used as a reconfigurable computer that changes its functionality by forming specialized electron beams and addressing specialized detector configurations, as opposed to a computer that runs new software or firmware routines. In a CXL, extra deflection plates may be incorporated in the electron guns of a electron gun matrix, and specialized detector arrangements are incorporated in a detector matrix. By way of analogy, the electron guns and detector arrangements may be addressably configured in much the same way that logic cells are addressably configured in a field-programmable gate array ("FPGA"). A CXL may allow complex and reconfigurable logic processing in a very small, high speed device.

An Analog Crossbar Matrix ("AXM") is an embodiment whereby, as previously discussed, each e-beam in a crossbar matrix modulates with continuous voltage levels, and each detector is a pair of segments as in an EBRX. Thus, steerable analog channels can be amplified. In an AXM, low noise operation may require higher beam currents for each channel, and sub-arrays of multiple electron guns per beam, as in prior embodiments (e.g., FIG. 18). For example, groups of electron guns within an electron gun matrix of a CXL may be configured to emit and deflect a composite beam with the higher beam current conducive to low noise operation, and this composite beam may be directed to a specialized detector configuration of the CXL. Additionally, beam focusing may be provided in the manner of FIG. 90, where an emission plane electrode is shown enclosing each microcolumn sub-array, and focusing fields are generated by the relation of the potentials of the emission plane electrodes to the potential of a drift can electrode.

An Analog Crossbar Beamformer ("AXB") is another embodiment for applications that can employ analog summation of multiple signals, as from antenna elements. This is similar to the power combiner of FIG. 98. Here, multiple modulated e-beams can be directed at a single detector element, where the modulated signals are detected and summed. If a differential signal from a beam A is $\Delta x_A$ and a signal from a beam B is $\Delta x_B$, it can be seen that the current output of the detector element is a sum $\Delta x_A+\Delta x_B$. This principle allows summation of a plurality of signals carried by the modulation of individual e-beams. It may also be seen that multiple detector elements may be excited simultaneously by different combinations of e-beams; furthermore, each of the e-beams may be time delay controlled. In this manner it is possible to construct a small antenna beamformer.

Figure 113:
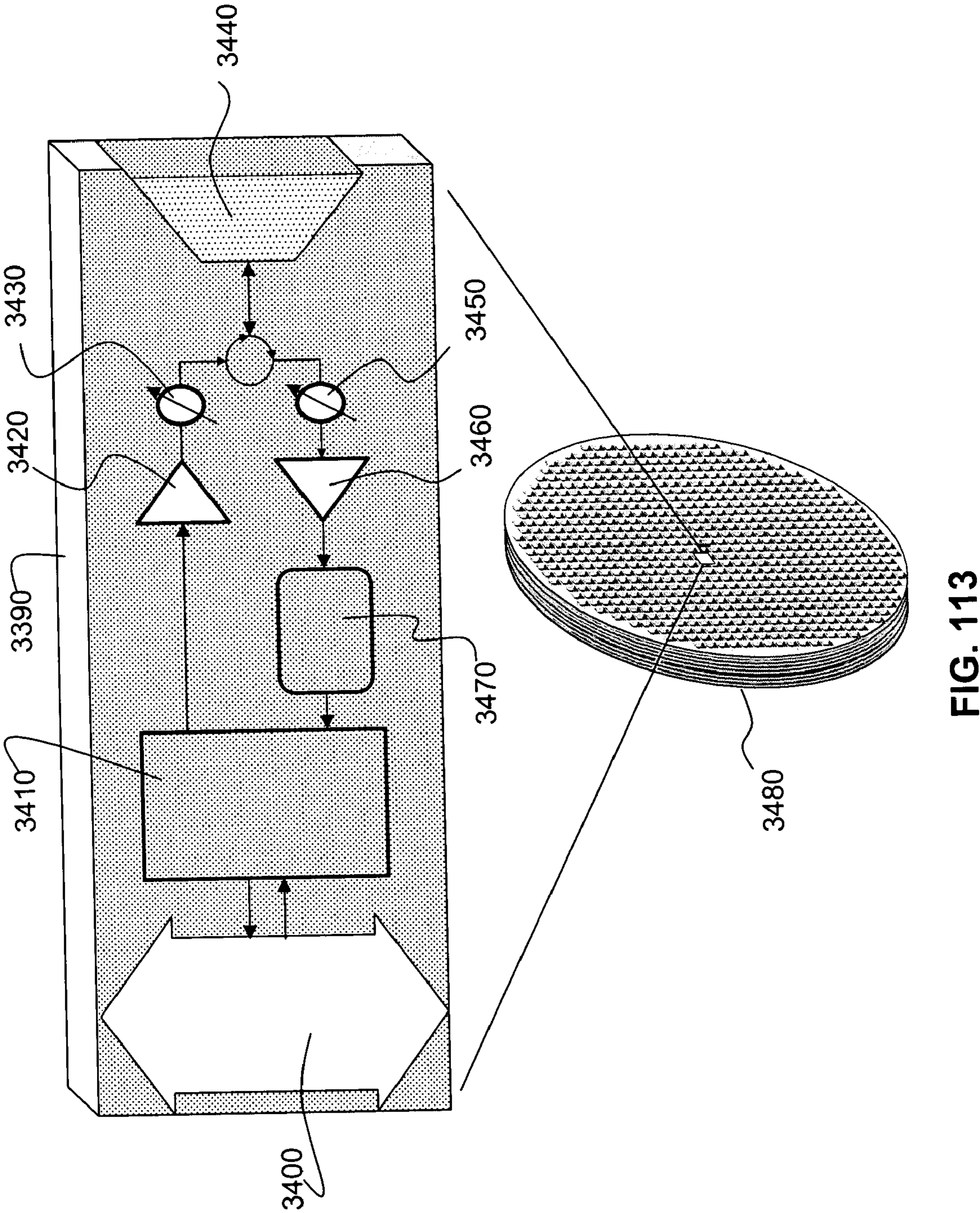
FIG. 113 shows schematically components of a wafer-bonded T-R beamforming array constructed using the elements described herein.
Figure 114:
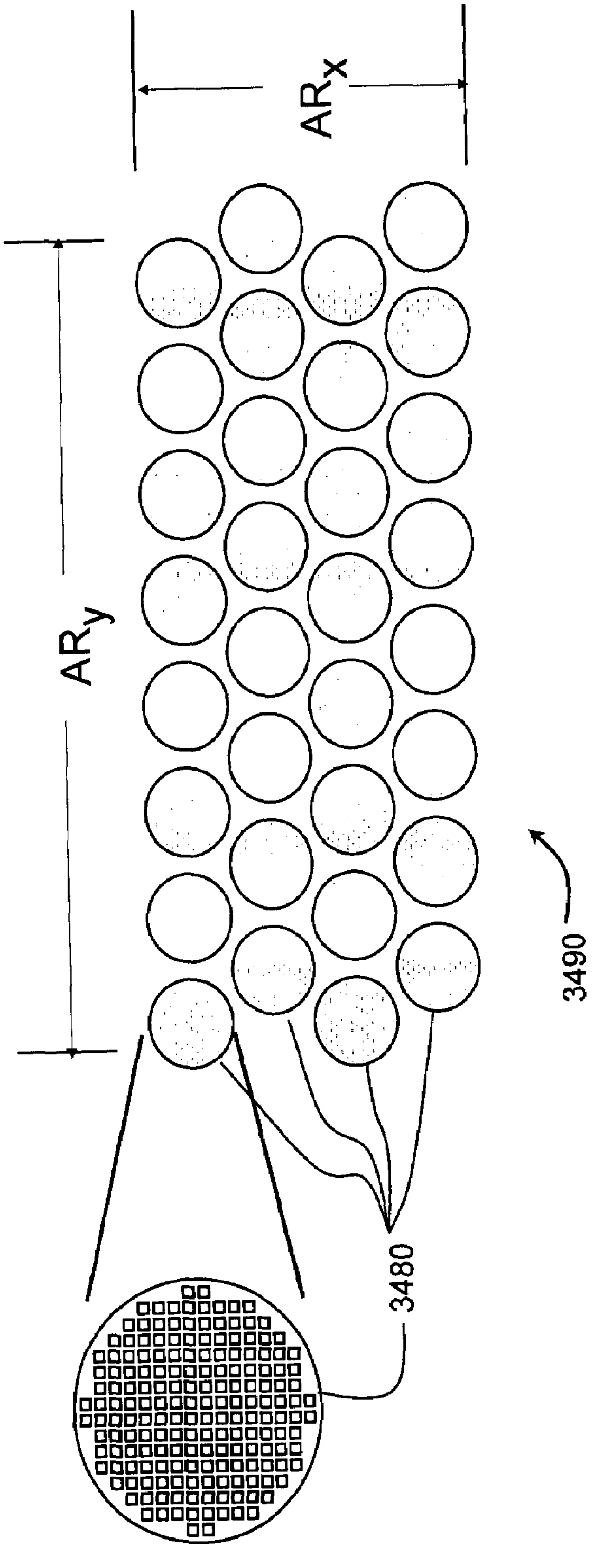
FIG. 114 shows an example of a large wafer-based antenna array which may be constructed from a plurality of wafer stacks.

FIG. 113 shows schematically components of a wafer-bonded T-R beamforming array 3390 constructed using the elements described herein. Wafer-bonded T-R array 3390 may include one or more of an EBRX 3400, an EBX 3410 (and/or its variations CXL, AXM, AXB), an EBTX 3420, time and phase shifting elements 3430 and 3450, a horn antenna 3440, and an electron beam ADC 3470, for example as described in U.S. Pat. No. 6,356,221 (LeChevalier). Wafer-bonded T-R array 3390 is one of an identical set of wafer-bonded T-R arrays 3390 concurrently fabricated in a wafer stack 3480, as shown schematically. FIG. 114 shows an example of a large wafer-based antenna array 3490 which may be constructed from a plurality of wafer stacks 3480. Antenna array 3490 has a height ARx of 1 m and a width ARy of 2 m, and has the characteristics of high frequency, wide bandwidth and light weight.

Unterminated Waveguide Coupled Beam Deflection

Any RF amplifier is generally coupled to a signal source via some kind of wave-guiding structure, such as a transmission line or more generally, a waveguide. Usually the coupling requires terminating load resistors, or a more general matching network of resistors and reactive elements such as capacitors, inductors, waveguide stubs, etc, to provide a low-impedance match (say, 50 ohms) to the waveguide, and a simultaneous match to the input impedance of the amplifier. The match causes the transmission line to see a load with the same real impedance as the waveguide and the amplifier to see a reactive impedance that cancels any reactance at the input port of the amplifier.

Advantages of a terminating matched network between the waveguide and an amplifier are two-fold: First, the matched termination maximizes the power transfer from the waveguide to the amplifier. A load impedance that is the complex conjugate match of the same real part impedance or negative reactive impedance of the transmission line (or waveguide) absorbs the maximum signal energy in the real part of the load, e.g., a resistor. Likewise, when the matching network is the complex conjugate of the amplifier impedance, the maximum power is transferred from the network to the amplifier.

When the amplifier has no significant reactive input impedance the match can be accomplished with simple resistors. More often, however, the amplifier has a strong reactive impedance, and the matching network must incorporate reactive elements to cancel the amplifier reactance (within a frequency band of interest). This prevents the reactive part of the amplifier load from distorting the frequency response to the amplifier.

Generally, the matching network must transform the waveguide impedance of perhaps 50 ohms to a finite and fairly small amplifier impedance of a few kohms at most. Solid-state semiconductor amplifiers generally have a low amplifier impedance as an unavoidable consequence of the technology. For example, bipolar amplifiers are generally limited by the input resistance to the base of a transistor. This is often in the range of 1 kohm or less, dictated by the design requirements at higher frequencies of operation. Amplifiers made in FET technology (MOS, Schottky gate, etc.) may have a very high gate resistance, but a very low capacitive impedance from the large gate structure that is usually required to achieve significant gain.

The second advantage of a matching network is that it eliminates (or reduces, depending on the quality of the match) the back-wave reflection of the signal from the load onto the waveguide. This is a corollary to maximum power transfer. Thus, with a match termination, no forward-traveling wave energy is reflected back to the signal source at the input end of the waveguide. All the signal power is thus available to the amplifier (if the transmission line couples the signal to an amplifier), and the source does not have to absorb any reflected power.

Generally, the reflection is described by what is termed a "reflection coefficient", usually denoted by the symbol Γa factor which is multiplied by the incident wave to determine the amplitude of the reflected wave. The general formula is $$\Gamma = \frac{Z_L - Z_0}{Z_L + Z_0} \tag{1.53}$$

where $Z_L$ is the load impedance seen by the line, and $Z_0$ is the line impedance (e.g., 50 ohms). Thus, a load open ($Z_L$=high impedance) has Γ=+1, while a load short ($Z_L$=0) has Γ=−1. In the case of a short, the reflected wave is inverted in amplitude, and the total voltage seen at the short is zero.

The case of a high impedance load is the one of interest. In this case, the reflected wave has the same polarity and amplitude as the incident wave, and the total voltage seen at the open is twice the incident voltage wave.

Backward reflected power is undesirable in some applications if the RF source is impedance mismatched to the transmission line (or waveguide). This is because the reflected wave can in turn get re-reflected at the source if the source is not matched well to the line. Thus, the backward wave is re-reflected towards the load, causing signal distortion. That is, the re-reflected wave reaches the load after the round-trip delay time of the transmission line (twice the line length divided by the velocity of the wave) and the load sees the signal plus a delayed version of the signal from an earlier time—albeit an attenuated, possibly inverted version, depending on the losses of the transmission line and the kind of source and load mismatch. If there is a strong mismatch at both ends and only weak attenuation along the transmission line, the successive reflections can seriously corrupt the signal being amplified with delayed representations thereof.

The advantage of a load matching network can thus be seen: for if the load match achieves a small ΓL that attenuates the reflection by x, and if the source match achieves a small ΓS that attenuates the reflection by y, then the total attenuation achieved is xy. For example, if ΓL=0.1 and ΓS=0.1, the total attenuation is 0.01. On the other hand, if the load was an open with ΓL=1, and if the source ΓS=0.1, the total attenuation is only 0.1—ten times worse.

Thus, a matching network at the load mitigates the non-ideal characteristics of the amplifier itself, improving the power transfer, frequency response and signal integrity. The signal VS is reflected with twice the voltage amplitude and four times the power gain.

Unterminated Waveguide Coupling

Figure 115:
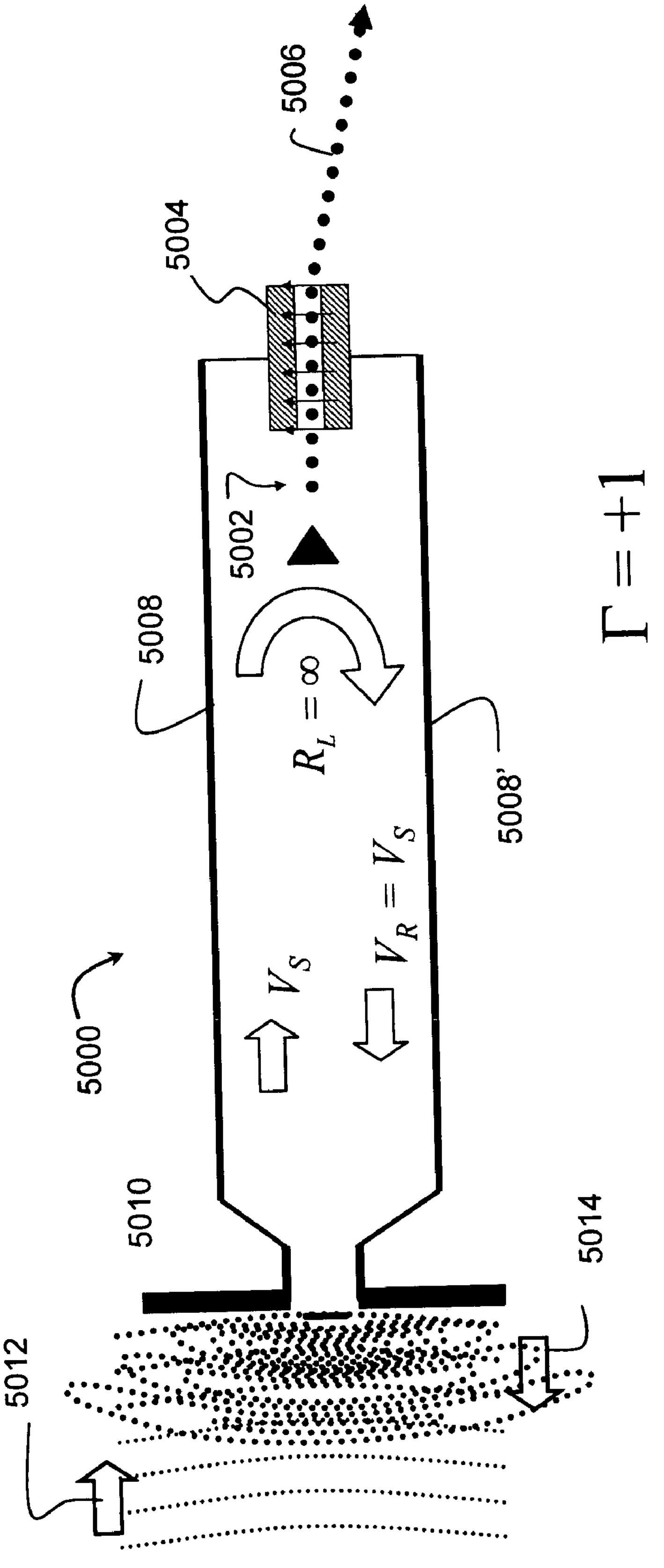
FIG. 115 shows an unterminated waveguide coupling with reflection.

Though the EBTX or EBRX can be coupled to a waveguide in the conventional manner using a matched load termination, a reflective amplifier 5000 as shown in FIG. 115 is provided with a unique characteristic that largely negates the need for a terminating load matching network: an EBRX (or EBTX) 5002 having a very high input impedance. For example, the deflector circuit impedance ZIN may be a few femtofarads according to the capacitance of the deflectors 5004. This is a direct consequence of the unique microminiature circuitry associated with deflectors 5004, which act to sweep emitted e-beam 5006. Input resistance is substantially an infinite load RL because the deflectors 5004 behave electrically like small capacitors. The capacitance of the deflection apparatus, in turn, is extremely small because the deflectors are very small and have a relatively large plate spacing (e.g., 1 um) with a vacuum between them. As an example, a single deflector for an electron beamlet might have only 0.5 fF capacitance (0.5× 10-15 F). An entire array of deflectors might have a total capacitance of only 100 fF.

A transmission line and/or waveguide 5008, 5008' forms a circuit connecting antenna 5010 with deflectors 5004. Incoming RF 5012 strikes antenna 5010 to produce a voltage signal VS, which drives the deflectors 5004 in the usual manner; however, due to the large nature of RL, there is a reflected voltage signal VR which is approximately equal to or equal to VS. The reflected voltage signal VR communicates on transmission line and/or waveguide 5008, 5008' to antenna 5010 for emission of re-radiated RF field 5014.

FIG. 115 shows that under some special circumstances, it is possible to directly couple to an unterminated waveguide or transmission line when two conditions are satisfied, namely: (1) when the frequency band of RF 5012 operation is low enough that the capacitive load of the amplifier 5002 does not attenuate the signal, and (2) when the source signal VS is well matched to the waveguide coupling.

Because the total input capacitance of an EBTX or EBRX array may be as low as 100 fF, the bandwidth when coupled to a low-impedance waveguide can be very high. For example, 100 fF coupled to a 50 ohm line has a bandwidth of 60 GHz.

The key to using an unterminated line is to have a source impedance match. If the coupling at the source is a match of high quality, the reflection there can be made small enough to tolerate a load mismatch. The re-reflected wave will be much smaller in amplitude than the incident wave, and the effect on the signal at the load will be small.

This is often difficult to achieve in practical circuits if the source of signal power is another amplifier. Amplifiers usually have complex reactances in their output port that will create a poor match in the absence of a source-matching network.

There is one special case where the source can be well matched: an antenna. If the EBTX is directly coupled to its antenna with a very short transmission line (or no transmission line at all), the source match can be excellent. The antenna match can generally be well controlled, and the effect of the reflected energy is to simply be re-radiated without being re-reflected.

Two basic approaches may realize the unterminated coupling. In one approach, the transmission line or waveguide 5002 may end at the deflectors 5004. Alternatively, a transmission line may continue past the EBRX 5002, which merely taps off or "samples" the signal propagating down the guide. In this second case, the deflector 5004 can be the waveguide 5002 itself or the deflector 5004 can sample the voltage VS on a waveguide or transmission line by a wired connection to points of greatest voltage potential. In context of equation 1.53, it may be preferable for Γ=+1 where ZWN is the impedance or EBRX 5002 and $Z_0$ is the impedance of a waveguide.

Direct Waveguide-Electron Beam Coupling

Figure 116:
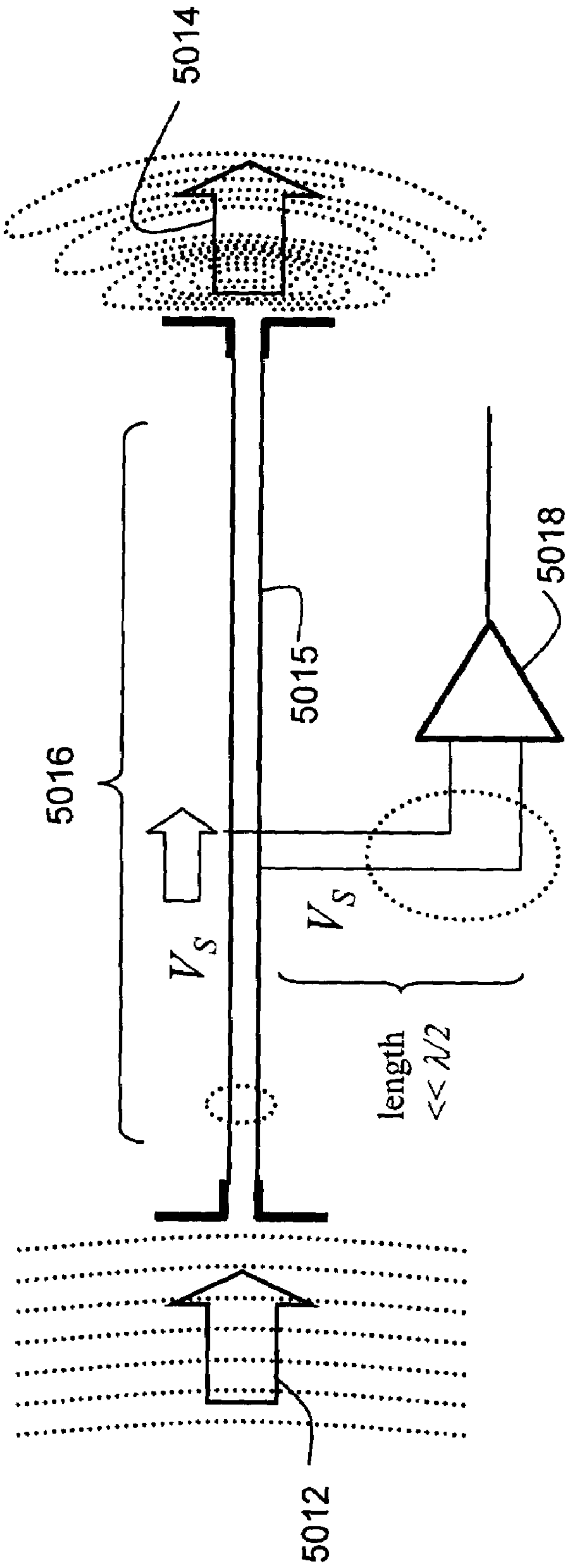
FIG. 116 shows a waveguide coupling with pass-through signal transport.

Although the input capacitance an EBRX or EBTX may be quite small, the loading effect may sill be significant if the frequency of operation is very high, e.g., 100 GHz or more. As shown in FIG. 116, one way to mitigate this loading effect is to make the deflector 5015 forming at least part of waveguide 5016 transporting the signal $V_S$ to EBRX 5018. If an electron beam passes through the waveguide rather than merely coupling to it with some wires, the beam is subjected to the electric (and magnetic) field of the signal $V_S$ propagating along the waveguide 5016.

The key is to make the e-beam travel at approximately right angles to the RF wave motion, because then the beam is subjected to approximately the same amplitude of the RF wave as it passes through. The waveguide must be constructed to ensure a single mode of operation, preferably TE or TEM, so that the electric field vector of the wave is perpendicular to both the e-beam and RF wave motions. This way, the e-beam is deflected uniformly in one direction, the direction of the electric field.

For this case the deflector does not really load the waveguide 5016 at all—it is the waveguide 5016 and has an impedance of $Z_0$. according to Equation 1.53. That is, the capacitance of the deflector is just part of the natural distributed capacitance of the waveguide. There is no loading beyond a miniscule coupling to the electron beam itself, and the signal wave can propagate along the line without reflective obstruction or attenuation, and without distortion. The electron beam deflects directly in response to the propagating wave field of the signal $V_S$ without the need for a terminating load resistor to generate a voltage.

Solid-state amplifiers are not able to directly amplify a wave field. Transistors require the electric and magnetic field of a signal in a waveguide to first be converted to a voltage and current. Direct wave amplification is normally only possible to amplifiers such as TWTs and klystrons which couple the electromagnetic field of a signal to an electron beam by means of a special mechanical waveguiding structure or resonant cavities.

In principle, the signal power in a waveguide can generate an electric field of equal magnitude to that of a voltage across a deflector, so long as the wave can be guided into a constricted region having the dimensions of the deflector. In practice, this is not usually possible if the deflector has spacing and length dimensions of a few microns. The reason is that for most frequencies of operation a waveguide of such small cross-section will not sustain the propagation of a traveling RF wave. The maximum dimension for a closed waveguide (width or height) should be at least one-half wavelength. A 100 GHz frequency has a wavelength of 3 mm in free-space. Even a 1 THz frequency has a wavelength of 300 microns.

Nonetheless, there are specialized applications at extremely high frequency (100 GHz to 1 THz or more) where this might be done. If the waveguide is filled with a dielectric, for instance, the wavelength is much shorter, in inverse proportion to the relative permittivity of the dielectric. For example, $SiO_2$, which has a relative permittivity of 3.9 would have a wavelength approximately ½ the free-space wavelength. A 1 THz frequency would have a minimum guide dimension of 75 um.

Thus, a direct coupling of the electron beam to the signal, by directing the beam through a waveguide, is one embodiment as shown.

Waveguide Voltage Sampling

Most applications of the EBTX or EBRX include deflectors coupled to a transmission line, which is a special case of a two-wire waveguide. The advantage of the transmission line is that each wire can have a different potential, and therefore the wire spacing is not constrained to be a minimum of one-half wavelength. Unlike the closed waveguide which can only sustain TE (transverse electric) or TM (transverse magnetic) modes of propagation (where waves bounce off the interior walls of a closed waveguide), the transmission line can sustain a TEM mode. Thus, the preferred embodiment couples an unterminated transmission line to the deflection apparatus.

Advantage of the Unterminated Embodiments

Two advantages accrue to the unterminated load. The first is that the reflected wave doubles the signal voltage received by the amplifier. This has the same effect as 4 times the signal power in a conventional terminated connection.

The second advantage is an improvement in input noise. Solid-state amplifiers are normally used at the front-end of RF receivers to amplify the signal from an antenna, because they offer very low-noise amplification (1 to 5 dB noise figure). TWTs and other traditional electron beam amplifiers are normally used where large signal power of many watts is required, because they have only been practical to construct for high power operation, which is usually an extremely noisy process. A typical TWT might have a noise figure of 40 dB. In contrast, low-noise solid-state amplifiers often operate with signal levels that can be equal to or less than the noise power of a simple resistor, which is given by the well know formula PR=4 kTB. This low-noise amplifier (LNA) characteristic is extremely important in any RF receiver.

In an RF receiver coupled to an antenna, the LNA must normally have a wide bandwidth. For the reasons cited above, the amplifier coupling normally employs a matching network between the transmission line and the LNA. This terminating resistor is an unavoidable source of noise power diminishing the ultimate sensitivity and dynamic range of an RF receiver. In thermal equilibrium, the RF noise power is a simple result of the brownian motion of electrons in the resistor causing a varying resistor voltage that radiates RF; an equal amount of power is absorbed and re-radiated, and the radiated power is random broadband noise.

The EBTX or EBRX, therefore, when employed as a LNA, can improve the sensitivity of an RF receiver over prior art by eliminating the terminating resistor. The RF signal from, say, an antenna, can be amplified prior to being subject to other circuit noise. If the amplifier gain is high enough the added noise of the amplifier referred back to the input (i.e., divided by the amplifier gain) can be much less than the noise power of a simple terminating resistance. In the amplifier embodiment, the gain can be as much as 40 dB, or more. This makes it is possible to have an equivalent input referred noise power that is 1/10 or less of a simple resistor noise power at an ambient temperature of, for example, 300 K.

In this sense the effect of eliminating the resistor termination is like supercooling an input termination resistor to a temperature of only a few degrees Kelvin. The difference is that it can be done without any refrigeration, which is desirable in many applications such as spaceborne electronics, where the weight, power consumption, reliability and expense of cryogenic operation is unacceptable.

To achieve the noise reduction, however, it is desirable that the RF in the guide not be absorbed in any kind of resistance, either a load or losses in the waveguide walls. Any resistive power absorption will generate random RF noise that look just like a resistor, no matter where it is generated in the guide, since it will propagate back to the amplifier input.

In any of these embodiments, the goal is the same: to prevent remove the signal energy once it has been detected by the amplifier, without absorbing it in a noise-generating load. Otherwise this would eliminate the key advantage of the unterminated coupling: the reduction of input noise and the improvement of output signal-to-noise ratio (SNR).

Step-tapered Drift Cavity for Short Focal Length Electron Lens

For an EBTX or EBRX to operate with high gain, a high current beam is needed. This requires a large initial beam diameter, e.g., or several hundred microns or more, so that the beam can be propagated across a long drift cavity of up to 5 mm or even more without severe beam spreading from space charge forces, and then the beam must be focused down to a small beam spot at the detector to provide a useful output signal with wide bandwidth.

Focusing a large diameter beam to a small beam spot requires strong electron optical elements. Many schemes are possible, but one common approach employs what is called an "Einzel lens". This consists of two annular ring electrodes with a gap between them, similar to a cylindrical soup can cut in half. Each electrode has a different potential applied to it, and the effect is to create the electron optical equivalent of a spherical lens, as in normal light optics.

Figure 117:
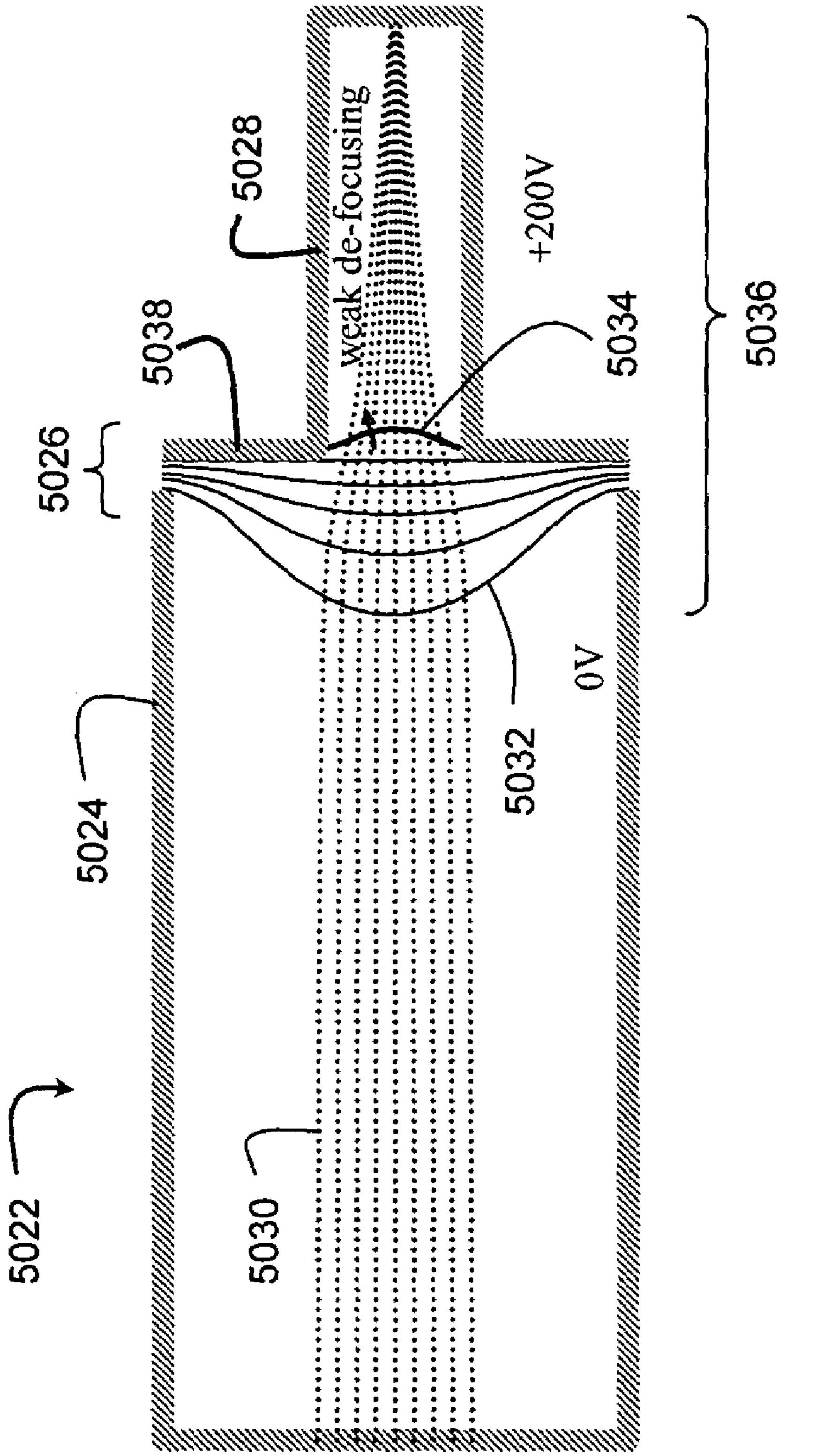
FIG. 117 shows a step tapered cavity Einzel lens.

As shown in FIG. 117, an Einzel lensing arrangement 5022 is formed of a relatively larger diameter cylindrical electrode 5024 that is separated by gap 5026 from a relatively smaller diameter cylindrical electrode 5028. Beamlets 5030 are first processed by a strong focusing field 5032 and then weakly defocused by field 5034, such that beam focusing continues in area 5036 beyond lensing fields 5032, 5034. The potential difference between electrodes 5024, 5028 causes equipotentials near the gap 5026 to vary in a symmetrical way. The electrons in beamlet 5030 experience a force vector that is normal to the equipotentials. If the electrons start from the end of the can with the lowest potential (say, 0V), and are directed toward the end of the can at the higher potential (say, +200V), the electrons initially pass through equipotentials that exert a strong focusing force towards the cylindrical axis of a can formed by electrodes 5024, 5028.

Because the electrons are traveling from a region of lower to higher potential, they are also accelerated as they pass through the equipotentials. The velocity of the electrons is therefore lower on the focusing side of the lens (the near-side), and higher on the defocusing of the lens (the far-side). The far-side equipotentials exert a strong defocusing force away from the axis of the same magnitude as the focusing forces, but because the electrons are traveling faster in this region, they are exposed to the defocusing action for a shorter period of time. Thus, the focusing action is not entirely cancelled by the defocusing and the lens exhibits a net focusing action. It can be appreciated, however, that the strong defocusing significantly diminishes the overall focusing power that might otherwise be achieved if the electrons were only subject to the focusing action on the near-side of the lens.

The essence of the problem with the conventional Einzel lens is that the equipotentials on either side of the gap are symmetrical. Even though the electron beam transit time through the defocusing region is shorter, it is not sufficiently shorter that the defocusing action does not cancel most of the initial focusing action. However, in the symmetrical can structure of an Einzel lens, it is not possible to make the equipotentials asymmetrical to any significant degree. This stems from the physics of static fields described by Maxwell's formula for a potential field in a charge free region of space.

The embodiment shown in FIG. 117 achieves asymmetric equipotentials proximate gap 5026 by modifying the Einzel structure so that first and second annular electrodes are made with different radii and the mechanical construction is asymmetric. The second electrode at the higher potential is constructed with a smaller radius than the first and is also provided with a flange 5038. The smaller radius of electrode 5028 prevents the defocusing field from penetrating far into the second electrode, and the flange shields the field potentials from outside influences and shapes the focusing fields inside the first electrode. Since the defocusing fields are greatly diminished both in intensity and length through the region in which the electron beam must propagate, the focusing power of the lens is greatly enhanced.

A variation on this theme is possible by electrically decoupling the flange from the first and second electrodes. In this arrangement, the flange acts as a third electrode to shape the equipotentials of the lens, such as to correct for lens aberrations and improve the focusing.

It may be noted that the electron beam 5030 should stay focused on a detector, meaning the beam 5030 is never deflected a great distance away from the optical axis. Since the beam stays close to the axis, it is possible to narrow down the initial drift can radius (which is required for a large diameter beam) to a smaller radius drift can (which receives a smaller beam diameter as a result of the focusing action). Thus, it may be appreciated that the stepped radius of the modified Einzel lens structure not only achieves stronger focusing, but is well suited to the electron beam amplifier concept in particular.

RF Cavity Detector

Figure 118:
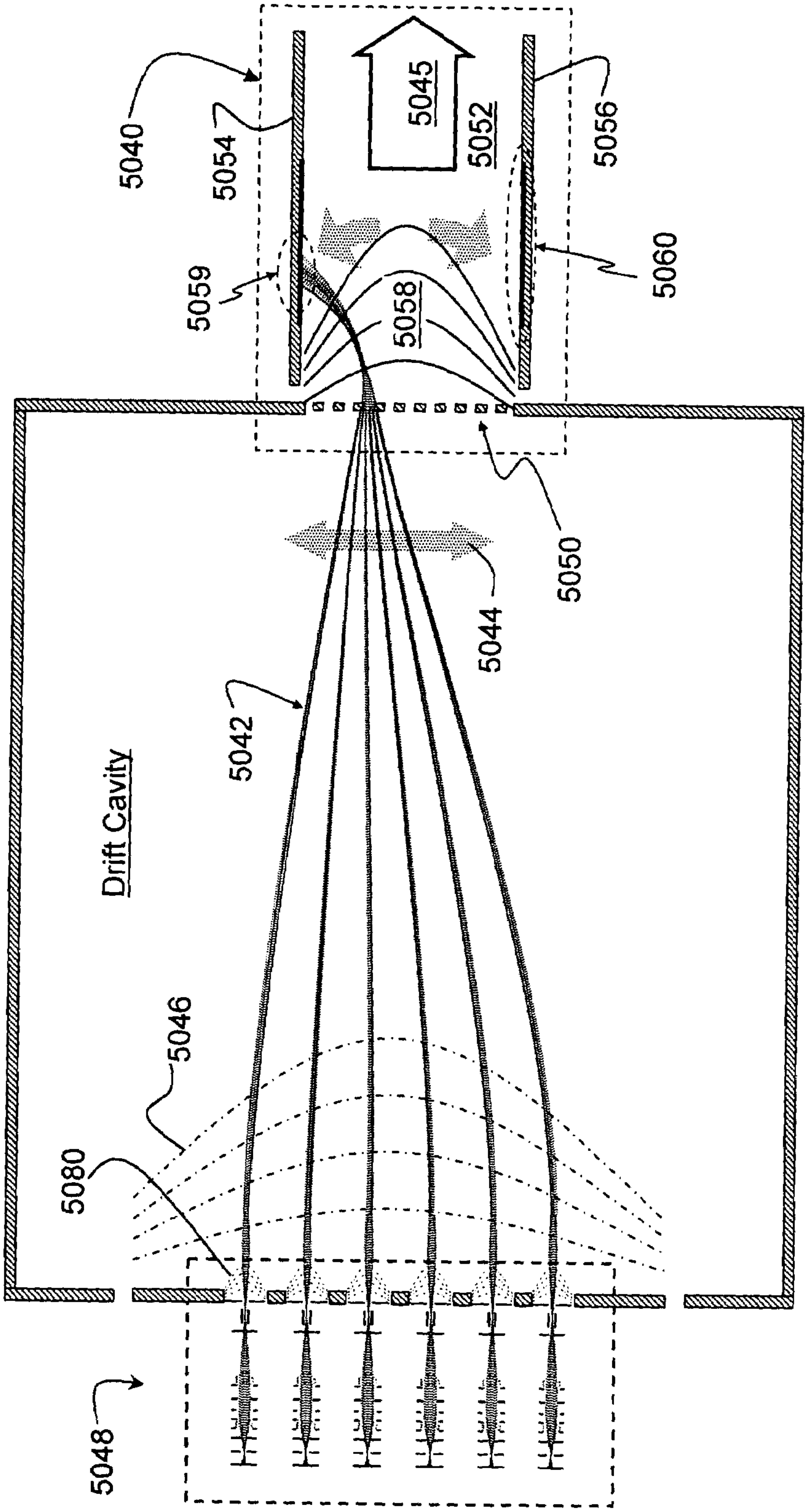
FIG. 118 shows an RF cavity detector.

FIG. 118 shows an RF Cavity detector 5040 that may be used for direct conversion of beam energy to RF electromagnetic radiation 5044. One desirable feature of this embodiment high power RF output with high conversion efficiency. In the embodiments previously discussed, it is desirable to operate with relatively low-beam energies to avoid heating losses in electron striking the detector, and because the beam energy itself is a source of loss, insofar as this does not directly contribute to output power (it contributes indirectly).

As shown in FIG. 118, one goal is to use the same principles of swept beam action 5044 and electron focusing 5046 from an array of electron guns 5048 in a microminiature structure, but with a high beam energy 5042, which is converted directly to the output RF signal 5045, by way of example, to convert a 10 keV beam into a high power RF. If the conversion efficiency is high, there will be little heating losses in the amplifier and this can be accomplished without destructive effects in the device.

The basic principle of the RF cavity detector 5040 is to receive the high energy swept beam energy 5042 at a porous beam contact, such as a gridded or slotted beam contact or wall 5050 that may act as an electron permeable RF shield. Wall 5050 permits the beam energy 5042 to be transmitted through, generally unimpeded. In this case, however, the beam electrons do not directly enter a semiconductor, but an RF cavity 5052 including conducting detector-waveguide 5054, 5056. The walls 5054, 5056 are generally at a different electrical potential from the potential of the beam contact or wall 5050, and the relation of the wall 5050 to the cavity walls 5054, 5056 creates an electron lens 5058, as has been described. In this, cause, a decelerating lens is preferred. When the beam energy 5042 enters the RF cavity 5052, it is immediately slowed down. Preferably, the speed of the electrons is reduced almost to zero. This is accomplished by having a cavity potential on detector waveguides 5054, 5056 that is negative with respect to the beam contact wall 5050 by the potential of the beam energy 5042. For example, if the energy of the beam entering the cavity is 1 keV, the cavity walls may be 1000V after the beam contact wall 5050.

The effect of the decelerating beam is to impart energy back into the cavity walls 5054, 5056 as a wall current on the wall surface. If the beam remained focused on one position, this would deliver a DC energy back to the power supply coupled to the cavity walls, less losses. However, the one feature is to convert this energy into RF field in the cavity 5052 by sweeping action along spots 5059, 5060 where the beam energy 5042 is steered by the action of field 5058. This modulates the spatial position of the beam energy 5042, moving the beam spot across the cavity walls, from left to right and back again, for instance. Many methods of spatial modulation are possible to achieve a desired signal or efficiency, but this one is illustrative as shown. In general, the goal is to mimic, to the extent possible, the wall current which would be present if an RF were already present in the cavity.

Thus, in this embodiment, the detector is a region of the cavity walls where the beam spot strikes it. The "detector" is simply a region of the metal guidewall in the cavity 5052. The detector may or may not provide current gain.

The beam contact wall 5050 in this embodiment is a gridded screen or slotted aperture to allow the electron beam to pass through unimpeded, and is actually spatially separated from the region on the cavity wall where the beam spot forms. The gridding of the beam contact is small enough relative to the RF field being generated (ie, the grid spacing is much less than a half-wavelength) that little RF can penetrate back into the beam drift cavity, where it would otherwise cause fields that would defocus the electron beam. The gridding isolates the RF in the cavity detector from the drift cavity.

In operation, the beam spot sweeps back and forth across screen grid (ie, beam contact) and back and forth inside the cavity, where the spot may be defocused or not, but where it will be "bent" in trajectory by the lensing action therein, causing the beam spot to sweep from one wall to the other (ie, the "segments" of the detector regions), with firehose action. If the spatial motion of the beam and the other factors are properly controlled, this can efficiently generate RF energy directly, which can be coupled out of the cavity by a waveguide, antenna horn or other RF guiding structure.

Crossbar Sequencing Control

Figure 119:
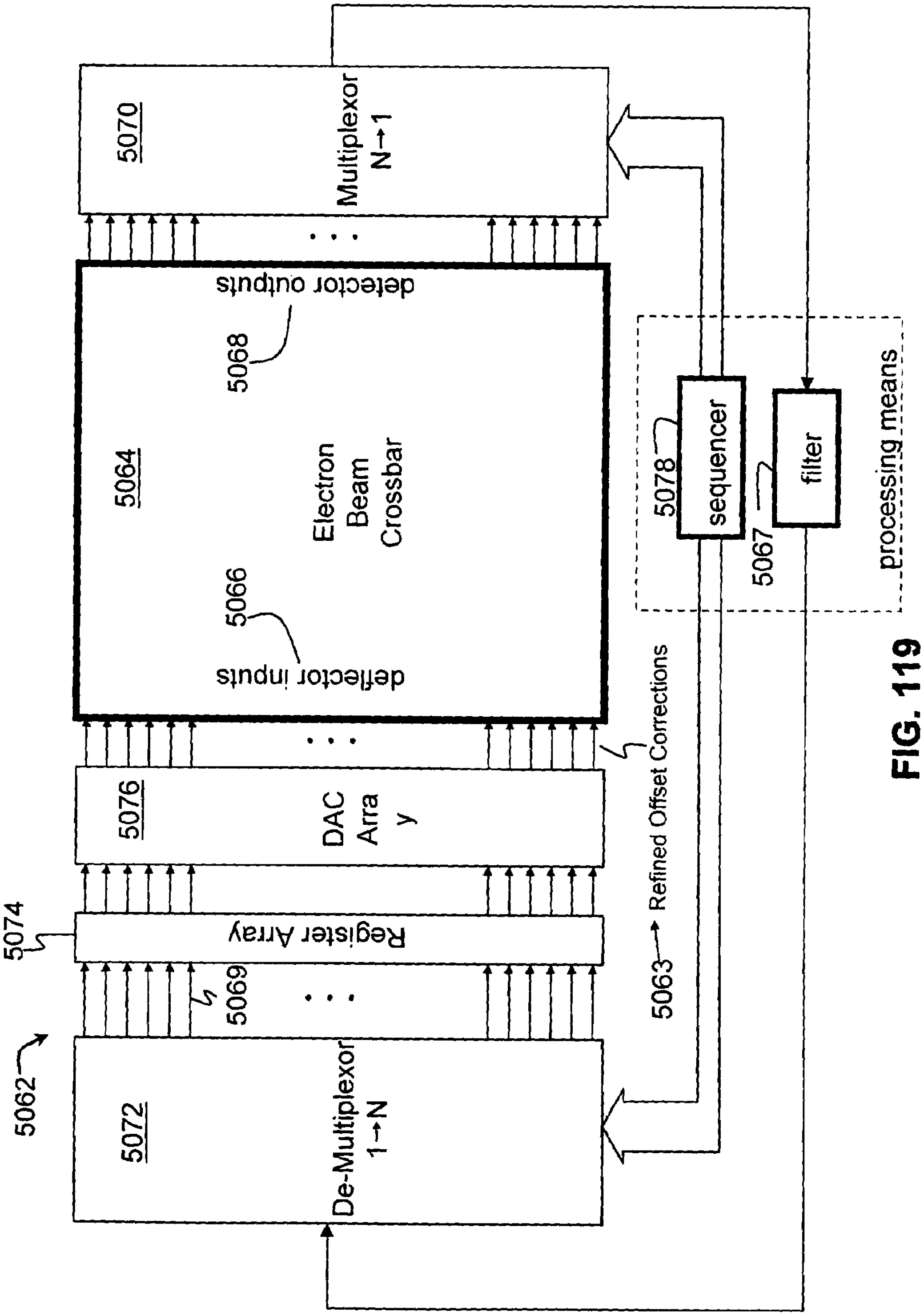
FIG. 119 shows a schematic circuit for sequential feedback positioning control of beam position based upon detector output.

FIG. 119 shows schematic diagram for a crossbar sequencing control circuit 5062 that is used for sequential correction 5063 of refined beam offset error. As shown, a crossbar 5064 is configured by applying beam steering signals 5066 to EBTX or EBRX deflectors to guide each beamlet from an electron gun to a designated detector of a detector array (not shown). Because of mechanical tolerances or interactions between beamlets in any particular arrangement, there may be steering errors that can be corrected if the beamlets are to be centered on the detectors for correct operation, and for this reason some kind of calibration loop might be required, either in the form of fixed calibration coefficients stored for every crossbar configuration, or by means of active feedback loops from the detectors through a filter 5067 generating feedback error correction at the deflectors of the electron guns.

In the case of the feedback loops, it can be difficult and complex to perform the all the feedback loops simultaneously, because for many channels of electron beams, just as many channels of feedback would be required. Moreover, some kind of secondary crossbar switch would be required to select each given detector and couple a feedback path back to each given electron gun, since these paths are different for every configuration of the main e-beam crossbar. Speed in the feedback paths can be orders of magnitude slower, though, since once the beamlets are properly centered they will not change except from thermal cycling, and so forth, so the secondary crossbar could be made of transistors, but even that would be excessively complicated if the e-beam crossbar had a lot of channels.

A solution is to simply achieve the feedback loops sequentially. In this case, a single detector output from detector output signals 5058 is selected, as may be coupled to a single filter 5067, and the single filter 5067 may couple a single error correction to a selected one of the electron guns (not shown). The selection of the detector can be a simple N to 1 multiplexor switch 5070, and the selection of the electron gun may be a simple 1 to N demultiplexor switch 5072, both made compactly and efficiently from conventional transistor technology. The filter 5067 may be analog but is preferably a digital filter so that the "state variables" of the filter 5067 can be stored and recalled each time a channel is updated, since otherwise the filter 5067 would retain the history of the error of the previous channel. This would slow the convergence of the feedback loops considerably and introduce undesirable transient settling errors into the beam steering. If a digital filter 5067 is employed, then the detector error transmitted from the multiplexor 5070 may be sampled by an analog-to-digital converter (not shown) before it is received by the digital filter 5067.

With the sequential update, the output of the filter 5067 is stored for each detector channel 5069. In an all-analog loop, this can be by means of capacitive storage (not shown), for example, a sample-hold on each deflector. In an digital loop, the storage can be a register 5074 s coupled to a DAC 5076, with the DAC 5076 driving the deflector (not shown) with the refined offset correction. In either case, the refined offset correction is summed with the coarse steering command in either digital or analog form, at any point after the refined offset is generated: either before the DAC or after it. The summing can be digital, analog, or even by means of a supplementary set of deflectors in each e-gun to drive the beamlets independently. A sequencer 5078 sequentially repeats this process for each detector in an array.

Microlensing Embodiment

FIG. 118 also illustrates a microlensing approach to the electron optics, for example, as is also shown in the power combiner 4800 of FIG. 98. As described previously, an array of electron guns and a doublet lens system in the drift cavity may focus the array beamlets from the array of gun, towards the detector. In the power combining embodiment of FIG. 98, this was improved by means of subarrays of electron guns, wherein each sub-array possessed an independent subarray lens to focus the beamlets of the subarray, and then the array of subarrays was then focused by the first lens of a drift cavity doublet lens. This technique of focusing the output of a smaller arrays of lenses by means of a single more encompassing lens has sometimes been called "microlensing" in the field of light optics, where it is sometimes employed.

Though some embodiments it might be desirable to focus electron gun subarrays in that manner to achieve power combining, the concept has more general application. For instance, one problem is the maximum current of an electron gun. If the current is too high, the electron gun might focus it, but then the beamlet will spread out from space charge forces within the drift cavity. The doublet lensing of the drift cavity depends on the beamlets staying substantially focused during the drift time to the detector. This means the beamlet current should be quite low. Yet to obtain substantial overall beam current, a large array of electron guns is employed so that the beamlet currents combine additively.

Yet the problem of a large array is that if there too many electron guns, the input impedance seen from a signal source will be excessive, and the bandwidth of the amplifier will be reduced. Thus, fewer electron guns having higher beamlet current are desirable. This might be possible with a large diameter beamlet, but the problem is that as the beamlet diameter increases, the deflector plate spacing within the electron gun must increase also. This reduces the gain and the amplifier performance.

In the previous embodiments, the electron gun was described as generating a substantially parallel beamlet of electrons as they passed through the deflector and exited into the drift cavity. To increase the beamlet diameter while still maintaining a small deflector plate spacing, the beamlet can be brought to a tight focus near the deflector, then allowed to de-focus quickly so that the space charge forces have little time to cause repulsive effects. As the beamlet enters the drift cavity, the beamlet can be allowed to increase to a much larger diameter than the deflector plate spacing, and this would reduce the space charge forces, but uncorrected would still leave unresolved the problem of beamlet spreading as the beamlet travels to the detector.

The solution is microlensing where a series of successively larger lensing electrodes provide successively larger lensing fields 5080, 5046, as shown in FIG. 118. Once the beam so formed exits into the drift cavity, a lens can be use to focus that beamlet and only that beamlet, so that it is restored to near parallel rays during the transit through the drift cavity. If each electron gun does the same, the effect is the same as a greater plurality of electron guns, but without the deleterious effects of an excess of deflectors on the input impedance. In this case, the first lens of the doublet for the drift cavity still operates on the array of beamlets as a whole. Thus the structure is an array of lenses within a lens.

The first doublet lens 4806 is as shown before in FIG. 98: a planar disk electrode encompassing the array of electron guns, and another electrode 4802 surrounding it with the potentials of both selected to achieve the overall "large-scale" lensing action. The microlenses 4818, 4820 are constructed in a similar fashion: a small disk electrode encompasses the output of a single electron gun, and in concert with the potential of another electrode around it, the microlense field is achieved. But since the microlenses are inside the first doublet lens, this second electrode surrounding the first electrode of the first double lens can be the same.

The idea can be extended any time more current is effectively required from an electron gun without increasing the number of guns, or to couple more signals into the deflector array. The key concept here is the idea of electron lenses inside electron lenses inside electron lenses, which has ever been done before. For example, single microlensed electron guns, then bigger microlenses for subgroups of electron guns, then groups of guns in a doublet lens of the drift cavity is a real possibility that is practical and useful.

Multiple Deflector Load Compensation

Depending on the application, the electron beam amplifier may require up to several hundred deflectors to be coupled to a waveguide or transmission line. Multiple deflector coupling can be accomplished in the same manner as a single deflector so long as the total capacitance of the multiple deflectors is small relative to the waveguide impedance and the bandwidth required, and the area encompassed by the multiple deflectors is small enough that transmission line delays do not cause substantial differences in the electron beam deflection between any two deflectors in the array.

One problem of coupling multiple deflectors to a transmission line is the additional capacitive loading. As indicated previously, the capacitance of the array (CARRAY) might be greater than 100 fF. This is large enough that it can cause enough mismatch on the transmission line for destructive signal reflections to occur.

One further embodiment therefore mitigates these reflections by compensating the waveguide structure so that the loading of the deflector array creates a constant waveguide impedance. The general principle is to transform the waveguide impedance from an initial value Z0, where the guide does not couple to the CARRAY, to a larger value Z1 in the region where the guide couples to CARRAY. As known in the art, a waveguide can be viewed as a distributed ladder of series inductors and grounded capacitors per unit length (FIG. 9*a*), and the guide impedance is given simply by $$Z_0 = \sqrt{\frac{L_0}{C_0}} \tag{1.54}$$

The magnitudes of $L_0$ and $C_0$ are determined by the physical structure of the guide, but in general it can be appreciated that if $L_0$ is constant, then increasing $C_0$ reduces $Z_0$ and decreasing $C_0$ increases $Z_0$. Thus, excess load capacitance decreases $Z_0$, and by the previous formula for □, there will be reflections generated.

The formula therefore suggests another embodiment: If the capacitance of the deflector array is enough to induce undesired reflections, the waveguide structure can be modified across a section to reduce the distributed capacitance of the guide, thereby raising the impedance to a different value Z1. Then the deflector capacitance can be coupled in distributed fashion along the modified section so that the average distributed capacitance is the same as the unmodified guide. Thus, the effective impedance along the modified section of guide will equal Z0, the magnitude in the unmodified sections of guide. This can substantially eliminate any reflections from the deflector array loading.

Modifying a section of the guide can be quite simple in principle though details must be carefully determined in practice. For a simple two-wire transmission line, the wire spacing can be increased for the distance of the modified section. For a closed waveguide, the guide walls on which the electric field lines terminate (as in a TEmn mode) can be spaced further apart. This is illustrated schematically in FIG. 9 and FIG. 10.

Other Detector Embodiments with Improved Gain and Linearity

One problem with a diode detector is achieving sufficient current gain without incurring distortion in the output waveform. The cascade gain mechanism multiplies beam current without sensitivity to the voltage of the load, since it depends only on the beam energy and the semiconductor material. But the gain from this mechanism is limited to perhaps a few hundred, even with high beam energies. For this reason, a detector might be supplemented with avalanche gain, to further multiply the diode current by a second gain factor of 5—perhaps 20 or more. Thus, overall detector gain, which is the multiple of the cascade and avalanche effects can exceed several thousand, thereby providing significantly greater output drive and output power.

Avalanche gain is inherently voltage sensitive. Avalanche operates by creates a strong field across a reverse biased diode junction that is near breakdown; as electrical carriers (electrons and holes) drift into the internal field of the diode junction, they are accelerated sufficient velocity to impact with atoms in the crystal lattice, breaking free more electrons. These electrons are themselves then accelerated in the field, breaking free more electrons, and so on in a chain reaction the grows until the electrons leave the high field region.

The problem is that the intensity of the high field region is very sensitive to the external voltage across the diode. Even small changes in the voltage can cause large changes in the avalanche gain.

When an avalanche diode is connected directly to a load, the large current modulates the load voltage and hence the avalanche gain. Thus, if the avalanche diode is a detector, the beam current generates a cascade current in the diode, and the cascade current is multiplied by the avalanche gain, generating a diode output current which drives the load—but as the load voltage changes in response to the diode output current the voltage across the detector changes, and hence the detector gain changes, thereby modifying the output current. This makes it impossible for the load voltage to linearly follow the collected beam current, and hence, the output voltage becomes distorted by harmonics. While this might be desirable in a frequency multiplier, it is very undesirable in a linear amplifier.

Figure 120:
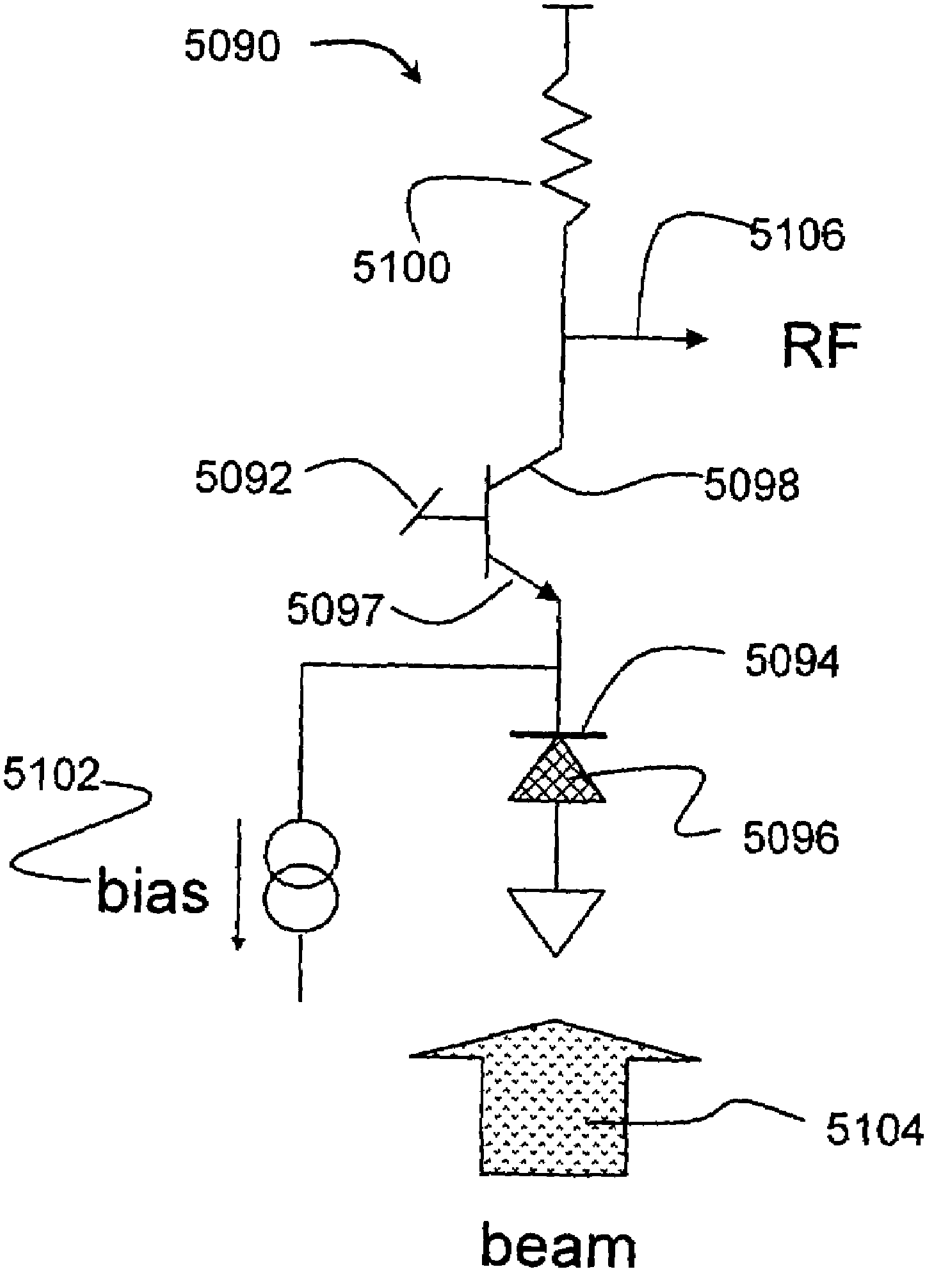

Thus, one option is to isolate the detector from the load voltage, as shown in FIG. 120 illustrating an avalanche detector with heterojunction bipolar transistor (HBT) load isolation 5090. An HBT 5092 is biased in a "cascode" or "common base" mode. By coupling a cathode 5094 of a detector 5096 to the emitter 5097 of the HBT 5092, the current is essentially transmitted to the collector 5098 of the HBT 5092 without amplification or distortion, and coupled to the load 5100 according to well-known principles of bipolar transistor action. Furthermore, this is a fast mode of bipolar operation, and in HBT's the bandwidth of the bipolar can exceed hundreds of gigahertz. Detector 5096 is subject to bias 5102 to configure the detector 5096 for avalanche amplification of beam current 5104 to drive RF output 5106.

In effect, the high transconductance of the bipolar isolates the detector from the load. According to bipolar physics, large changes in the bipolar emitter-collector current are caused by very small changes of only a few millivolts in the base-emitter voltage, or vice versa. Thus, if the base contact of the bipolar is fixed to a bias supple, large changes in the avalanche current transmitted to the bipolar emitter cause very little change in the voltage across the avalanche diode. The bipolar in effect behaves as an impedance transformer so that the avalanche diode sees a small "AC" resistance, while the bipolar sees the high resistance of the load.

HBT Detector

Another option is to make a detector supplementary gain without using the avalanche effect, as shown in FIG. 121 HBT detector circuit 5108 makes use of HBT 5110, but is otherwise made of components previously described in context of FIG. 120. One type of HBT 5110 operates on the principle of a phototransistor, except impingement of beam current 5104 causes bipolar injection gain in this type of structure. In this case, the detector 5110 is made of alternating layers of semiconductor N-P-N doping compositions, for example, as shown in FIG. 122A where beam current 5104 strikes P layer E to cause shifting of electrons and holes as shown in FIG. 122B. The layer E adjacent to the beam contact can operate similarly to that previously described, to generate cascade gain, but the next two layers B, C make the sandwich a bipolar transistor. In the figure, the layers are labeled E, B and C for the respective emitter, base and collector. Unlike the previously describe Schottky detector having a thin cascade layer over a thicker layer, the cascade layer in this new structure is the middle base layer. This best uses an extremely thin emitter layer of perhaps 10 angstroms so that most beam electrons penetrate into the base.

If minority carriers (in this case, the electrons of the beam as multiplied by the cascade action) enter a base region, they generate bipolar gain described by a current gain factor "beta", or β Beta is also often called "$h_{FE}$", and is the ratio of the collector current to the base current. Typical values are β=100. For example, if the base current is 1 uA and beta=100, the collector current is 100 uA. Generally, the emitter current is very nearly equal to the collector current by (1+β)/β, so the two can be assumed the same value here for convenience.

The method of operation may depend on the ratio of the carrier mobilities μn and μp between base and emitter, the thickness of the emitter and base layers XE and XB, and the doping concentration of emitter and base layers, NE and NB. according to a formula $$1.\ h_{FE} = \frac{\mu_{nB} X_E N_E}{\mu_{pE} X_B N_B} \quad (1.55)$$

Controlling these parameters in a suitable device structure can thus create a detector of very high gain. To use this as a detector, the base is simply coupled to a fixed bias supply, and the emitter is coupled to a beam contact of suitable thin construction so as to permit beam electrons to pass through, and the collector is coupled to the load.

Injecting a beam current into the base of a detector so constructed multiplies the beam current, first by cascade, and then by the bipolar β factor. In this manner, extremely high detector output current can be achieved at the bipolar collector. For example, if the cascade gain is 100 and the bipolar gain is 100, an overall gain of 10,000 is possible. It works. Moreover, the bipolar gain mechanism is not nearly so sensitive to voltage excursions of the output voltage on the collector. Thus, it achieve improvement of the detector linearity in the manner of the aforementioned cascode structure.

Nonetheless, the bipolar detector is not completely immune to gain non-linearity. As is well-known, bipolar devices suffer a second-order modulation of their current gain as the collector-base voltage. This is not expressed in the previous equation, but the effect can be as much as tens of percent or as little as a few percent. Compared to the voltage sensitivity of an avalanche diode, which might vary the gain from 1 to 1000 for a change in voltage of a few volts, this is not much, but it can still be significant.

A second problem with the bipolar detector is AC feedback from the collector voltage to the base region. This is due to the junction capacitance between these two point, and the effect is to substantially reduce the bandwidth of the detector, by approximately the factor β. In high frequency RF circuits this is generally (almost always) avoided by using a cascode(common base) transistor to achieve AC isolation.

Thus, it may be appreciated that the bipolar detector could, in some circumstances, profit from isolating the collector of the detector from the load voltage, in the same manner as the avalanche diode detector can: with a cascode transistor. The method can, in fact, be the same: a bipolar or HBT transistor.

References

The following documents are incorporated by reference:

1 T. H. P. Chang et al, "Electron-beam microcolumns for lithography and related applications", J. Vac Sci. Technol. B 14(6), November/December 1996, pp. 3774-3781

2 M. G. R. Thomson et al., "Lens and deflector design for microcolumns", J. Vac Sci. Technol. B 13(6), November/December 1995 American Vacuum Society, pp. 2445-2449.

3 E. Kratschmer et al., "Experimental evaluation of a 20×20 mm footprint microcolumn", J. Vac Sci. Technol. B 14(6), November/December 1996 American Vacuum Society, pp. 3792-3796.

4 T. H. P. Chang et al., "Electron beam microcolumn technology and applications", Electron-Beam Sources and Charged-Particle Optics, SPIE vol. 2522, 1995, 10 pgs.

5 T. H. P. Chang et al., "Arrayed miniature electron beam columns for high throughput sub-100 nm lithography", J. Vac Sci. Technol. B 10(6), November/December 1992 American Vacuum Society, pp. 2743-2748

6 T. H. P Chang et al., "Electron beam technology—SEM to microcolumn". Microelectronic Engineering 32, (1996), pp. 113-130.

7 H. S. Kim et al., "Miniature Schottky electron source", J. Vac. Sci. Technol. B 13(6), November/December 1995, pp. 2468-2472.

8 N. M. Froberg et al, "TeraHertz Radiation from a Photoconducting Antenna Array", IEEE J. Quantum Electronics, vol. 28, No. 10, pp. 2291-2301 (1992)

9 Sang-Gyu Park et al, "High-Power Narrow-Band Terahertz Generation Using Large-Aperture Photoconductors", IEEE J. Quantum Electronics, vol 35, No. 8, pp. 1257-1268 (1999).

10 Cha-Mei Tang et al, "Deflection microwave and millimeter-wave amplifiers", J. Vac Sci. Technol. B 12(2), March/April 1994, pp. 790-794.

11 Manohara et al, "Design and fabrication of a THz nanoklystron", Far-IR, Sub-mm & MM Detector Technology Workshop, Monterey Calif.; Apr. 1-3, 2002. www.sofia.usra.edu/det_workshop/papers/session6/3-43manohara_rev020911.pdf: www.sofia.usra.edu/det_workshop/posters/session3/3-43manohara_Poster.pdf 12 Kitamura et al, "Microfield emitter array triodes with electron bombarded semiconductor anode", J. Vac. Sci. Technol. B 11(2), March/April 1993.

The invention claimed is:

1. A device to amplify a deflection signal comprising one or more voltage signals, the device comprising an emission wall and a detector wall separated from one another to define an evacuated drift cavity that presents an electron transmission pathway between the emission wall and the detector wall, the emission wall and the detector wall being parallel to one another;

the drift cavity extending between an emission wall surface at a terminus of the emission wall proximate to the drift cavity and a detector wall surface at a terminus of the detector wall proximate to the drift cavity;

an array of electron guns disposed behind the emission wall, each electron gun in the array of electron guns configured to emit electrons as current of a beamlet into the drift cavity, through the emission wall and along the transmission pathway toward the detector wall, each electron gun in the array of electron guns having a corresponding beamlet deflector that is operable for receipt of the deflection signal, and the aggregate of emitted beamlets forms an electron beam positioned relative to the transmission pathway, the electron beam forming a beam spot on the detector wall, and the aggregate of beamlet deflectors forms an electron beam deflector such that in a quiescent state of the deflection signal the electron beam is transmitted on the transmission pathway in a non-deflected mode, and in a non-quiescent state of the deflection signal the electron beam deflector deflects the electron beam in a swept mode of sweeping action that moves the beam spot along a sweep pathway at the detector wall;

a detector forming one or more areas on the detector wall for selective collection of the electron beam according to positioning of the beam spot, the detector including a construction that is capable of responding to the selective collection by generating an output current.

2. The device of claim 1 in which the output current is representative of the deflection signal but amplified with respect to the deflection signal by virtue of interaction between the detector, the beam spot and the detector construction.

3. The device of claim 1, further comprising an output load to receive the output current.

4. The device of claim 1 wherein the beamlet deflector of each electron gun comprises a first deflector electrode and a second deflector electrode in substantially parallel orientation with respect to one another across a selected portion of the transmission pathway and disposed in the emission wall such that the electron beam passes between the first deflector electrode and the second deflector electrode before entering the drift cavity, the first deflector electrode and the second deflector electrode being configured for selective electric field application driven by a first voltage signal of the deflection signal applied as a potential difference between the first deflector electrode and the deflector second electrode.

5. The device of claim 4 wherein the beamlet deflector of each electron gun is of matched construction, so that for a given deflection signal, each beamlet deflector deflects a corresponding electron beamlet by substantially the same amount.

6. The device of claim 1 wherein the detector construction includes a material that amplifies a current of the electron beam to generate the output current under condition of the selective collection.

7. The device of claim 1 wherein the array of electron guns is arranged such that the beamlet deflector of each electron gun is arranged in planar form and located proximate behind the emission wall surface.

8. The device of claim 1 further comprising an electrostatic lens system operable for simultaneous action on a plurality of beamlets emitted by the array of electron guns.

9. The device of claim 1 wherein the array of electron guns is of predetermined pattern by design to achieve beam spot formation and the predetermined pattern comprises a grid pattern of electron gun locations and an outline pattern for a shape of a perimeter of the array.

10. The device of claim 9 wherein the predetermined pattern comprises a substantially rectangular grid pattern.

11. The device of claim 9 wherein the predetermined pattern comprises a substantially hexagonal grid pattern.

12. The device of claim 9 wherein the outline pattern is substantially circular.

13. The device of claim 9 wherein the outline pattern is substantially rectangular.

14. The device of claim 9 wherein the outline pattern is a line.

15. The device of claim 8 wherein the electrostatic lens system comprises:

a first lens electrode located proximate to the emission wall surface; and a second lens electrode located proximate to the emission wall surface;

wherein the second lens electrode defines an opening and the first lens electrode is centrally disposed with respect to the opening and the second lens electrode.

16. The device of claim 15 wherein the first lens electrode comprises a circular disk and the opening comprises a circular hole.

17. The device of claim 16 wherein the first lens electrode is coupled to means for applying a first potential to the first lens electrode, and the second lens electrode is coupled to means for applying a second potential to the second lens electrode.

18. The device of claim 17 wherein the first potential is more positive than the second potential.

19. The device of claim 17, wherein the drift cavity includes a sidewall extending from the emission wall surface to the detector wall surface, and the electrostatic lens system additionally comprises a fourth lens electrode residing at a position selected from the group consisting of at least part of the sidewall, one portion of the detector wall, and combinations thereof, and a third lens electrode forming part of the detector wall.

20. The device of claim 19 configured for time delay shifting, comprising means for adjusting a potential of the third lens electrode in response to a time delay control command word.

21. The device of claim 20 further comprising means for adjusting a potential of the fourth lens electrode in response to a time delay control command word.

22. The device of claim 21 wherein the means for adjusting the potential of the fourth planar electrode comprises a read-only memory associated with the fourth lens electrode to provide means for storing a plurality of fourth electrode voltage words, each of the fourth electrode voltage words corresponding to one of a plurality of time delay control command words;

means for providing a selected fourth electrode voltage word in response to receiving a time delay control command word, means for selecting a time delay control command word for communication between the storing means and the providing means, and a digital-to-analog converter coupled with the read-only memory to provide a fourth electrode potential to the fourth lens electrode in response to receiving an electrode voltage word from the read-only memory.

23. The device of claim 20 wherein the means for adjusting comprises:

a read-only memory associated with the third lens electrode to provide means for storing a plurality of third electrode voltage words, each of the third electrode voltage words corresponding to one of a plurality of time delay control command words;

means for providing a selected third electrode voltage word in response to receiving a time delay control command word, means for selecting a time delay control command word for communication between the storing means and the providing means, and a digital-to-analog converter coupled with the read-only memory to provide a third electrode potential to the third lens electrode in response to receiving an electrode voltage word from the read-only memory.

24. The device of claim 19 wherein the third lens electrode comprises a circular disk.

25. The device of claim 19 additionally comprising one or more digital-to-analog converters configured for control of electrode voltages applied to the electrostatic lens system.

26. The device of claim 19 wherein the third lens electrode comprises a planar electrode that forms part of the detector wall and defines an open section that is not covered by the third lens electrode, the fourth lens electrode being centrally disposed with respect to the open section, and the third lens electrode being electrically isolated from the fourth lens electrode.

27. The device of claim 26 wherein the third electrode is a disk and the open section comprises a circular hole.

28. The device of claim 26 wherein the detector is centered with respect to the fourth lens electrode.

29. The device of claim 26, additionally comprising:

a plurality of cylindrical ring electrodes forming part of the sidewall, each disposed to circumscribe the electron beam when emitted by the array of electron guns;

each ring electrode being electrically isolated from the remainder of the ring electrodes and being coupled to a corresponding ring potential, a first ring electrode being one of the plurality of the ring electrodes that is nearest the emission wall, the first ring electrode coupled to means for providing a first ring potential, and a last ring electrode being the ring electrode that is nearest the detector wall, the last ring electrode being coupled to means for providing a last ring potential.

30. The device of claim 29 wherein the ring electrodes have substantially identical diameters with respect to one another.

31. The device of claim 29 including means for providing increased ring electrode potential in relative order proceeding from the first ring electrode to the last ring electrode, such that the last ring electrode has a highest ring potential of the ring electrodes when the means for providing increased ring electrode potential is activated and equal potentials among adjacent ring electrodes are not precluded by the relative order.

32. The device of claim 31 further comprising segmented ring biasing circuitry that includes a first ring potential source, a tapped resistor with a first end, a second end, and a plurality of tapped resistor terminals, the tapped resistor coupled at the first end to the first ring potential source and at the second end to the third lens electrode, and each of the plurality of ring electrodes coupled to one of the tapped resistor terminals.

33. The device of claim 31 further comprising segmented ring biasing circuitry that includes:

a read-only memory with means for storing a plurality of ring-electrode voltage words, each ring-electrode voltage word corresponding to one of a plurality of time delay control command words, means for providing the corresponding ring-electrode voltage word in response to receiving a time delay control command word, means for selecting a time delay control command word for communication between the storing and providing means; and one or more digital-to-analog converters, each coupled to the read-only memory, wherein each digital-to-analog converter provides the ring electrode potential to a corresponding ring electrode in response to receiving one of the ring-electrode voltage words from the read-only memory.

34. The device of claim 26 including a drift can electrode wherein the first lens electrode is centered with respect to the opening defined by the second lens electrode, and the third lens electrode is centered in the open section.

35. The device of claim 34 wherein the third lens electrode is coupled to a third potential, the drift can electrode is coupled to a fifth potential, and the third potential is more positive than the fifth potential.

36. The device of claim 35 wherein a first digital-to-analog converter controls the first potential, and the second and fifth potentials are fixed.

37. The device of claim 36 including a third digital-to-analog converter to control the third potential.

38. The device of claim 34 wherein the third lens electrode is coupled to a third potential, the fourth lens electrode is coupled to a fourth potential, the drift can electrode is coupled to a fifth potential, and the third potential is more positive than the fifth potential.

39. The device of claim 38 wherein the fourth and fifth potentials are the same.

40. The device of claim 38 wherein the fourth potential is controlled by a fourth digital-to-analog converter.

41. The device of claim 34 configured for true time delay shifting, comprising means for adjusting respective potentials of the third lens electrode, the fourth lens electrode, and the drift can electrode in response to a time delay control command word.

42. The device of claim 41 wherein the means for adjusting the potentials comprises an electrode voltage word including a binary segment with data allocated to each of the third lens electrode, the fourth lens electrode, and the drift can electrode;

a read-only memory with means for storing a plurality of electrode voltage words, each electrode voltage word corresponding to one of a plurality of time delay control command words, means for providing the corresponding electrode voltage word in response to receiving a time delay control command word, means for selecting a time delay control command word for communication between the storing and providing means;

a first digital-to-analog converter coupled to the read-only memory, wherein the first digital-to-analog converter provides a third-electrode potential to the third electrode in response to receiving one of the electrode voltage words from the read-only memory;

a second digital-to-analog converter coupled to the read-only memory, wherein the second digital-to-analog converter provides a fourth-electrode potential to the fourth electrode in response to receiving an one of the electrode voltage words from the read-only memory; and a third digital-to-analog converter coupled to the read-only memory, wherein the third digital-to-analog converter provides a fifth-electrode potential to the drift can electrode in response to receiving one of the electrode voltage words from the read-only memory.

43. The device of claim 25 additionally comprising:

a digital controller for generating a digital focusing word;

the digital focusing word comprising groups of binary bits, each group providing control information to one of the digital-to-analog converters.

44. The device of claim 43 wherein the digital controller comprises a read-only memory, operably responsive to a digital focusing command to provide the digital focusing word as input to the one of the digital-to-analog converters.

45. The device of claim 8 constructed for astigmatic beam focusing comprising a square planar electrode in the emission plane to circumscribe the array of electron guns, the square planar electrode having left and right sides opposed to one another, and top and bottom sides opposed in a second direction that is orthogonal to the sweep pathway and the transmission pathway;

first and second astigmatic electrodes positioned in the emission surface and arranged on opposing sides, in the sweep direction, of the square planar electrode;

third and fourth astigmatic electrodes positioned in the emission surface and arranged on opposing sides, in the second direction, of the square planar electrode;

coupling between the first and second astigmatic electrodes and a first astigmatic voltage source; and coupling between the third and fourth astigmatic electrodes and a second astigmatic voltage source.

46. The device of claim 1 wherein the detector consists of a single detection segment and the electron beam deflector is configured to sweep the beam spot across an edge of the segment.

47. The device of claim 1 wherein:

the detector comprises one or more segments; and a perimeter of any of the one or more segments is shaped by complementary design with respect to the beam spot to improve linearity of the output current in response to the deflection signal.

48. The device of claim 1 wherein the detector comprises two detector segments separated by a slot.

49. The device of claim 48 wherein the segments are substantially triangular and arranged in inverted opposition so as to form a generally rectilinear shape transected by a diagonal slot.

50. The device of claim 49 where the rectilinear shape is defined by one pair of orthogonally connected edges and another pair of orthogonally connected edges, the electron beam deflector being arranged and controlled such that each of the orthogonally connected edges in each of the one pair and the other pair are either parallel to the sweep pathway or orthogonal to the sweep pathway.

51. The device of claim 49 configured such that the beam spot comprises a line spot where it impinges upon the detector wall, a height of the line spot in a direction orthogonal to the sweep pathway is approximately equal to a corresponding height of the detector, and a width of the line spot along the sweep pathway is substantially less than a width of the detector in the sweep pathway.

52. The device of claim 49 wherein the generally rectilinear shape is rectangular.

53. The device of claim 49 wherein the slot is arranged in combination with the generally rectilinear shape and the beam spot such that the device produces, in response to the deflection signal, the output current that is substantially linear.

54. The device of claim 48 wherein the segments are substantially rectangular and sequentially available along the sweep pathway.

55. The device of claim 54 wherein the beam spot is substantially rectangular.

56. The device of claim 1, further comprising a beam centering signal generator comprising differential coupling means generating an offset error signal provided to means for feedback loop correction processing generating an integrated offset signal.

57. The device of claim 56 further comprising means for centering the electron beam in response to the integrated offset signal.

58. The device of claim 56 further comprising summing circuitry for combining input voltage signals with the integrated offset signal, to generate the deflection signal.

59. The device of claim 56 further comprising a secondary beam deflector in each electron gun, the secondary beam deflector being coupled to receive the integrated offset signal.

60. The device of claim 56 further comprising a digital-to-analog converter coupled to provide the integrated offset signal in response to a calibrated digital beam offset word.

61. The device of claim 60 further comprising a digital processor configured to provide the calibrated digital beam offset word in response to a beam targeting command.

62. The device of claim 56 wherein the feedback loop correction processing comprises a digital processor.

63. The device of claim 62 wherein the digital processor comprises a read-only memory configured to:

store a plurality of calibrated digital beam offset words, each calibrated digital beam offset word corresponding to one of a plurality of beam targeting commands; and provide the corresponding calibrated digital beam offset word in response to each beam targeting command received by the read-only memory.

64. The device of claim 56 wherein the means for feedback loop correction processing comprises an integrator.

65. The device of claim 64 wherein the integrator comprises:

a differential transconductance amplifier that is differentially coupled to the detector and configured to generate a transconductance current; and a filter capacitor, coupled to receive the transconductance current and generate the integrated offset signal.

66. The device of claim 64 wherein the differential transconductance amplifier comprises transistors in a differential amplifier configuration.

67. The device of claim 64 wherein the integrator comprises:

an operational amplifier comprising a minus input, a plus input and an output;

a first resistor coupled between a first detector terminal and the minus input;

a second resistor coupled between a second detector terminal and the plus input;

a first integrating capacitor coupled between the minus input and the output;

a second integrating capacitor coupled between the plus input and a ground;

means for coupling the output to the beam offset control terminal; and a differential coupling between the detector and the first and second detector terminals, wherein the output provides the integrated offset signal.

68. The device of claim 56, the detector comprising one or more segments, and wherein the differential coupling means comprises offset sense segments arranged adjacent to each detector segment, to measure a beam offset and to generate an offset error signal provided to the means for feedback loop correction processing.

69. The device of claim 65 wherein the integrator comprises a differential transconductance amplifier comprising first and second transistors, each transistor comprising gate, source and drain terminals;

coupling between the gate terminals of the first and second transistors and a bias source;

differential input terminals A and B to receive the offset error signal;

coupling between the source of the first transistor and terminal A and the source of the second transistor hand terminal B;

a current mirror configured to receive an input current of a given polarity and transmit a current mirror output current of opposite polarity to an amplifier output terminal that provides the integrated offset signal;

coupling between the drain terminal of the first transistor to an input terminal of the current mirror;

coupling between the drain terminal of the second transistor to the amplifier output terminal.

70. The device of claim 1 wherein the detector comprises a semiconductor.

71. The device of claim 70 wherein the detector further comprises a beam contact; an output contact; and a semiconductor disposed between the beam contact and the output contact.

72. The device of claim 70 wherein the semiconductor is constructed as a diode.

73. The device of claim 70 wherein the diode comprises a material selected from the group consisting of Ge, Si, GaAs, InP, GaN, SiC, diamond, doped variations thereof, and combinations thereof.

74. The device of claim 70 wherein the detector comprises a Schottky diode wherein at least one of the beam contact and the output contact forms a Schottky contact with the semiconductor.

75. The device of claim 74 wherein the beam contact is metallic.

76. The device of claim 74 wherein one of the beam contact and the output contact is coupled to an output load.

77. The device of claim 74 wherein the beam contact permits penetration of beam electrons through the beam contact and into the semiconductor.

78. The device of claim 74 wherein the Schottky diode is reverse biased.

79. The device of claim 74 wherein the Schottky diode comprises silicon.

80. The device of claim 74 wherein the Schottky diode comprises germanium.

81. The device of claim 74 wherein the beam contact has a gridded conductor structure comprising thick grid elements that have low ohmic resistance and contact regions in between the thick grid elements that permit most beam electrons to penetrate into the semiconductor.

82. The device of claim 81 wherein the thick grid elements comprise parallel fins.

83. The device of claim 81 wherein the thick grid elements form a repeating geometric pattern.

84. The device of claim 77 wherein the diode comprises means for generating a cascade current by impingement of the electron beam passing through the beam contact and for collecting and transmitting the cascade current to the output contact.

85. The device of claim 84 wherein the means for generating is a single semiconductor material.

86. The device of claim 84 wherein the semiconductor material is capable of providing amplification of the cascade current via avalanche multiplication.

87. The device of claim 84 wherein the means for generating includes a top layer and a bottom layer.

88. The device of claim 87 wherein the top layer includes germanium.

89. The device of claim 87 wherein the bottom layer includes a material selected from the group consisting of doped silicon and gallium arsenide.

90. The device of claim 87 wherein the bottom layer is capable of amplifying the cascade current via avalanche multiplication.

91. The device of claim 84 wherein the means for generating comprises a low pair-production energy III-V material.

92. The device of claim 91 wherein the III-V material comprises one of indium arsenide or indium antimonide.

93. The device of claim 87 wherein the top layer comprises at least one material selected from the group consisting of indium arsenide, indium antimonide, combinations of indium arsenide with other materials, and combinations of indium antimonide with other materials.

94. The device of claim 87 wherein the top layer comprises a low pair production energy III-V material and the bottom layer comprises silicon.

95. The device of claim 87 wherein the top layer is fusion bonded to the bottom layer.

96. The device of claim 1 wherein the detector is a photoconductive resistor.

97. The device of claim 96 wherein the photoconductive resistor comprises a beam contact;

an output contact; and a semiconductor disposed in electrical contact between the beam contact and the output contact.

98. The device of claim 96 wherein the output contact is coupled to an output load.

99. The device of claim 1 wherein the detector comprises a microdynode.

100. The device of claim 1 wherein each electron gun comprises a gun axis aligned towards the electron transmission pathway for emission of a corresponding one of the beamlets in a positive direction of the gun axis towards the detector wall;

a field emission cathode;

a gate electrode to regulate the flow of current from the cathode;

means for controlling a gate potential of the gate electrode to control release of a stream of electrons from the cathode; and a plurality of focusing electrodes.

101. The device of claim 100 wherein each focusing electrode forms a hole that is circular and centered on the gun axis, a first focusing electrode is the focusing electrode that is nearest the gate electrode, and a last focusing electrode is the focusing electrode that is furthest from the gate electrode; each electron gun further comprising means for adapting gun focusing potentials of the focusing electrodes to focus the stream of electrons into the corresponding beamlet transmitted along the gun axis through the hole of a selected focusing electrode.

102. The device of claim 101 wherein the focusing electrodes are adapted to provide beam focusing, and comprise a first and a second electron lens and the first lens is positioned closest to the cathode, the second lens is positioned further from the cathode than the first lens.

103. The device of claim 102 wherein: the first lens is an accelerating lens acting with convex action.

104. The device of claim 102 wherein the second lens acts with concave action.

105. The device of claim 102 wherein the second lens is an accelerating lens.

106. The device of claim 102 wherein the focusing electrodes additionally comprise a third electron lens.

107. The device of claim 106 wherein the third electron lens is positioned between the first and the second lens, at a focal point of the first lens, and forms a hole adapted to allow a focused electron beam to pass through, but to stop electrons that are not focused by the first lens;

the second lens acts with convex action;

the third lens acts with concave action;

the third lens is positioned further from the cathode than the second lens.

108. The device of claim 100 wherein the field emission cathode comprises a Spindt cathode.

109. The device of claim 100 wherein the focusing electrodes further comprise a first and a second electron lens, the first lens being positioned between the cathode and the second lens;

the first lens and the second lens being accelerating lenses;

the first lens acting with convex action;

the second lens acting with concave action.

110. The device of claim 101 wherein the electron gun additionally comprises a signal deflector located in the positive direction of the gun axis from the last focusing electrode, centered about the gun axis to receive the beamlet and transmit a deflected representation thereby, a conductive coupling between the signal deflector and a first voltage signal comprising at least one voltage signal of the deflection signal, whereby the first voltage signal is configured to deflect the corresponding beamlet along the sweep pathway; and an exit aperture plate that is substantially parallel and proximate to the emission wall, located in the positive direction of the gun axis from the signal deflector, and forming an aperture positioned to allow the corresponding beamlet to pass through.

111. The device of claim 110 wherein the signal deflector comprises a pair of planar deflection electrodes that are coaxial with the gun axis, to permit the corresponding beamlet to pass between the deflection electrodes.

112. The device of claim 110 wherein the exit aperture plate is in the emission wall.

113. The device of claim 110, wherein each electron gun further includes a blanking deflector for pulsed operation.

114. The device of claim 113, additionally comprising;

a blanking aperture electrode positioned between the blanking deflector and the signal deflector, the blanking aperture electrode forming an aperture, wherein the blanking deflector is positioned between the last focusing electrode and the signal deflector, and is centered about the gun axis, and comprises a blanking voltage signal comprising, alternately, a blanking state and a non-blanking state, the blanking voltage signal being coupled to the blanking deflector; such that the corresponding beamlet is deflected by the blanking deflector and blocked by the blanking aperture electrode when the blanking voltage signal is in the blanking state, and the electron beam passes through the aperture of the blanking aperture electrode when the blanking voltage signal is in the non-blanking state.

115. The device of claim 100 wherein each electron gun additionally comprises current control means comprising:

an amplifier, comprising first and second input ports, and an output port coupled to the gate electrode and responsive to a potential difference between the first and second input ports;

a ballast resistor coupled between the field emission cathode and a cathode bias potential, to provide a sensed current potential;

the sensed current potential coupled to the first input port; and a reference potential, coupled to the second input port.

116. The device of claim 115 additionally comprising a filter, such that the gate electrode is responsive to an average of the potential difference between the first and second input ports over time.

117. The device of claim 100 wherein each electron gun additionally comprises one or more digital-to-analog converters, each digital-to-analog converter controlling the potential of a corresponding focusing electrode, each digital-to-analog converter being responsive to a corresponding digital focusing word; and a digital processor to generate the focusing words.

118. The device of claim 117 wherein the digital processor comprises a read-only memory to store a plurality of focusing words corresponding to a plurality of beam energy values;

a digital beam energy command word coupled to an address port of the read-only memory, causing the read-only memory to transmit a single one of the focusing words corresponding to a beam energy commanded thereby.

119. The device of claim 118 wherein the means for controlling the gate potential comprises an analog to digital converter to control the gate potential and to generate a digital focusing command word thereby.

120. The device of claim 100, further comprising means for adjusting a beam energy of each electron gun in response to a time delay command word.

121. The device of claim 120 including a plurality of digital-to-analog converters, wherein each digital-to-analog converter is coupled to provide a gun focusing potential to a corresponding gun focusing electrode; and each digital-to-analog converter is coupled to receive a binary segment of a digital focusing word from a digital processor, wherein the digital processor is configured to receive the time delay command word.

122. The device of claim 121 wherein the digital processor includes a read-only memory.

123. The device of claim 122 wherein the read-only memory stores a plurality of electron gun focusing words, each electron gun focusing word corresponding to one of a plurality of the time delay command words, and comprising means for providing a corresponding electron gun focusing word in response to receiving a time delay command word, and means for selecting a time delay command word for communication between the storing and providing means.

124. The device of claim 121, the means for controlling a gate potential comprising electron gun current control means including a current reference input terminal;

a current reference signal coupled to the current reference input terminal; and an analog-to-digital converter configured to generate a digital gate voltage word corresponding to the gate potential and coupled to transmit the digital gate voltage word to the digital processor.

125. The device of claim 124 including a read-only memory.

126. The device of claim 125 wherein the read-only memory stores a plurality of electron gun focusing words;

each electron gun focusing word corresponding to specific pairs of one of the digital gate voltage words and one of the time delay command words, and means are included for providing the corresponding electron gun focusing word in response to receiving a digital gate voltage word and a time delay command word.

127. The device of claim 126 further comprising a current reference read-only memory with means for storing a plurality of current reference words, each current reference word corresponding to one of a plurality of time delay command words, means for providing the corresponding current reference word in response to receiving a time delay command word, and a current reference digital-to-analog converter, coupled to the current reference read-only memory, wherein the current reference digital-to-analog converter provides a current reference signal to the current reference input terminal.

128. The device of claim 126 further comprising a current reference read-only memory with means for storing a plurality of current reference words, each current reference word corresponding to specific pairs of one of the time delay command words and one of a plurality of gain command words, means for providing the corresponding current reference word in response to receiving one of the specific pairs, and a current reference digital-to-analog converter, coupled to the current reference read-only memory, wherein the current reference digital-to-analog converter provides a current reference signal to the current reference input terminal.

129. The device of claim 1 adapted to provide frequency multiplication wherein the detector comprises more than two segments arranged in a first group and a second group where individual segments of the first group and the second group are intercollated in alternating order sequentially between segments of the first group and the second group;

the first group being coupled to a positive detector output, and the second group being coupled to a negative detector output; and means for applying the deflection signal as an alternating signal with an amplitude that is operable to sweep the beam spot across the segments.

130. The device of claim 129 wherein the detector comprises at least four segments and the detector is adapted to achieve at least frequency doubling.

131. The device of claim 129 wherein the segments are:

arranged in a row along the sweep pathway, the row having a center and two ends and the segments are wider in a direction of the sweep pathway towards the center and narrower in the direction of the sweep pathway towards each end.

132. The device of claim 131 wherein the segments are separated by substantially diagonal slots.

133. The device of claim 131 wherein the deflection signal is of programmable amplitude to vary an amplitude of the sweeping action and a number of the segments the beam spot intersects during the sweeping action.

134. The device of claim 129 wherein the beam spot comprises a line spot.

135. The device of claim 129 wherein the beam spot is of circular shape.

136. The device of claim 129 wherein the beam spot is rectangular.

137. The device of claim 129 wherein the segments are rectangular.

138. The device of claim 129 wherein the detector is circular;

the segments comprise substantially equiangular slices;

each electron gun additionally comprises a second beam deflector coupled to a second deflection signal, the second beam deflector operable to deflect the corresponding beamlet in a direction that is orthogonal to the sweep pathway, and means for applying the second deflection signal as an alternating signal with an amplitude operable to sweep the beam spot across all of the segments.

139. The device of claim 1 wherein the detector comprises a single triangular segment and the beam spot is rectangular.

140. The device of claim 1 wherein the detector comprises a rectangular segment and the beam spot is of triangle shape.

141. The device of claim 1 wherein the detector comprises a segment with an edge intersecting the sweep pathway such that the edge has a predetermined shape introduced by design to act in concert with the sweeping action of the beam spot to achieve non-linearity, in a current collected by the detector, with respect to the deflection voltage.

142. The device of claim 141 further including means for applying the deflection signal so that the beam spot repeatedly crosses the edge at a periodic frequency.

143. The device of claim 141 wherein the beam spot comprises a rectangle, the sweep pathway is linear and the edge is shaped to observe a square law curvature such that a distance of the edge along the sweep pathway is described by a variable 'x' and a distance of the edge orthogonal to the sweep pathway is described by a variable 'y', and a shape of the edge is substantially described by a mathematical relation of the form $y=x^N$ wherein N is a number greater than or equal to 1.

144. The device of claim 143 wherein N is a value selected from the group consisting of 1, 2, 3, 4, 5, 6, 7, 8, 9 and 10.

145. The device of claim 1 wherein the array comprises an arrangement of the electron guns that has a generally rectangular border outline.

146. The device of claim 1 wherein the array comprises an arrangement of the electron guns that has a generally triangular border outline.

147. The device of claim 1 wherein the array comprises an arrangement of the electron guns that has a generally circular border outline.

148. The device of claim 1 wherein the electron gun array comprises a generally linear pattern arrangement of the electron guns.

149. The device of claim 129 wherein the detector is segmented by a horizontal slot and a vertical slot, the slots being orthogonal and intersecting such that there are four segments in each of four quadrants of the detector wall, and the beamlet deflector of each electron gun in the array of electron guns is comprised of X and Y deflectors configured to generate orthogonal beamlet deflections thereby;

the deflection signal is comprised of a horizontal voltage signal and a vertical voltage signal, wherein the two signals generate orthogonal X and Y sweeping actions with the X sweeping action being collinear with the horizontal slot and the Y sweeping action collinear with the vertical slot.

150. The device of claim 149 wherein the beam spot is substantially rectangular.

151. The device of claim 150 wherein the beam spot is substantially square.

152. The device of claim 1 wherein the detector comprises one or more segments, and the beam deflector comprises one or more input deflectors, and the one or more voltage signals include one or more input signals, and each input deflector is coupled to a corresponding one of the input signals, whereby the quiescent state comprises a quiescent state of all input deflection input signals so that the electron beam is transmitted along the transmission pathway to position the beam spot at a quiescent spot position on the detector wall, and the non-quiescent state comprises one or more of the input deflection signals deflecting the electron beam such that the beam spot is moved to a non-quiescent spot position on the detector wall corresponding to the combination of input signal states, and a position of each detector segment on the detector wall corresponds to one of the quiescent or non-quiescent spot positions.

153. The device of claim 152 further comprising a load circuit coupled to each detector segment.

154. The device of claim 153 wherein the load circuit comprises a resistor.

155. The device of claim 153 wherein the load circuit comprises a resonant tunneling diode.

156. The device of claim 152 wherein the sweep pathway is comprised of a horizontal pathway and a vertical pathway, and the horizontal pathway and vertical pathway are generally orthogonal, and a first subset of the input deflectors provide deflection along the horizontal pathway in a non-quiescent state of the corresponding input signals of the first subset, and a second subset of the input deflectors provide deflection along the vertical pathway in the non-quiescent state of the corresponding input signals of the second subset.

157. The device of claim 152 further comprising an electrical clamp coupled to each detector segment.

158. The device of claim 157 wherein the electrical clamp comprises a Schottky diode.

159. The device of claim 152 comprising two or more input deflectors respectively providing geometries that differ from one another to produce correspondingly greater or lesser deflection gain.

160. The device of claim 1 further comprising a radiating element coupled to the detector, wherein the element achieves electromagnetic radiation in response to a beam spot interaction with the detector.

161. The device of claim 160 wherein the radiating element is an antenna.

162. The device of claim 161 wherein the antenna comprises a dipole.

163. The device of claim 160 wherein the detector comprises first and second segments;

the radiating element comprises first and second feedpoints;

the first detector segment couples with the first feedpoint and the second detector segment couples with the second feedpoint;

a first load couples with the first feedpoint and a second load couples with the second feedpoint.

164. The device of claim 160 wherein the detector comprises first and second segments; the radiating element comprises first and second feedpoints and first and second endpoints;

the first detector segment couples with the first feedpoint and the second detector segment couples with the second feedpoint;

a first load couples with the first endpoint and a second load couples with the second endpoint.

165. The device of claim 161 wherein the antenna comprises a patch.

166. The device of claim 165 further comprising:

a plurality of feedpoints located at different positions on the patch;

a plurality of detector segments forming the detector, the detector segments being equal in number to the feedpoints, each detector segment being coupled to a corresponding feedpoint; and means for addressably directing the beam to a specific detector segment in response to a targeting command.

167. The device of claim 165 additionally comprising:

a plurality of feedpoints located at different positions on the patch;

a plurality of detector segments forming the detector, the detector segments being equal in number to the feedpoints, each detector segment being coupled to a corresponding feedpoint;

wherein the array of electron guns is comprised of electron gun subarrays, the electron beam deflector is comprised of independent subdeflectors corresponding to each electron gun subarray; and the deflection signal is comprised of a plurality of subarray excitation signals coupled one per subdeflector.

168. The device of claim 161 wherein the antenna comprises one of a group consisting of a monopole, a log spiral, a folded log spiral, a horn, and a vivaldi-type.

169. The device of claim 160 wherein the radiating clement comprises a crossed-polarization radiator comprising two single polarization radiating elements X and Y arranged orthogonal to one another, with feedpoints 1 and 2 for radiating with X polarization and feedpoints 3 and 4 for radiating with Y polarization;

the detector comprises segments A, B, C and D arranged in quadrants and labeled in clockwise order; and segments A and B reside along a X sweep direction, segments D and C reside along the X sweep direction, segments A and D reside along a Y sweep direction orthogonal to the X sweep direction, and segments B and C reside along the Y sweep direction, and segment A couples with feedpoints 1 and 3, segment B couples with feedpoints 1 and 4, segment C couples with feedpoints 4 and 2 and segment D couples with feedpoints 2 and 3; and the electron beam deflector comprises one or more first beam subdeflectors operable to deflect the electron beam in the X sweep direction, and one or more second beam subdeflectors operable to deflect the electron beam in the Y sweep direction.

170. The device of claim 169 wherein the radiating element X comprises a first antenna, and feedpoints of the first antenna are coupled to feedpoints 1 and 2; and the radiating element Y comprises a second antenna, and feedpoints of the second antenna are coupled to feedpoints 3 and 4; and the first antenna is constructed to generate X polarization and the second antenna is constructed to generate Y polarization.

171. The device of claim 170 wherein the first and second antennas are dipoles.

172. The device of claim 169 operable to generate X polarization wherein segments A and D are separated from B and C by a first slot, and segments A and B are separated from C and D by a second slot.

173. The device of claim 172 operable to generate X polarization wherein the beam spot is deflected along the X sweep direction.

174. The device of claim 172 operable to generate Y polarization wherein the beam spot is deflected along the Y sweep direction.

175. The device of claim 172 operable to generate dual polarization wherein the beam spot is deflected along the X and Y sweep directions.

176. The device of claim 160 wherein the radiating element is a waveguide.

177. The device of claim 176 wherein the waveguide comprises a top wall, a bottom wall, and two side walls, the top and bottom walls being separated from each other by a first distance in a direction orthogonal to the sweep direction and orthogonal to a transmission axis aligned with the transmission pathway, and the two side walls being separated from each other by a second distance in the sweep direction, and the detector comprises a first detector segment coupled with the top wall, and a second detector segment coupled with the bottom wall.

178. The device of claim 177 wherein the waveguide is rectangular.

179. The device of claim 177 wherein the waveguide is cylindrical and the top, bottom and side walls comprise quadrants of a cylindrical wall of the waveguide.

180. The device of claim 176, wherein the electron gun array is comprised of an X subarray and a Y subarray;

the deflector is comprised of an X subdeflector and a Y subdeflector, and the X subarray is responsive to the X subdeflector and the Y subarray is responsive to the Y subdeflector;

the deflection signal is comprised of an X signal coupled to the X subdeflector and a Y signal coupled to the Y subdeflector;

the electron beam is comprised of an X beam emitted by the X subarray and a Y beam emitted by the Y subarray, and the beam spot is comprised of an X spot and a Y spot, and the X beam is transmitted along the transmission pathway, the Y beam is transmitted along the transmission pathway, and wherein a deflection of the X beam and sweep of the X beam spot is responsive to the X signal and a deflection of the Y beam and sweep of the Y beam spot is responsive to the Y signal.

181. The device of claim 176 wherein the waveguide comprises a cylindrical wall, having a cylindrical axis parallel to the transmission pathway, and a diameter DC;

two rod electrodes extending from the detector wall into an input end of the waveguide, parallel to each other and to the cylindrical axis, and separated by a distance D that is less than DC, each rod electrode having a rod diameter DR that is much less than D; and the detector comprises two segments, each segment coupled to one of the rod electrodes.

182. The device of claim 176 wherein an output port of the waveguide is coupled to a feed of an antenna horn.

183. The device of claim 1 wherein an output contact of the detector at least partially comprises an antenna.

184. The device of claim 1 wherein:

the electron gun array comprises one or more subarrays of the electron guns;

the electron beam comprises a plurality of sub-beams corresponding to each subarray;

the deflection signal comprises a plurality of input signals, each input signal comprising a quiescent state and a non-quiescent state;

the electron beam deflector comprises one or more subdeflectors corresponding to each subarray;

each subdeflector is coupled to each corresponding input signal; and when all of the input signals are in the quiescent state, the electron beam is transmitted parallel to the transmission pathway, and when any of the input signals are in the non-quiescent state, the corresponding sub-beam is deflected.

185. The device of claim 184 wherein each input signal comprises a primary signal and an offset signal.

186. The device of claim 185 wherein the detector comprises an array of subdetectors.

187. The device of claim 186 wherein each subdetector comprises two segments.

188. The device of claim 187 wherein the subdetector segments are positionally disposed along the sweep pathway.

189. The device of claim 185 wherein each subdeflector comprises X and Y subdeflectors and each offset signal comprises an X offset signal coupled to an X subdeflector and a Y offset signal coupled to a Y subdeflector.

190. The device of claim 186 wherein the array of subdetectors is organized in a two-dimensional grid with a specified pattern.

191. The device of claim 190 wherein the pattern is one of a group including a rectangular grid and a hexagonal grid.

192. The device of claim 190 wherein the subarrays of the electron guns are organized in a two-dimensional grid pattern matching the pattern of the subdetectors.

193. The device of claim 186 additionally comprising beam offset control means to selectably direct each sub-beam to one of the subdetectors in response to a beam targeting word that is binarily segmented to control each subdeflector with a corresponding binary segment.

194. The device of claim 193 wherein the beam offset control means further comprises a plurality of beam targeting digital-to-analog converters coupled to provide the offset signals to each subdeflector, and further coupled to receive a corresponding binary segment of the beam targeting word.

195. The device of claim 194 wherein the beam targeting word is generated by processing means.

196. The device of claim 195 wherein the array of subdetectors generates a corresponding array of differential offset error signals coupled to the processing means.

197. The device of claim 196 operable to adjust the offset signals in response to the differential offset error signals to thereby refine a centering of each sub-beam on a targeted one of the subdetectors.

198. The device of claim 196 configured to select one of the differential offset error signals, filter it by filter means, generating a refined offset correction error signal thereby, and selectably deliver the refined offset correction error signal to the subdeflector selected by the beam targeting word.

199. The device of claim 197 wherein the a correction error is a digital word, and further comprising a plurality of correction error digital-to-analog converters coupled to each corresponding subdeflector, storage means coupled to each correction error digital-to-analog converter, and means to selectably couple the correction error to a selected correction error digital-to-analog converter corresponding to a selected subdeflector.

200. The device of claim 199 wherein the processing means sums the refined offset correction error signal with the binary segment of the beam targeting word corresponding to the selected subdeflector, generating a composite subdeflector offset word, and comprising storage means to receive the composite subdeflector offset word and to provide a stored representation thereof to the selected one of the beam targeting digital-to-analog converters.

201. The device of claim 184 further comprising antenna means coupled to any of the one or more subdeflectors.

202. An array of the devices of claim 1.

203. An analog beamform matrix device comprising a microcolumn array formed of N sub-arrays, each sub-array including M microcolumns that each contain an electron gun separated from a detector by a drift cavity, and a deflection apparatus, the detector, the drift cavity, and the deflection apparatus operably configured to act upon an electron beam in the drift cavity when the electron beam is emitted by the electron gun, the deflection apparatus of every microcolumn in a discrete sub-array being driven by an input signal $V_N$, wherein each detector in each sub-array receives a beam from at least one electron gun in the sub-array and outputs a received antenna beam; and time-delay addressing means to generate a time delay from each sub-array.

204. A crossbar matrix device comprising a plurality of N electron guns, each augmented with a vertical deflector;

a plurality of N horizontal deflection signals;

a plurality of M detectors;

a plurality of N horizontal beam offset signals and N vertical beam offset signals;

a drift cavity;

means for combining the N horizontal deflection signals and the N horizontal beam offset signals; and crossbar addressing means.

205. The device of claim 204 where in the crossbar addressing means comprises a plurality of digital-to-analog converters generating the N horizontal beam offset signals and N vertical beam offset signals in response to a digital crossbar configuration word; and a digital processor to generate the digital crossbar configuration word.

206. The device of claim 205 wherein the digital processor comprises a read-only memory.

207. The device of claim 204 comprising free-space photonic I/O comprising a photonic input array to transmit a plurality of input light signals;

an input lens system configured to direct the plurality of input light signals;

a photodetector array comprising a plurality of photodetectors, each photodetector being configured to receive one of the plurality of input light signals and generate a voltage signal in response thereto;

a laser diode array comprising a plurality of laser diodes, each laser diode being configured to receive an output signal from a detector and generate an output light signal in response thereto;

an output lens system configured to direct the output light signals; and a photonic output array to receive the plurality of output signals.

208. The device of claim 207 wherein:

the photonic input array comprises an input fiber bundle comprising a plurality of input optical fibers, with a one-to-one correspondence between the input optical fibers and the photodetectors;

each input light signal is transmitted from one of the input optical fibers to a corresponding photodetector;

the photonic output array comprises an output fiber bundle comprising a plurality of output optical fibers, with a one-to-one correspondence between the laser diodes and the output optical fibers; and each output light signal is transmitted from one of the laser diodes to the corresponding output optical fiber.

209. The device of claim 208 wherein each deflection signal is binarily encoded.

210. The device of claim 204 wherein the device is implemented as part of an active backplane.

* * * * *